United States Patent [19]

Lo et al.

[11] Patent Number: 5,649,065

[45] Date of Patent: Jul. 15, 1997

[54] OPTIMAL FILTERING BY NEURAL NETWORKS WITH RANGE EXTENDERS AND/OR REDUCERS

[75] Inventors: James Ting-Ho Lo, Ellicott City; Lei Yu, Adelphi, both of Md.

[73] Assignee: Maryland Technology Corporation, Ellicott City, Md.

[21] Appl. No.: 104,488

[22] Filed: Aug. 9, 1993

Related U.S. Application Data

[63] Continuation-in-part of Ser. No. 68,176, May 28, 1993, Pat. No. 5,408,424.

[51] Int. Cl.$^6$ .................................................. G06F 15/18
[52] U.S. Cl. ................... 395/23; 395/22; 395/24; 395/27; 364/724.04
[58] Field of Search .............................. 395/22, 23, 24, 395/27; 364/724.01

[56] References Cited

U.S. PATENT DOCUMENTS

| | | | |
|---|---|---|---|
| 5,003,490 | 3/1991 | Castelaz et al. | 395/22 |
| 5,150,323 | 9/1992 | Castelaz | 364/807 |
| 5,253,329 | 10/1993 | Villarreal et al. | 395/23 |
| 5,408,414 | 4/1995 | Nomoto et al. | 364/449 |
| 5,490,505 | 2/1996 | Diab et al. | 128/633 |

OTHER PUBLICATIONS

Ruck et al, "Comparative Analysis of Backpropagation and the Extended Kalman Filter for Training Multilayer perceptions", IEEE Transactions on Pattern Analysis & Machine Intelligence, 1992.

Palmieri et al, "Sound Localization with a Neural Network Trained with the Multiple Extended Kalman Algorithm", IEEE Inter. Conf. on Neural Networks, 1991.

Rao et al, "A Recurrent Neural Network for Nonlinear Time Series Prediction", IEEE Neural Networks for Signal Processing II, 1992.

R. S. Bucy and K. D. Senne, "Digital Synthesis of Non-linear Filters," *Automatica*, vol. 7, pp. 287–298 (1971).

R. S. Bucy and K. D. Senne, "Non-linear Filtering Algorithms for Vector Processing Machines," *Comp. & Maths. with Apps.*, vol. 6, pp. 317–338 (1980).

J. T.-H. Lo, "Optimal Estimation for the Satellite Attitude Using Star Tracker Measurements," *Automatica*, vol. 22, pp. 477–482 (1986).

J. T.-H. Lo and S.-K. Ng, "Optimal Fourirer–Hermite Expansion for Estimation," *Stochastic Processes and their Applications*, vol. 21, pp. 291–304 (1986).

S. I. Sudharsanan and M. K. Sundareshan, "Maximum A posteriori State Estimation: A Neural Processing Algorithm," in *Procs. of the 28th Conf. on Decision and Control*, Tampa, Florida, pp. 1805–1806 (1989).

Q. Sun et al, "A Neural Network Computation Algorithm for Discrete–Time Linear System State Estimation," in *Procs. of IJCNN*, Jun. 1992, Baltimore, Maryland, pp. 1–443 (1992).

(List continued on next page.)

*Primary Examiner*—George B. Davis

[57] ABSTRACT

A method and apparatus is provided for processing a measurement process to estimate a signal process, even if the signal and/or measurement processes have large and/or expanding ranges. The method synthesizes training data comprising realizations of the signal and measurement processes into a primary filter for estimating the signal process and, if required, an ancillary filter for providing the primary filter's estimation error statistics. The primary and ancillary filters each comprise an artificial recurrent neural network (RNN) and at least one range extender or reducer. Their implementation results in the filtering apparatus. Many types of range extender and reducer are disclosed, which have different degrees of effectiveness and computational cost. For a neural filter under design, range extenders and/or reducers are selected from those types jointly with the architecture of the RNN in consideration of the filtering accuracy, the RNN size and the computational cost of each selected range extender and reducer so as to maximize the cost effectiveness of the neural filter. The aforementioned synthesis is performed through training RNNs together with range extenders and/or reducers.

94 Claims, 30 Drawing Sheets

OTHER PUBLICATIONS

J. L. Elman, "Finding Structure in Time," *Cognitive Science*, vol. 14, pp. 179–211 (1990).

D. L. Elliott, "A Better Activation Function for Artificial Neural Networks," ISR Technical Report TR 93-8, Institute for Systems Research, University of Maryland, College Park, MD 20742 (1993).

M. I. Jordan, "Attractor Dynamics and Parallelism in a Connectionist Sequential Machine," in *Procs. of the 8th Annual Conf. of the Cognitive Science Society*, pp. 531–546, Erlbaum (1986).

J. T.-H. Lo, "Finite-dimensional Sensor Orbits and Optimal Nonlinear Filtering," *IEEE Transactions on Information Theory*, vol. IT–18, pp. 583–588 (1972).

K. Hornik et al, "Multilayer Fedeforward Networks are Universal Approximators," *Neural Networks*, vol. 2, pp. 359–366 (1989).

P. Poddar and K. P. Unnikrishnan, "Non–linear Prediction of Speech Signals Using Memory Neuron Networks," in *Neural Networks for Signal Processing*, ed. J. H. Juang et al, pp. 395–404 (1991).

A. J. Robinson and F. Fallside, "A Dynamic Connectionist Model for Phoneme Recognition," in *Neural Networks from Models to Applications*, ed. L. Personnaz and G. Dreyfus, pp. 541–550, IDEST, Paris (1989).

O. Nerrand et al, "Neural Network Training Schemes for Non–linear Adaptive Filtering and Modelling," in *Procs. of IJCNN*, Jun. 1991, Seattle, Washington, pp. I–61–66 (1991).

J. P. DeCruyenaere and H. M. Hafez, "A Comparison between Kalman Filters and Recurrent Neural Networks," in *Procs. of IJCNN*, Jun. 1992, Baltimore, Maryland, pp. IV–247–251 (1992).

J. T.-H. Lo, "Optimal Filtering by Recurrent Neural Networks," in *Procs. of the 30th Annual Allerton Conf. on Comm., Contr., and Comput.*, Monticello, IL, Oct. 1992, ed. P. Van Dooren and M. Spong, pp. 903–912 (1992).

J. T.-H. Lo, "Synthetic Approach to Optimal Filtering," *Procs. of the 1992 Intl. Simul. Tech. Conf. and 1992 Workshop on Neural Networks, Clear Lake, Texas*, Nov. 1992, pp. 475–481 (1992).

O. Nerrand et al, "Neural Networks and Nonlinear Adaptive Filtering: Unifying Concepts and New Algorithms," *Neural Computation*, vol. 5, pp. 165–199 (1993).

L. Yin et al, "A New Class of Nonlinear Filters—Neural Filters," *IEEE Transaction on Signal Procesing*, vol. 41, pp. 1201–1222 (1993).

primary filter ⟶ primary filter with augmented input terminals
ancillary filter ⟶ ancillary filter with augmented input terminals
training data ⟶ augmented training data
ancillary training data ⟶ augmented ancillary training data
$y(t)$ ⟶ $(y(t), s(t))$

OPTIMAL FILTERING BY NEURAL NETWORKS WITH RANGE EXTENDERS AND/OR REDUCERS

CROSS-REFERENCE TO RELATED APPLICATION

This application is a continuation-in-part of U.S. patent application Ser. No. 08/068,176, filed May 28, 1993, now U.S. Pat. No. 5,408,424, granted Apr. 18, 1995.

STATEMENT OF GOVERMENT INTEREST

This invention was made in part with United States Government support under contract F30602-91-C-0033 awarded by the U.S. Air Force. The Government has certain rights in some claims of this invention.

BACKGROUND OF THE INVENTION

This invention is concerned with the problem of discrete-time optimal filtering, namely the problem of processing a discrete-time measurement process for the purpose of estimating a discrete-time signal process, even if the ranges of the measurement and/or signal processes are large.

In a standard formulation of the problem in the modern theory of optimal filtering, whether the ranges of the measurement and signal processes are large or not, the signal process and measurement process are described by the mathematical/statistical model:

$$x(t+1)=f(x(t),t)+G(x(t),t)\xi(t),\ x(0)=x_0, \quad (1)$$

$$y(t)=h(x(t),t)+\epsilon(t), \quad (2)$$

where $x(t)$ is an n-dimensional stochastic process; $y(t)$ is an m-dimensional stochastic process; $x_0$ is a Gaussian random vector with mean $\bar{x}_0$ and covariance $\Pi_0$, $\xi(t)$ and $\epsilon(t)$ are respectively $n_1$-dimensional and $m_1$-dimensional Gaussian noise processes with zero means; $x_0$, $\xi(t)$ and $\epsilon(t)$ have given joint probability distributions; and $f(x, t)$, $G(x, t)$ and $h(x, t)$ are known functions with such appropriate dimensions and properties that (1) and (2) describe faithfully the evolutions of the signal and measurement. The problem of discrete-time optimal filtering is to design and make a discrete-time dynamic system that inputs $y(t)$ and outputs an estimate $\hat{x}(t)$ of $x(t)$ at each time $t=1,2,\ldots,T$, which estimate minimizes a given estimation error criterion. Here T is a positive integer or infinity. The dynamic system is called an optimal filter with respect to the given estimation error criterion. The dynamic state of the optimal filter at a time $t_1$ must carry the optimal conditional statistics given all the measurements $y(t)$ that have been received up to and including the time $t_1$ at the time so that at the next time $t_1+1$, the optimal filter will receive and process $y(t_1+1)$ using the optimal conditional statistics from $t_1$, and then produce the optimal estimate $\hat{x}(t_1+1)$. The most widely used estimation error criterion is the mean square error criterion, $E[\|x(t)-\hat{x}(t)\|^2]$, where E and $\|\cdot\|$ denote the expectation and the Euclidean norm respectively. The estimate $\hat{x}(t)$ that minimizes this criterion is called the minimum variance estimate or the least-square estimate.

The most commonly used method of treating such a problem, whether the ranges of the measurement and signal processes are large or not, is the use of a Kalman filter (KF) or an extended Kalman filter (EKF). A detailed description of the KF and EKF (and some other approximate nonlinear filters) can be found in e.g., A. H. Jazwinski, *Stochastic Processes and Filtering Theory*, pp. 194–358, Academic Press (1970), and B. D. O. Anderson and J. B. Moore, *Optimal Filtering*, pp. 36–287, Prentice-Hall (1979). The KF and EKF have been applied to a wide range of areas including aircraft/ship inertial and aided-inertial navigation, spacecraft orbit determination, satellite attitude estimation, phase array radar tracking, nuclear power plant failure detection, power station control, oceanographic surveying, biomedical engineering, and process control. Many important papers on the application of the KF and EKF can be found in H. W. Sorenson, editor, *Kalman Filtering: Theory and Application*, IEEE Press (1985).

In the rare cases where f and h are linear functions of $x(t)$ and G does not depend on $x(t)$, the model, (1) and (2), is called the linear-Gaussian model. If the KF is used for a linear-Gaussian model, the resulting estimate $\hat{x}(t)$ is the minimum variance (or the least-squares) estimate. In most cases, however, the foregoing linearity conditions on f, h and G are not satisfied and the EKF is used. At each time point, the EKF, which is a suboptimal approximate filter, first linearizes f and G at the estimated value of $x(t)$ and linearizes h at the predicted value of $x(t+1)$. Then the EKF uses the KF equations to update the estimated value of $x(t+1)$ and the predicted value of $x(t+2)$ for the new measurement $y(t+1)$. By iterating the linearization and estimation a certain number of times or until convergence at each time point, we have the so-called iterated EKF (IEKF). Since both the EKF and IEKF involve linearization, they are not optimal filters. In fact, when either the random driving term $G(x(t))\xi(t)$ in (1) or the random measurement noise $\epsilon(t)$ in (2) has such large variances and covariances that the aforementioned estimated value and predicted value of the signal are not very close to the true signal, and/or when the functions f, G and h are not very smooth, the linearization may be a poor approximation and the EKF as well as IEKF may yield poor estimates or even fail totally.

This shortcoming of the EKF and IEKF has motivated an enormous amount of work on nonlinear filtering in the past thirty years or so. But the results have been disappointing. With very few, if any, exceptions, the nonlinear filtering results have been confined to research papers and textbooks. This state of the art is reflected in V. Krishnan, *Nonlinear Filtering and Smoothing: An Introduction to Martingales, Stochastic Integrals and Estimation*, John Wiley & Sons (1984) and R. S. Liptser and A. N. Shiryayev, *Statistics of Random Processes I: General Theory and II: Applications*, Springer-Verlag (1977). The EKF and, to a much less extent, the IEKF remain as the standard filters for estimating stochastic signals. This 30-year failure is believed to be related to the methodology that has been used since R. E. Kalman derived the KF equations. The methodology is analysis. Starting with a mathematical/statistical model, the methodology searches for a solution consisting of analytic formulas and/or equations that describe the structures and determine the parameters of the filter.

Because of the inherent inaccuracies and frequent failures of the EKF and IEKF and the restrictive and unrealistic assumptions and prohibitive computational requirements of other existing filters, new filters are needed that will consistently yield a high degree of estimation accuracy vis-à-vis the information contained in the measurements about the signal and that can be applied in a large variety of real-world situations.

Recent years have seen a rapid growth in the development of artificial neural networks (ANNs), which are also known as connectionist models, parallel distributed processors, neuroprocessors, and neurocomputers. Being crude mathematical models of theorized mind and brain activity, ANNs exploit the massively parallel processing and distributed information representation properties that are believed to exist in a brain. A good introduction to ANNs can be found in R. Hecht-Nielsen, *Neurocomputing*, Addison-Wesley (1990) and J. Hertz, A. Krogh and R. G. Palmer, *Introduction to the Theory of Neural Computation*, Addison-Wesley (1991).

There is a large number of ANN paradigms such as Hopfield networks, high-order networks, counter-propagation networks, bidirectional associative memories, piecewise linear machines, neocognitrons, self-organizing feature maps, adaptive resonance theory networks, Boltzmann machines, multilayer perceptrons (MLPs), MLPs with various feedback structures, other recurrent neural network paradigms, etc. These and other ANN paradigms have been applied to systems control (e.g., D. A. White and D. A. Sofge, editors, *Handbook of Intelligent Control*, Van Nostrand Reinhold (1992)), signal processing (e.g., B. Kosko, editor, *Neural Networks for Signal Processing*, Prentice Hall (1992)), speech processing (e.g., D. P. Morgan and C. L. Scofield, *Neural Networks and Speech Processing*, Kluwer Academic Publishers (1991)), and others (e.g., E. Sanchez-Sinencio and C. Lau, editors, *Artificial Neural Networks*, IEEE Press (1992)).

There are many patent documents concerning the applications of ANNs. The two that seem the most relevant to the present invention among them are mentioned as follows. In U.S. Pat. No. 5,003,490 to P. F. Castelaz and D. E. Mills, (1991), a multilayer perceptron with a sigmoid activation function and a tapped delay line for the input is used to classify input waveforms. In U.S. Pat. No. 5,150,323 (1992) to P. F. Castelaz, a multilayer perceptron with a sigmoid activation function and a couple of tapped delay lines for preprocessed inputs is used for in-band separation of a composite signal into its constituent signals.

There are many research articles concerning applications of ANNs, most of which can be found in the foregoing books, journals (e.g., *IEEE Transactions on Neural Networks, Neural Networks, and Neural Computation*), and Conference proceedings (e.g., *Proceedings of the International Joint Conference on Neural Networks*). Applications of two groups of the aforementioned neural network paradigms to optimal filtering have been reported in the open literature since 1989. The applications of the first group to optimal filtering were reported in S. I. Sudharsanan and M. K. Sundareshan, "Maximum A Posteriori State Estimation: A Neural Processing Algorithm," *Proceedings of the 28th Conference on Decision and Control*, pp. 1805–1806 (1989), and in Q. Sun, A. T. Alouani, T. R. Rice and J. E. Gray, "A Neural Network Computation Algorithm for Discrete-Time Linear System State Estimation," *Proceedings of the 1992 International Joint Conference on Neural Networks*, pp. I-443–458 (1992). The signal and measurement processes considered therein are described by the linear-Gaussian model, and the neural networks used are Hopfield networks with the neural activation function slightly modified in the first paper cited above. The connection weights and neuron biases for the network are determined by using the Kalman filter (KF) equations so that when the Hopfield network stabilizes at each time point, the stable state is the minimum variance estimate. The usefulness of the method is very limited, because it can only be applied to the linear-Gaussian model for which the KF equations are available, and the weights and biases of the Hopfield network need to be updated in the operation of the Hopfield network by other means, using the Kalman filter equations or their slight modification.

The applications of the second group of the aforementioned neural network paradigms to optimal filtering were reported in the open literature by J. P. DeCruyenaere and H. M. Hafez, "A Comparison Between Kalman Filters and Recurrent Neural Networks," *Proceedings of the 1992 International Joint Conference on Neural Networks*, pp. IV-247–251 (1992); J. T.-H. Lo, "Neural Network Approach to Optimal Filtering," invited paper presented at the First World Congress of Nonlinear Analysts, Tampa, Florida (1992); J. T.-H. Lo, "Optimal Filtering by Recurrent Neural Networks," *Proceedings of the Thirtieth Annual Allerton Conference on Communication, Control and Computing*, pp. 903–912 (1992); J. T.-H. Lo, "Synthetic Approach to Optimal Filtering," *Proceedings of the 1992 International Simulation Technology Conference and 1992 Workshop on Neural Networks*, pp. 475–481 (1992). The second group of the aforementioned neural network paradigms consists of multilayer perceptrons with feedbacks.

Through these publications, a new approach emerged in the open literature. As opposed to the analytic methodology used in the foregoing conventional filtering theory as well as the foregoing application of the first group of neural network paradigms to optimal filtering, the new approach is synthetic in nature. Signal and measurement realizations, which are generated by either computer simulation or actual experiment, are synthesized into a filter by training and testing at least one multilayer perceptron with some feedback structure until the filtering performance of such a multilayer perceptron (with the given feedback structure) with respect to the mean square error criterion is satisfactory or can not be significantly improved by increasing the size of the multilayer perceptron (with the given feedback structure), whichever comes first, and then selecting a trained multilayer perceptron (with the given feedback structure) as the filter, analyzing network size versus filtering accuracy to optimize the cost effectiveness.

The selected multilayer perceptron (with the given feedback structure) is a recursive filter optimal for its architecture (e.g. number of layers, number of neurons in each layer, types of feedback, etc.), with the lagged feedbacks carrying the optimal statistics at each time point. Above all, it was proven that multilayer perceptrons with appropriate feedback structures exist that approximate the optimal filter in performance with respect to the mean square error criterion to any desired degree of acuracy.

Because of the synthetic nature of the new approach, no such assumptions as the Markov property, Gaussian distribution, and additive noise are necessary in the approach. However, there is a fundamental requirement in the approach. Namely, the measurement process in the optimal filtering problem is required to stay in a bounded region. In theory, the requirement is always fulfilled, since all measurable quantities in the real world can always be contained in a bounded region sufficiently large. However, if the measurement process or the signal process or both keep growing such as in a typical filtering problem in satellite orbit determination and aircraft/ship navigation, for a multilayer perceptron with a feedback structure (MLPWFS) to have a sufficient valid domain to cover the range of measurements and to have a sufficient valid range to cover the range of signals, the sizes of the MLPWFS and the training data set must be large. The larger the MLPWFS and the training data set are, the more difficult it is to train the MLPWFS on the training data set.

Furthermore, the time period or periods, over which the training data is collected, by computer simulation or actual experiment, must be of finite length. If the measurement and signal processes keep growing, the MLPWFS trained on the training data has difficulty to generalize beyond the foregoing time period or periods.

A simple way to extend an MLPWFS output range and to reduce an input data range is scaling. We may multiply an MLPWFS output by a constant greater than one and/or divide an input by another constant also greater than one. Or alternatively, we may use a monotone increasing function to extend (or antisquash) an MLPWFS output and/or use another monotone increasing function to reduce (or squash) an input. However, scaling is a "static" method of extending and reducing a range, employing a static mapping to transform the range. It is not very effective in extending a bounded MLPWFS output range to an expanding signal process range, or reducing an expanding measurement process range to a bounded MLPWFS input domain. Consequently, its usefulness is limited, as borne out in our computer simulations.

Therefore, more effective methods and apparatuses to transform MLPWFS output ranges and input data ranges are needed, when the ranges of the signal and/or measurement processes are large and/or expanding.

SUMMARY OF INVENTION

It is known that under some rather mild conditions on given signal and measurement processes, a multilayer perceptron with interconnected neurons or with output feedbacks exists that approximates the minimum variance filter in performance to any desired degree of accuracy over a finite time interval. However, if the ranges of the signal and/or measurement processes are large and/or expanding in time, the sizes required of the neural network and the training data set can be very large and the neural network trainings involved in synthesizing the training data set into a filter can be extremely difficult, especially if a good filtering performance is needed. Furthermore, the resulting neural filter may not be able to generalize beyond the finite time interval over which the training data is available.

To alleviate these difficulties, a method and an apparatus are provided for filtering a measurement process to estimate a signal process, even if the signal and/or measurement processes have large and/or expanding ranges. The basic idea is the employment of range extenders and reducers herein disclosed. While a range extender extends and/or transforms dynamically the output range of an output node of a recurrent neural network (RNN), a range reducer reduces and/or transforms dynamically the range of a component of an input process (e.g. a measurement process).

Our method synthesizes realizations of the signal and measurement processes into a primary filter for estimating the signal process and, if required, an ancillary filter for providing the primary filter's estimation error statistics. The primary and ancillary filters each consist of a recurrent neural network (RNN) and range extenders and/or reducers. Each implementation results in a filtering apparatus, called a neural filter.

Five types of range extender by estimate addition and three types of range reducer by estimate subtraction are provided. These types have different levels of effectiveness and different levels of computational cost. The selection of range extenders and reducers for a neural filter is governed by the trade-off between effectiveness and computational cost.

Formulas for training a recurrent neural network together with selected range extenders and/or reducers are disclosed in the form of pseudo computer programs. In accordance with the teachings of the present invention, synthesizing realizations of signal and measurement processes into a neural filter (a primary or an ancillary filter), is performed through training at least one neural system, consisting of an RNN and its range extenders and/or reducers, and selecting such a neural system as the neural filter in consideration of the filtering accuracy, the RNN size, and the computational cost of each range extender and reducer so as to optimize the cost-effectiveness of the neural filter.

If the signal and measurement processes are time-variant, a modified method and apparatus is provided. The idea is to include a vector-valued time function describing the time-variant property as extra inputs to a neural filter with augmented input terminals so as to reduce the number of neurons and the number of connections required of the neural filter to achieve a desired level of filtering accuracy.

If a neural filter under design is to operate in an interactive environment, its interaction with the environment should be taken into account in the synthesizing of the neural filter. Training formulas for such synthesis are also disclosed in the form of pseudo computer programs.

DESCRIPTION OF THE DRAWINGS

FIG. 29 is a table showing the replacements of terminologies required to convert the block diagrams in FIG. 5, and FIGS. 10–17, and FIGS. 23–28 into corresponding block diagrams concerning a primary filter with augmented input terminals and/or an ancillary filter with augmented input terminals.

DESCRIPTION OF THE INVENTION

Figure 1:
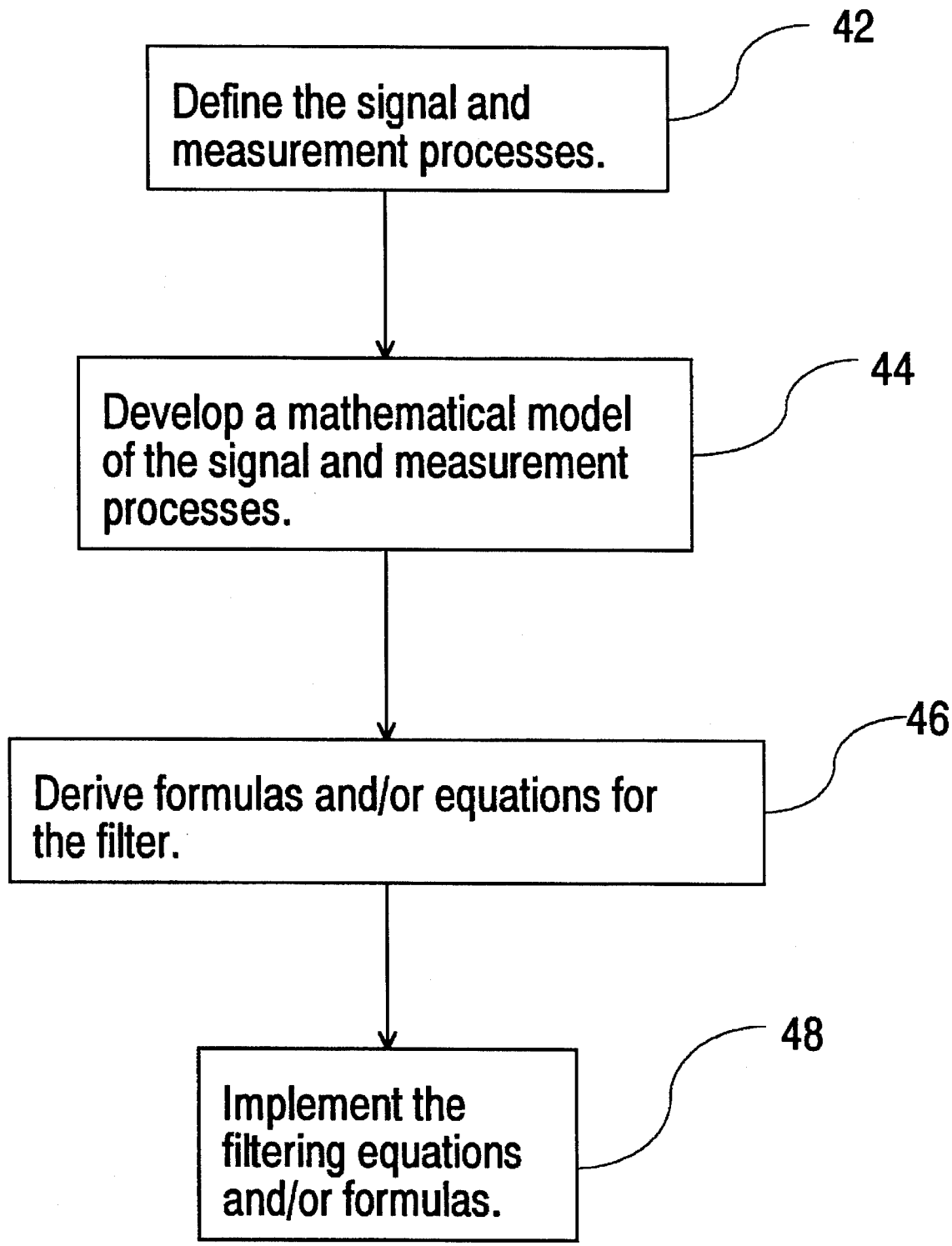
FIG. 1 is a block diagram showing the major steps taken in using the conventional method of designing and making a filter.

Referring to FIG. 1, a block diagram of the conventional method of designing and making a filter is shown. The conventional method consists essentially of four steps. First step 42, the filtering requirements are examined and the signal and measurement processes are defined. Second step 44, a mathematical model of the signal and measurement processes is developed. In this process of modeling, the assumptions such as the Markov property, Gaussian distribution, and additive noise are made to make the model mathematically tractable. The most widely used type of model is (1) and (2). Third step 46, analytic methods and techniques are used to derive formulas and/or equations to characterize the estimate of the signal process and its error statistics. If the formulas and/or equations are not in an implementable form, they are simplified by approximation. The most widely used approximate filter resulting from this analytic approach is the extended Kalman filter.

In the last step 48, the simplified filter formulas and/or equations are implemented by programming a computing device or making a special circuit for the filter. As discussed earlier, this analytic method has many shortcomings. Briefly, it needs a mathematical/statistical model, which is sometimes difficult or even impossible to get; it makes many assumptions, which may be invalid; it derives formulas/ equations, which, more often than not, have to be simplified by rough approximations in order to be implemented; and finally, the analytic method produces filters, which are inaccurate relative to the optimal and require excessive computing time for high-dimensional nonlinear problems.

Figure 2:
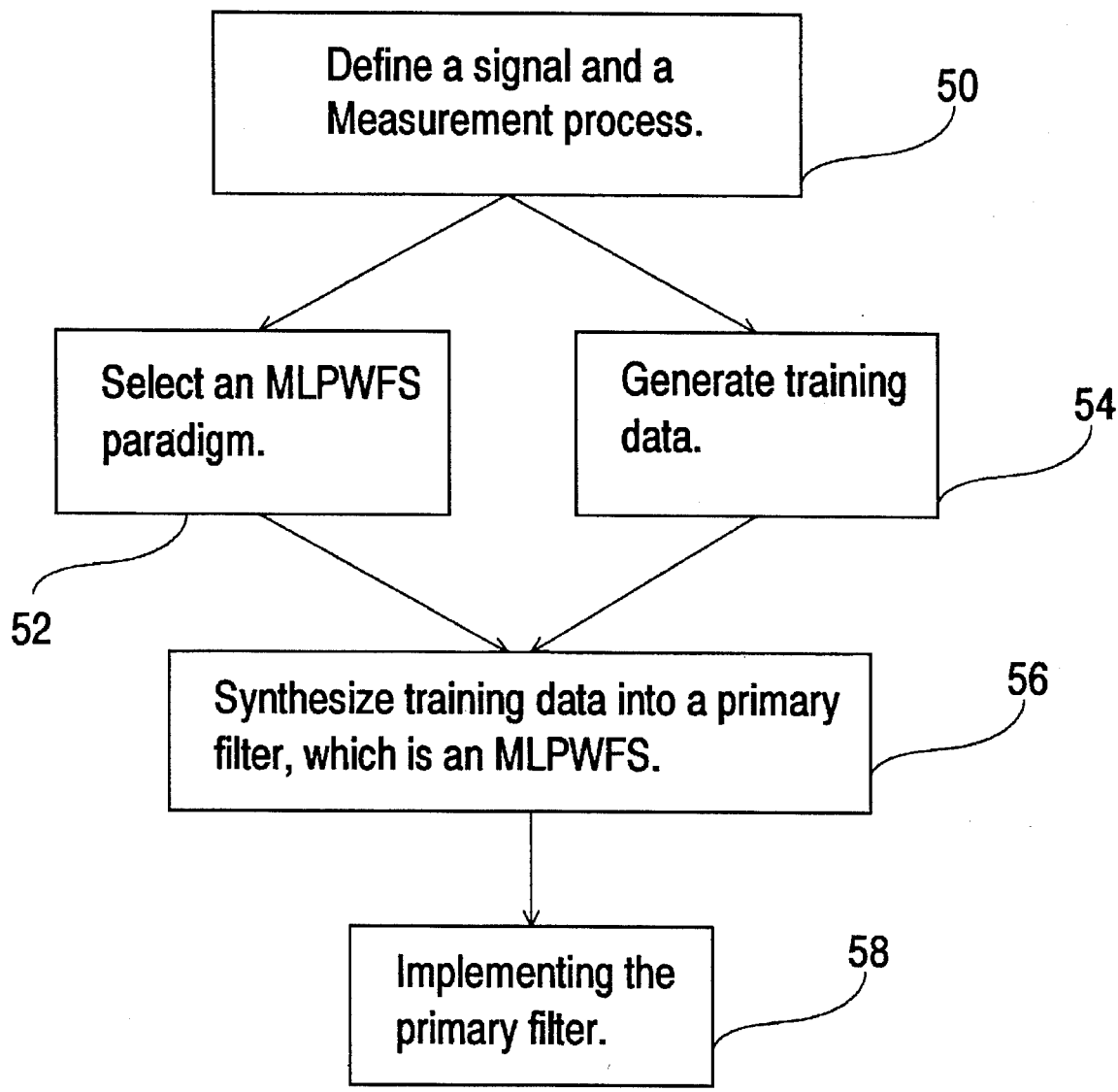
FIG. 2 is a block diagram showing the major steps taken in using the synthetic method of designing and making a neural filter consisting of a recurrent neural network alone.

Referring to FIG. 2, a block diagram for a neural network approach to designing and making a filter is shown. The approach emerged recently in the open literature in J. P. DeCruyenaere and H. M. Hafez, "A Comparison Between Kalman Filters and Recurrent Neural Networks," *Proceedings of the* 1992 *International Joint Conference on Neural Networks*, pp. IV-247–251 (1992); J. T.-H. Lo, "Neural Network Approach to Optimal Filtering," invited paper presented at the First World Congress of Nonlinear Analysts, Tampa, Fla. (1992); J. T.-H. Lo, "Optimal Filtering by Recurrent Neural Networks," *Proceedings of the Thirtieth Annual Allerton Conference on Communication, Control and Computing*, pp. 903–912 (1992); J. T.-H. Lo, "Synthetic Approach to Optimal Filtering," *Proceedings of the* 1992 *International Simulation Technology Conference and* 1992 *Workshop on Neural Networks*, pp. 475–481 (1992). The neural network approach consists essentially of five steps. In the first step 50, the signal and measurement processes are defined. In the second step 52, an MLPWFS (multilayer perceptron with a feedback structure) paradigm is selected. More specifically, we select a neural network paradigm from the group consisting of multilayer perceptrons with output feedbacks (MLPWOFs) and multilayer perceptron with interconnected neurons (MLPWINs). Detailed specifications of MLPWOF paradigms and MLPWIN paradigms will be given in the sequel.

In the third step 54, training data, which consists of realizations of the signal and measurement processes, are generated. If a mathematical/statistical model of the signal and measurement processes is available, training data are easily generated by computer simulation. Otherwise, actual experiments with the signal and measurement processes are performed to collect the training data. The second and third steps, 52 and 54, can be done in any order or in parallel.

In the fourth step 56, the training data are synthesized into a filter by training, with respect to the mean square error criterion, at least one MLPWFS of the selected MLPWFS paradigm using the training data, and then selecting one MLPWFS in consideration of the MLPWFS size versus the estimation accuracy to maximize cost-effectiveness.

In the fifth and last step 58, the MLPWFS obtained in the fourth step is implemented by programming a computer or microprocessor, programming an analog or digital device, downloading the weights and/or parameters and initial dynamic state of the MLPWFS into a neural network chip, making a special circuit or device, or construct an optical or electro-optical apparatus. The implemented filter processes the measurement process to estimate the signal process and is called a primary filter.

Figure 3:
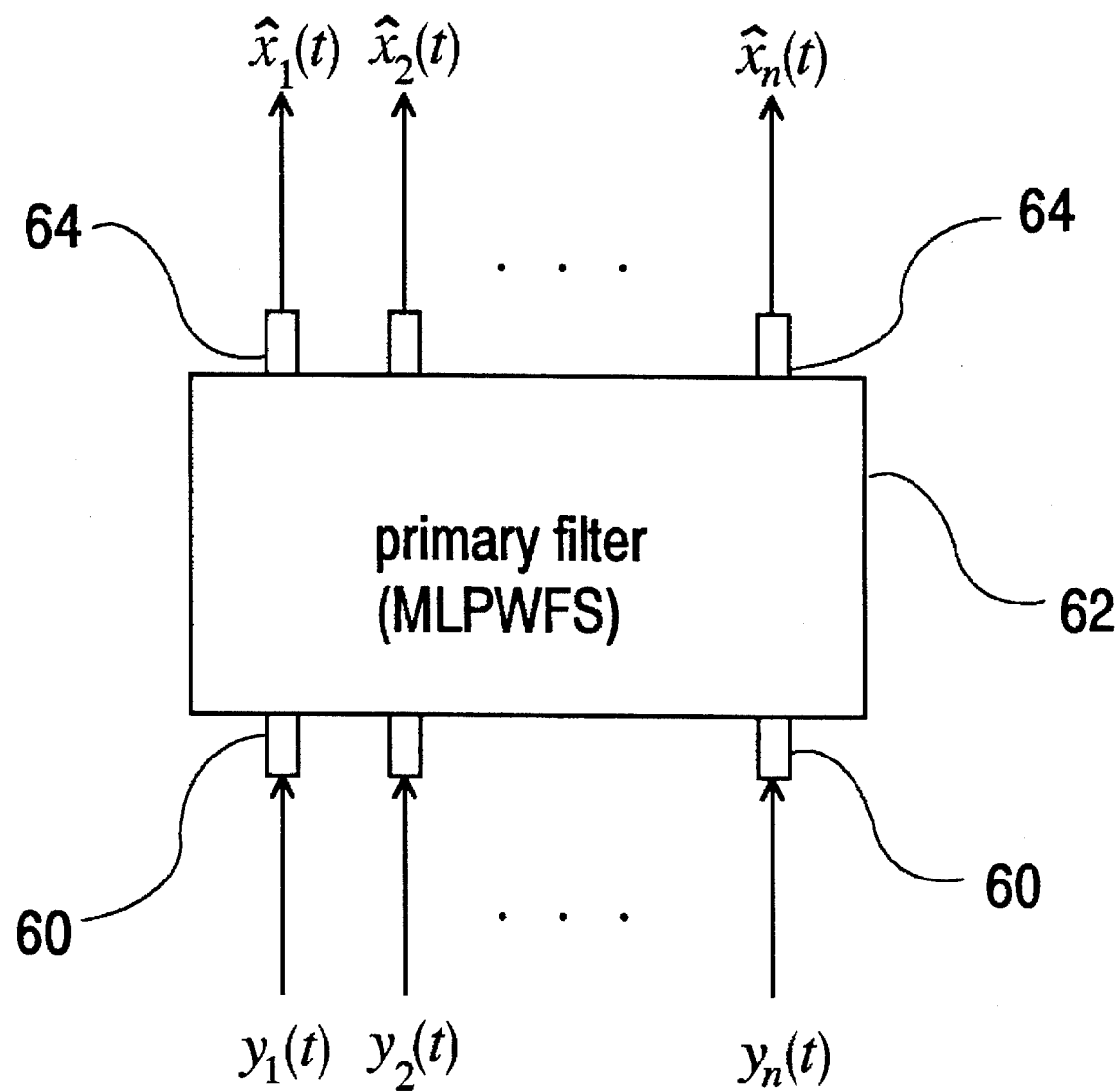
FIG. 3 shows a primary filter, that is just a multilayer perceptron with a feedback structure, receiving the measurement vector $(y_1(t), y_2(t), \ldots, y_m(t))$ at the input terminals of the filter and sending out the estimate $(\hat{x}_1(t), \hat{x}_2(t), \ldots, \hat{x}_n(t))$ of the signal vector $(x_1(t), x_2(t), \ldots, x_n(t))$ at the output terminals of the filter at time t.

After implementation, the primary filter can be viewed as a box 62 with input and output terminals as shown in FIG. 3. It receives the measurement vector $(y_1(t), y_2(t), \ldots, y_m(t))$ at the input terminals 60 and sends out the estimate $(\hat{x}_1(t), \hat{x}_2(t), \ldots, \hat{x}_n(t))$ of the signal vector $(x_1(t), x_2(t), \ldots, x_n(t))$ at the output terminals 64 at the discrete-time $t=1,2,\ldots$. The primary filter is also called a neural filter.

A proof was given in J. T.-H. Lo, "Optimal Filtering by Recurrent Neural Networks," *Proceedings of the Thirtieth Annual Allerton Conference on Communication, Control and Computing* (1992) and J. T.-H. Lo, "Synthetic Approach to Optimal Filtering," *Proceedings of the 1992 International Simulation Technology Conference and 1992 Workshop on Neural Networks*, pp. 475–481 (1992) that if a primary filter is made out of either an MLPWIN with a single hidden layer of enough neurons or an MLPWOF with enough free feedbacks and a single hidden layer of enough neurons, the filter can generate an estimate $\hat{x}(t)$ of the signal $x(t)$, that approximates the minimum variance (or minimum mean square error) estimate of $x(t)$ to any degree of accuracy over an arbitrary finite time interval. Here the MLPWOF is fully-forward-connected and the MLPWIN is both fully-forward-connected and fully-laterally-interconnected (i.e. with neurons in each hidden layer fully interconnected). The activation function used in the MLPWIN or MLPWOF is a bounded and nondecreasing function which is not a constant. The foregoing approximation accuracy is measured by the mean square error, $$(1/T) \sum_{t=1}^{T} E[\| E[x(t)|y(\tau), \tau=1,2,\ldots,t] - \hat{x}(t) \|^2],$$

where the conditional expectation $E[x(t)|y(\tau), \tau=1, 2, \ldots, t]$ of the signal $x(t)$ given the measurements $y(\tau), \tau=1, 2, \ldots, t$ is known to be the minimum variance estimate, and $\hat{x}(t)$ is the output vector of the filter and $\|\cdot\|$ denotes the Euclidean norm. The aforementioned proof was done under the assumption that the signal process $x(t)$ has finite second moments (i.e. $E[\|x(t)\|^2]<\infty$, $t=1,2,\ldots,T$) and the range of the values of the measurement process is bounded (i.e. $\|y(t)\|<B$, $t=1,2,\ldots,T$, for some finite positive number B).

Since in the real world, a signal process must have finite energy and all measurable quantities can be contained in a bounded region sufficiently large, this assumption is always satisfied in a real-world application. However, if the signal and/or measurement processes have ranges that are large or grow in time, a large MLPWFS (i.e. MLPWIN or MLPWOF) and a large training data set are required to synthesize a primary filter that will have a sufficient valid range to cover the range of the signals and/or a sufficient valid domain to cover the range of the measurements. This requirement can make the training and synthesizing extremely difficult. Moreover, if the signal and/or measurement processes keep growing in time, an MLPWFS, that is trained on a training data set consisting of realizations of the signal and/or measurement processes over a finite time interval, will have difficulty to generalize beyond the finite time interval, imposing severe limitation on the MLPWFS as a filter.

In accordance with the present invention, effective methods and apparatuses are provided for processing a discrete-time measurement process to estimate a discrete-time signal process, even when the ranges of the signal and/or measurement processes are large or keep growing in time. Some terminologies used herein are now defined: A noun in its plural form is sometimes used to encompass both the singular and plural forms of the same noun for brevity. A vector is an n-tuple of real numbers, where n is a positive integer. A scalar is a one dimensional vector. A vector-valued variable is a single-dimensional or a multiple-dimensional variable. A process is an ordered sequence of vector-valued variables with the same dimension. The sequence index is called time and denoted by t and takes on nonnegative integer values $1, 2, \ldots, T$, where T is a finite positive integer or infinity. There may or may not be a mathematical/statistical model for the process, which governs the evolution of the process. There may or may not be any knowledge about the relationship among the components of each vector-valued variable of the process or among the vector-valued variables at different times. If two processes denoted by $x(t)$ and $y(t)$, for $t=1, 2, \ldots, T$, respectively, are related by a known and fixed function f such that $y(t)=f(x(t))$ for $t=1, 2, \ldots, T$, then the function f is called a static transformer of the x process. If $y(t)$ at a current time t depends not only on $x(t)$ but also on at least one preceding value, say $x(t-1)$, of the x process, and/or on the current and/or preceding value(s) of another process, then the mapping, transversal or recursive, that effects this transformation from the x process to the y process is called a dynamic transformer of the a: process. If the vector-valued variable of a process at each time t is a vector-valued random variable, the process is called a stochastic process. The collection of all the stochastic processes, whose values at each time are what we want to estimate, is called a signal process. The vector value of a signal process at time t is called the signal or signal vector at time t. A mathematical/statistical model for an example signal process is (1). The collection of all the stochastic processes whose values at each time need to be estimated to provide required estimation error statistics for an estimation of a signal process is called an ancillary signal process. The collection of all the processes whose values at each time are the measurements available to and selected by us for the estimation of a signal process is called a measurement process. The vector value of a measurement process at time t is called the measurements or measurement vector at time t. The measurements at a time are usually the sensor outputs at that time. A mathematical/statistical model for a measurement process is (2). The measurement process may or may not contain random noises, but must contain information about the signal process. A signal vector and a measurement vector can be either single-dimensional or multiple-dimensional. A filter is a dynamic system, with a dynamic state, that inputs the measurement vectors one at a time in the order that they appear in the measurement process and then outputs, at each corresponding time, an estimate (or estimate vector) of the vector-valued random variable of a signal process or an ancillary signal process. A filter is usually assumed to be a causal dynamic system and the estimate produced by the filter at each time $t_1$ is a function of all the measurement vectors that have been received by the filter up to and including time $t_1$. The word "filter" is used to refer to either a mathematical description or its implementation of the dynamic system, depending on the context. The filters for estimating the signal process and the ancillary signal process are called a primary filter and an ancillary filter respectively. These filters are digital filters. A realization of a signal process and the corresponding realization of a measurement process are, respectively, a sequence of the consecutive vector values of the signal process and a sequence of the corresponding consecutive vector values of the measurement process, that are recorded jointly at the same time in an actual experiment or a computer simulation. A neuron or node is a processing element that receives input numbers and produces an output number, which is called the activation level of the neuron or node. There are many types of neuron. Neurons of some types are each specified in part by a certain number of constants, which affect the signal processing that a neuron with these constants performs. These constants are called the parameters of the neuron. A delayless connection is means for effecting a weighted signal transfer from one neuron to another neuron. More specifically, a delayless connection is means for multiplying the activation level of a neuron by a number, which is called the weight of the delayless connection, and sending the resulting product to another neuron as one of this neuron's input numbers. A weight of a delayless connection is sometimes called a delayless weight. A delay connection is means for multiplying a first neuron's activation level by a number, which is called the weight of the delay connection, holding the resulting product for at least one unit of time, and then sending this product to a second neuron as one of this second neuron's input values. The second neuron may or may not be the same as the first. A weight of a delay connection is sometimes called a delay weight. By a connection and a weight, we will mean hereinafter a delayless or delay connection and weight, respectively, unless indicated or implied otherwise. Some weights of connections (delayless and/or delay connections) may be set equal to one or some other constant(s), while others are determined in a process or procedure called training to be elaborated on later. A neural network is a plurality of neurons and a plurality of connections (delay and/or delayless connections), which include some neurons receiving input signals from outside the neural network, which neurons are called input nodes and some neurons sending out output signals to outside the neural network, which neurons are called output nodes. An input node and an output node are sometimes called an exogenous input node and an outward output node, respectively. Those neurons that are neither input nodes nor output nodes are called hidden neurons of the neural network. There may be one or more different types of neuron in a neural network. For instance, an input node may only serve to distribute its single input signal through connections to some other neurons and an output node may only serve to evaluate the sum of its input signals, which arrive through connections from other neurons. A neural network is called a recurrent neural network (RNN), if the neural network includes one or more delay connections. An RNN is a discrete-time dynamic system with all the activation levels of the RNN, that are held by delay connections, as its dynamic state. The collection of all the RNNs with some common configurational feature(s) is called an RNN paradigm. For instance, the existence of a neuron layer and nonexistence of a connection among the neurons in a neuron layer form a configurational feature. The collection of all the RNNs of the same RNN paradigm that have the same number of the neurons of each type, the same number of delay connections, the same number of delayless connections, the same number of input nodes, the same number of output nodes, and the same configuration thereof is called an RNN architecture. In other words, two RNNs are of the same architecture if and only if they are identical except with different weights on the connections and/or different parameters in the neurons. Whenever these weights, and parameters, if there are any, are specified for an RNN architecture, the RNN is completely specified. To simplify our terminology, the totality of these weights, and parameters, if there are any, of an RNN are called the weights of the RNN, unless a distinction between the weights on the connections and the parameters in the neurons is necessary and made clear in the context. A range extender is a dynamic transformer of the output process of at least one output node of an RNN, which dynamic transformer extends and/or transforms dynamically the output range of said at least one output node. A range reducer is a dynamic transformer of at least one component process of an input process to a filter, which dynamic transformer reduces and/or transforms dynamically the range of said at least one component process. Therefore, a range extender and reducer are a postprocessor and preprocessor of the RNN respectively. A range extender or a range reducer is also called a range transformer. Many types each of range extender and reducer will be disclosed in the sequel. Some of the types have coefficients (or parameters) and initialization values to be determined. A neural system is defined to be a system comprising an RNN and at least one range transformer, which function cooperatively. However, to simplify our discussion, a neural system consisting of an RNN and at least one range transformer is often considered herein. It will be appreciated that generalization of our discussion to a general neural system is straightforward. Two neural systems each consisting of an RNN and at least one range transformer are said to be of the same architecture, if their RNNs are of the same architecture and they have the same types of range extender and/or reducer each concatenated to the same output nodes and input nodes, respectively, of their RNNs. In general, two neural systems are of the same architecture, if and only if they are identical except with possible different weights (i.e. weights and/or parameters) and/or initial dynamic state in their RNNs and/or different coefficients and initialization values in their corresponding range transformers (i.e. range extenders and/or reducers). The weights in the RNN and any coefficients and initialization values in the range extenders and/or reducers in a neural system are called weights of the neural system (NS) for brevity. While some weights of an NS (neural system) are equal to given constants, the other weights are to be determined by "training the neural system," which is defined in the sequel. The former weights are called fixed weights and the latter weights are called adjustable weights of the NS. Those weights of the RNN in an NS, that are adjustable weights of the NS, are called adjustable weights of the RNN. A neural filter is either a primary or an ancillary filter that is a neural system. A neural system that is used as an ancillary filter is called an ancillary neural system. Range extenders and reducers that are used in an ancillary neural system are called ancillary range extenders and ancillary range reducers respectively. When it is necessary to distinguish an RNN, an RNN paradigm, or an RNN architecture, that is associated with an ancillary filter, from that associated with a primary filter, we use the modifier, "ancillary," to specify the former. Hence, an ancillary RNN, an ancillary RNN paradigm, an ancillary RNN architecture, and ancillary training data refer to an RNN, an RNN paradigm, an RNN architecture, and training data, respectively, of an ancillary filter. An ancillary range extender or an ancillary range reducer is also called an ancillary range transformer. Many other terminologies will be defined as needs arise in the sequel.

Figure 4:
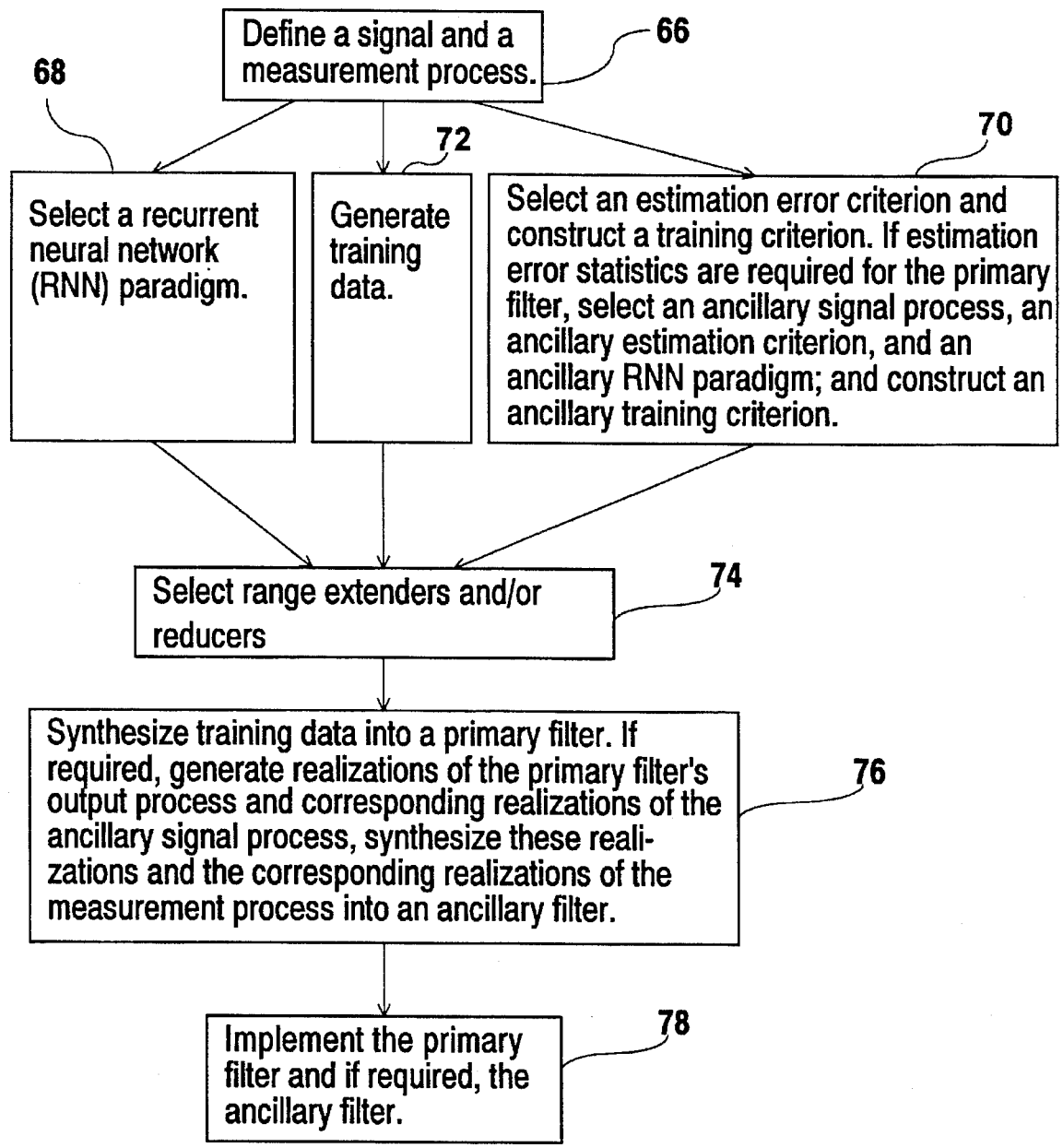
FIG. 4 is a block diagram showing the major steps taken in using the synthetic method of designing and making a neural filter consisting of a recurrent neural network and selected range extenders and/or reducers.

The method of designing and making a filter according to the present invention comprises seven steps as shown in FIG. 4.

In the first step 66, the signal and measurement processes are defined. Usually, the measurement vector at a time point consists of the measurements available at the time point. The signal vector should consist of the quantities that are to be estimated. The measurement vectors and signal vectors at times $t=1, 2, \ldots, T$ form the measurement process and the signal process, respectively.

In the second step 68 and the third step 70, a recurrent neural network paradigm and an estimation error criterion are selected respectively. There are a large number of recurrent neural network paradigms and many estimation error criteria to choose from, which will be described in the sequel. If estimation error statistics are required, an ancillary signal process is defined in consideration of the estimation error criterion. For estimating the ancillary signal process and thereby generating the estimation error statistics, an ancillary estimation error criterion and an ancillary RNN paradigm are also selected in the third step 70.

In the fourth step 72, training data, which comprises of realizations of the signal and measurement processes, are generated. If a mathematical model of the signal and measurement processes are available, the training data are easily generated by computer simulation. Otherwise, actual experiments with the signal and measurement processes are performed to collect the training data. The second, third and fourth steps 68, 70, 72 can be done in any order or in parallel.

In the fifth step 74, the realizations of the signal and measurement processes in the training data are examined and the physical meanings of the same processes are considered so as to decide which components of the signal process need to be assigned range extenders and which components of the measurement process need to be assigned range reducers. A range extender or reducer is then selected for each such assignment from among the types of range extender and reducer to be disclosed in detail in the sequel.

If an ancillary filter is required, the realizations of its input and desired output processes are examined and the physical meaning of the same processes are considered. Then range extenders and reducers are assigned and selected in exactly the same way as for a primary filter.

In the sixth step 76, the training data are synthesized into a primary filter by training each of a collection of neural systems, using the training data and then selecting one NS (neural system) in consideration of the NS size versus the estimation accuracy to maximize the cost-effectiveness for the filtering application. A collection of recurrent neural networks is defined to be a group of at least one recurrent neural network. By the phrase, "training an NS," we mean "determining the adjustable weights and if required, RNN initial dynamic state of a neural system substantially through a process of reducing the value of a training criterion by the variation of the adjustable weights and if required, the RNN initial dynamic state so as to optimize the filtering performance of the neural system." Here the training criterion is a function of the adjustable weights of the NS and if required, the RNN initial dynamic state, which function is constructed, on the basis of a selected estimation error criterion, with training data generated in the fourth step 72. If some estimation error statistics are required, realizations of the primary filter's output process and corresponding realizations of the ancillary signal process are generated. These realizations together with their corresponding realizations of the measurement process are then synthesized into an ancillary filter by training at least one RNN of the selected ancillary RNN paradigm, together with the selected ancillary range transformers using the realizations, and then selecting one NS in consideration of the NS size versus the estimation accuracy to maximize the cost-effectiveness for the application. A large number of unconstrained optimization methods are available. These optimization methods, some of which take advantage of the rich structures of the RNN, will be discussed later on.

In the seventh and last step 78, one or two neural systems obtained in the fifth step 76 are implemented by programming a computer or a microprocessor, programming an analog or digital device, downloading the weights and initial dynamic state of the RNN into a neural network chip, making a special circuit or device, and/or construct an optical or electro-optical apparatus.

It will be appreciated that any of the above seven steps may be repeated if necessary. It will also be appreciated that two or more of the six steps may be performed jointly and/or at the same time. For instance, if a general-purpose computer is used in the sixth step 76 of synthesizing training data into a primary filter, the resulting primary filter has already been programmed into the general-purpose computer and thus the sixth and the seventh steps have been carried out jointly at the same time.

Figure 5:
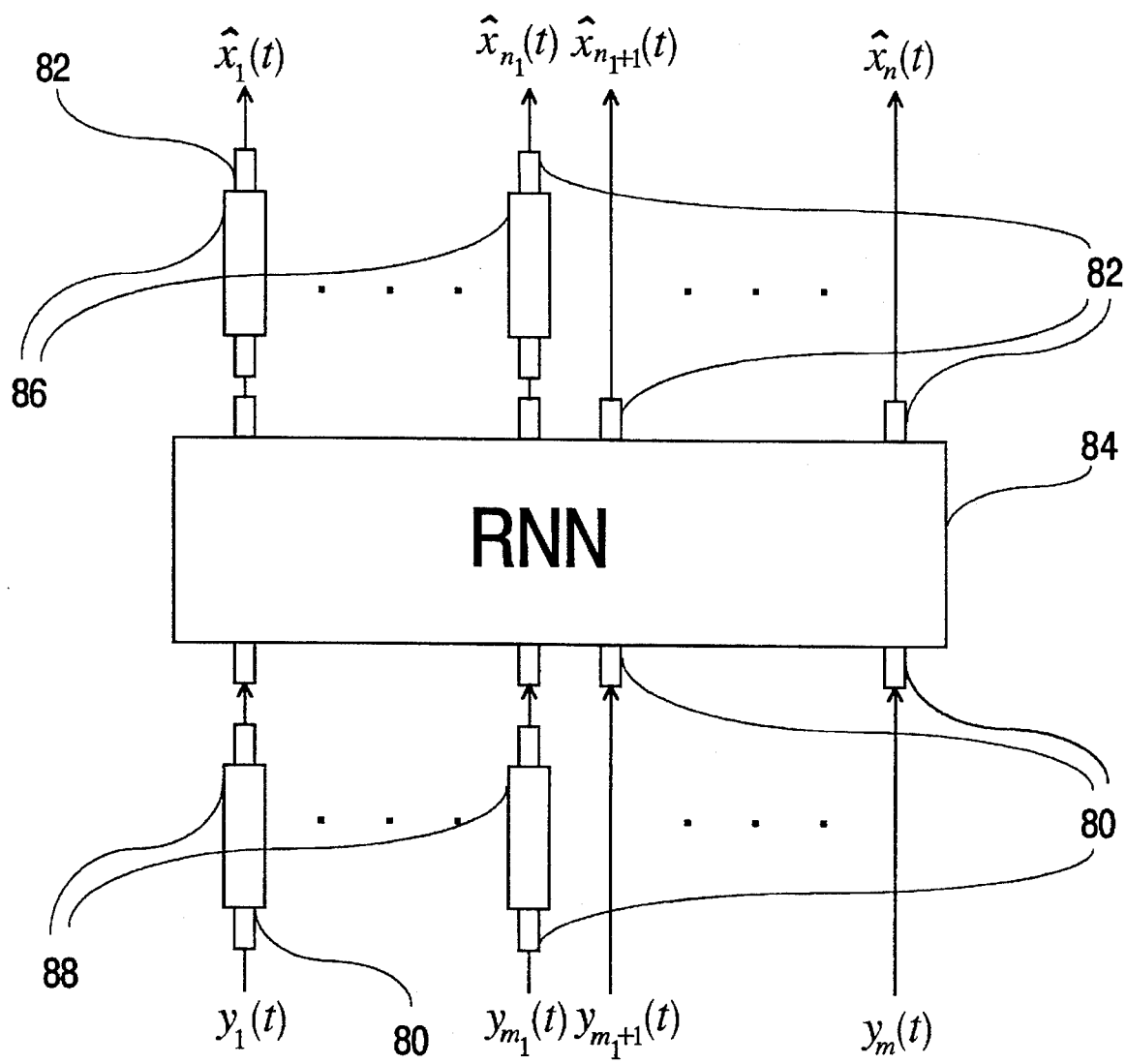
FIG. 5 is a primary filter consisting of a recurrent neural network and range extenders and reducers, receiving the measurement vector $(y_1(t), y_2(t), \ldots, y_m(t))$ at the input terminals of the filter and sending out the estimate $(\hat{x}_1(t), \hat{x}_2(t), \ldots, \hat{x}_n(t))$ of the signal vector $(x_1(t), x_2(t), \ldots, x_n(t))$ at the output terminals of the filter at time t.

After implementation, the primary filter with input and output terminals, 80 and 82, is shown by the schematic diagram in FIG. 5. It receives the measurement vector $(y_1(t), y_2(t), \ldots, y_m(t))$ at the input terminals 80 and sends out the estimate $(\hat{x}_1(t), \hat{x}_2(t), \ldots, \hat{x}_n(t))$ of the signal vector $(x_1(t), x_2(t), \ldots, x_n(t))$ at the output terminals 82 at the discrete-time $t=1, 2, \ldots$ . It is assumed here (without loss of generality) that there are, in the primary filter, $m_1$ range reducers 88 to transform the ranges of the first $m_1$ measurements and $n_1$ range extenders 86 to transform the ranges of the first $n_1$ outputs 90 of the RNN 84. The ancillary filter, after implementation, has the same schematic diagram except that the input and output variables have to be changed. The primary filter and the ancillary filter are sometimes each referred to as a neural filter.

In the following, we will first introduce recurrent neural networks. We will then disclose some types of range extender and reducer to illustrate the purposes and functions of a range extender and reducer. Those skilled in the art will recognize that other types of range extender and reducer are possible with similar purposes and similar functions, following the teachings of the present invention.

After introducing recurrent neural networks and disclosing some range extenders and reducers, we will embark on explaining in detail the seven steps in FIG. 4.

Recurrent Neural Networks Used to Construct Neural Filters

A neural filter in accordance with the present invention includes a recurrent neural network (RNN) and at least one selected range transformer. Some RNN paradigms are described in the following.

Figure 6:
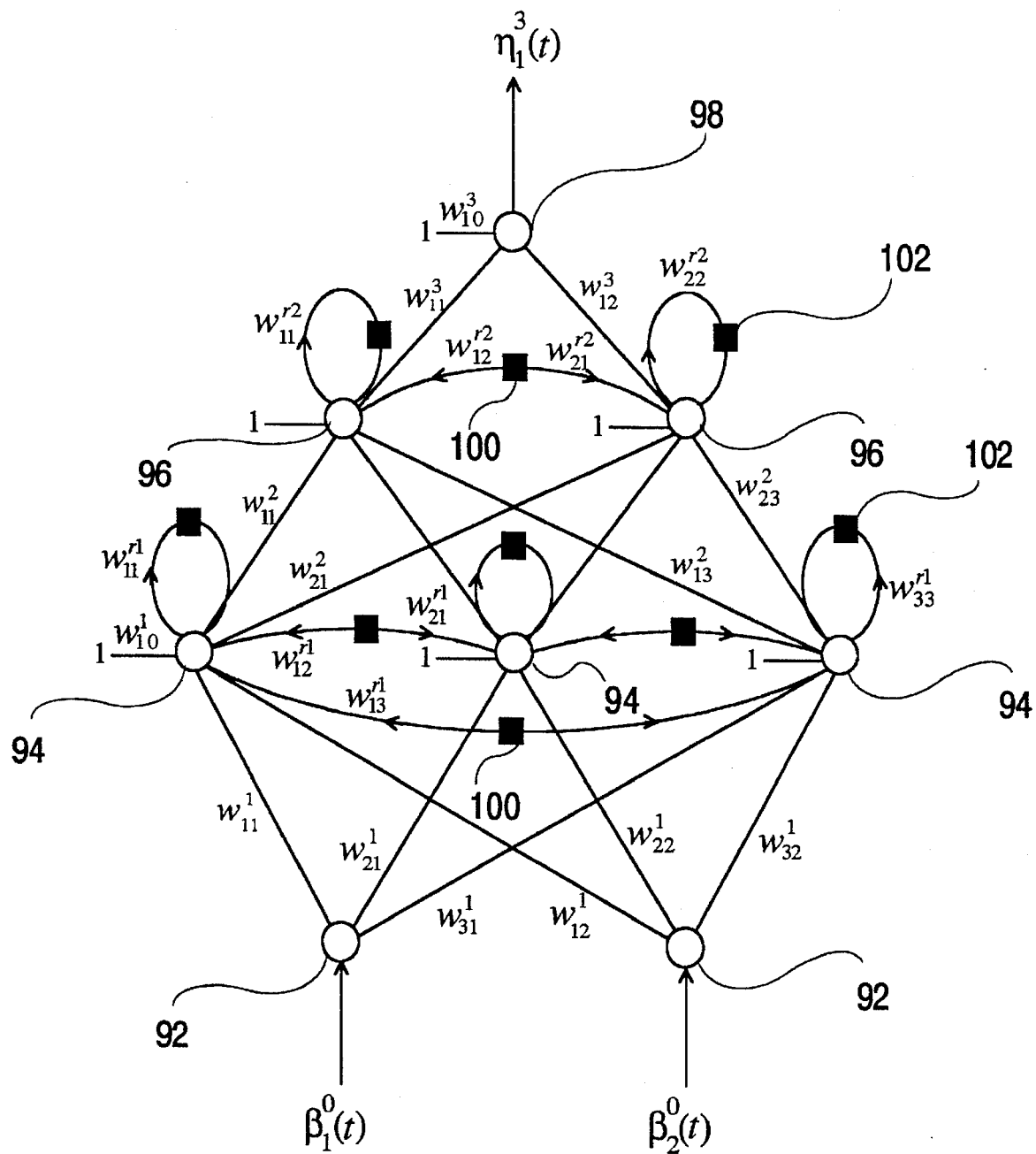
FIG. 6 is a schematic diagram of a typical multilayer perceptron with interconnected neurons (MLPWIN).

1. Multilayer perceptrons with interconnected neurons (MLPWIN): An MLPWIN is formed from a multilayer perceptron (MLP) by connecting some or all of the neurons in at least one layer of the MLP. There is a unit time delay device on each such connection, making it a delay connection. Such RNNs first appeared in J. L. Elman, "Finding Structures in Time," Cognitive Science, Vol. 14, pp. 179–211 (1990). A typical MLPWIN is depicted in FIG. 6. It has 2 input nodes 92, 1 output node 98, and 2 layers 94, 96 of hidden neurons. The first layer has 3 neurons 94 and the second layer has 2 neurons 96. The input and output nodes are regarded as the nodes in layer 0 and layer 3 respectively and the neurons in layers 1 and 2 are regarded as nodes in their respective layers. The nodes 92 in layer 0 simply distribute the inputs to the MLPWIN to the nodes in layer 1 and the node 98 in layer 3 evaluates the weighted sum of the activation levels of the neurons 96 in layer 2. The nodes 92 in layer 0 receive inputs from outside the MLPWIN and the node 98 in layer 3 sends out outputs to outside the MLPWIN. Since the nodes in layers 1 and 2 do not interact directly with outside the MLPWIN, they are called hidden nodes or neurons and their layers are called hidden layers.

Figure 7:
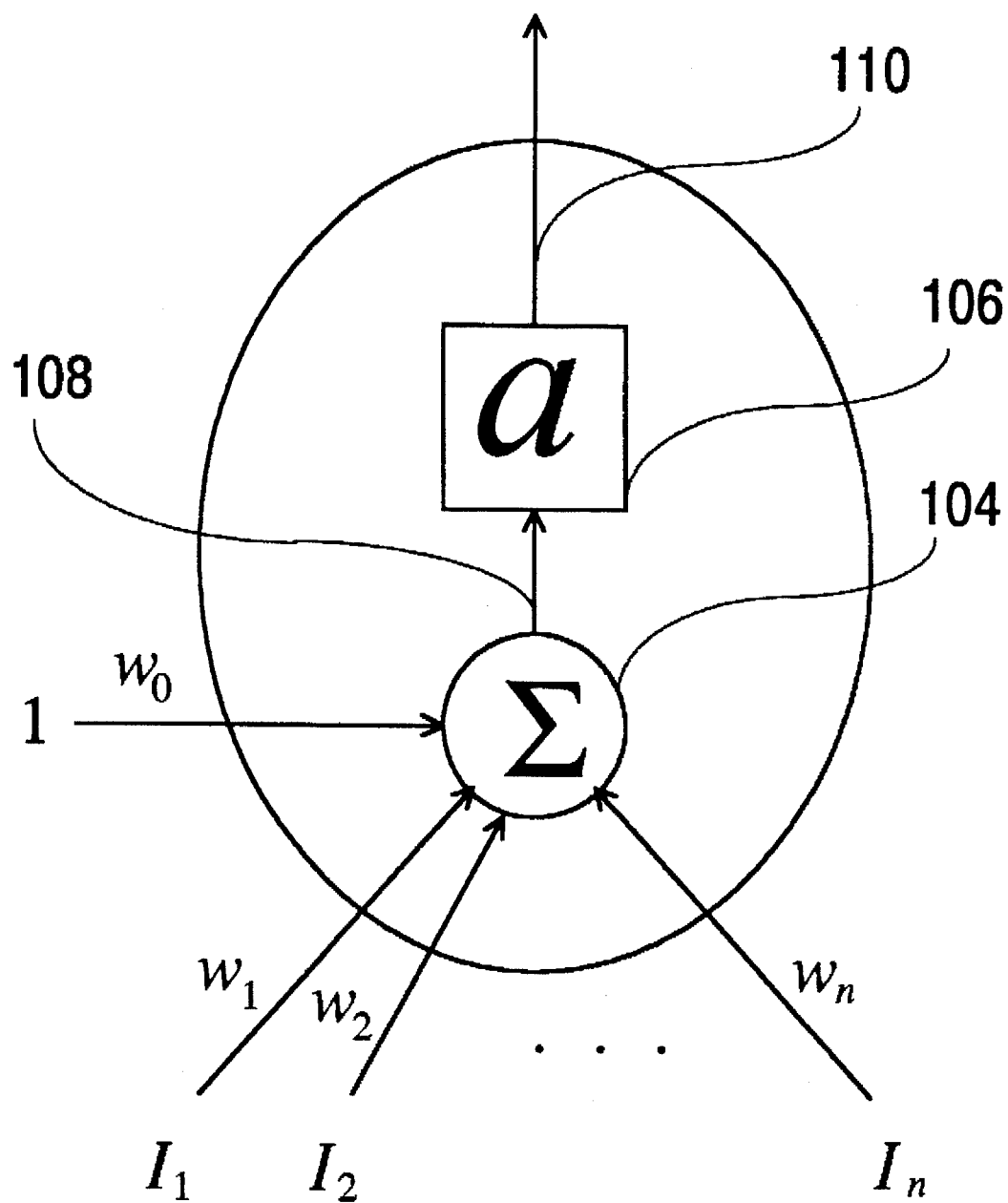
FIG. 7 is a schematic diagram of a neuron, which is used in an MLPWIN such as the one in FIG. 6 and in an MLPWOF such as the one in FIG. 8.

A typical neuron in layers 1 and 2 is depicted in FIG. 7. It consists of a summer 104 and an activation function 106 denoted by $\Sigma$ and a respectively. The activation function is a sigmoid function such as the hyperbolic tangent function $\tanh x$ and the logistic function $1/(1+e^{-x})$. The inputs to the typical neuron are denoted by $I_1, I_2, \ldots, I_n$, the weights on the connections leading into the neuron are denoted by $w_1, w_2, \ldots, w_n$, and the bias for the neuron is $w_0$. The weighted sum in the neuron at the link 108 is then equal to $$w_0 + \sum_{i=1}^{n} w_i I_i$$

and the activation level of the neuron at its output terminal 110 is $$a\left( w_0 + \sum_{i=1}^{n} w_i I_i \right).$$

An input node here can be viewed as a neuron that has only a single input and whose activation function is the identity function, $a(x)=x$. An output node here can be viewed as a neuron whose activation function is also the identity function. Therefore, the words, "neuron" and "node", are interchangeable.

The nodes in each layer are numbered from left to right here. The "numbering of a node" refers to this numbering in the node's layer. The symbol $w^l_{ij}$ denotes the weight on the delayless connection from node j in layer l-1 to node i in layer l. For notational simplicity, the bias for node i in layer l is denoted by $w^l_{i0}$, which is viewed as the "the weight on the delayless connection leading into node i in layer l from node 0 in layer l-1, the activation level of node 0 being set always equal to 1." The symbol $w^{rl}_{ij}$ denotes the weight on the delay connection from neuron j to neuron i in the same layer l. The two delay connections associated with $w^{rl}_{ij}$ and $w^{rl}_{ji}$ between neuron i and neuron j in layer l are indicated in FIG. 6 by the opposite arrow heads on the same line connecting the neurons. The solid square 100 between the opposite arrow heads denotes a unit time delay device that the activation levels of neuron i and j go through before they are fedback to neurons j and i respectively. The weight for self feedback of neuron i in layer l is denoted by $w^{rl}_{ii}$. The self-feedback is also delayed by one time unit by a unit time delay device 102 in the FIG. 6.

Let us now see how the MLPWIN depicted in FIG. 6 processes information at time t. Denoting input i to the MLPWIN at time t by $\beta_i^0(t)$, the activation level $\beta_i^l(t)$ of neuron i in layer l and the weighted sum $\eta_i^l(t)$ in the same neuron at time t satisfy, for l=1, 2, $$\beta_i^l(t) = a(\eta_i^l(t)) \qquad (3)$$

$$\eta_i^l(t) = w^l_{i0} + \sum_{j=1}^{n_{l-1}} w^l_{ij} \beta_j^{l-1}(t) + \sum_{j=1}^{n_l} w^{rl}_{ij} \beta_j^l(t-1), \qquad (4)$$

where $n_l$ denotes the number of nodes in layer l, a(x) is the activation function, and $\beta_i^l(0)$, for i=1,2, ... ,$n_l$ and l=1,2, form the initial dynamic state of the MLPWIN. The output $\eta_1^3(t)$ of the MLPWIN depicted in FIG. 6 is then determined by $$\eta_1^3(t) = w^3_{10} + \sum_{j=1}^{2} w^3_{1j} \beta_j^2(t). \qquad (5)$$

Depending on the application, there can be, in an MLPWIN, any number of input nodes, output nodes, layers, and neurons in each hidden layer. Although only the hyperbolic tangent function $\tanh x$ and the logistic function $1/(1+e^{-x})$ have been used as the activation functions in the MLPWINs in the literature, other functions such as any wavelet, spline, polynomial, rational, trigonometric and exponential function can also be used as the activation function in accordance with the present invention to make filters. Another activation function worth mentioning here is $x/(1+|x|)$, which was recently proposed in D. L. Elliott, "A Better Activation Function for Artificial Neural Networks," ISR Technical Report TR 93-8, Institute for Systems Research, University of Maryland, College Park, Md. (1993). It is noted that all the MLPWINs with one and the same activation function for hidden neurons form one MLPWIN paradigm. It will be appreciated that there may be more than one type of activation function in an MLPWIN paradigm and the activation function of an input node does not have to be an identity function.

2. Multilayer perceptrons with output feedbacks (MLPWOFs): An MLPWOF is formed from a multilayer perceptron (MLP) by connecting some or all of its last layer nodes (i.e. the output nodes of the MLP) to some of its zeroth layer nodes (i.e. the input nodes of the MLP). There is a unit time delay device on each such connection. The outputs of an MLPWOF are the processing results of the MLPWOF. They usually enter the training criterion directly and are forced to approach some target (or desired) outputs of the MLPWOF in training.

Those last layer nodes that are connected to some zeroth layer nodes (i.e. the input nodes of the MLP) are called feedback-sending nodes. If a feedback-sending node is also an output node, it is called an output-feedback-sending node. Otherwise, it is called a free-feedback-sending node. Similarly, a zeroth layer node is called an output-feedback-receiving node or a free-feedback-receiving node, depending on whether the zeroth layer node is connected to an output-feedback-sending or a free-feedback-sending node. Those zeroth layer nodes that receive inputs from outside the MLPWOF are called input nodes.

MLPWOFs first appeared in M. I. Jordan, "Attractor Dynamics and Parallelism in a Connectionist Sequential Machine," In *Proceedings of the Eighth Annual Conference of the Cognitive Science Society*, pp. 531–546, Erlbaum (1986). However, in all of the MLPWOFs' applications to system identification/control and signal processing, that can be found in the literature, the feedback-sending nodes of an MLPWOF include all of the output nodes.

Figure 8:
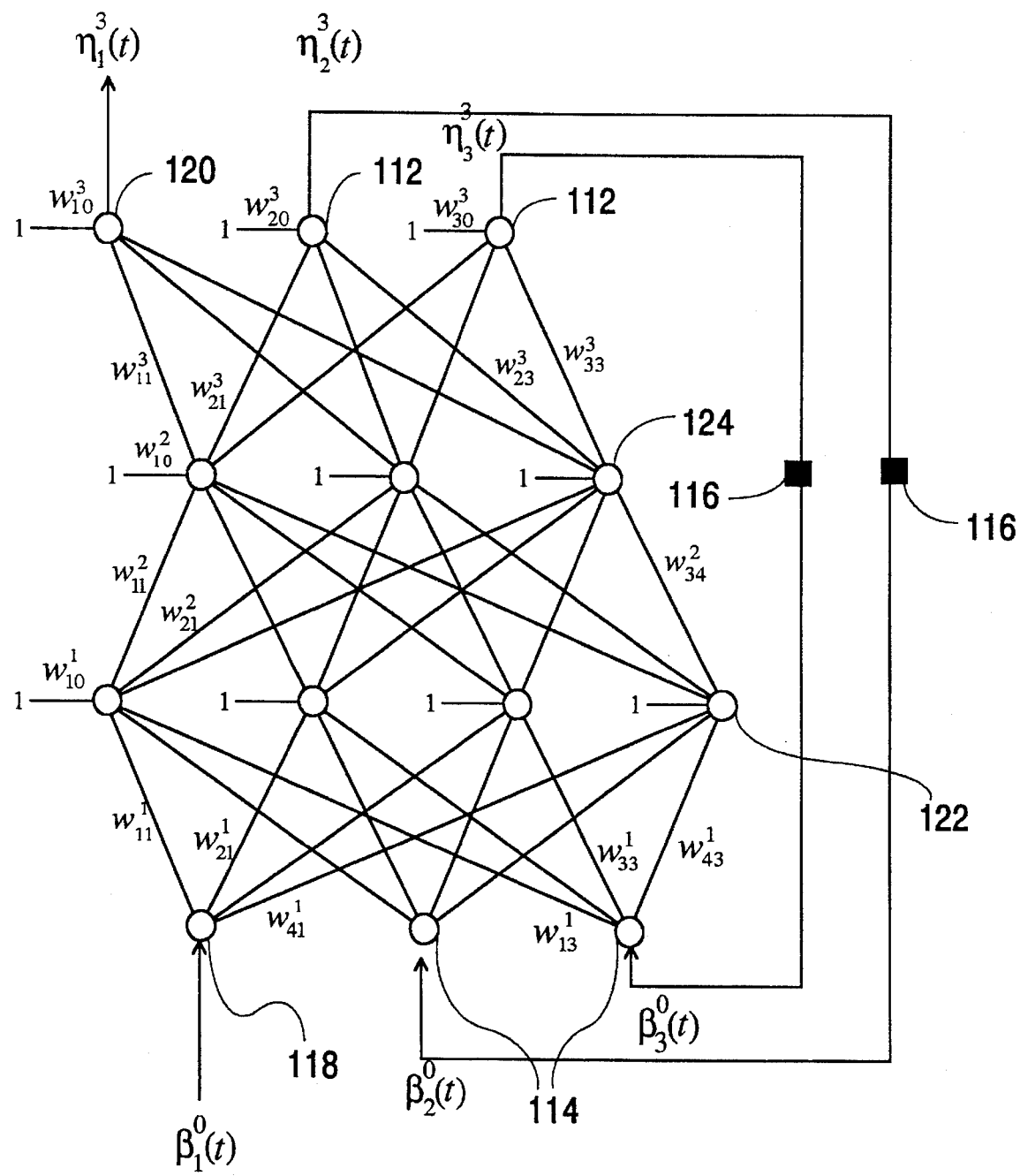
FIG. 8 is a schematic diagram of a typical multilayer perceptron with output feedbacks (MLPWOF).

Preferred MLPWOFs for filtering, in accordance with the teaching of this invention, have only free feedbacks. A typical MLPWOF with only free feedbacks is depicted in FIG. 8. The MLPWOF has 2 free-feedback-sending nodes 112 each connected to a free-feedback- receiving node 114 through a unit time delay device 116, which is indicated by a solid square as before. The free-feedback-sending nodes 112 shown in FIG. 8 are summers. However, free-feedback-sending nodes may also be nodes (or neurons) of another type or types. There is one input node 118 in the MLPWOF, which receives input data from outside the network, and one output node 120, which sends output data to outside the network.

The MLPWOF in FIG. 8 has 4 neurons 122 in the first layer of neurons and 3 neurons 124 in the second layer. The internal function of a neuron in layers 1 and 2 is shown in FIG. 7 and explained previously. In short, the weighted sum 108 in the neuron is $$w_0 + \sum_{i=1}^{n} w_i I_i$$

and the activation level 110 of the neuron is $$a\left(w_0 + \sum_{i=1}^{n} w_i I_i\right),$$

where the activation function a(x) is a sigmoid function such as the hyperbolic tangent function tanh x and the logistic function $1/(1+e^{-x})$.

The 3 nodes 114, 118 and 3 nodes 112, 120 are regarded as nodes in layer 0 and layer 3 respectively. The neurons in layers 1 and 2 are regarded as nodes in their respective layers. Since the nodes in layers 1 and 2 do not interact directly with outside the MLPWOF, they are called hidden nodes or neurons, and their layers are called hidden layers. The 3 nodes in layer 0 simply distribute the feedbacks to the nodes in layer 1. Each of the 3 nodes in layer 3 evaluates the weighted sum of the activation levels of the neurons in layer 2. All nodes in each layer are numbered from left to right. An input node here can be viewed as a neuron, that has only a single input and whose activation function is the identity function, a(x)=x. An output node here can be viewed as a neuron whose activation function is also the identity function. Therefore, the words, "neuron" and "node", are interchangeable.

The nodes in each layer are numbered from left to right here. The "numbering of a node" refers to this numbering in the node's layer. The symbol $w_{ij}^l$ denotes the weight on the delayless connection from node j in layer l-1 to node i in layer l. Only a few of the $w_{ij}^l$ are shown in FIG. 8 to avoid cluttering the figure. The bias for node i in layer l is denoted by $w_{i0}^l$, which is viewed as "the weight on the delayless connection leading into i in layer l from node 0 in layer l-1, whose activation level is set always equal to 1."

Let us now see how the MLPWOF depicted in FIG. 8 processes information at time t. Denoting input i at time t by $\beta_i^0(t)$, the activation level $\beta_i^l(t)$ of neuron i in layer l and the weighted sum $\eta_i^l(t)$ in the same neuron at time t satisfy, for l=1,2, $$\beta_i^l(t) = a(\eta_i^l(t)) \tag{6}$$

$$\eta_i^l(t) = w_{i0}^l + \sum_{j=1}^{n_{l-1}} w_{ij}^l \beta_j^{l-1}(t), \tag{7}$$

where $n_{l-1}$ denotes the number of nodes in layer l-1 and a(x) is the activation function. The output $\eta_i^3(t)$ at output terminal i is then determined by $$\eta_i^3(t) = w_{i0}^3 + \sum_{j=1}^{3} w_{ij}^3 \beta_j^2(t). \tag{8}$$

The feedbacks, $\eta_2^3(t)$ and $\eta_3^3(t)$, are fedback to the feedback-receiving terminals 114 after a unit time delay. Therefore the feedbacks at these terminal, $\beta_2^0(t)$ and $\beta_3^0(t)$, are equal to $\eta_2^3(t-1)$ and $\eta_3^3(t-1)$ respectively. The activation levels, $\eta_2^3(0)$ and $\eta_3^3(0)$, of the feedback-sending nodes 112 at time t=0 form the initial dynamic state of the MLPWOF.

Depending on the application, there can be, in an MLPWOF, any number of input nodes, output nodes, free feedbacks, output feedbacks, and layers, and any number of neurons in each hidden layer. Although only the hyperbolic tangent function tanh x and the logistic function $1/(1+e^{-x})$ have been used as the activation function in the MLPWOFs in the literature, other functions such as any wavelet, spline, polynomial, rational, trigonometric and exponential function can also be used as the activation function, in accordance with the present invention, to make the filters. It is noted that all the MLPWOFs with one and the same activation function for hidden neurons form one MLPWOF paradigm. It will be appreciated that there may be more than one type of activation function in an MLPWOF paradigm and the activation function of an input node does not have to be an identity function.

3. Recurrent Radial basis function networks (RRBFNs): Radial basis function networks (RBFNs) first appeared in J. T.-H. Lo, "Finite Dimensional Sensor Orbits and Optimal Nonlinear Filtering", Ph.D. Dissertation, University of Southern California (1969). They were proposed to approximate probability density functions. Only Gaussian activation functions were used then, but numerous other activation functions have been used in a large number of research papers ever since. Nevertheless, all the RBFNs in the literature are feedforward neural networks with a single layer of hidden neurons (or processing units).

Figure 9:
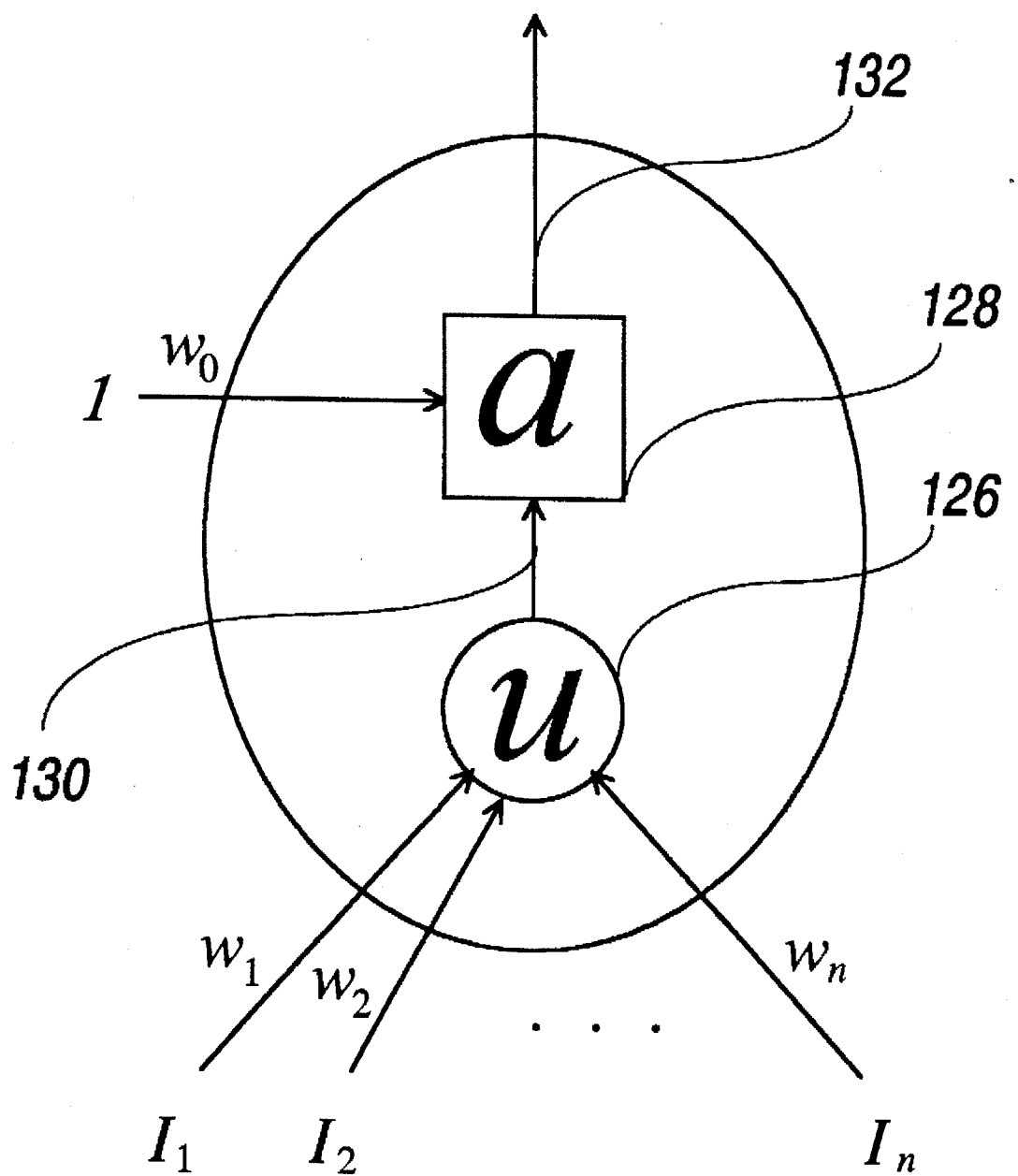
FIG. 9 is a schematic diagram of a general neuron, which consists of a basis function u and an activation function a. For instance, recurrent radial basis function networks (RRBFNs) use such a neuron with the basis function defined to be the Euclidean distance between the parameter vector $(w_1, w_2, \ldots, w_n)$ and the input vector $(I_1, I_2, \ldots, I_n)$ and with the activation function defined to be the Gaussian, thin-plate-spline, multiquadric, or inverse multiquadric function with $w_0$ as a parameter of the function.

A typical neuron of an RBFN is depicted in FIG. 9. It is a composition of a basis function 126 and an activation function 128, which are denoted by u and a respectively. If the inputs to the neuron are $I_1, I_2, \ldots, I_n$, as shown in FIG. 9, the basis function 126 with parameters $w_1, w_2, \ldots, w_n$, is usually the Euclidean distance between the vectors $(I_1, I_2, \ldots, I_n)$ and $(w_1, w_2, \ldots, w_n)$, i.e.

$$u(I_1, I_2, \ldots, I_n, w_1, w_2, \ldots, w_n) = \sqrt{\sum_{i=1}^{n}(I_i - w_i)^2}, \tag{9}$$

which appears at 130. The activation function 128 can be any one of many functions such as the Gaussian function, $$a(x, w_0) = \exp(-x^2/w_0^2), \tag{10}$$

the thin-plate-spline function, $$a(x,w_0) = x^2 \log x, \quad (11)$$

the multiquadric function, $$a(x,w_0) = (x^2 + w_0^2)^{1/2}, \quad (12)$$

and the inverse multiquadric function, $$a(x,w_0) = (x^2 + w_0^2)^{-1/2}, \quad (13)$$

where $w_0$ is a parameter to be determined together with the parameters $w_1, w_2, \ldots, w_n$ in training. The activation level of the neuron is its output at 132.

If we replace the multilayer perceptron neurons depicted in FIG. 7 with the RBFN neurons depicted in FIG. 9 in the hidden layers of the MLPWINs (e.g. FIG. 6) and the MLPWOFs (e.g. FIG. 8), we obtain the RBFNs with interconnected neurons (RBFNWINs) and the RBFNs with output feedbacks (RBFNWOFs), respectively. Thus the RNNs in FIG. 6 and FIG. 8 can be viewed as a typical RBFNWIN and a typical RBFNWOF respectively. Here we note that $w_{ij}^l$ denotes a parameter of the i-th neuron in the l-th layer and that the weights on the connections are set equal to one and are not adjustable weights.

Let us now see how the RBFNWIN depicted in FIG. 6 processes information at time t. Here we assume that the basis function is the Euclidean distance and the activation function is the Gaussian function. Denoting input i to the RBFNWIN at time t by $\beta_i^0(t)$, the activation level $\beta_i^l(t)$ of neuron i in layer l and the basis function output $\eta_i^l(t)$ in the same neuron at time t satisfy, for l=1,2, $$\beta_i^l(t) = a(\eta_i^l(t), w_{i0}^l) = \exp[-(\eta_i^l(t))^2/(w_{i0}^l)^2] \quad (14)$$

$$\eta_i^l(t) = \left[ \sum_{j=1}^{n_{l-1}} (\beta_j^{l-1}(t) - w_{ij}^l)^2 + \sum_{j=1}^{n_l} (\beta_j^l(t-1) - w_{ij}^l)^2 \right]^{1/2}, \quad (15)$$

where $n_l$ denotes the number of nodes in layer l, and $\beta_i^l(0)$, for $i=1,2,\ldots,n_l$ and $l=1,2$, form the initial dynamic state of the RBFNWIF. The output $\eta_1^3(t)$ of the RBFNWIN depicted in FIG. 6 is then determined by $$\eta_i^3(t) = w_{i0}^3 + \sum_{j=1}^{2} w_{ij}^3 \beta_j^2(t). \quad (16)$$

Let us now see how the RBFNWOF depicted in FIG. 8 processes information at time t. Denoting input i at time t by $\beta_i^0(t)$, the activation level $\beta_i^l(t)$ of neuron i in layer l and the basis function output $\eta_i^l(t)$ in the same neuron at time t satisfy, for l=1,2, $$\beta_i^l(t) = a(\eta_i^l(t), w_{i0}^l) = \exp[-(\eta_i^l(t))^2/(w_{i0}^l)^2], \quad (17)$$

$$\eta_i^l(t) = \left[ \sum_{j=1}^{n_{l-1}} (\beta_j^{l-1}(t) - w_{ij}^l)^2 \right]^{1/2}, \quad (18)$$

where $n_{l-1}$ denotes the number of nodes in layer l-1. The output $\eta_i^3(t)$ at output node i is then determined by $$\eta_i^3(t) = w_{i0}^3 + \sum_{j=1}^{3} w_{ij}^3 \beta_j^2(t). \quad (19)$$

The feedbacks, $\eta_2^3(t)$ and $\eta_3^3(t)$, are fedback to the feedback-receiving nodes 114 after a unit time delay. Therefore the feedbacks at the feedback-receiving nodes, $\beta_2^0(t)$ and $\beta_3^0(t)$, are equal to $\eta_2^3(t-1)$ and $\eta_3^3(t-1)$ respectively. The activation levels, $\eta_2^3(0)$ and $\eta_3^3(0)$, of the feedback-sending nodes 112 at time t=0 form the initial dynamic state of the RBFNWOF.

Depending on the application, there can be in an RBFNWIN or an RBFNWOF any numbers of input nodes, output nodes, free and output feedbacks (if appropriate), layers, and neurons in each hidden layer. It is noted that all the RBFNWINs (or respectively RBFNWOFs) with one and the same activation function for hidden neurons form one RBFNWIN (or respectively RBFNWOF) paradigm. It will be appreciated that there may be more than one type of activation function in an RBFNWIN or an RBFNWOF paradigm and an input node does not have to simply distribute an input to the first layer neurons.

4. Other recurrent neural network paradigms: Many other recurrent neural networks can be used to construct neural filters in accordance with the present invention. Since they are too numerous to describe individually in detail here, we will only briefly describe them, sometimes using the general versions of the schematic diagrams in FIG. 6 and FIG. 8 in the following. By the word "general" we mean "with arbitrary numbers of input nodes, output nodes, free feedbacks, output feedbacks, layers of neurons, and neurons in each hidden layer." In the following discussion, a reference to FIG. 6 and/or FIG. 8 actually refers to their respective general versions.

(a). Many different neurons (or nodes) other than those used in MLPWINs, MLPWOFs and RRBFNs can be used in FIG. 6 and FIG. 8. Basically, a neuron (or node) consists of two functions, a basis function u and an activation function a, forming a function composition as depicted in FIG. 9. The basis function is usually a finite series expansion of the inputs, $I_1, I_2, \ldots, I_n$, to the neuron which is comprised of polynomial, rational, trigonometric, exponential, logarithmic, hyperbolic, transcendental, wavelet, and/or spline elements. The symbols $w_1, w_2, \ldots, w_n$ may denote either parameters of the basis function or weights on the connections leading into the neuron. Those parameters that are not set equal to some constants are determined by the network training.

The activation function is simply a linear or nonlinear transformation, which is a sigmoidal, exponential, wavelet, spline, polynomial, rational, trigonometric, hyperbolic, logarithmic, (other) transcendental function and/or a combination thereof. The activation function may or may not contain parameters to be determined by the network training. For example, in the so called recurrent polynomial networks, the activation function is the identity function and the basis function is a multivariable polynomial of a fixed degree, whose coefficients are the parameters to be determined by the network training.

(b). Tapped delay lines of fixed lengths may be included for holding past neural network output feedbacks, past neuronal inputs to a neuron, and/or past inputs to the network. If a tapped delay line is included for a neural network output feedback, say $\eta_3^3(t)$ in FIG. 8, the delayed values of the output, say $\eta_3^3(t-1), \eta_3^3(t-2)$ and $\eta_3^3(t-3)$, are available for feedback. There are then the same number of additional feedback-receiving nodes for receiving them separately. Similarly, if a tapped delay line is included for an input, say $\beta_1^0(t)$ in FIG. 6 or FIG. 8, the delayed values of the input, say $\beta_1^0(t-1), \beta_1^0(t-2), \beta_1^0(t-3)$, and $\beta_1^0(t-4)$, are received separately at the same number of additional input nodes.

If a tapped delay line is included for an input to a neuron, the delayed values of the input are also received by the neuron as inputs to the basis function. For instance, if each of the inputs $I_1(t), I_2(t), \ldots, I_n(t)$ to a neuron has 2 tapped delays, then the basis function u is a finite series expansion of $I_1(t), I_1(t-1), I_1(t-2), I_2(t), I_2(t-1), I_2(t-2), \ldots, I_n(t), I_n(t-1), I_n(t-2)$.

(c). The neural networks depicted in FIG. 6 and FIG. 8 are fully-connected in the sense that every node in a layer is connected to every node in its preceding layer and furthermore in FIG. 6, every neuron is also two-way interconnected to every neuron (including the former neuron itself) in the same layer. In many applications, fully-connectedness is unnecessary and some of the connections among neurons in the same layer are removed to shape special network topologies before network training. Some of the connections may also be removed by various pruning techniques during or after network training.

(d). Three kinds of delay connections, namely free and output feedbacks, delay connections within a layer, and various tapped delay lines, have been discussed, which are all used to provide neural networks with memory or dynamic states. Any one of the three kinds is sufficient to construct large classes of filters. However, judicious combinations of two or three kinds may prove beneficial in some applications.

(e). Neural filters may be made out of RNNs without neurons grouped in layers. Every input node may be connected to every neuron and/or every output node in either or both directions. Every neuron may be connected to every neuron, every input node and every output node in either or both directions. Every output node may be connected to every input node and/or every neuron in either or both directions.

(f). A class of feedforward neural networks with one hidden layer of neurons is defined and called Ell networks in K. Hornik, M. Stinchcombe, and H. White, "Multilayer Feedforward Networks are Universal Approximators," *Neural Networks*, Vol. 2, pp. 359–366 (1989). These ρΠ networks can be easily generalized to multilayer ΣΠ networks, which can be easily turned into recurrent multilayer ρΠ networks by adding output and/or free feedbacks and/or interneuron delay connections within each layer.

(g). Any number of different RNNs described so far may be concatenated in series and/or in parallel to form another RNN to construct a neural filter.

(h). There may be one individual RNN, with a single output node, for each component of the output vector. These individual RNNs share only the same input nodes, but no neurons or connections. This structure is known as one-class-in-one-network structure.

(i). In most of the RNNs considered above, the output nodes are simply summers, which can also be viewed as neurons of the kind depicted in FIG. 7 with the activation function 106 being the identity function, i.e. a(x)=x. However, they may be neurons of another type or types. For instance, if the range of the target (or desired) values for an output node is known, the activation function a for the node should be chosen, in accordance with the teachings of the present invention, to reflect the target range so as to ease the approximation burden of the RNN, as well as to produce more plausible approximates. For example, if the range of target values for an output node is the interval from $c_1$ to $c_2$, the sigmoid function, $a(x)=(c_2+\delta+(c_1-\delta)e^{-x})/(1+e^{-x})$, for some selected small number $\delta \geq 0$, can be used as the activation function of the output node. If the range of target values is the interval from $c_1$ to $\infty$ (or respectively from $-\infty$ to $c_2$), the exponential function, $a(x)=c_1-\delta+e^x$ (or respective $c_2+\delta-e^{-x}$) for some selected small number $\delta \geq 0$, can be used as the activation function.

Range Extenders Used to Construct Neural Filters

The function of a range extender is to extend and/or transform the output range of an RNN to cover the range of a signal process. Given a signal process, a purpose of using a range extender is to reduce the valid output range and/or approximation capability required of an RNN so as to ease the RNN size and training data requirements and thereby lessen the training difficulty. In the following, we will simplify our discussion by restricting it to a range extender's function of extending the output range of an RNN to achieve the purpose of reducing the valid output range required of the RNN. It will be appreciated that another function of a range extender is simply to transform an RNN's output range, without necessarily extending it, to achieve another purpose of reducing the approximation capability required of the RNN, without necessarily reducing the valid output range required of the same RNN.

To further simplify our discussion, we will restrict it to range extenders for a primary filter whose input process is the measurement process y(t) and whose target (or desired) output process is the signal process x(t). However our discussion, except the discussion involving range extenders by Kalman filtering, is also valid for range extenders for an ancillary filter, which is to be defined and elaborated on in the sequel. This extension is valid if the signal process x(t) in the discussion is replaced with the ancillary signal process V(t) and, if the input process to the ancillary filter is ($\hat{x}(t)$, y(t)), the measurement process y(t) in the discussion is replaced with this input process ($\hat{x}(t)$, y(t)). Here $\hat{x}(t)$ denotes the output vector of the primary filter at time t, which is the estimate generated by the primary filter at the same time.

A simple way to transform the output range of an output node of an RNN is to use a static transformer to transform the output process of the output node. However, a static transformer is sometimes not very effective, especially when the signal vector keeps growing in magnitude during the operation of the neural filter. In accordance with the teaching of this invention, a range extender based on a dynamic transformer is used. Some embodiments of range extenders are disclosed in the following.

A basic scheme for dynamically transforming the output range of an output node, say node i in layer L, of an RNN is to add some estimate $\hat{x}_i(t)$ of the desired output $x_i(t)$ for the same output node to the node's actual output $\beta_i^L(t)$ at every time point t. The resulting sum, $\beta_i^L(t)+\hat{x}_i(t)$, is used as the ith component $\hat{x}_i(t)$ of the output vector $\hat{x}(t)$ of the neural filter at time t. Thus, the "actual desired output" for the output node is $x_i(t)-\hat{x}_i(t)$ at time t, whose range is expected to be smaller than the range of $x_i(t)$, provided that the estimate $\hat{x}_i(t)$ is "good". The estimate $\hat{x}_i(t)$ will be called an auxiliary estimate of $x_i(t)$ and a scheme that generates this estimate $\hat{x}_i(t)$ will be called an auxiliary estimator. A device that comprises such an auxiliary estimator and an adder will be called range extender by estimate addition, which is a dynamic transformer of the output process $\beta_i^L(t)$. A fundamental requirement for a range extender by estimate addition to work properly is that the estimate $\hat{x}_i(t)$ be a function of the measurements, $y(\tau)$, $\tau=1, 2, \ldots, t$, for $t=1,2,\ldots, T$. Five types of range extender by estimate addition, whose auxiliary estimators have different levels of estimation accuracy and different levels of computational cost, are given in the following:

1. Range Extenders by Kalman Filtering

Assume that a model in the form of (1) and (2) for the signal process x(t) and measurement process y(t) is available and that a range extender is required for every output node of the RNN in a neural filter.

Figure 10:
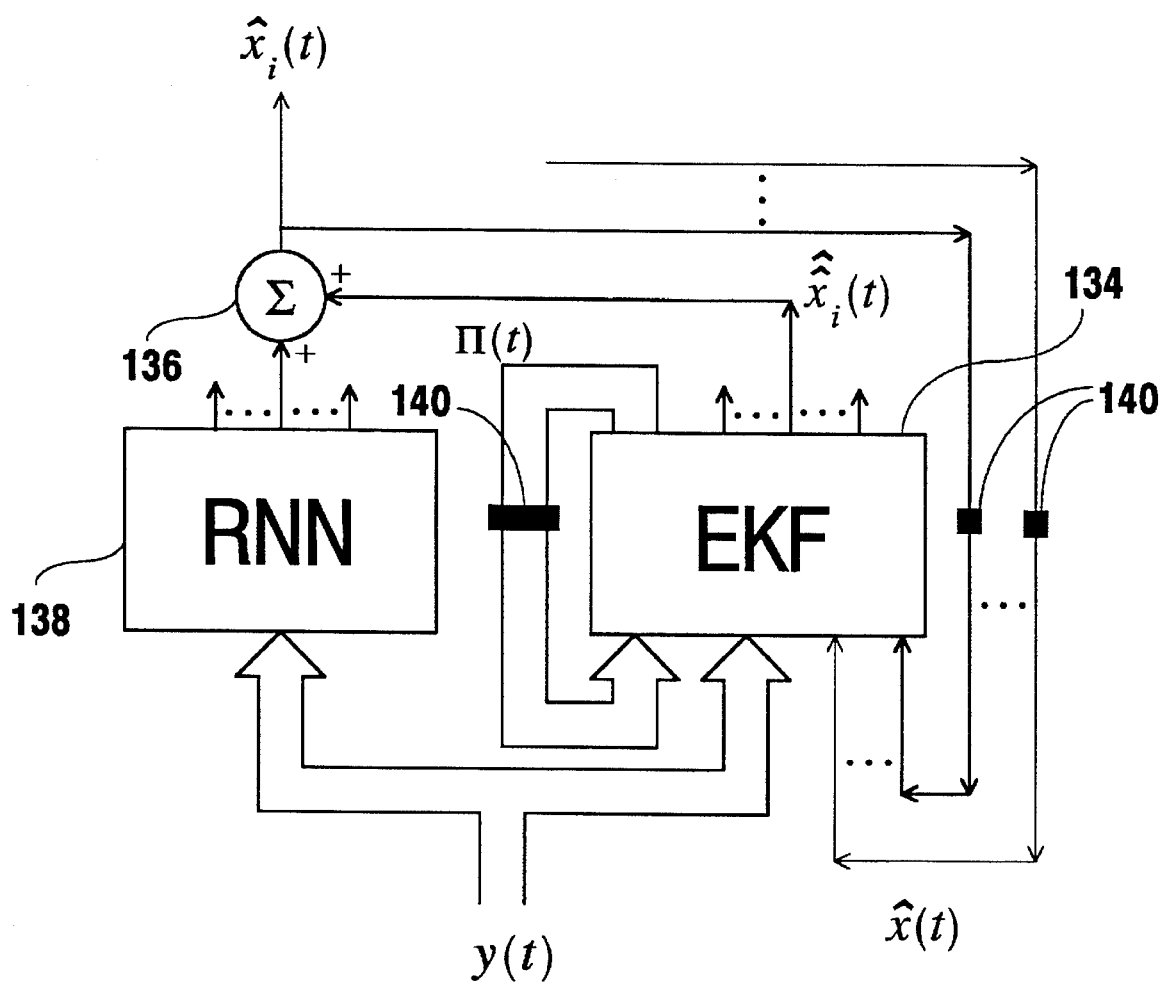
FIG. 10 shows one range extender by Kalman filtering and how it is connected to a recurrent neural network in a primary neural filter.

Consider the neural filter depicted in FIG. 10, where only one range extender for an output node is shown. Recall a solid square 140 represents a unit time delay device. The extended Kalman filter (EKF) 134 and the adder 136 constitute a range extender. The EKF uses the output $\hat{x}(t-1)$ from the neural filter, the error covariance matrix $\Pi(t-1)$ from itself, and the measurement vector y(t) to produce an estimate $\hat{x}(t)$ of x(t). The RNN is then employed only to estimate the difference $x_i(t)-\hat{x}_i(t)$ for the ith signal component. The range of the difference is expected to be much smaller than $x_i(t)$, if $\hat{x}_i(t)$ is a good estimate of $x_i(t)$. Denoting the ith output of the RNN by $\beta_i^L(t)$, the estimate $\hat{s}_i(t)$ of $x_i(t)$ generated by the neural filter is $\hat{x}_i(t)=\hat{x}_i(t)+\beta_i^L(t)$. The EKF equations are $$\Pi(t|t-1)=F(t-1)\Pi(t-1)F^T(t-1)+ G(\hat{x}(t-1),t-1)\cdot Q(t-1)G^T(\hat{x}(t-1),t-1), \quad (20)$$

$$\hat{x}(t|t-1)=f(\hat{x}(t-1),t-1), \quad (21)$$

$$\Omega(t)=H^T(t)\Pi(t|t-1)H(t)+R(t), \quad (22)$$

$$L(t)=\Pi(t|t-1)H(t)\Omega^{-1}(t), \quad (23)$$

$$\hat{x}(t)=\hat{x}(t|t-1)+L(t)[y(t)-h(\hat{x}(t|t-1))], \quad (24)$$

$$\Pi(t)=\Pi(t|t-1)-\Pi(t|t-1)H(t)\Omega^{-1}(t)H^T(t)\Pi(t|t-1), \quad (25)$$

where $F(t-1)=(\delta f(x, t-1)/\delta x)|x=\hat{x}(t-1)$, and $H^T=(\delta h(x, t)/\delta x)|x=\hat{x}(t|t-1)$. At t=0, we initialize the neural filter by setting $\hat{x}(0)=\bar{x}_0$ and $\Pi(0)=\Pi_0$ to activate the above EKF equations.

Note that $\hat{x}(t)$ is indeed a function of y(1), y(2), ..., y(t), for t=1,2, ..., T, satisfying the aforementioned fundamental requirement for a range extender by estimate addition.

We stress here that the above EKF equations involve the outputs of the RNN through $\hat{x}(t-1)$ and are thus not the standard EKF equations. If an RNN is properly selected and trained, the estimate $\hat{x}(t)$ generated by the above EKF equations is better than the standard extended Kalman estimate. Because of the involvement of $\hat{x}(t-1)$ in the above EKF equations, training of the RNN here is more involved than that of an RNN alone. Training algorithms are provided in the sequel for training an MLPWIN and an MLPWOF as the RNN together with the EKF in a neural system.

If the signal process x(t) is only a part of the process described by (1), the estimate $\hat{x}(t-1)$ generated by the neural filter is then only a part of the "preceding estimate" used in the EKF equations for (1) and (2). The rest of the "preceding estimate" used is necessarily the corresponding components of the preceding EKF estimate generated by these EKF equations.

It will be appreciated that we may extend the output ranges of any number of selected components of $\beta^L(t)$ by adding the corresponding components of $\hat{x}(t)$ to them. Nevertheless, the entire EKF has to be run to provide these components of $\hat{x}(t)$.

2. Range Extenders by Feedforward Kalman Filtering

The only difference between this type of range extender and the preceding type, namely range extenders by Kalman filtering, is that the "preceding estimate" $\hat{x}(t-1)$ used in the EKF equations, (20)–(25), is now replaced by $\hat{x}(t-1)$. Thus the EKF equations used here are the standard EKF equations without the involvement of $\hat{x}(t-1)$ generated by the neural filter.

A range extender by feedforward Kalman filtering is usually inferior to a range extender by Kalman filtering. However, including a range extender by feedforward Kalman filtering in a neural system does not incur much extra computation for training the neural system. Since the EKF equations used here do not involve the RNN in the neural system, the only special treatment in training for a range extender by feedforward Kalman filtering is to use $x_i(t)-\hat{x}_i(t)$, t=1, 2, ..., T instead of $x_i(t)$, t=1, 2, ..., T as the target or desired output process for the output node i involved in the RNN.

3. Range Extenders by Accumulation

If a signal process x(t) consists of the vector-values, at discrete time points, of a slowly varying continuous continuous-time process, then the vector value x(t−1) is a good approximate of x(t), and a good estimate of x(t−1) is a "reasonably good" estimate of the vector value x(t). This observation motivated a simple, yet effective way to extend the output range of an RNN in a neural filter, when two consecutive signals, x(t−1) and x(t), are not too far apart.

Figure 11:
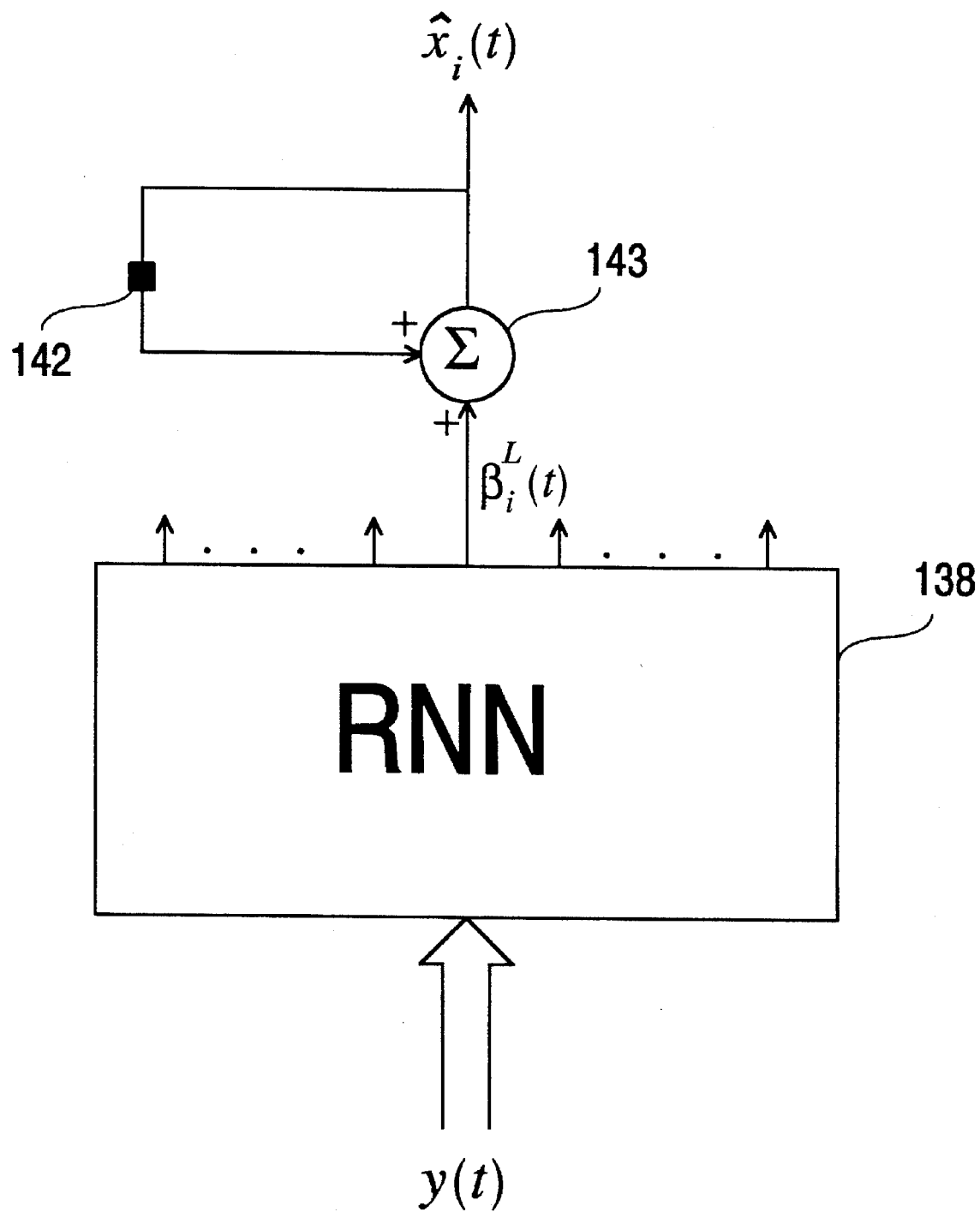
FIG. 11 shows one range extender by accumulation and how it is connected to a recurrent neural network in a primary neural filter.

Consider the neural filter depicted in FIG. 11. Only one accumulator used as a range extender is shown. The accumulator, consisting of a unit time delay device 142 and an adder 143, is concatenated directly to output node i of the RNN 138. At each time point t, the accumulator adds the output $\beta_i^L(t)$ of the RNN to the accumulator's output $\hat{x}_i(t-1)$ at the preceding time point t−1. Thus the accumulator accumulates all the outputs of output node i of the RNN from t=1 onward plus the initial accumulation denoted by $\hat{x}_i(0)$. Mathematically, the accumulator is described simply by $$\hat{x}_i(t)=\beta_i^L(t)+\hat{x}_i(t-1), \quad t=1,2,\ldots,T. \quad (26)$$

Here, the RNN actually estimates the difference $x_i(t)-\hat{x}_i(t-1)$, which is expected to have a much smaller range than does $x_i(t)$, if the two consecutive signals, x(t−1) and x(t), are not too far apart. If a good a priori estimate $\bar{x}_i(0)$ is given of $x_i(0)$, it should be used as the initial accumulation $\hat{x}_i(0)$. Otherwise, the initial accumulation $\hat{x}_i(0)$ can be determined together with the weights and/or parameters w and the initial dynamic state v of the RNN in minimizing a training criterion for the neural filter. Training algorithms are provided in the sequel for training an MLPWIN and an MLPWOF as the RNN together with selected accumulators in the neural filter.

Note that $\hat{x}_i(t-1)$ is a function of y(1), y(2), ..., y(t−1), for t=1,2, ..., T. Viewing $\hat{x}_i(t-1)$ as an estimate $\hat{x}(t)$ of $x_i(t)$ that is added to the output $\beta_i^L(t)$ of output node i, we see that the accumulator is a range extender by estimate addition, which satisfies the fundamental requirement for a range extender by estimate addition as stated early on. An accumulator used as a range extender will be called a range extender by accumulation.

4. Range Extenders by Linear Prediction

Figure 12:
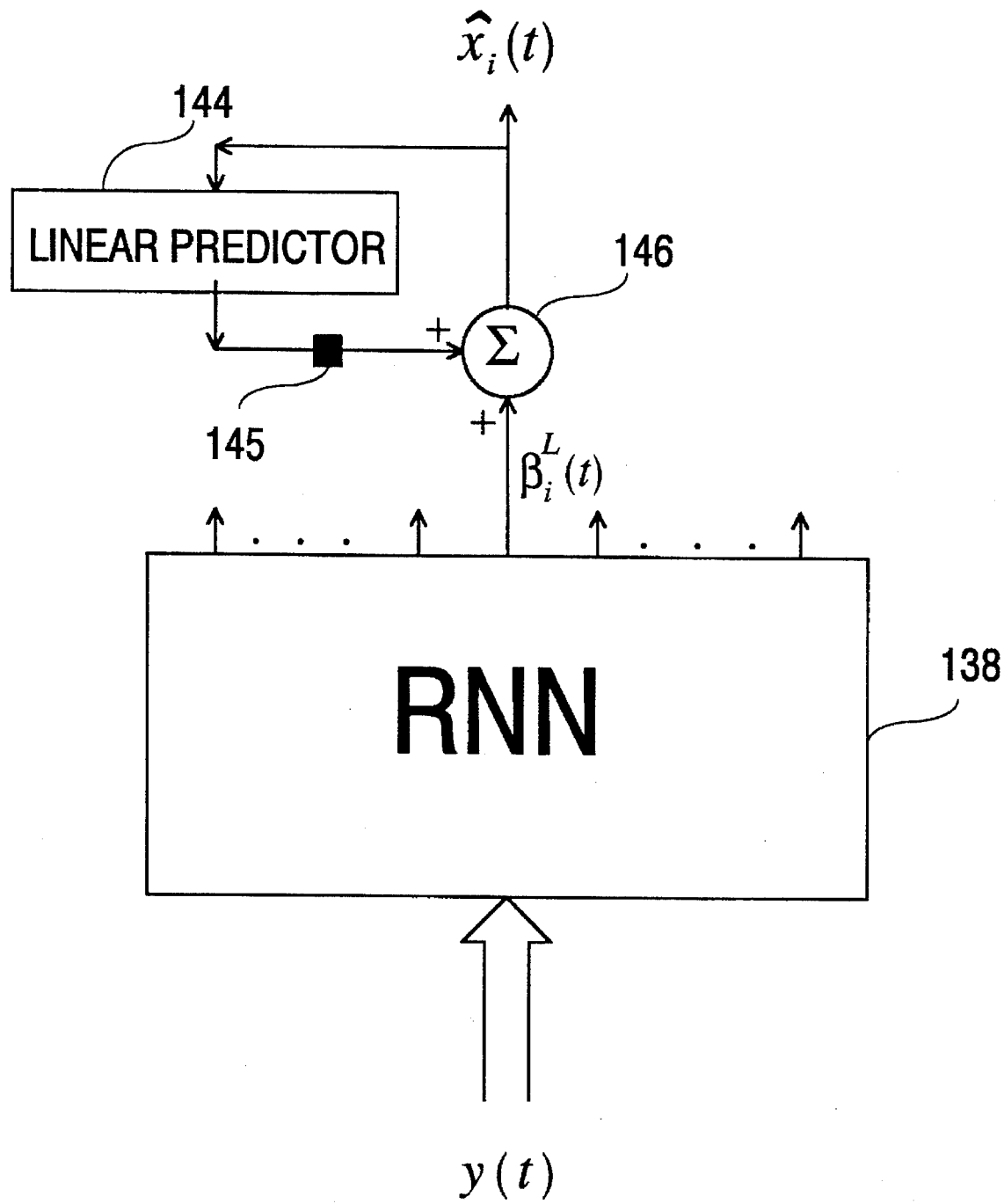
FIG. 12 shows one range extender by linear prediction and how it is connected to a recurrent neural network in a primary neural filter.

Consider the neural filter depicted in FIG. 12 where only one range extender is shown. The one shown is a range extender by estimate addition, that consists of a linear predictor 144, a unit time delay device 145 and an adder 146, and is concatenated to output node i of an RNN 138. The estimate $\hat{x}(t)$, to be added to $\beta_i^L(t)$ to yield $\hat{x}_i(t)$, i.e. $\hat{x}_i(t)=\beta_i^L(t)+\hat{x}_i(t)$, is generated by a linear predictor. A range extender by accumulation can be viewed as a special case in which $\hat{x}_i(t-1)$ is used as the predicted value of $\hat{x}_i(t)$.

A better estimate of $\hat{x}_i(t)$ than $\hat{x}_i(t-1)$, which is used in a range extender by accumulation, can be obtained by the linear predictor $$\hat{\hat{x}}_i(t) = \sum_{j=1}^{J} c_j \hat{x}_i(t-j),$$

where J is a fixed positive integer called the order of the linear predictor, $c_j$ are the linear predictor coefficients (S. Haykin, *Adaptive Filter Theory*, 2nd edition, Prentice-Hall (1991)). However, before both the RNN and the linear predictor are fully specified, the sequence $\hat{x}_i(t)=\beta_i^L(t)+\hat{\hat{x}}_i(t)$, $t=1,2,\ldots,T$ is not available, preventing us from applying standard methods to determine the linear predictor coefficients, $c_j$, $j=1,2,\ldots,J$, and thereby specify the linear predictor. To get around this difficulty, we may determine the linear predictor coefficients for predicting the signal $x_i(t)$ instead. More specifically, we use realizations of the ith component $x_i(t)$ of the signal process, which realizations are part of the training data to be discussed in the sequel, to determine $c_j$, $j=1,2,\ldots,J$, so that the linear finite impulse response filter $$\sum_{j=1}^{J} c_j x_i(t-j)$$

predicts $x_i(t)$ in the standard least-squares sense A fast and stable algorithm for thin can be found in D. T. M. Slock and T. Kailath, "Numerically Stable Fast Transversal Filters for Recursive Least Squares Adaptive Filtering," *IEEE Transactions on Signal Processing*, Vol. 39, No. 1, pp. 92–114 (1991). Some other algorithms can be found in S. Haykin, *Adaptive Filler Theory*, 2nd edition, Prentice-Hall (1991).

Then we use these coefficients $c_j$, $j=1,2,\ldots,J$ as the coefficients in the linear predictor $\hat{\hat{x}}_i(t)=$ $$\sum_{j=1}^{J} c_j \hat{x}_i(t-j)$$

for predicting $\hat{x}_i(t)$. The resulting linear predictor is expected to generate good estimate $\hat{\hat{x}}_i(t)$ of $\hat{x}_i(t)$, provided $\hat{x}_i(t)$ mimics $x_i(t)$ closely.

To initialize the linear predictor at t=1, we need the initialization values, $\hat{x}_i(-J+1)$, $\hat{x}_i(-J+2)$, ..., $\hat{x}_i(0)$, in both the training and the operation of the neural filter. If the signals, $x_i(-J+1)$, $x_i(-J+2)$, ..., $x_i(0)$, are available at t=1 in the operation of the neural filter in the application under consideration, we may include realizations of $x_i(-J+1)$, $x_i(-J+2)$, ..., $x_i(0)$ in the training data set in addition to those of $x_i(1)$, $x_i(2)$, ..., $x_i(T)$. In training, a realization of $x_i(-J+1)$, $x_i(-J+2)$, ..., $x_i(0)$ is used as the initialization values, $\hat{x}_i(-J+1)$, $\hat{x}_i(-J+2)$, ..., $\hat{x}_i(0)$.

If the signals, $x_i(-J+1)$, $x_i(-J+2)$, ..., $x_i(0)$ are not available at time t=1, in the operation of the neural filter in the application under consideration, we may use a starter-filter to process $y(-J+1)$, $y(-J+2)$, ..., $y(0)$ for estimating $x(-J+1)$, $x(-J+2)$, ..., $x(0)$. The resulting estimates are then used as the initialization values. Here of course, we need the measurements, $y(-J+1)$, $y(-J+2)$, ..., $y(0)$, which are either extra measurements or the measurements $y(1)$, $y(2)$, ..., $y(J)$ with the time scale shifted. We may employ an extended Kalman filter as a starter-filter. Since J is usually small and the ranges of the signal and measurement processes can not be very large over the time interval, $t=-J+1, -J+2, \ldots, 0$, a simple neural filter without range extenders and reducers is expected to work nicely here as a starter-filter.

Now holding the coefficients $c_j$ constant, we synthesize the training data into an RNN. If the resulting neural filter, including the linear predictor, adder, and RNN, works satisfactorily, the process of designing a neural filter is completed. Otherwise, we may increase J and repeat the above process determining $c_j$ and then synthesizing an RNN again or we may adjust the values of $c_j$, $j=1, 2, \ldots, J$ together with the weights w and initial dynamic state v of the RNN by minimizing the training criterion further, using the existing values of $c_j$, w, and v as the initial guess in the minimization process. The terminologies, synthesizing, training, training criterion, initial dynamic state and minimization will all be explained in the sequel.

It will be appreciated that the above arguments can be easily generalized to the vector case, in which a linear predictor generates a vector-valued estimate of a certain number of components of x(t), of which estimate a selected number of components are then added to their corresponding components of $\beta^L(t)$ to yield their corresponding components of $\hat{x}(t)$.

Training algorithms that take into consideration range extenders by linear prediction will be provided in the sequel. Since range extenders by accumulation are special cases of range extenders by linear prediction, those training algorithms are valid for range extenders by accumulation as well.

5. Range Extenders by Feedforward Linear Estimation

Figure 13:
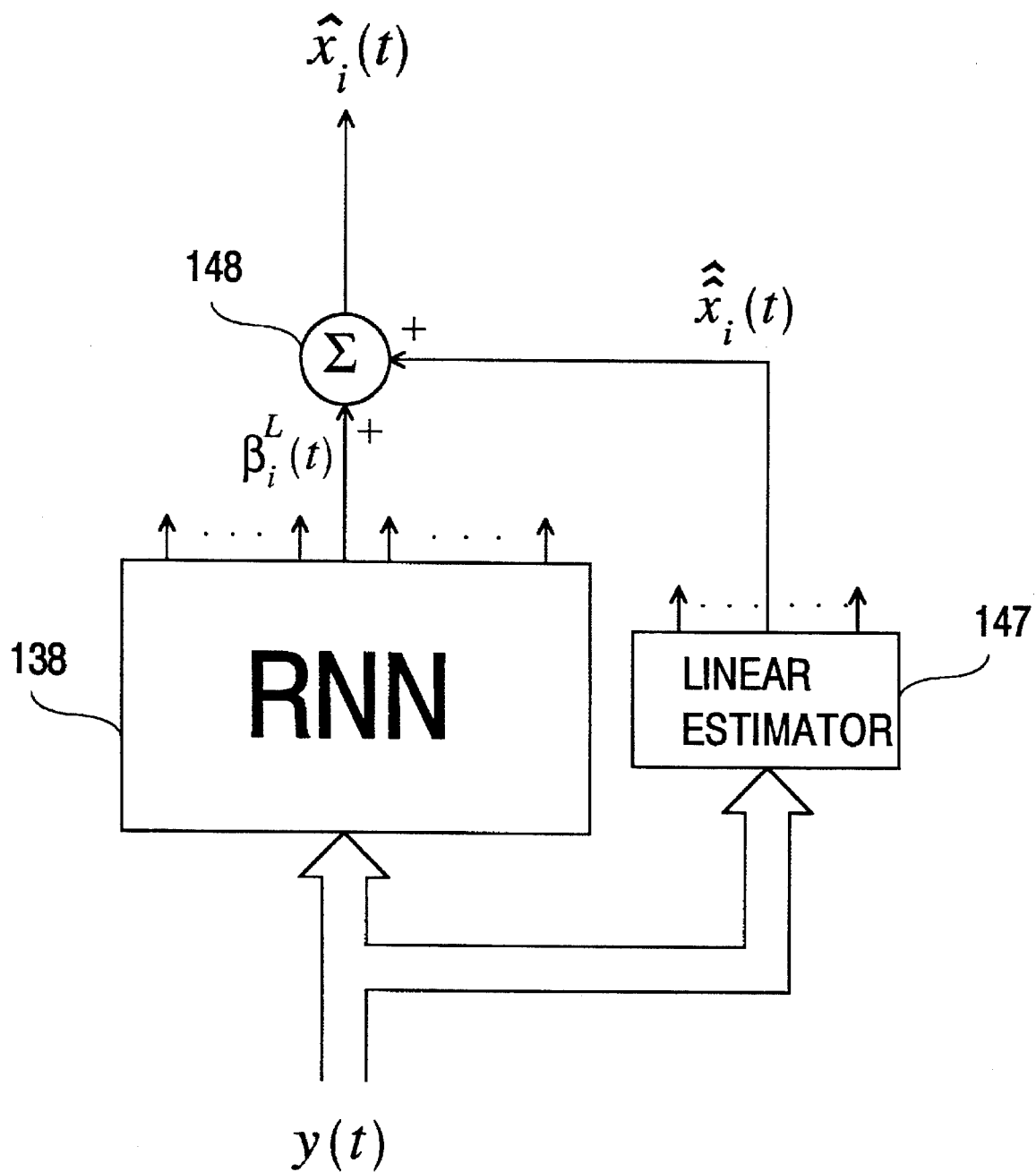
FIG. 13 shows one range extender by feedforward linear estimation and how it is connected to a recurrent neural network in a primary neural filter.

In many filtering environments, a linear finite-impulse-response (FITS) filter can be used to process the measurement process to obtain a rather good estimate of the signal process. Using such a linear filter as an auxiliary estimator, a range extender by estimate addition is obtained, which will be called a range extender by feedforward linear estimation. Such a range extender 147, 148 is shown in FIG. 13. The input vector to its auxiliary estimator 147 at time t is the m-dimensional measurement vector y(t) and the output vector of the auxiliary estimator 147 at the same time is the auxiliary estimate of those components of the signal process. Let the vector with those components be denoted by z(t) and the auxiliary estimate of z(t) by denoted by $\hat{z}(t)$.

The auxiliary estimator is a linear estimator described by $$\hat{z}(t) = \sum_{j=0}^{J-1} C_j y(t-j),$$

where J denotes the order of the linear estimator and $C_j$, for $j=0, 1, \ldots, J-1$, are the coefficient matrices. Using the components of $z(t,\omega)$ corresponding to those of $\hat{z}(t)$ as the desired output, and $y(t,\omega)$ as the input for each $\omega \in S$, the coefficient matrices are determined by minimizing $$\sum_{\omega \in S} \sum_{t=1}^{T} \| z(t,\omega) - \sum_{j=0}^{J-1} C_j y(t-j,\omega) \|^2,$$

where $\|\cdot\|$ is the Euclidean norm. Assuming that $y(\tau,\omega)$ is zero for $\tau \leq 0$ and $\omega \in S$, the recursive least squares algorithm in D. T. M. Slock and T. K. Kailath, "Numerically Stable Fast Transversal Filtering for Recursive Least Squares Adaptive Filtering," *IEEE Transactions on Signal Processing*, Vol. 39, No. 1, pp. 92–114 (1991), can be applied to calculate the coefficient matrices, $C_j$, $j=0,1, \ldots, J-1$.

The estimate $\hat{z}_i(t)$ of $z_i(t)$ generated by the neural filter depicted in FIG. 13 is the sum of $\hat{z}_i(t)$ and $\beta_i^L(t)$, the ith output of the RNN 138. To initialize the linear estimator in operation at t=1, we need the initialization values for $y(-J+1)$, $y(-J+2)$, ..., $y(0)$. If they are not available, we may set them equal to zero in synthesizing the neural filter and then in operating the neural filter. An alternative way to determine the initialization values is to optimize them jointly with the weights of the neural filter.

The auxiliary estimate $\hat{z}(t)$ generated by the linear estimator 147 is fedforward to the adder 148. Since the linear estimator does not involve the RNN 138 in its generation of $\hat{z}(t)$, the only special treatment in training for a range extender by feedforward linear estimation is to use $z(t)-\hat{z}(t)$, $t=1,2,\ldots,T$, as the target output process for the RNN.

Range Reducers Used to Construct Neural Filters

The function of a range reducer is to reduce and/or transform the range of an input process to a neural filter and send the resulting process to the input terminals of an RNN in the neural filter. A purpose of using a range reducer is to reduce the valid input range and/or approximation capability required of the RNN so as to ease the RNN size and training data requirements and thereby lessen the training difficulty.

A fundamental requirement for the range reducers used in a neural filter to work properly is that the input process to the RNN, after the range reducers preprocess the input process to the neural filter, and the input process to the neural filter are causally equivalent with respect to the RNN in the sense that the value of any one of these two (input) processes at a time point can be constructed, with the aid of memory in the RNN, from all the values of the other process up to and including the same time point. This causal equivalence with respect to the RNN is required to guarantee that the information contained in the input process to neural network is not destroyed by the range reducers.

To simplify our discussion, we will restrict it to range reducers for a primary filter whose input process is the measurement process $y(t)$ and whose target (or desired) output process is the signal process $x(t)$. However, our discussion, except the discussion involving range reducers by model-aided prediction, is also valid for range reducers for an ancillary filter, which is to be defined and elaborated on in the sequel. This extension is valid if the signal process $x(t)$ in the discussion is replaced with the ancillary signal process $V(t)$ and, if the input process to the ancillary filter is $(\hat{x}(t), y(t))$, the measurement process $y(t)$ in the discussion is replaced with this input process $(\hat{x}(t), y(t))$. Here $\hat{x}(t)$ denotes the output vector of the primary filter at time t.

To further simplify our discussion, we will restrict it to a range reducer's function of reducing the input range required of an RNN. It will be appreciated that another function of a range reducer is simply to transform the range of an input process, without necessarily reducing it, to reduce the approximation capability required of an RNN.

A simple way to transform the range of a measurement process is to use a static transformer to transform the measurement process. However, a static transformer is not very effective, especially when the measurement vector keeps growing in magnitude during the operation of the neural filter. In accordance with the teaching of this invention, a range reducer based on a dynamic transformer is used. Some embodiments of range reducers are disclosed in the following.

A basic scheme for reducing the range of the ith component $y_i(t)$ of an input process $y(t)$ to the neural filter is to subtract some estimate $\hat{y}_i(t)$ of $y_i(t)$ from $y_i(t)$ at every time point t. A scheme that generates the estimate $\hat{y}_i(t)$ is called an auxiliary estimator of $y_i(t)$. The resulting difference, $y_i(t)-\hat{y}_i(t)$, is used at time t as the ith component of the input vector to the RNN in the neural filter. The range of the difference, $y_i(t)-\hat{y}_i(t)$, is expected to be smaller than the range of $y_i(t)$, provided that the estimate $\hat{y}_i(t)$ is good. A device that comprises an auxilliary estimator to generate an estimate $\hat{y}_i(t)$, and a subtracter to perform the substitution, $y_i(t)-\hat{y}_i(t)$, is called a range reducer by estimate subtraction, which is a dynamic transformer of $y_i(t)$. It has been shown that if all the range reducers in a neural filter are range reducers by estimate subtraction and all the estimates $\hat{y}_i(t)$ therein involved at the time point t are functions of the measurement process $y(t)$ up to and including the time point $t-1$, for $t=1,2,\ldots,T$, then the input process to the neural filter, and the input process to the RNN in the neural filter are causally equivalent with respect to the RNN, provided that the RNN has a sufficient number of delay connections.

Three types of range reducer by estimate subtraction are given in the following:

1. Range Reducers by Model-Aided Prediction

Assume that a model in the form of (1) and (2) for the signal process $x(t)$ and measurement process $y(t)$ is available and that a range reducer is required for the ith component of the measurement process, which is the input process to the neural filter.

Figure 14:
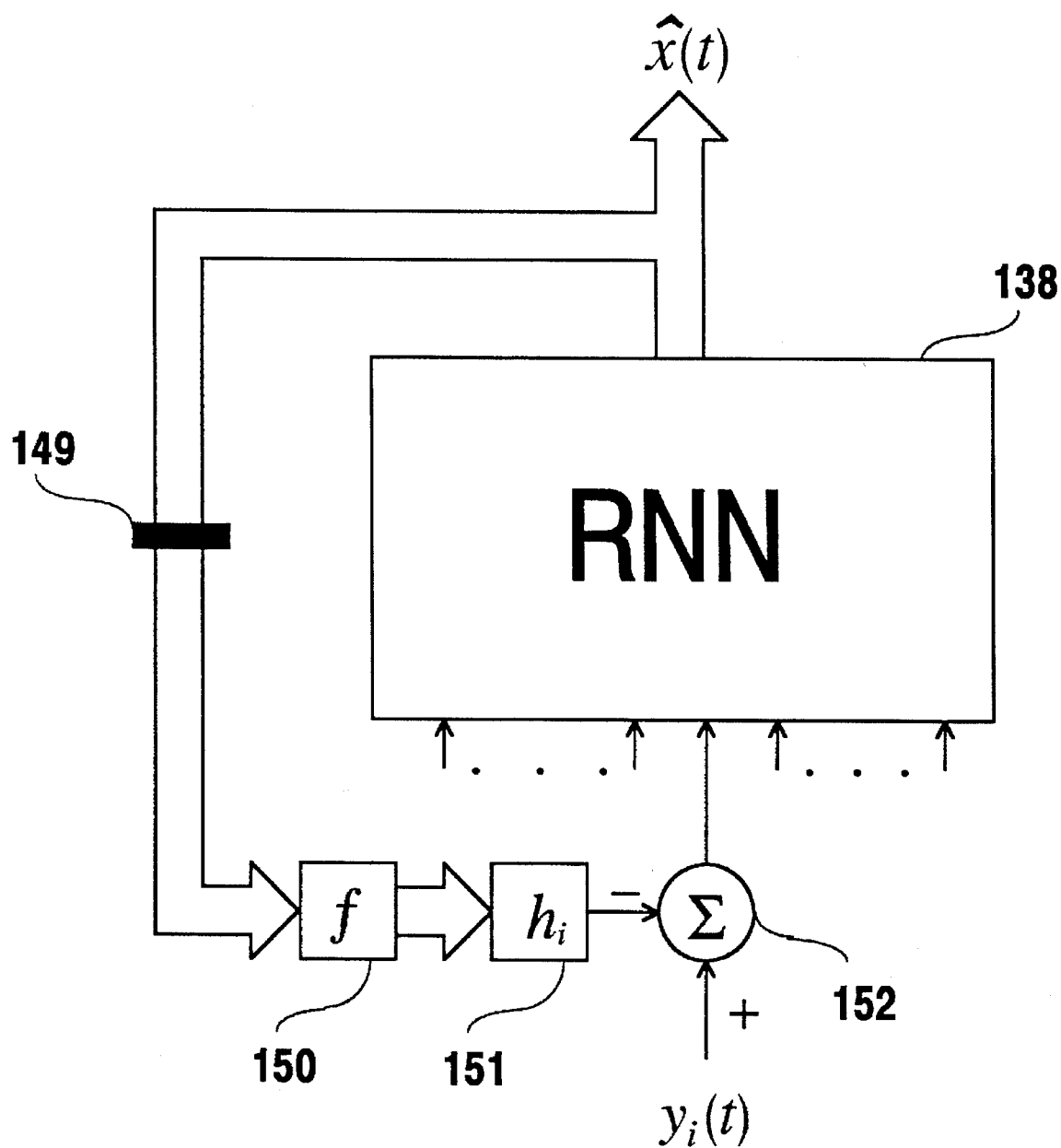
FIG. 14 shows one range reducer by model-aided prediction and how it is connected to a recurrent neural network in a primary neural filter.

Consider the neural filter depicted in FIG. 14, where only one range reducer is shown. The unit time delay device 149, function f 150, function $h_i$ 151, and subtracter 152 constitute a range reducer. The output $\hat{x}(t-1)$ of the neural filter at time $t-1$ is the best estimate of the signal $x(t-1)$ that is available to the neural filter. Given the model (1) and (2), it is obvious that a good prediction $\hat{x}(t)$ of $x(t)$ is $\hat{x}(t)=f(\hat{x}(t-1), t-1)$ and a good prediction $\hat{y}_i(t)$ of $y_i(t)$ is $\hat{y}_i(t)=h_i(f(\hat{x}(t-1), t-1), t)$. At time $t=1$, the estimate $\hat{x}(0)$ is set equal to an a priori estimate $\bar{x}(0)$ of $x(0)$ and the prediction $\hat{y}_i(1)$ of $y_i(1)$ is then equal to $h_i(f(\bar{x}(0), 0), 1)$. The a priori estimate $\bar{x}(0)$ is simply the best estimate of $x(0)$ that is available. Its accuracy as an estimate of $x(0)$ is not critical. However, once it is chosen, it should be consistently used in both the training and the operation of the neural filter. An alternative way to determine $\hat{y}_i(1)$ is to determine it jointly with the weights w and initial dynamic state v of the RNN in minimizing a selected training criterion to be discussed in the sequel.

Note that $\hat{y}_i(t)$ is a function of $y(1), y(2), \ldots, y(t-1)$, for $t=1, 2, \ldots, T$. Hence the fundamental requirement, stated previously, is not violated by the range reducer for the ith component $y_i(t)$ of the measurement process, that is shown in FIG. 14.

We notice that this range reducer provides the RNN with extra feedbacks of its outputs into its inputs, in addition to the feedbacks inside the RNN. This should be taken into consideration in training the RNN together with the range reducer.

2. Range Reducers by Differencing

If a measurement process $y(t)$ consists of the vector-values, at discrete time points, of a continuous continuous-time process, then the vector value $y(t-1)$ is a "reasonably good" estimate of the vector value $y(t)$. This observation motivated a simple, yet effective way to reduce the range of the measurements, when two consecutive measurements, $y(t-1)$ and $y(t)$, are not too far apart.

Figure 15:
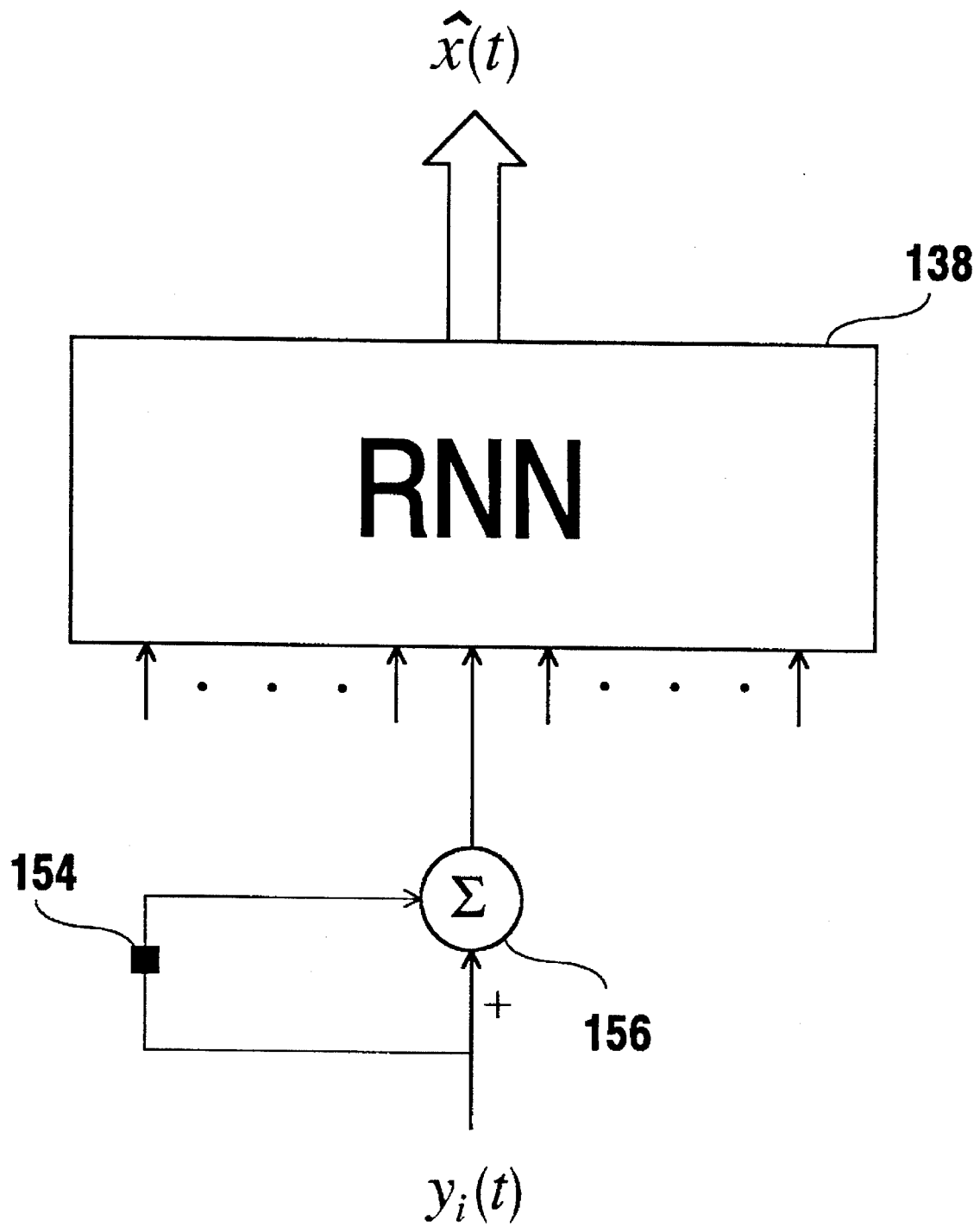
FIG. 15 shows one range reducer by differencing and how it is connected to a recurrent neural network in a primary neural filter.

Consider the neural filter depicted in FIG. 15. A differencer, that consists of a unit time delay 154 and a subtractor 156, is concatenated at a input terminal of an RNN. At each time point t, the differencer subtracts the preceding measurement $y_i(t-1)$ from the current measurement $y_i(t)$ and feeds the difference $y_1(t)-y_i(t-1)$ to the ith input terminal of the RNN.

There are three ways to initialize the differencer. One way is to start the neural filter at $t=2$, the ith component of the first input vector to the RNN being $y_i(2)-y_1(1)$ and the first output vector of the RNN being $\hat{x}(2)$. The second way is to determine an initialization value for $y_i(0)$ jointly with the weights w and initial dynamic state v of the RNN in training. In the operation of the neural filter, the ith component of the first input vector to the RNN is $y_1(1)-y_i(0)$. The third way is to use the best available estimate $\bar{y}_i(0)$ of $y_i(0)$ and then use $y_i(1)-\bar{y}_i(0)$ as the ith component of the first input vector to the RNN consistently in the training and operation of the neural filter.

In this range reducer by estimate subtraction, the estimate $\hat{y}_i(t)$ of $y_i(t)$, that is subtracted from $y_i(t)$ to reduce the range of $y_i(t)$, is $y_i(t-1)$, which is obviously a function of $y(1)$, $y(2), \ldots, y(t-1)$. Hence the fundamental requirement, stated previously for a range reducer by estimate subtraction, is not violated.

We note here that a differencer concatenated at the input terminals of an RNN does not require additional treatment in a training algorithm for the rest of the neural filter except replacing $y(t)$ by $y(t)-y(t-1)$ as the input vector at time t.

3. Range Reducers by Linear Prediction

Figure 16:
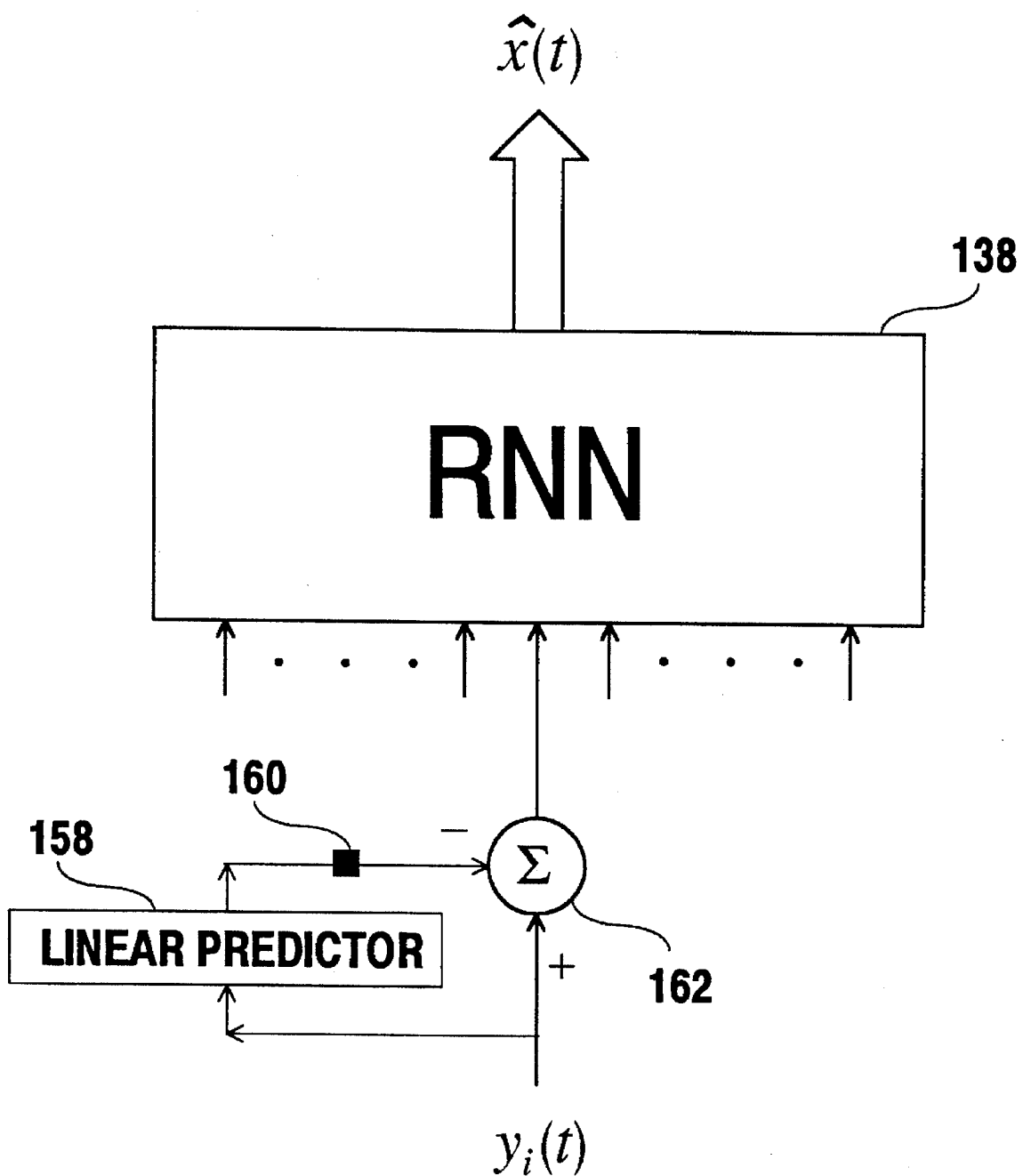
FIG. 16 shows one range reducer by linear prediction and how it is connected to a recurrent neural network in a primary neural filter.

Consider the neural filter depicted in FIG. 16 where one range reducer is shown. The range reducer, which consists of a linear predictor 158, a unit time delay device 160 and a subtractor 162, is concatenated to the ith input terminal of an RNN 138.

The linear predictor inputs the ith component of the input process to the neural filter, which input process is the measurement process $y(t)$, and outputs a prediction $\hat{y}_i(t+1)$ of $y_i(t+1)$. After a unit time delay, the preceding prediction $\hat{y}_i(t)$ is now subtracted from $y_i(t)$ by the subtractor 162. The resulting difference, $y_i(t)-\hat{y}_i(t)$, is then input to the RNN at its ith input terminal.

A range reducer by differencing is obviously a special range reducer by linear prediction, in which the estimate $\hat{y}_i(t+1)$ generated by the linear predictor is simply $y_i(t)$. A general linear predictor is written as $$\hat{y}_i(t) = \sum_{j=1}^{J} c_j y_i(t-j),$$

where J is a fixed positive integer called the order of the linear predictor, and $c_j$ are the linear predictor coefficients (S. Haykin, *Adaptive Filter Theory*, 2nd edition, Prentice-Hall (1991)). Realizations of the ith component $y_1(t)$ of the measurement process, which are part of the training data to be discussed in the sequel, are used to determine $c_j$, $j=1,2,\ldots,J$ so that the linear predictor, $$\hat{y}_i(t) = \sum_{j=1}^{J} c_j y_i(t-j),$$

predicts $y_i(t)$ in the standard least-squares sense. A fast and stable algorithm for this can be found in D. T. M. Slock and T. Kailath, "Numerically Stable Fast Transversal Filters for Recursive Least Squares Adaptive Filtering," *IEEE Transactions Signal Processing*, Vol. 39, No. 1, pp. 92–114 (1991). Some other algorithms can be found in S. Haykin, *Adaptive Filter Theory*, 2nd edition, Prentice-Hall (1991).

There are two ways to initialize the linear predictor. One way is to start the neural filter at $t=J+1$, the ith component of the first input vector to the RNN being $y_i(J+1)-\hat{y}_i(J+1)$ and the first output vector of the RNN being $\hat{x}(Y+1)$. The second way is to determine J initialization values, $y_i(-J+1)$, $y_1(-J+2), \ldots, y_i(0)$ jointly with the weights w and initial dynamic state v of the RNN in training. In the operation of the neural filter, the ith component of the first input vector to the RNN is $$y_i(t) - \sum_{j=1}^{J} c_j y_i(t-j).$$

In this range reducer by estimate subtraction, the estimate $\hat{y}_i(t)$ of $y_i(t)$, that is substracted from $y_1(t)$ to reduce the range of $y_1(t)$, is obviously a function of $y(1), y(2), \ldots, y(t-1)$. Hence the fundamental requirement, stated previously for a range reducer by estimate substraction, is not violated.

It will be appreciated that the above arguments can be easily generalized to the vector case in which a linear predictor generates a vector-valued estimate of a certain number of components of $y(t)$, of which estimate a selected number of components are then subtracted from their corresponding components of $y(t)$ to yield their corresponding components of the input vector to the RNN.

Having introduced recurrent neural networks and disclosed many types range extenders and reducers, we are ready to explain in detail how each of the seven steps depicted in FIG. 4 is carried out in accordance with the teachings of the present invention.

Defining the Signal and Measurement Processes

The way to decide what signal process to use for neural filtering (i.e. using a neural filter for filtering) is sometimes different from that for Kalman filtering. The former is much simpler and more straightforward than the latter. Let us illustrate the difference by an example: Suppose that we want to estimate a scalar-valued process $x_1(t)$ that is the first component of a 4-dimensional Markov process described by, for $t=1,2, \ldots, T-1$, $$\begin{bmatrix} x_1(t+1) \\ x_2(t+1) \\ x_3(t+1) \\ x_4(t+1) \end{bmatrix} = \begin{bmatrix} 0 & 0 & 1 & 0 \\ 1 & 0 & 0 & 0 \\ 0 & 1 & 0 & 0 \\ 0 & 0 & 1 & 1 \end{bmatrix} \begin{bmatrix} x_1(t) \\ x_2(t) \\ x_3(t) \\ x_4(t) \end{bmatrix} + \begin{bmatrix} \xi_1(t) \\ \xi_2(t) \\ \xi_3(t) \\ \xi_4(t) \end{bmatrix}, \quad (27)$$

where $\xi(t)=[\xi_1(t), \xi_2(t), \xi_3(t), \xi_4(t)]^T$ is a standard 4-dimensional white Gaussian sequence with mean 0 and covariance $E[\xi(t_1)\xi^T(t_2)]=\delta_{t_1 t_2} I_4$, $I_4$ being the 4×4 identity matrix, and where the initial state $x(0)=x_0$ is a Gaussian random vector with mean 0 and covariance $\Sigma_0$ and statistically independent of $\xi(t)$ for all t. $\xi_{t_1 t_2}$ is the Kronecker delta, i.e. $\xi_{t_1 t_2}:=1$, if $t_1=t_2$, and $\xi_{t_1 t_2}:=0$ otherwise. Assume that the measurement process $y(t)$ is described by $y(t)=x_4(t)+\epsilon(t)$, where $\epsilon(t)$ is a scalar valued (or equivalently 1-dimensional vector-valued) white Gaussian sequence with mean 0 and variance 1 and statistically independent of the Markov process $x(t)$.

In applying the Kalman filter to estimating $x_1(t)$, we need to include all the four components of $x(t)$, $t=1, 2, \ldots, T$, in the signal process for Kalman filtering. Notice that the first 3 components, $x_1(t)$, $x_2(t)$ and $x_3(t)$, of $x(t)$ form a Markov process by themselves. Nevertheless, this Markov process can not be regarded as the signal process because its components do not enter the measurement process directly.

In fact in applying the Kalman filter or the extended Kalman filter, the signal process must be a Markov process that contain, as its components, all the processes (e.g. $x_1(t)$ in the above example) being estimated, all the processes (e.g. $x_4(t)$ in the above example) entering the measurement process directly, and all the processes (e.g. $x_2(t)$ and $x_3(t)$ in the above example) being required to make the signal process a Markov process.

However, in applying a neural filter, the signal process consists only of the processes (e.g. $x_i(t)$ in the above example) being estimated, whether a mathematical/statistical model in the form of (1) and (2) is available or not. The signal process for neural filtering has been and will continue to be denoted by $x(t)$, $t=1,2,\ldots,T$, whether a mathematical/statistical model such as (1) and (2) is available or not. If the mathematical/statistical model (1) and (2) is available, the Markov process (1), that is used as the signal process for Kalman filtering, is also denoted by $x(t)$, $t=1, 2, \ldots, T$, but the signal process $x(t)$ for neural filtering may consist of only some but not all of the components of the Markov process. Bearing this in mind, the dual use of the symbol $x(t)$ should not cause any confusion, especially since the context is written to make it clear which process the symbol $x(t)$ refers to.

The way to decide what measurement process to use for neural filtering is the same as that for Kalman filtering. Just include all or some of the variables, whose values are available and contain information about the signal process, in the measurement vector. The measurement process is the sequence of the measurement vectors over time.

Selecting an RNN paradigm (68 in FIG. 4)

An MLPWIN or MLPWOF paradigm is preferred for use in a neural filter, unless there is an application-related reason to indicate otherwise. In fact, two theorems, discovered and proven by the inventors, state that, if the RNN in a neural filter is either an MLPWIN with a single hidden layer of enough neurons or an MLPWOF with enough free feedbacks and a single hidden layer of enough neurons, and if the range extenders and reducers in the neural filter fulfill the aforestated fundamental requirements for range extenders and reducers, then the neural filter can generate an estimate $\hat{x}(t)$ of the signal $x(t)$, that approximates the minimum variance (or least-squares) estimate of $x(t)$ to any degree of accuracy over an arbitrary finite time interval. Here the MLPWOF is fully-forwardly-connected as shown in FIG. 8 and MLPWIN is both fully-forwardly-connected and fully-laterally-connected (i.e. with neurons in each hidden layer fully connected) as shown in FIG. 6. These RNNs will simply be said to be fully-connected. The activation function used in the MLPWIN or MLPWOF is a bounded and nondecreasing function, which is not a constant. The foregoing approximation accuracy is measured by the mean square error, $$(1/T) \sum_{t=1}^{T} E[\| E[x(t)|y(\tau), \tau = 1,2,\ldots,t] - \hat{x}(t) \|^2],$$

where the conditional expectation $E[x(t)|y(\tau), \tau=1, 2, \ldots, t]$ of the signal $x(t)$ given the measurements $y(\tau), \tau=1,2,\ldots,t$ is known to be the minimum variance estimate, and $\hat{x}(t)$ is the output vector of the filter and $\|\cdot\|$ denotes the Euclidean norm. The two theorems are proven under the assumption that the output process $\beta^L(t)$ of the RNN has finite second moments (i.e. $E[\|\beta^L(t)\|^2] < \infty$, $t=1,2,\ldots,T$) and the range of the values of the input process $\beta^0(t)$ to the RNN is bounded (i.e. $\|\beta^0(t)\| < B$, $t=1, 2, \ldots, T$, for some finite positive number B). This assumption poses little restriction on the application of the two theorems to real world problems.

Note that an RNN is a dynamic system, whose dynamic state is the activation levels of the neurons that are held for at least a unit time by the delay connections in the RNN. The output vector of the RNN is a function of not only the input vector and RNN weights, but also the dynamic state. Consequently, the sequence of output vectors depends on not only the sequence of input vectors and RNN weights but also the initial dynamic state. The aforementioned approximation accuracy of the filter, consisting of either an MLPWIN or MLPWOF and selected range extenders and reducers, can not be achieved by setting an arbitrary initial dynamic state for the RNN. The proofs of the foregoing theorems indicate that an initial dynamic state that can be used to achieve the said approximation accuracy is all the initial activation levels of the fedback nodes being equal to a number that every component of the input vector $\beta^0(t)$ to the RNN for $t=1, 2, \ldots, T$, has probability zero to equal. Such an initial dynamic state will be called a canonical initial dynamic state. Once a canonical initial dynamic state is chosen, it should be used consistently in both the training of the RNN together with selected range transformers and the operation of the resulting neural filter.

An alternative method to determine the initial dynamic state is to optimize it jointly with the adjustable weights of an RNN in the training of the NS. A method of training will be elaborated on in the sequel. This method usually results in a more parsimonious RNN, namely a smaller RNN for the same approximation accuracy. It is stressed that both methods, using a canonical initial dynamic state and optimizing the initial dynamic state in training an RNN together with selected range transformers, were discovered from the insight gained from the mathematical proofs of the foregoing two theorems.

The proofs of these two theorems also indicate respectively, a proper way to increase the size of an MLPWIN and a proper way to increase the size of an MLPWOF to achieve a higher degree of approximation accuracy in the process of synthesizing training data into a neural filter. Also, if fully-connected MLPWINs, with a bounded, nondecreasing, and nonconstant activation function, are the selected paradigm, one can start with training an MLPWIN with one layer of a reasonably small number of neurons and then training MLPWINs with gradually increasing numbers of neurons until the filtering performance of a MLPWIN is satisfactory or stops to improve significantly, whichever comes first. If fully-connected MLPWOFs with a bounded, nondecreasing, and nonconstant activation function are the selected paradigm, one can start with training an MLPWOF with one layer of a reasonably small number of neurons and a reasonably small number of free feedbacks. The number of neurons and the number of free feedbacks are then increased gradually and alternately until the filtering performance of the MLPWOF is satisfactory or stops to improve significantly, whichever comes first. Since only the number of neurons needs to be determined for an MLPWIN with a single layer of hidden neurons and both the number of neurons and the number of free feedbacks need to be determined for an MLPWOF with a single layer of hidden neurons, the former RNN is preferred to the latter RNN for constructing a neural filter, unless there is application-related reasons to indicate otherwise. Even when an RNN with a plurality of hidden layers is required, an MLPWIN is preferable, because a corresponding MLPWOF with the same MLP structure always has one more number to determine, that is the number of free feedbacks.

The foregoing approximation accuracy of a neural filter with a fully-connected MLPWIN or MLPWOF, with a bounded, nondecreasing and nonconstant activation function as a filter using an initial dynamic state prescribed above, can also be achieved by many other RNNs including the MLPWINs and MLPWOFs with more than one layer of neurons, the recurrent multilayer $\Sigma\Pi$ networks, the recurrent radial basis function networks with interconnected neurons (RRBFNWINs) and those with output feedbacks (RRBFNWOFs).

Note that the minimum variance filter can be looked upon at each time t as a function that assigns the minimum variance estimate $\hat{x}(t)$ to each measurement sequence $y(\tau)$, $\tau=1,2,\ldots,t$. If there is good reason to believe that the minimum variance filter, that we try to approximate with an NS, is a discontinuous or nearly discontinuous function, then RNNs with two or more layers of neurons are expected to need less numbers of neurons and connections (including both delayless connections and lateral delay connections) than do RNNs with one layer of neurons, to achieve the same filtering performance.

Generating training data (72 in FIG. 4)

In the literature on neural networks, a typical set of training data for training a neural network consists of exemplary pairs of input and output of a function or dynamic system that the neural network is trained to approximate. The outputs in the pairs are called target or desired outputs, because they are the values to be approximated by the actual neural network outputs as closely as practically possible, for the given neural network architecture. Neural systems herein considered, that are to serve as filters, are supposed to output estimates of the signal process, but not the signal process itself. Hence, if the conventional way of generating training data is followed, the output exemplars (or target outputs) to be included in the training data should be the optimal estimates with respect to an estimation error criterion. However, before a filter in accordance with the present invention is obtained, such optimal estimates are usually difficult, if not impossible, to acquire when the ranges of the signal and/or measurement processes are large. It has been stressed that this difficulty was the motivation for the present invention. Hence one must use some unconventional training data to achieve the approximation accuracy discussed early on.

Fortunately, it has been discovered and proven that if the realizations of the signal process are used as the target outputs instead of the estimates of these realizations in the training data, a neural system can be trained to approximate the optimal filter to any degree of accuracy that is possible for the given neural system architecture. This allows us to use, as training data, realizations of the measurement process and corresponding realizations of the signal process, which can be relatively easily generated by computer simulation or actual experiment, depending on whether a faithful mathematical/statistical model is available or not. The definition of a realization of the signal process and the definition of the corresponding realization of the measurement process were given previously. To illustrate these definitions in detail, we will show how said realizations are constructed from the mathematical/statistical model, (1) and (2), in the following, assuming that the Markov process (1) is the signal process for neural filtering: First, a pseudo-random number generator is used to generate a sequence of vector values of $\xi(t)$, $t=1, 2, \ldots, T$, and a sequence of vector values of $\epsilon(t)$, $t=1, 2, \ldots, T$ in accordance with their respective probability distributions. These sequences are called realizations of the stochastic processes, $\xi(t)$ and $\epsilon(t)$, and are denoted by $\xi(t, 1)$ and $\epsilon(t, 1)$, $t=1, 2, \ldots, T$, respectively, where the second argument 1 denotes the first such realization. Second, a pseudo-random number generator is used to generate a vector value of $x(1)$, in accordance with the probability distribution of $x_1$. This vector value is called a realization of $x(1)$ and is denoted by $x(1, 1)$, where the second argument 1 denotes again the first such realization. Third, substituting $x(1, 1)$ and $\xi(1, 1)$ for $x(t)$ and $\xi(t)$ in (1) yields $x(2, 1)$ and substituting $x(1, 1)$ and $\epsilon(1, 1)$ for $x(t)$ and $\epsilon(t)$ in (2) yields $y(1, 1)$, where the second arguments in $x(1, 1)$ and $y(1, 1)$ both indicate the first such realizations. Continuing the substitutions in this fashion, two sequences of vector values, $x(t, 1)$ and $y(t, 1)$, $t=1, 2, \ldots, T$, are obtained, which are called the first realization of the Markov process and the corresponding realization of the measurement process. Fourth, repeating the foregoing three steps, we obtain the second realizations, $x(t, 2)$ and $y(t, 2)$, $t=1, 2, \ldots, T$. If the first three steps above are repeated a certain number of times, we obtain a set of training data, $(y(t, w), x(t, w))$, $t=1, 2, \ldots, T$, $\omega \in S$, where $\omega$ is called the sample index and S is a set of positive integers, $1,2,\ldots,\#S$. Here $\#S$ denotes the number of elements in S. If the signal process for neural filtering consists of some but not all of the components of the above Markov process $x(t)$, $t=1, 2, \ldots, T$, then the realizations of those components of $x(t)$ that are not included in the signal process are purged from the training data and the remaining realizations of the signal process are also denoted by $x(t,\omega)$, $t=1,2,\ldots,T$, $\omega \in S$. This dual use of the symbol x should not cause any confusion, because the context always makes it clear whether x refers to the signal process for neural filtering or to the Markov process described by (1), which is the signal process for Kalman filtering. If a mathematical/statistical model of the signal and measurement processes is unavailable, realizations of these processes are obtained by performing actual experiments with these processes and recording both the consecutive values of the signal process and the corresponding consecutive values of the measurement process resulting in each experiment.

In general, a training data set is a group of finite sequences of the (measurement, signal) pairs, which are denoted by $(y(t,\omega), x(t,\omega))$, $t=1, 2, \ldots, T$, parametrized by the sample index w. The totality of $\omega$ in the training data set is denoted by S. It is assumed that the sequences have the same length and that their length is the same as the length of the time interval over which filtering is performed. These assumptions are made here to simplify our discussion and are not required in training RNNs together with selected range transformers into filters. When the measurement vectors, $y(t,\omega)$, $t=1, 2, \ldots, T$, for a fixed $\omega$ are received, at the input terminals of a neural system (including an RNN and range transformers) under training, one at a time consecutively for $t=1, 2, \ldots, T$, each of the vectors, $y(t,\omega)$, is processed by the neural system and an output vector appears at its output terminals at each time $t=1,2,\ldots,T$. The output vector at time t is the neural system's estimate of $x(t,\omega)$, and is denoted by $\hat{x}(t, \omega, w, v)$, where w denotes the totality of all the adjustable weights of the NS and v denotes its initial dynamic state at $t=0$. Including w and v as arguments of $\hat{x}(t,\omega,w,v)$ stresses that the output vector is a function of w and v as well as a function of $y(\tau,\omega)$, $\tau=1, 2, \ldots, t$.

It is appropriate to note here that a training data set should be small to make the step of synthesizing training data into a filter easy, but a more important consideration is that the training data set should be sufficiently large to reflect the probability distribution of the signal and measurement processes.

Selecting an estimation error criterion, an ancillary signal process, etc. (70 in FIG. 4)

There are many types of estimation error criterion. Each can be used to construct a type of training criterion for training a neural system into a filter. However, only three types of estimation error criterion and their corresponding training criteria will be herein stated. For each type, a set of estimation error statistics will be described and an ancillary signal process will be defined, of which the estimation provides approximate values of the estimation error statistics. In the following, it is assumed that a training data set is available, which consists of realizations, (y(t, ω), x(t, ω)), t=1, 2, ..., T, ω∈S, of the measurement and signal processes, y(t) and x(t). This training data set will sometimes be referred to as the primary training data set, to avoid confusion with another training data set to be defined.

The most commonly used estimation error criterion is undoubtedly the mean square error $E[\|x(t)-\hat{x}(t)\|^2]$, where $\hat{x}(t)$ is an estimate of a signal process x(t) to be estimated, the estimate being a function of y(1), y(2), ..., y(t). When the criterion is minimized, $\hat{x}(t)$ is called the minimum variance (or least-squares) estimate of x(t). Based on this estimation error criterion, the corresponding training criterion, which incorporates the given training data set and is also called the mean square error criterion, is $$Q(w,v) = \frac{1}{T(\#S)} \sum_{\omega \in S} \sum_{t=1}^{T} \|x(t,\omega) - \hat{x}(t,\omega,w,v)\|^2, \quad (28)$$

where #S is the number of elements in the sample set S, ω is the sample index, v is the initial dynamic state of the RNN in the neural system under training, x(t,ω) is the target output at t, and $\hat{x}(t, \omega, w, v)$ is the output of the neural system, whose adjustable weights are denoted by w. We stress that $\hat{x}(t,\omega, w, v)$ is the output vector at t of the neural system, which started with the RNN's initial dynamic state v at t=0, and which has received, at its input terminals, the measurement vector sequence y(τ, ω), τ=1, 2, ..., t, one at a time in the given order.

Assume that a signal process x(t) is to be estimated with respect to the mean square error and the conditional error covariance of the estimate given the past and current measurements, y(τ), τ=1, 2, ..., t, is the estimation error statistics required. Assume also that a given training data set has been synthesized into a primary filter with respect to Q(w, v), using one of the training methods to be described later on. Denoting the process that the primary filter outputs by $\hat{x}(t)$, we call $V(t):=(x(t)-\hat{x}(t))(x(t)-\hat{x}(t))^T$ an ancillary signal process (":=" denotes "is defined to be"). Hence, the required conditional error covariance of the estimate $\hat{x}(t)$ is the conditional expectation E[V(t)|y(1), y(2), ..., y(t)] of V(t) given the past and current measurements, y(1), y(2), ..., y(t). This conditional expectation is the minimum variance estimate of V(t) minimizing $E[\|V(t)-\hat{V}(t)\|_F^2]$, where $\hat{V}(t)$ is an estimate of v(t) and $\|\cdot\|_F$ denotes the sum of squares of all the entries of the enclosed matrix.

Figure 23:
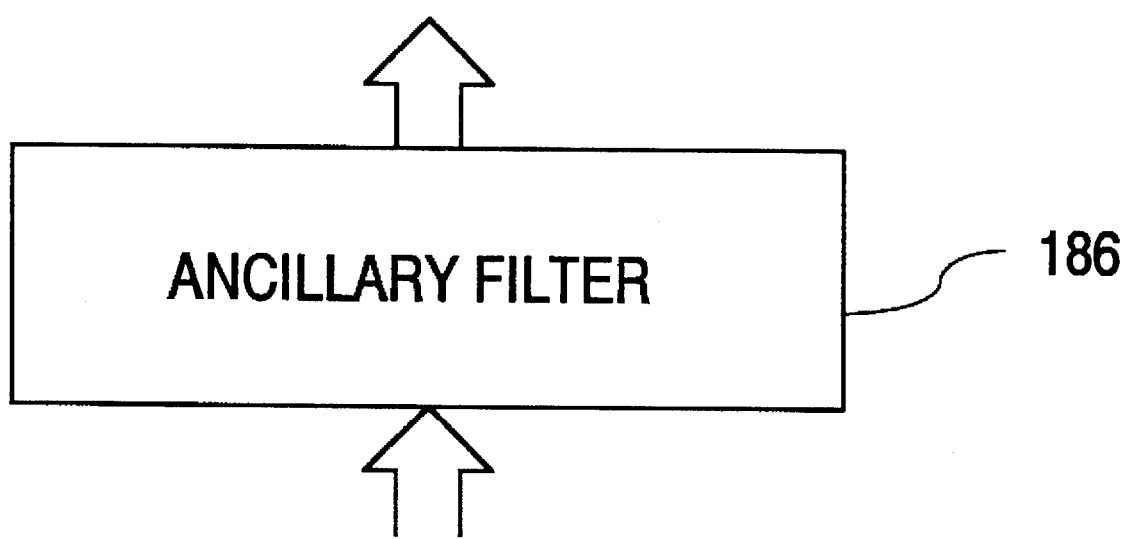
FIG. 23 is a schematic diagram of an ancillary filter.

To obtain a neural filter for estimating the ancillary signal process V(t) with respect to $E[\|V(t)-\hat{V}(t)\|_F^2]$, a corresponding training criterion is defined as $$Q_1(w,v) = \frac{1}{T(\#S)} \sum_{\omega \in S} \sum_{t=1}^{T} \|V(t,\omega) - \hat{V}(t,\omega,w,v)\|_F^2, \quad (29)$$

where $\|\cdot\|_F^2$ denotes the sum of squares of all the entries of the enclosed matrix, and $\hat{V}(t, \omega, w, v)$ denotes the output matrix of the neural system with adjustable weights w and initial dynamic state v. This training criterion is called an ancillary training criterion. Furthermore, a training data set for synthesizing the neural filter is constructed as follows: Use the primary filter to generate $\hat{x}(t,\omega)$, t=1, 2, ..., T, for each measurement sequence y(t,ω), t=1, 2, ..., T in the primary training data set. Compute the corresponding realization $V(t, \omega):=(x(t,\omega)-\hat{x}(t,\omega))(x(t,\omega)-\hat{x}(t,\omega))^T$, t=1, 2, ..., T of the ancillary signal process V(t) for each ω∈S. Then the training data set consists of (y(t,ω), V(t,ω)), t=1,2,...,T and ω∈S, where y(t,ω) and V(t,ω) are the input sequence and the corresponding target (or desired) output sequence respectively. This training data set is called an ancillary training data set. A neural filter resulting from synthesizing such an ancillary training data set is called an ancillary filter and must have m input terminals to receive the measurements y(t) and $n^2$ output terminals to send out an estimate $\hat{V}(t)$ of the ancillary signal process V(t). Recall that m and n are the dimensions of y(t) and x(t) respectively. $\hat{V}(t)$ is the desired estimation error statistics. A shematic diagram of this ancillary filter 186 is given in FIG. 23. It will be appreciated that we can use only part of the entries of V(t) (e.g. the diagonal entries) as the ancillary signal process, and synthesize an ancillary filter to estimate this ancillary signal process.

Figure 17:
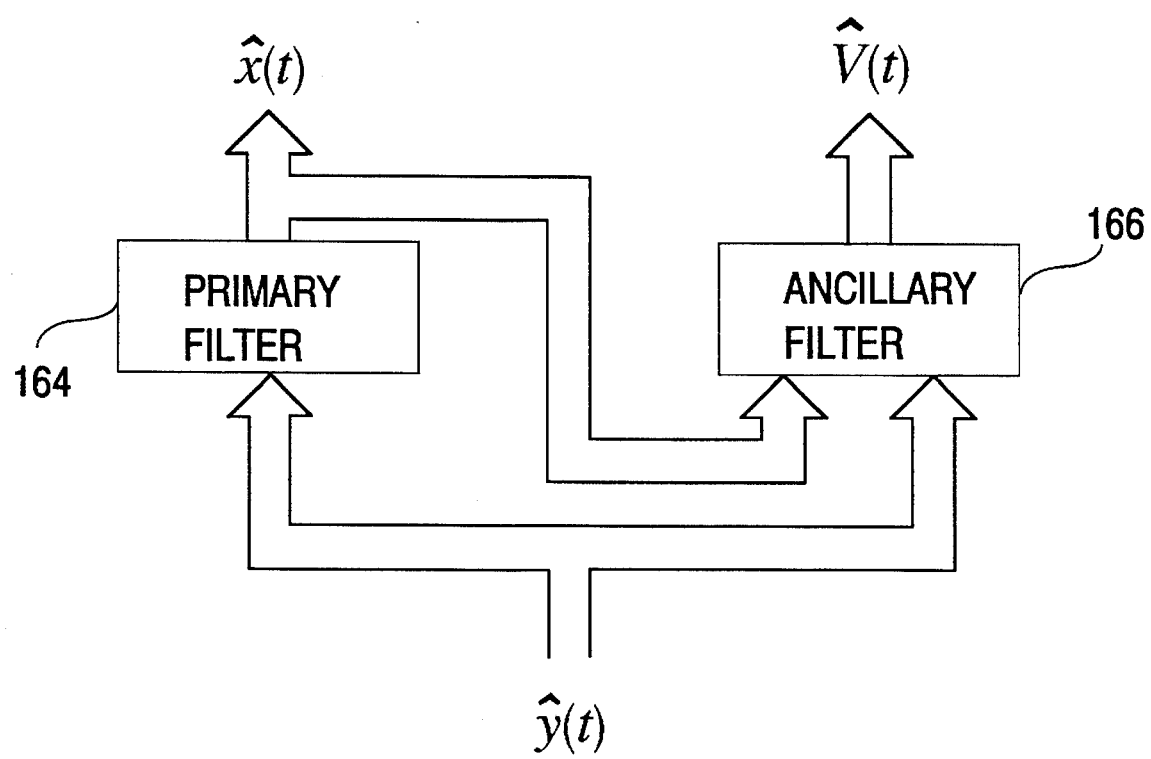
FIG. 17 shows one way that a primary filter and an ancillary filter are connected. It will be appreciated that the two filters may share the same input nodes for the measurement vector y(t).

An alternative ancillary training data set can be used. It consists of the realizations, V(t,ω), t=1, 2, ..., T, ω∈S as the target output sequences, and the corresponding sequences (y(t,ω), $\hat{x}(t,\omega)$), t=1, 2, ..., T, ω∈S as the input sequences. If this alternative ancillary training data set is used, the ancillary filter should have m+n input terminals, where m and n are the dimensions of y(t) and $\hat{x}(t)$ respectively. In operation, these trained primary 164 and ancillary 166 filters are connected as shown in FIG. 17. The output $\hat{x}(t)$ of the primary filter at time t is fed into the ancillary filter at the same time, without a unit time delay. The ancillary filter processes its inputs $\hat{x}(t)$ and y(t) and produces $\hat{V}(t)$ as the filter's output at time t.

A problem with the mean square error criterion is that the signal outliers in the training data set tend to have undesirably large impact on the training results. An alternative training criterion is based on the well known mean absolute deviation $$\sum_{i=1}^{n} E[|x_i(t) - \hat{x}_i(t)|],$$

where $\hat{x}_i(t)$ is an estimate of the ith component $x_i(t)$ of a signal process x(t). The alternative training criterion, also called mean absolute deviation criterion, is written $$D(w,v) = \frac{1}{T(\#S)} \sum_{\omega \in S} \sum_{t=1}^{T} \sum_{i=1}^{n} |x_i(t,\omega) - \hat{x}_i(t,\omega,w,v)|, \quad (30)$$

where |·| denotes the absolute value and the other symbols are defined as for Q(w, v) above.

Assume that a signal process x(t) is to be estimated with respect to the mean absolute deviation criterion, and that the conditional mean absolute deviation of the estimate given the past and current measurements, y(τ), τ=1, 2, ..., t, is the estimation error statistics required. Assume also that a given training data set has been synthesized into a primary filter with respect to D(w, v), using one of the training methods to be described later on. Denoting the process that the primary filter outputs by $\hat{x}(t)$, we call $V(t):=(|x_1(t)-\hat{x}_1(t)|,|x_2(t)-\hat{x}_2(t)|, ...,|x_n(t)-\hat{x}_n(t)|)$ an ancillary signal process (":=" denotes "is defined to be"). The required conditional mean absolute deviation of the estimate $\hat{x}(t)$ is the minimizer of $$E\left[\sum_{i=1}^{n} |V_i(t) - \hat{V}_i(t)|\right]$$

over all the functions $\hat{V}(t)$ of the past and current measurements, y(1), y(2), ..., y(t). In other words, the required conditional mean absolute deviation is the optimal estimate of the ancillary signal process V(t) with respect to the estimation error criterion $$E\left[\sum_{i=1}^{n} |V_i(t) - \hat{V}_i(t)|\right].$$

To obtain a neural filter for estimating the ancillary signal process V(t) with respect to $$E\left[\sum_{i=1}^{n} |V(t) - \hat{V}(t)|\right],$$

a corresponding training criterion is defined as $$D_1(w,v) = \frac{1}{T(\#S)} \sum_{\omega \in S} \sum_{t=1}^{T} \sum_{i=1}^{n} |V_i(t,\omega) - \hat{V}_i(t,\omega,w,v)|, \quad (31)$$

where $\hat{V}(t, \omega, w, v)$ denotes the output vector of the neural filter with adjustable weights w and initial dynamic state v. This training criterion is called an ancillary training criterion. Furthermore, a training data set for synthesizing the neural filter is constructed as follows: Use the primary filter to generate $\hat{x}(t,\omega)$, t=1, 2, ..., T, for each measurement sequence y(t,ω), t=1, 2, ..., T in the primary training data set. Compute the corresponding realization $V(t,\omega) := (|x_1(t,\omega) - \hat{x}_1(t,\omega)|, |x_2(t,\omega) - \hat{x}_2(t,\omega)|, ..., |x_n(t,\omega) - \hat{x}_n(t,\omega)|)$, t=1, 2, ..., T of the ancillary signal process V(t) for each ω∈S. Then the training data set consists of (y(t,ω),V(t,ω)), t=1,2, ...,T and ω∈S, where y(t,ω) and V(t,ω) are the input sequence and the corresponding target (or desired) output sequence respectively. This training data set is called an ancillary training data set. A neural filter resulting from synthesizing such an ancillary training data set is called an ancillary filter and must have m input terminals to receive the measurements y(t) and n output terminals to send out an estimate $\hat{V}(t)$ of the ancillary signal process V(t). Recall that m and n are the dimensions of y(t) and x(t) respectively. $\hat{V}(t)$ is the desired estimation error statistics. A shematic diagram of this ancillary filter 186 is given in FIG. 23. It will be appreciated that we can use only part of the entries of V(t) as the ancillary signal process and synthesize an ancillary filter to estimate this ancillary signal process.

An alternative ancillary training data set can be used. It consists of the realizations, V(t,ω), t=1,2, ..., T, ω∈S as the target output sequences and the corresponding sequences (y(t,ω), $\hat{x}$(t,ω)), t=1, 2, ..., T, ω∈S as the input sequences. If this alternative ancillary training data set is used, the ancillary filter should have m+n input terminals, where m and n are the dimensions of y(t) and $\hat{x}$(t) respectively. In operation, these trained primary 164 and ancillary 166 filters are connected as shown in FIG. 17. The output $\hat{x}$(t) of the primary filter at time t is fed into the ancillary filter at the same time without a unit time delay. The ancillary filter processes its inputs $\hat{x}$(t) and y(t), and produces $\hat{V}$(t) as the filter's output at time t.

It is appropriate to note here that the two theorems stated early on and the ensuing discussion on them are valid if the mean square error and the minimum variance estimate (i.e. conditional mean) in the theorem statements and discussion are replaced by the mean absolute deviation and the minimum mean absolute deviation estimate (i.e. the conditional median) respectively. This extension of the two theorems can be proven under the assumption that the output process $\beta^L(t)$ of the RNN in the neural filter has a finite $L_1$ norm $$\left(\text{i.e. } E\left[\sum_{i=1}^{n} |\beta_i^L(t)|\right] < \infty, t = 1, 2, ..., T\right)$$

and the range of the values of the input process $\beta^0(t)$ of the same RNN is bounded $$(\text{i.e. } \sum_{i=1}^{m} |\beta_i^0(t)| < B, t = 1, 2, ..., T,$$

for some positive number B).

An interesting estimation error criterion that combines the mean square error and the mean absolute deviation is the mean Huber's error $$\sum_{i=1}^{n} E[\rho(x_i(t) - \hat{x}_i(t))],$$

where $\rho(u)=u^2$, if $|u| \leq M$ and $\rho(u)=2M|u|-M^2$, if $|u|>M$ for the scalar variable u and some prechosen positive number M. Based on the mean Huber's error, a robust training criterion is written $$H(w,v) = \frac{1}{T(\#S)} \sum_{\omega \in S} \sum_{t=1}^{T} \sum_{i=1}^{n} E[\rho(x_i(t,\omega) - \hat{x}_i(t,\omega,w,v))], \quad (32)$$

where symbols other than ρ are defined as for Q(w, v). H(w, v) will also be called mean Huber's error criterion. The training criterion H(w, v) is twice differentiable except where $\rho=M^2$. Many of the optimization methods involving differentiation can be applied to it.

Assume that a signal process x(t) is to be estimated with respect to the mean Huber's error criterion, and the conditional mean Huber's error of the estimate, given the past and current measurements, y(τ), τ=1, 2, ..., t, is the estimation error statistics required. Assume also that a given training data set has been synthesized into a primary filter with respect to H(w, v), using one of the training methods to be described later on. Denoting the process that the primary filter outputs by $\hat{x}$(t), we call $V(t):=(\rho(x_1(t)-\hat{x}_1(t)),\rho(x_2(t)-\hat{x}_2(t)), ..., \rho(x_n(t)-\hat{x}_n(t)))$ an ancillary signal process (":=" denotes "is defined to be"). The required conditional mean Huber's error of the estimate $\hat{x}$(t) is the minimizer of $$\sum_{i=1}^{n} E[\rho(V_i(t) - \hat{V}_i(t))]$$

over all the functions $\hat{V}_i(t)$ of the past and current measurements, y(1), y(2), ..., y(t). In other words, the required conditional mean Huber's error is the optimal estimate of the ancillary signal process V(t) with respect to the estimation error criterion $$\sum_{i=1}^{n} E[\rho(V_i(t) - \hat{V}_i(t))].$$

To obtain a neural filter for estimating the ancillary signal process V(t) with respect to $$\sum_{i=1}^{n} E[\rho(V(t) - \hat{V}(t))],$$

a corresponding training criterion is defined as $$H_1(w,v) = \frac{1}{T(\#S)} \sum_{\omega \in S} \sum_{t=1}^{T} \sum_{i=1}^{n} \rho(V_i(t,\omega) - \hat{V}_i(t,\omega,w,v)), \quad (33)$$

where $\hat{V}(t,\omega,w,v)$ denotes the output vector of the neural filter with adjustable weights w and initial dynamic state v. This training criterion is called an ancillary training criterion. Furthermore, a training data set for synthesizing the neural filter is constructed as follows: Use the primary filter to generate $\hat{x}$(t,ω), t=1,2, ...,T, for each measurement sequence y(t,ω), t=1,2, ...,T in the primary training data set.

Compute the corresponding realization $V(t,\omega):=(\rho(x_1(t,\omega)-\hat{x}_1(t,\omega)), \rho(x_2(t,\omega)-\hat{x}_2(t,\omega)), \ldots, \rho(x_n(t,\omega)-\hat{x}_n(t,\omega))), t=1,2, \ldots, T$ of the ancillary signal process $V(t)$ for each $\omega \in S$. Then the training data set consists of $(y(t,\omega), V(t,\omega)), t=1, 2, \ldots, T$ and $\omega \in S$, where $y(t,\omega)$ and $V(t, \omega)$ are the input sequence and the corresponding target (or desired) output sequence respectively. This training data set is called an ancillary training data set. A neural filter resulting from synthesizing such an ancillary training data set is called an ancillary filter and must have m input terminals to receive the measurements $y(t)$ and n output terminals to send out an estimate $\hat{V}(t)$ of the ancillary signal process $V(t)$. Recall that m and n are the dimensions of $y(t)$ and $x(t)$ respectively. $\hat{V}(t)$ is the desired estimation error statistics. A shematic diagram of this ancillary filter 186 is given in FIG. 23. It will be appreciated that we can use only part of the entries of $V(t)$ as the ancillary signal process and synthesize an ancillary filter to estimate this ancillary signal process.

An alternative ancillary training data set can be used. It consists of the realizations, $V(t,\omega), t=1, 2, \ldots, T, \omega \in S$ as the target output sequences and the corresponding (measurement, signal estimate) pair realizations, $(y(t,\omega), \hat{x}(t, \omega)), t=1,2, \ldots, T, \omega \in S$, as the input sequences. If this alternative ancillary training data set is used, the ancillary filter should have m+n input terminals, where m and n are the dimensions of $y(t)$ and $\hat{x}(t)$ respectively. In operation, these trained primary 164 and ancillary 166 filters are connected as shown in FIG. 17. The output $\hat{x}(t)$ of the primary filter at time t is fed into the ancillary filter at the same time without a unit time delay. The ancillary filter processes its inputs $\hat{x}(t)$ and $y(t)$ and produces $\hat{V}(t)$ as the filter's output at time t.

It is appropriate to note here that the two theorems stated early on, and the ensuing discussion on them are valid if the mean square error and the minimum variance estimate in the theorem statements and ensuing discussion are replaced by the mean Huber's error and minimum mean Huber's error estimate respectively. This extension of the two theorems can be proven under the assumption that the output process $\beta^L(t)$ of the RNN in the neural filter satisfies $$E\left[\sum_{i=1}^{n} \rho(\beta_i^L(t))\right] < \infty, t=1,2,\ldots,T,$$

and the ranges of the values of the input process $\beta^0(t)$ of the same RNN is bounded $$(\text{i.e. } \sum_{i=1}^{m} \rho(\beta_i^0(t)) < B, t=1,2,\ldots,T,$$

for some finite number B).

There are many other types of estimation error criterion used in statistics and information theory. Each can be used to construct a type of training criterion. It will be appreciated that the primary and ancillary training criteria in one application do not have to be of the same type.

Selecting Range Extenders and/or Reducers (74 in FIG. 4)

Recall that a primary filter and an ancillary filter are each referred to as a neural filter. We will, in the following, refer to a signal process $x(t)$ and an ancillary signal process $V(t)$ each as a target (or desired) output process of a neural filter, and refer to a measurement process $y(t)$ and a (measurement, signal estimate) pair process $(y(t), \hat{x}(t))$ each as an input process to a neural filter.

If the input and/or target output processes of a neural filter under design have large and/or expanding ranges, range transformers can be built into the neural filter to alleviate the size requirements of the RNN and training data set, and alleviate the associated difficulty in training. Moreover, range transformers can greatly enhance the generalization capability of a neural filter in such signal/measurement environments. Sometimes, a range transformer is used simply to achieve the purpose of reducing the approximation capability required of the RNN, without necessarily reducing the valid input or output range required of the RNN.

However, range extenders and reducers may have a high cost. For instance, if the RNN in the neural filter is implemented on an analog neural network chip (e.g. Intel's 80170NX ETANN), the range extenders may have to be implemented in a separate digital computing device or the like, incurring extra cost. Digital computing devices are most suitable for the implementation of the range extenders and reducers, because they are used to deal with large and/or expanding ranges, which analog devices are inadequate to deal with with high accuracy.

There are three ways to examine the possible range of a component of an input or target output process of a neural filter. This component will now be referred to as the component process. First, we consider the physical meaning of the component process, which is usually sufficient for us to determine whether the range of the component process is large and/or expanding. For instance, the longitude and latitude of an ocean-going ship or a long range airplane usually have large and expanding ranges. On the other hand, the grey level of a pixel in a thermal imagery usually has a small and bounded range. Second, we analyze the dynamic equation (if it exists) that governs the evolution of the component process. For instance, if the dynamic equation is not BIBO (bounded-input-bounded-output) stable, the range of the component process is not even bounded in the long run. On the other hand, if the dynamic equation has a global attractor, which is super stable, the range of the component must be bounded, provided the perturbation term in the dynamic equation is also bounded. In this case, the bound of the component process can sometimes be determined from the bound of the perturbation. Third, we examine the realizations of the component process in the training data set. If some of the these realizations have a large range or have a tendency to grow, then the range of the component process should be regarded as large and/or expanding.

The adjective, "large," is, of course, a relative term. It has a lot to do with the "resolution" of the component process, that we are concerned with. For instance, if we want to estimate the location of a ship to within a standard error of 10 feet, a range of 10 miles is "very large." However, if we only want to estimate the ship location to within a standard error of ½ mile, the range of 10 mile is not large at all.

After examining the possible range of a component process, if we still have some doubt as to whether the range should be regarded as large, we can check if there is sufficient difference in performance between neural filters with and without a range extender or reducer for the component process to justify building such a range extender or reducer into the neural filter.

Recall that a purpose of a range extender by estimate addition is to reduce the valid output range required of an output node of the RNN in a neural system and, with the aid of a range extender by estimate addition, the valid output range required is the range of the difference, at each time point, between the target output of the output node and the auxiliary estimate generated by the auxiliary estimator in the range extender. Hence this range of the difference is a good measurement of performance for a range extender by estimate addition. Recall also that the purpose of a range reducer by estimate subtraction is to reduce the valid input range (or valid domain) required of an input node of the RNN in a neural system and, with the aid of a range reducer by estimate addition, the valid input range required is the range of the difference, at each time point, between the corresponding input to the neural system and the auxiliary estimate generated by the auxiliary estimator in the range reducer. Hence this range of the difference is a good measure of performance for a range reducer by estimate subtraction.

If the input process to the auxiliary estimator in a range extender or reducer is only part or all of the input process to a neural system, it is straightforward to evaluate the performance of the range extender or reducer. For instance, the auxiliary estimators used in range extenders by feedforward linear estimation and by feedforward Kalman filtering, and the auxiliary estimators used in range reducers by differencing and by linear prediction all input part or all of the input process of a neural system and nothing else. To evaluate the performance of such an auxiliary estimator and thus the range extender or reducer that it serves, all that needs to be done is to apply the auxiliary estimator to the realizations of the part or all of the input process of the neural filter under design, that are available in the training set, compute the estimation errors (i.e. $x_1(t, \omega) - \hat{x}_i(t, \omega)$ or $y_i(t, \omega) - \hat{y}_i(t, \omega)$) of the resulting estimates, and then examine the range of these errors, which is the desired measure of performance. Note that such an evaluation can be done before we start to train any neural systems.

If the input process to the auxiliary estimator in a range extender or reducer involves the outputs of the neural system, a thorough evaluation of the performance of the range extender or reducer requires training the neural system first. The auxiliary estimator used in the range extenders by accumulation, by linear prediction, and by Kalman filtering, and the auxiliary estimators used in the range reducers by model-aided prediction all involves the outputs of the neural system in their (i.e. the auxiliary estimators') inputs.

Since training a neural system involves a great deal of computation, a method of evaluating the performance of such a range extender or reducer without first training a neural system is highly desirable, even if the method does not produce a perfectly accurate results. We will now look at such a method. Suppose that a good neural filter has been found and has a good filtering performance. Then the (actual) output process of the neural filter is closely approximated by its target output process. Hence a good approximate of the output process of an auxiliary estimator, whose input process involves the output process of the neural filter, can be obtained by replacing this output process of the neural filter with its target output process for the inputing of the auxiliary estimator. This method will be called a bootstrap method and usually provides an adequate measure of performance. For instance, if a primary filter is under design, the range of $x_i(t, \omega) - x_i(t-1, \omega)$, $t=2, 3, \ldots, T, \omega \in S$ is thus used as an approximate of the range of $x_i(t,\omega) - \hat{x}_i(t-1,\omega)$, $t=2, 3, \ldots, T, \omega \in S$, in checking if a range extender by accumulation is effective for the component process $x_i(t)$. To check if a range extender by linear prediction is effective for a primary filter, we examine the range of $$x_i(t,\omega) - \sum_{j=1}^{J} c_j x_i(t-j,\omega), t=J+1, J+2, \ldots, T, \omega \in S,$$

where J is the order of linear prediction. To check if a range extender by Kalman filtering is effective for a primary filter, we examine the range of $x_i(t,\omega) - \tilde{x}_i(t,\omega)$, $t=1,2,\ldots,T, \omega \in S$, where $\tilde{x}_i(t,\omega)$ are generated by equations (20)–(25) using $y(t,\omega)$ as the measurements and $x(t-1, \omega)$ instead of $\hat{x}(t-1, \omega)$ in those equations, as an approximate of the range of $x_i(t,\omega) - \hat{x}_i(t,\omega)$, $t=1,2, \ldots, T, \omega \in S$, where $\hat{x}_i(t,\omega)$ are generated by the original equations (20)–(25). To check if a range reducer by model-aided prediction is effective for a primary filter, we examine the range of $x_i(t,\omega) - h_i(f(x(t-1, \omega), t-1), t)$, $t=2, 3, \ldots, T, \omega \in S$.

However, if a thorough evaluation of a range extender or reducer, whose inputs involve the neural system outputs, is needed, then the training of neural systems is indispensible. Algorithms for training neural systems are provided in the sequel. To minimize computation involved in training, the evaluation and selection of range transformers, and the training of neural systems should be coordinated carefully. We use a fixed RNN architecture, whose size is believed large enough to incur negligible filtering errors, in evaluating and selecting range transformers. We determine the RNN architecture to be eventually used in the neural filter only after range transformers are selected. The foregoing bootstrap method can be first used to narrow down the types of range transformer for a more thorough evaluation. Here range extenders by linear prediction of different orders are considered as different types. Every time a neural system is trained, one or more types of range transformers are evaluated. The adjustable weights and initial dynamic state of the RNN of the given fixed architecture, resulting from training a neural system, can be used as initial values of the same weights and initial dynamic state for training the next neural system of the same RNN architecture so as to minimize computation costs.

The final selection of range extenders and reducers for a large RNN architecture is made in consideration of the computational and implementational costs of the range transformers, and, of course, the filtering performance of the neural filter in order to optimize the cost-effectiveness of the neural filter.

In the following, we will provide methods of training neural systems of various architectures and discuss the selection of an RNN architecture for use in the neural filter. It should be appreciated that the tradeoff between the RNN performance and the performances of the range transformers must be taken into consideration in the final selection of the RNN and range transformers that constitute the neural filter. Some more evaluations of range transformers may be necessitated by the trade-off consideration. The final selection is made to achieve the maximum cost effectiveness of the neural filter.

Synthesizing Training Data into a Primary and, if Required, an Ancillary Filter

Neural network training and synthesis are well-established concepts in the open literature, where there are many training and synthesis methods and techniques available. Here we present only those that we now prefer. The scope of the present invention should not be limited by them.

Synthesizing training data into a primary (or respectively an ancillary) filter usually comprises training and testing at least one neural system with an RNN from a selected RNN paradigm and with selected at least one range transformer, until the filtering performance of a neural filter with respect to the selected estimation error criterion (or respectively the selected ancillary estimation error criterion) is satisfactory or can not be significantly improved by increasing the size of the NS, whichever comes first, and then selecting a trained neural system as the primary (or respective ancillary) filter in consideration of network size versus filtering accuracy to optimize the cost-effectiveness. Sometimes trade-off between the RNN performance and the performances of the range transformers is considered and the training of neural systems with different combinations of the RNN size and the range transformer types is performed.

Figure 24:
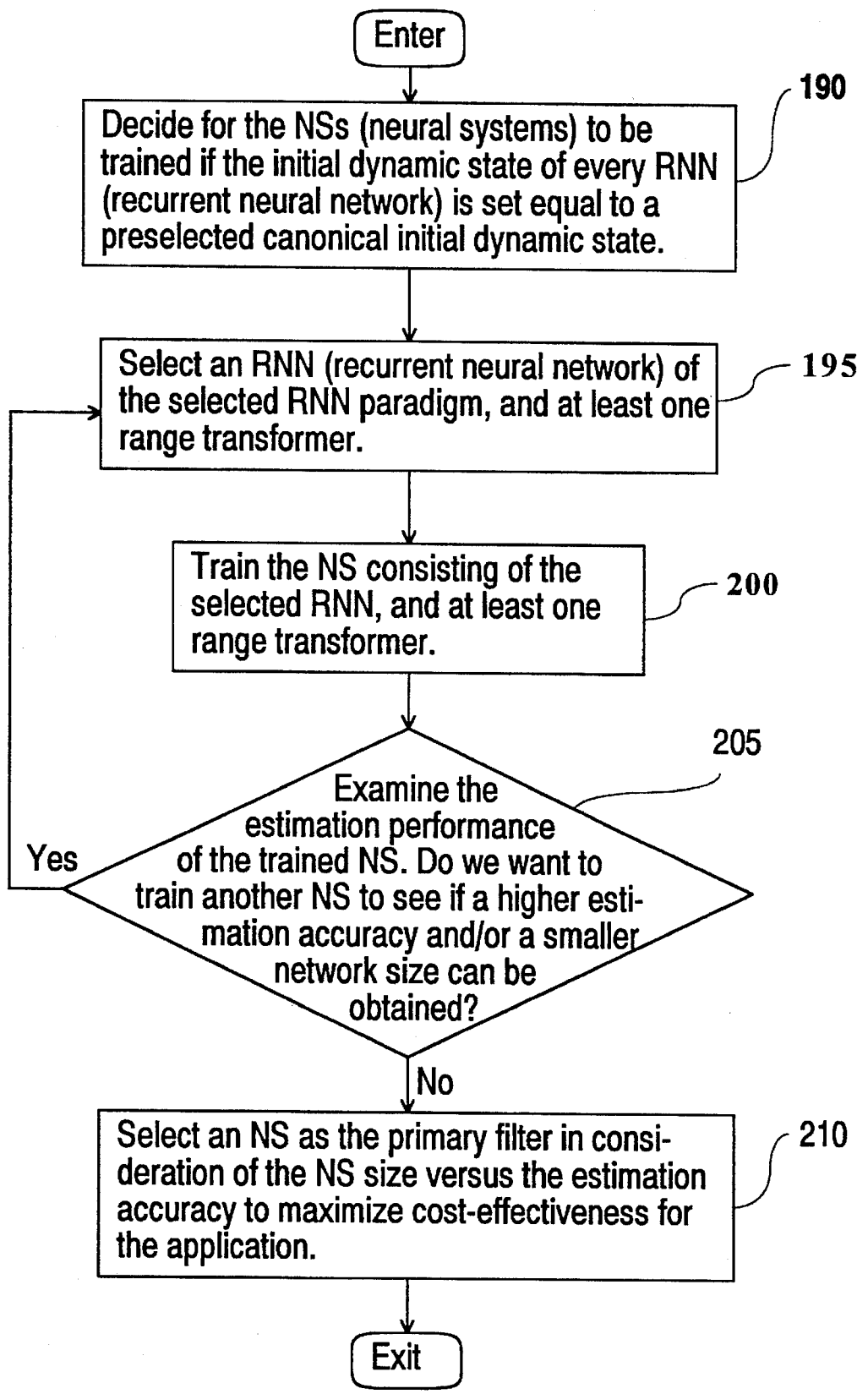
FIG. 24 is a block diagram showing typical iterative procedure taken in synthesizing training data into a primary filter.

Typical iterative procedures taken in synthesizing training data into a primary filter are shown in FIG. 24. We first decide 190 if the initial dynamic state of every RNN to be trained is set equal to a preselected canonical initial dynamic state. We then select 195 an RNN of the selected RNN paradigm, and at least one range transformer. An NS comprising the selected RNN and at least one range transformer is then trained 200 by one of the methods or procedures to be discussed in more detail. We then examine the estimation performance of this trained NS and decide 205 if we want to train another NS to see whether a higher estimation accuracy and/or a smaller network size can be obtained. If we do want to train another NS, we repeat the procedures 195, 200 and 205. Otherwise, a trained NS is selected 210 as the primary filter in consideration of the NS size versus the estimation accuracy to maximize cost-effectiveness for the application at hand.

Figure 25:
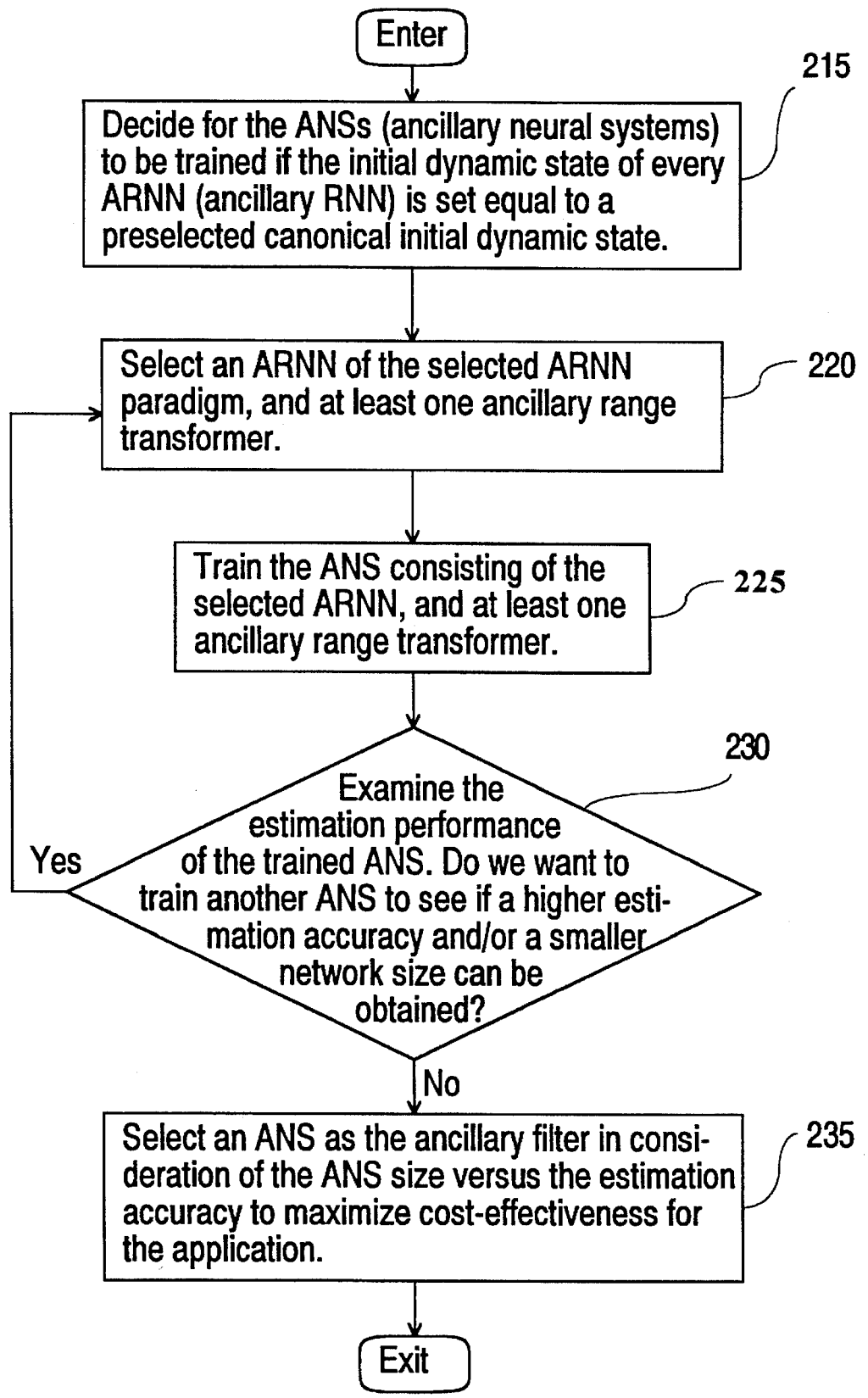
FIG. 25 is a block diagram showing typical iterative procedures taken in synthesizing ancillary training data into an ancillary filter.

Typical iterative procedures taken in synthesizing ancillary training data into an ancillary filter are shown in FIG. 25. They are similar to those shown in FIG. 24. We first decide 215 if the initial dynamic state of every RNN to be trained is set equal to a preselected canonical initial dynamic state. We then select 220 an RNN of the selected ancillary RNN paradigm, and at least one range transformer. An NS comprising the selected RNN and at least one range transformer is then trained 225. Examining the estimation (or approximation) performance of this trained RNN, we decide 230 if another NS is to be trained to see whether a higher estimation accuracy and/or a smaller network size can be obtained. Accordingly, we either repeat procedures 220, 225 and 230, or select 235 a trained NS as the ancillary filter in consideration of the NS size versus the estimation (or approximation) accuracy to maximize cost-effectiveness for the application at hand.

Once a training criterion is selected and training data collected, the training criterion is a well defined function of the adjustable weights (i.e. weights and/or parameters) w and the initial dynamic state v of the neural system under training. We note that w includes the coefficients and initialization values of the range transformers to be determined jointly with the RNN's adjustable weights in training. The selected training criterion will now be denoted by $C(w, v)$. If v is set equal to a canonical initial dynamic state, training the RNN into a filter is a problem of minimizing $C(w, v)$ by the variation of w. If v is also to be optimized, training the RNN is a problem of minimizing $C(w, v)$ by the variation of w and v.

Either of these two training problems is simply one of the unconstrained optimization problems that are studied in a very large field of numerical and theoretical research by the name of optimization theory. There are basically two types of method for unconstrained optimization. One type, including the annealing methods and the clustering methods, needs only evaluations of the optimization criterion, and the other type requires also evaluations of its derivatives. The methods of both types, and their pros and cons, can be found in a large number of books and articles and will not be further discussed here. It is only stressed that any optimization method can be selected to train a neural system for filtering in accordance with the teachings of the present invention, provided that the selected training criterion, together with the neural system, satisfies the required conditions for the selected optimization method.

Nevertheless, due to the enormous number of adjustable weights (and the initial dynamic state components, if they are to be optimized as well) for even a small RNN, and the usually enormous amount of training data, training an RNN into a filter involves a very large amount of computation. For instance, the MLPWIN in FIG. 6 has 33 adjustable weights and 5 initial dynamic state components, and the MLPWOF in FIG. 8 has 45 adjustable weights and 2 initial dynamic state components. Notwithstanding so many variables to be optimized, these RNNs are actually much smaller than most of the RNNs required in a neural filter to do real-world filtering.

Generally speaking, the type of optimization method that needs evaluations of the derivatives of the training criterion $C(w, v)$ is more efficient and converges faster than other type. Due to the rich network structures of RNNs, many ideas for evaluating the derivatives of a mean square error criterion, for training an RNN without range extenders or reducers, with respect to the adjustable weights w of the RNN, have been proposed. Perhaps the most widely used ideas are backpropagation through time (BPTT) and real-time recurrent learning (RTRL). A good introduction to BPTT and RTRL ideas with adequate references can be found on pages 182–186 of J. Hertz, A. Krogh and R. G. Palmer, *Introduction to the Theory of Neural Computation*, Addison Wesley (1991).

Nevertheless, the BPTT and the RTRL formulas for computing the derivatives are not available in the literature, and are not easy to derive for training, even for the MLP-WINs and MLPWOFs without range extenders or reducers. The BPTT and RTRL formulas for differentiating the foregoing $C(w, v)$ for training a neural system consisting of an MLPWIN or MLPWOF and selected range transformers were derived by the present inventors and will be stated in the form of pseudo computer programs in the following. First, let us establish more notations.

An MLPWIN or an MLPWOF in a neural system considered here is fully-connected and has L+1 layers of nodes including layer 0 containing the input nodes and layer L containing the output nodes. The set of the numberings of the input nodes in layer 0 is denoted by I and the set of the numberings of the output nodes in layer L is denoted by O. The set of the numberings of the input terminals of the neural system and the set of the numberings of the output terminals of the same neural system are equal to I and O, respectively. For the MLPWOF, the set of the numberings of the feedback-receiving nodes is denoted by $F_I$, and the set of the numberings of the feedback-sending nodes is denoted by $F_O$. It is assumed without loss of generality, that $F_I=F_O$ and if a feedback-receiving node and a feedback-sending node are connected for feedback, these two nodes have the same numbering in their respective layers. Hence $F_I$ and $F_O$ are denoted by F.

Each node in the MLPWIN or MLPWOF, including nodes in layer 0 and layre L, has an individual activation function. The activation function of node i in layer 1 is denoted by $a_i^l(\rho)$. There can be any number of different activation functions in the MLPWIN or MLPWOF, each being shared by any number of nodes. The derivative of $a_i^l(\rho)$ with respect to $\rho$ is denoted by $(a_i^l)'(\rho)$.

The input sequence in a training data set, that is indexed by $\omega \in S$, is denoted by $\zeta(t,\omega)$, whose components are numbered by the numberings from I. The sequence $\zeta_i(t,\omega)$ is equal to $y_i(t,\omega)$, for each $i \in I$, for training the network (MLPWIN or MLPWOF) as a primary filter, or as an ancillary filter if the output of the primary filter is not input to the ancillary filter. However, if the output of the primary filter is input to the ancillary filter, the components of the input sequence $(y(t,\omega), \hat{x}(t,\omega))$ in the training data set are each assigned a numbering from I and the sequence $\zeta_i(t,\omega)$ is set equal to the component of $(y(t,\omega), \hat{x}(t,\omega))$ with the same numbering i.

Every range reducer in the neural system is concatenated to an input node of the RNN. A range reducer and its input, say $\zeta_i(t,\omega)$, have the same numbering i as does its output $\beta_i^0(t,\omega)$ in consistency with the usage of the symbol $\beta_i^0(t)$ as the ith input to the RNN at time t. The set of the numberings of all the range reducers in the neural system is denoted by R. Note that R is a subset of I. For each $i \in I$, that does not belong to R, we set $\beta_i^0(t,\omega) = \zeta_i(t,\omega)$. The target (or desired) output sequence in a training set, that is indexed by $\omega \in S$, is denoted by $=60 (t,\omega)$, t=1, 2, ..., T. The sequence $\alpha(t,\omega)$ is equal to $x(t,\omega)$ or $V(t,\omega)$ depending on whether the neural system is trained to be a primary filter or an ancillary filter. The components of $\alpha(t,\omega)$ are assigned the same numberings as in O so that $\alpha_i(t,\omega)$ is the target value of output terminal i of the neural system for each i in O. Furthermore, the set of all numberings of the range reducers by linear prediction is denoted by $R_{LP}$ and the set of all numberings of the range reducers by model-aided prediction is denoted by $R_{MAP}$. For each input node $i \in R_{LP}$, the linear predictor coefficients are $c_{ij}$, j=1, 2, ..., $J_i$, where $J_i$ is the order of the linear predictor, and for $t \leq J_i$, $$\beta_i^0 = \zeta_i(t) - \sum_{j=1}^{t-1} c_{ij}\zeta_i(t-j) - \sum_{j=t}^{J_i} c_{ij}u_{i(t-j)},$$

where $u_{ij}$ are the initialization values of the linear predictor. The set of all numberings of outputs used for model-aided prediction is denoted by M.

Every range extender in the neural system is concatenated to an output node of the RNN (an MLPWIN or MLPWOF). A range extender and its output, denoted by $\gamma_i(t,\omega)$, have the same numbering i as does its input $\beta_i^L(t,\omega)$, which is the output of its concatenated output node i of the RNN. The set of all the numberings of the range extenders in the neural system is denoted by $\epsilon$. Note that $\epsilon$ is a subset of O. For each $i \in O$, that does not belong to $\epsilon$, we define $\gamma_i(t,\omega)$ to be equal to $\beta_i^L(t,\omega)$. We note that if the activation functions $a_i^L(\eta)$, $i \in O$ are the identity function $a_i^L(\eta) = \eta$, $i \in O$, the activation level $\beta_i^L(t,\omega)$ is equal to $\eta_i^L(t,\omega)$, for each $i \in O$, 0, as is the case in FIG. 6 and FIG. 8. Furthermore, the set of all numberings of the range extenders by linear prediction is denoted by $\epsilon_{LP}$, and the set of all numberings of the range extenders by extended Kalman filtering is denoted by $\epsilon_{EKF}$. For output node $i \in \epsilon_{LP}$, the linear predictor coefficients are $c_{ij}$, j=1, 2, ..., $J_i$, where $J_i$ is the order of the linear predictor, and for $t \leq J_i$, $$\gamma_i(t) = \beta_i^L(t) + \sum_{j=1}^{t-1} c_{ij}\gamma_i(t-j) + \sum_{j=t}^{J_i} c_{ij}s_{i(t-j)},$$

where $s_{ij}$ are the initialization values of the linear predictor.

If an extended Kalman filter is necessary for extending the range of outputs of the RNN in a neural system, all components of the Markov process described by (1) need to be estimated as discussed before. Among these components, those whose Kalman estimates are used to extend the RNN output ranges, are assigned the numberings of their corresponding output nodes of the RNN, and thus have their numberings the same as those in $\epsilon_{EKF}$. The extended Kalman filter receives some of the neural system outputs as part of its input vector. The set of the numberings of these neural system outputs is denoted by $K_{NS}$. The extended Kalman filter also receives, as part of its input vector, the Kalman estimates of those Markov process components that are not estimated by the neural filtering. These Kalman estimates are assigned such numberings that the set of all such numberings, which is denoted by $K_{EKF}$, and the set $K_{NS}$ are disjoint, and that all the numberings in $\epsilon_{EKF}$ but not in $K_{NS}$ are included in $K_{EKF}$. The union of $K_{EKF}$ and $K_{NS}$ is denoted by K, which is also the set of the numberings for all the components of the Markov process described by (1).

Using these notations, the mean square error criterion $Q(w, v)$ is now written as $$Q(w,v) = \frac{1}{T(\#S)} \sum_{\omega \in S} \sum_{t=1}^{T} \sum_{i \in O} (\alpha_i(t,\omega) - \gamma_i(t,\omega))^2, \quad (34)$$

where $\Sigma_{i \in O}$ denotes the summation over all i in O. Notice that $\gamma_i(t, \omega)$ is a function of the adjustable weights w and the initial dynamic state v. An activation level in v is denoted by $V_i^l$, if the activation level is that of node i in layer l. In the following, the formulas for computing $dQ_\omega/dv_i^l$, $dQ_\omega/dw_{ij}^l$ and $dQ_\omega/dw_{ij}^{rl}$ are given, where $$Q_\omega := (1/(T(\#S))) \sum_{t=1}^{T} \sum_{i \in O} (\alpha_i(t,\omega) - \gamma_i(t,\omega))^2.$$

Recall that ":=" denotes "is defined to be." The desired derivatives $dQ(w, v)/dv_i^l$, $dQ(w, v)/dw_{ij}^l$ and $dQ(w, v)/dw_{ij}^{rl}$ are then obtained easily by the equations, $$dQ(w,v)/dv_i^l = \sum_{\omega \in S} dQ_\omega/dv_i^l, dQ(w,v)/dw_{ij}^l = \sum_{\omega \in S} dQ_\omega/dw_{ij}^l \text{ and}$$

$$dQ(w,v)/dw_{ij}^{rl} = \sum_{\omega \in S} dQ_\omega/dw_{ij}^{rl}, \text{ respectively.}$$

To simplify our description of the algorithms, the symbol $\Sigma_i$ (or $\Sigma_j$) denotes the summation over all the numberings of the nodes in the layer that node i (or j) appears. For instance, $$\sum_j w_{ij}^l \beta_j^{l-1} := \sum_{j=0}^{n_{l-1}} w_{ij}^l \beta_j^{l-1} \text{ and } \sum_j w_{ji}^{l+1}(dQ_\omega/d\eta_j^{l+1}(t)) := \sum_{j=1}^{n_{l+1}} w_{ji}^{l+1}(dQ_\omega/d\eta_j^{l+1}(t)).$$

Furthermore, $$\Sigma := \sum_{t=1}^{T},$$

$\delta_{ij}$ is the Kronecker delta, i.e. $\delta_{ij}:=1$, if $i=j$ and $\delta_{ij}:=0$, if $i \neq j$, and the variable $\omega$ in $\beta_i^l(t,\omega)$ and $\eta_i^l(t,\omega)$ is suppressed. All the variables $\gamma_i(t)$, $\tilde{\gamma}_i(t)$, $\Pi_{ij}(t)$, $\beta_i^l(t)$ and $\eta_i^l(t)$, all the derivatives of these variables, and all the derivatives with respect to these variables are understood to be zero for $t>T$ or $t<1$. The variables $w_{ij}^{rL}$ are also set to be zero and are not updated.

The BPTT and RTRL formulas for differentiating the foregoing $Q_\omega$ for an $\omega \in S$ and for a neural system consisting of an MLPWIN or MLPWOF and any number of range transformers of any combinations of types herein disclosed are stated in the following in the form of pseudo computer programs. The pseudo computer programs were written mainly to explain the formulas. They are therefore not the most efficient computationally. There are four "main programs," which provide an overview of the usages of the "subroutines." The "main programs" and "subroutines" are all given self-explanatory names. Many comments are inserted to make the pseudo programs easy to understand. Every comment is preceded by "//."

Every weight, parameter, activation level in an initial state, and initialization value, that is to be optimized, is initially assigned a pseudo random number from the uniform distribution between −0.5 and 0.5. For a set of values for all the adjustable weights of the neural system under training and an $\omega \in S$, the vectors, $\zeta(t,\omega)$, $t=1, 2, \ldots, T$, are input to the input terminals of the neural system one at a time $t$. Each vector $\zeta(t, \omega)$ is processed by the range reducers first, resulting in the range reducers' output vector $\beta^0(t,\omega)$. The RNN's input vector $\beta^0(t,\omega)$ is then processed by the RNN from layer to layer, resulting in weighted sums $\eta_i^l(t,\omega)$ and activation levels $\beta_i^l(t,\omega)$ for $i=1, 2, \ldots, n_l$ and $l=1,2,\ldots, L$. Finally, the RNN's outputs $\beta_i^L(t,\omega)$, $i \in O$ are processed by the range extenders, resulting in the output vector $\gamma(t,\omega)$ of the neural system. All these resultant vectors, weighted sums, and activation levels are then available for use in the following pseudo computer programs.

We note that if RTRL is applied, the derivatives of $Q_\omega$ can be calculated for the range reducers, for each layer of the RNN and for the range extenders, right after the above processing is completed respectively by the range reducers, by each layer of the RNN and by the range extenders. Once the derivatives of $Q_\omega$ are obtained for the range reducers, for each layer of the RNN and for the range extenders, the above resultant vectors, weighted sums and activation levels for the same can be erased immediately from the computer memory. However, if BPTT is applied, the derivatives of $Q_\omega$ are calculated first for the range extenders, then for each layer, backwards, of the RNN, and finally for the range reducers, requiring all the above resultant vectors, weighted sums and activation levels to be readily available throughout the calculation in the computer memory. This is the main reason why BPTT is less suitable than RTRL for real-time training. Nevertheless, if real-time training is not required, BPTT is much faster than RTRL.

Main program BPTT_for_Neural_System_with_MLPWIN:

```
begin
1.  For t = T, T − 1, . . . , 1, do
        Call subroutine BPTT_through_Extender_and_Reducer;
        Call subroutine BPTT_through_MLPWIN;
    end;
2.  Call subroutine Differentiating_Q_ω_wrt_Weight_for_MLPWIN_by_BPTT;
3.  Call subroutine Differentiating_Q_ω_wrt_Initial_State_for_MLPWIN_by_BPTT;
4.  Call subroutine Differentiating_Q_ω_wrt_LP_coefficient_by_BPTT;
end.
```

Main program BPTT_for_Neural_System_with_MLPWOF:

```
begin
1.  For t = T, T − 1, . . . 1, do
        Call subroutine BPTT_through_Extender_and_Reducer;
        Call subroutine BPTT_through_MLPWOF;
    end;
2.  Call subroutine Differentiating_Q_ω_wrt_Weight_for_MLPWOF_by_BPTT;
3.  Call subroutine Differentiating_Q_ω_wrt_Initial_State_for_MLPWOF_by_BPTT;
4.  Call subroutine Differentiating_Q_ω_wrt_LP_coefficient_by_BPTT;
end.
```

Main program RTRL_for_Neural_System_with_MLPWIN:

```
begin
1.  For t = 1, 2, . . . , T, do
        Call subroutine RTRL_through_Reducer;
        Call subroutine RTRL_through_MLPWIN;
```

-continued

Call subroutine RTRL_through_Extender;
2. Call subroutine Differentiating_$Q_\omega$_wrt_Weight_and_Initial_State_for_MLPWIN_by_RTRL;
3. Call subroutine Differentiating_$Q_\omega$_wrt_LP_coefficient_by_RTRL;
end.

Main program RTRL_for_Neural_System_with_an_MLPWOF:

begin
1. For t = 1,2, . . . ,T, do
      Call subroutine RTRL_through_Reducer;
      Call subroutine RTRL_through_MLPWOF;
      Call subroutine RTRL_through_Extender;
   end;
2. Call subroutine Differentiating_$Q_\omega$_wrt_Weight_and_Initial_State_for_MLPWOF_by_RTRL;
3. Call subroutine Differentiating_$Q_\omega$_wrt_LP_coefficient_by_RTRL;
end.

Subroutine BPTT_through_Extender_and_Reducer:

// Backpropagation through range extenders and/or reducers to output nodes of RNN:
For each $i \in O$, do
  If $i \notin K_{NS}, i \notin E_{LP}$ and $i \notin M$ then $$\frac{dQ_\omega}{d\gamma_i(t)} = \frac{\partial Q_\omega}{\partial \gamma_i(t)} ;$$

If $i \notin K_{NS}, i \notin E_{LP}$ and $i \in M$ then
// output $i$ of the RNN is input to reducer by model-aided prediction $$\frac{dQ_\omega}{d\gamma_i(t)} = \frac{\partial Q_\omega}{\partial \gamma_i(t)} + \sum_j \frac{\partial \eta_j^0(t+1)}{\partial \gamma_i(t)} \cdot \frac{dQ_\omega}{d\eta_j^0(t+1)} ;$$

If $i \notin K_{NS}, i \in E_{LP}$ and $i \notin M$ then
// output $i$ is input to range extender by linear prediction $$\frac{dQ_\omega}{d\gamma_i(t)} = \frac{\partial Q_\omega}{\partial \gamma_i(t)} + \sum_j c_{ij} \frac{dQ_\omega}{d\gamma_i(t+j)} ;$$

If $i \notin K_{NS}, i \in E_{LP}$ and $i \in M$ then $$\frac{dQ_\omega}{d\gamma_i(t)} = \frac{\partial Q_\omega}{\partial \gamma_i(t)} + \sum_j \frac{\partial \eta_j^0(t+1)}{\partial \gamma_i(t)} \cdot \frac{dQ_\omega}{d\eta_j^0(t+1)} + \sum_j c_{ij} \frac{dq_\omega}{d\gamma_i(t+j)} ;$$

If $i \in K_{NS}, i \notin E_{LP}$ and $i \notin M$ then

// output $i$ is input to range extender by Kalman filtering $$\frac{dQ_\omega}{d\gamma_i(t)} = \frac{\partial Q_\omega}{\partial \gamma_i(t)} + \sum_j \frac{\partial \gamma_j(t+1)}{\partial \hat{\gamma}_i(t)} \cdot \frac{dQ_\omega}{d\hat{\gamma}_j(t+1)} + \sum_{j,k} \frac{\partial \Pi_{jk}(t+1)}{\partial \gamma_i(t)} \cdot \frac{dQ_\omega}{d\Pi_{jk}(t+1)} ;$$

If $i \in K_{NS}, i \notin E_{LP}$ and $i \in M$ then $$\frac{dQ_\omega}{d\gamma_i(t)} = \frac{\partial Q_\omega}{\partial \gamma_i(t)} + \sum_j \frac{\partial \hat{\gamma}_j(t+1)}{\partial \gamma_i(t)} \cdot \frac{dQ_\omega}{d\hat{\gamma}_j(t+1)} + \sum_{j,k} \frac{\partial \Pi_{jk}(t+1)}{\partial \gamma_i(t)} \cdot \frac{dQ_\omega}{d\Pi_{jk}(t+1)} + \sum_j \frac{\partial \eta_j^0(t+1)}{\partial \gamma_i(t)} \cdot \frac{dQ_\omega}{d\eta_j^0(t+1)} ;$$

If $i \in K_{NS}, i \in E_{LP}$ and $i \notin M$ then $$\frac{dQ_\omega}{d\gamma_i(t)} = \frac{\partial Q_\omega}{\partial \gamma_i(t)} + \sum_j \frac{\partial \hat{\gamma}_j(t+1)}{\partial \gamma_i(t)} \cdot \frac{dQ_\omega}{d\hat{\gamma}_j(t+1)} + \sum_{j,k} \frac{\partial \Pi_{jk}(t+1)}{\partial \gamma_i(t)} \cdot \frac{dQ_\omega}{d\Pi_{jk}(t+1)} + \sum_j c_{ij} \frac{dQ_\omega}{d\gamma_i(t+j)} ;$$

If $i \in K_{NS}, i \in E_{LP}$ and $i \in M$ then $$\frac{dQ_\omega}{d\gamma_i(t)} = \frac{\partial Q_\omega}{\partial \gamma_i(t)} + \sum_j \frac{\partial \hat{\gamma}_j(t+1)}{\partial \gamma_i(t)} \cdot \frac{dQ_\omega}{d\hat{\gamma}_j(t+1)} + \sum_{j,k} \frac{\partial \Pi_{jk}(t+1)}{\partial \gamma_i(t)} \cdot \frac{dQ_\omega}{d\Pi_{jk}(t+1)} + \sum_j \frac{\partial \eta_j^0(t+1)}{\partial \gamma_i(t)} \cdot$$

$$\frac{dQ_\omega}{\partial \eta_j^0(t+1)} + \sum_j c_{ij} \frac{dQ_\omega}{d\gamma_i(t+j)} ;$$

end;
// Backpropagation through range extender by Kalman filtering to estimate output of the EKF:

For each $i \in K$, do
  If $i \notin K_{EKF}$, and $i \notin E_{EKF}$ then
  // output $i$ is used neither to extend an RNN output nor to update EKF $$\frac{dQ_\omega}{d\hat{\gamma}_i(t)} = 0;$$

If $i \notin K_{EKF}$ and $i \in E_{EKF}$ then
  // output $i$ is used to extend an RNN output but not to update EKF $$\frac{dQ_\omega}{d\hat{\gamma}_i(t)} = \frac{dQ_\omega}{d\gamma_i(t)};$$

If $i \in K_{EKF}$ and $i \notin E_{EKF}$ then
  // output $i$ is used to update EKF but not to extend an RNN output $$\frac{\partial Q_\omega}{\partial \hat{\gamma}_i(t)} + \sum_j \frac{\partial \hat{\gamma}_j(t+1)}{\partial \hat{\gamma}_i(t)} \cdot \frac{dQ_\omega}{d\hat{\gamma}_j(t+1)} + \sum_{j,k} \frac{\partial \Pi_{jk}(t+1)}{\partial \hat{\gamma}_i(t)} \cdot \frac{dQ_\omega}{d\Pi_{jk}(t+1)};$$

If $i \in K_{EKF}$ and $i \in E_{EKF}$ then
  // output $i$ is used both to extend an RNN output and to update EKF $$\frac{\partial Q_\omega}{\partial \hat{\gamma}_i(t)} = \frac{\partial Q_\omega}{\partial \gamma_i(t)} + \sum_j \frac{\partial \hat{\gamma}_j(t+1)}{\partial \hat{\gamma}_i(t)} \cdot \frac{dQ_\omega}{d\hat{\gamma}_j(t+1)} + \sum_{j,k} \frac{\partial \Pi_{jk}(t+1)}{\partial \hat{\gamma}_i(t)} \cdot \frac{dQ_\omega}{d\Pi_{jk}(t+1)};$$

end;
// Backpropagation through range extender by KF to covariance outputs of EKF:
For each $i \in K$ and each $j \in K$, do $$\frac{\partial Q_\omega}{d\Pi_{ij}(t)} = \sum_k \frac{\partial \hat{\gamma}_k(t+1)}{\partial \Pi_{ij}(t)} \cdot \frac{dQ_\omega}{d\hat{\gamma}_k(t+1)} + \sum_{k,m} \frac{\partial \Pi_{km}(t+1)}{\partial \Pi_{ij}(t)} \cdot \frac{dQ_\omega}{d\Pi_{km}(t+1)}$$

end;

Subroutine BPTT_through_MLPWIN:

// Backpropagation to output nodes of MLPWIN:
For each $i \in 0$, do $$\frac{dQ_\omega}{d\beta_i^L(t)} = \frac{dQ_\omega}{d\gamma_i(t)};$$

$$\frac{dQ_\omega}{d\eta_i^L(t)} = \frac{dQ_\omega}{d\beta_i^L(t)} ((\alpha_i^L)'(\eta_i^L(t)));$$

// If scaling is used, replace $\alpha_i^L$ above with composition of
// scaling function and $\alpha_i^L$.
end;
// Backpropagation through hidden layers of MLPWIN:
For $l = L - 1, L - 2, \ldots, 1$, do $$\frac{dQ_\omega}{d\eta_i^l(t)} = \left( \sum_j w_{ji}^{l+1} \frac{dQ_\omega}{d\eta_j^{l+1}(t)} + \sum_j w_{ji}^{rl} \frac{dQ_\omega}{d\eta_j^l(t+1)} \right) ((\alpha_i^l)'(\eta_i^l(t)))$$

end;
end;
// Backpropagation to input nodes of MLPWIN:
For $i = 1, 2, \ldots, n_0$, do $$\frac{dQ_\omega}{d\eta_i^0(t)} = \sum_j w_{ji}^1 \frac{dQ_\omega}{d\eta_j^1(t)} ((\alpha_i^0)'(\eta_i^0(t)))$$

// If scaling is used, replace $\alpha_i^0$ with composition of
// scaling function and $\alpha_i^0$.
end;

Subroutine Differentiating_$Q_\omega$_wrt_Weight_for_MLPWIN_by_BPTT:

For $l = 1, 2, \ldots, L$, do
  For $i = 1, 2, \ldots, n_l$, do
    For $j = 0, 1, \ldots, n_{l-1}$, do $$\frac{dQ_\omega}{dw_{ij}^l} = \sum_t \frac{dQ_\omega}{d\eta_i^l(t)} \beta_j^{l-1}(t);$$

If $l \neq L$, then $\dfrac{dQ_\omega}{dw_{ij}^{rl}} = \sum_t \dfrac{dQ_\omega}{d\eta_i^l(t)} \beta_j^l(t-1)$ end;
  end;
end;

Subroutine Differentiating_$Q_\omega$_wrt_Initial_State_for_MLPWIN_by_BPTT:

For $l = 1, 2, \ldots, L - 1$, do
  For $i = 1, 2, \ldots, n_l$, do $$\frac{dQ_\omega}{dv_i^l} = \sum_j w_{ji}^{rl} \frac{dQ_\omega}{d\eta_j^l(1)}$$

end;
end;

Subroutine Differentiating_$Q_\omega$_wrt_LP_coefficient_by_BPTT:

// Differentiating $Q_\omega$ wrt coefficients of range extender by LP:
For each $i \in E_{LP}$, do,
  For $j = -J_i + 1, -J_i + 2, \ldots, 0$, do $$\frac{dQ_\omega}{ds_{ij}} = \sum_{t=1}^{J_i + j} c_{i(t-j)} \frac{dQ_\omega}{d\gamma_i(t)}$$

end;
  For $j = 1, 2, \ldots, J_i$, do $$\frac{dQ_\omega}{dc_{ij}} = \sum_{t=j+1}^{T} \frac{dQ_\omega}{d\gamma_i(t)} \cdot \gamma_i(t-j) + \sum_{t=1}^{j} \frac{dQ_\omega}{d\gamma_i(t)} \cdot u_{i(t-j)}$$

end;

end;
// Differentiating $Q_\omega$ wrt initialization
values of range reducer by $LP$:
For each $i \in R_{LP}$, do
  For $j = -J_i + 1, -J_i + 2, \ldots, 0$, do $$\frac{dQ_\omega}{du_{ij}} = \sum_{t=1}^{J_i+j} (-c_{i(t-j)}) \frac{dQ_\omega}{d\eta_i^0(t)}$$

end;
end;

Subroutine BPTT_through_MLPWOF:

// Backpropagation to output nodes of $MLPWOF$:
For $i = 1, 2, \ldots, n_L$, do

If $i \notin F$ and $i \in O$ then $\dfrac{dQ_\omega}{d\beta_i^L(t)} = \dfrac{dQ_\omega}{d\gamma_i(t)}$ ;

// output $i$ above of $MLPWOF$ is not fedback

If $i \notin F$ and $i \in O$ then $\dfrac{dQ_\omega}{d\beta_i^L(t)} = \dfrac{dQ_\omega}{d\eta_i^0(t+1)}$ ;

// output $i$ above is free feedback

If $i \in F$ and $i \in$ then $\dfrac{dQ_\omega}{d\beta_i^L(t)} = \dfrac{dQ_\omega}{d\gamma_i(t)} + \dfrac{dQ_\omega}{d\eta_i^0(t+1)}$ ;

// output $i$ above is output feedback $$\frac{dQ_\omega}{d\eta_i^L(t)} = \frac{dQ_\omega}{d\beta_i^L(t)} ((\alpha_i^L)'(\eta_i^L(t)));$$

// If scaling is used, replace $\alpha_i^L$ with composition of
// scaling function and $\alpha_i^L$.

end;
For $l = L - 1, L - 2, \ldots, 0$, do
  For $i = 1, 2, \ldots, n_l$, do $$\frac{dQ_\omega}{d\eta_i^l(t)} = \sum_j w_{ji}^{l+1} \frac{dQ_\omega}{d\eta_j^{l+1}(t)} ((\alpha_i^l)'(\eta_i^l(t)))$$

end;
end;
// If scaling is used, replace $\alpha_i^0$ with composition of
// scaling function and $\alpha_i^0$.

Subroutine Differentiating_$Q_\omega$_wrt_Weight_for_MLPWOF_by_BPTT:

For $l = 1, 2, \ldots, L$, do
  For $i = 1, 2, \ldots, n_l$, do
    For $j = 0, 1, \ldots, n_{l-1}$, do $$\frac{dQ_\omega}{dw_{ij}^l} = \sum_t \frac{dQ_\omega}{d\eta_i^l(t)} \beta_j^{l-1}(t);$$

end;
  end;
end;

Subroutine Differentiating_$Q_\omega$_wrt_Initial_State_for_MLPWOF_by_BPTT:

For each $i \in F$, do $$\frac{dQ_\omega}{dv_i^L} = \frac{dQ_\omega}{d\eta_i^0(1)}$$

end;

Subroutine RTRL_through_Reducer:

// Forwardpropagation to input nodes of $RNN$:
For each $i \in I$, do
// Forwardpropagating derivatives wrt initialization values for range reducer:
  For each $p \in R_{LP}$, do
    For $q = -J_p + 1, -J_p + 2, \ldots, 0$, do If $i \in R_{MAP}$ then $\dfrac{d\beta_i^0(t)}{du_{pq}} = \sum_{j \in M} \dfrac{\partial \eta_i^0(t)}{\partial \gamma_j(t-1)} \cdot \dfrac{d\gamma_j(t-1)}{du_{pq}} ((\alpha_i^0)'(\eta_i^0(t))),$ else $\dfrac{d\beta_i^0(t)}{du_{pq}} = \left( -\delta_{ip} \sum_{j=-J_p+t}^{0} \delta_{qp} c_{p(t-j)} \right) ((\alpha_i^0)'(\eta_i^0(t)));$ end;
  end;
  If called by main program RTRL_for_Neural_System_with_MLPWOF then
// Forwardpropagating derivatives wrt inital dynamic state for $MLPWOF$:
  For each $p \in F$, do If $i \in R_{MAP}$ then $\dfrac{d\beta_i^0(t)}{dv_p^L} = \sum_{j \in M} \dfrac{\partial \eta_i^0(t)}{\partial \gamma_j(t-1)} \cdot \dfrac{d\gamma_j(t-1)}{dv_p^L} ((\alpha_i^0)'(\eta_i^0(t))),$ else $\dfrac{d\beta_i^0(t)}{dv_p^L} = 0;$ end;
  For $k = 1, 2, \ldots, L$, do
    For $p = 1, 2, \ldots, n_k$, do
    If called by main program RTRL_for_Neural_System_with_MLPWIN then
// Forwardpropagating derivatives wrt inital dynamic state for $MLPWIN$:

If $i \in R_{MAP}$ then $\dfrac{d\beta_i^0(t)}{dv_p^k} = \sum_{j \in M} \dfrac{\partial \eta_i^0(t)}{\partial \gamma_j(t-1)} \cdot \dfrac{d\gamma_j(t-1)}{dv_p^k} ((\alpha_i^0)'(\eta_i^0(t))),$ else $\dfrac{d\beta_i^0(t)}{dv_p^k} = 0;$ -continued // Forwardpropagating derivatives wrt delayless weights:
For $q = 0, 1, \ldots, n_{k-1}$, do If $i \in R_{MAP}$ then $\dfrac{d\beta_i^0(t)}{dw_{pq}^k} = \sum\limits_{j \in M} \dfrac{\partial \eta_i^0(t)}{\partial \gamma_j(t-1)} \cdot \dfrac{d\gamma_j(t-1)}{dw_{pq}^k} ((\alpha_i^0)'(\eta_i^0(t)))$, else $\dfrac{d\beta_i^0(t)}{dw_{pq}^k} = 0$;

end;
If called by main program RTRL_for_Neural_System_with_MLPWIN then
// Forwardpropagating derivatives wrt delay weights for MLPWIN:
For $q = 1, 2, \ldots, n_k$, do If $i \in R_{MAP}$ then $\dfrac{d\beta_i^0(t)}{dw_{pq}^{rk}} = \sum\limits_{j \in M} \dfrac{\partial \eta_i^0(t)}{\partial \gamma_j(t-1)} \cdot \dfrac{d\gamma_j(t-1)}{dw_{pq}^{rk}} ((\alpha_i^0)'(\eta_i^0(t)))$, else $\dfrac{d\beta_i^0(t)}{dw_{pq}^{rk}} = 0$;

end;
end;
end;
// Forwardpropagating derivatives wrt coefficients for range extenders by linear prediction:
For each $p \in E_{LP}$, do
For $q = -J_p + 1, -J_p + 2, \ldots, 0$, do If $i \in R_{MAP}$ then $\dfrac{d\beta_i^0(t)}{ds_{pq}} = \sum\limits_{j \in M} \dfrac{\partial \eta_i^0(t)}{\partial \gamma_j(t-1)} \cdot \dfrac{d\gamma_j(t-1)}{ds_{pq}} ((\alpha_i^0)'(\eta_i^0(t)))$, else $\dfrac{d\beta_i^0(t)}{ds_{pq}} = 0$;

end;
For $q = 1, 2, \ldots, J_p$, do

If $i \in R_{MAP}$ then $\dfrac{d\beta_i^0(t)}{dc_{pq}} = \sum\limits_{j \in M} \dfrac{\partial \eta_i^0(t)}{\partial \gamma_j(t-1)} \cdot \dfrac{d\gamma_j(t-1)}{dc_{pq}} ((\alpha_i^0)'(\eta_i^0(t)))$, else $\dfrac{d\beta_i^0(t)}{ds_{pq}} = 0$;

end;
end;
end;

Subroutine RTRL_through_MLPWIN:

// Forwardpropagation through MLPWIN:
For $l = 1, 2, \ldots, L$, do
  For $i = 1, 2, \ldots, n_l$, do
// Forwardpropagating derivatives wrt intialization values for range reducer:
  For each $p \in R_{LP}$, do
    For $q = -J_p + 1, -J_p + 2, \ldots, 0$, do $$\dfrac{d\beta_i^l(t)}{du_{pq}} = \left( \sum_j w_{ij}^l \dfrac{d\beta_j^{l-1}(t)}{du_{pq}} + \sum_j w_{ij}^{rl} \dfrac{d\beta_j^l(t-1)}{du_{pq}} \right) ((a_i^l)'(\eta_i^l(t)))$$

end;
  end;
  For $k = 1, 2, \ldots, L$, do
// Forwardpropagating derivatives wrt initial dynamic state:
    For $p = 1, 2, \ldots, n_k$, do $$\dfrac{d\beta_i^l(t)}{dv_p^k} = \left( \sum_j w_{ij}^l \dfrac{d\beta_j^{l-1}(t)}{dv_p^k} + \sum_j w_{ij}^{rl} \dfrac{d\beta_j^l(t-1)}{dv_p^k} + \delta_{lk}\delta_{t1} w_{ip}^{rk} \right) ((a_i^l)'(\eta_i^l(t)))$$

// Forwardpropagating derivatives wrt delayless weighs:
    For $q = 0, 1, \ldots, n_{k-1}$, do -continued $$\frac{d\beta_i^l(t)}{dw_{pq}^k} = \left( \sum_j w_{ij}^l \frac{d\beta_j^{l-1}(t)}{dw_{pq}^k} + \sum_j w_{ij}^{rl} \frac{d\beta_j^l(t-1)}{dw_{pq}^k} + \delta_{lk}\delta_{ip}\beta_q^{l-1}(t) \right) ((a_i^l)'(\eta_i^l(t)))$$

end;
// Forwardpropagating derivatives wrt delay weights:
    For $q = 1, 2, \ldots, n_k$, do $$\frac{d\beta_i^l(t)}{dw_{pq}^{rk}} = \left( \sum_j w_{ij}^l \frac{d\beta_j^{l-1}(t)}{dw_{pq}^{rk}} + \sum_j w_{ij}^{rl} \frac{d\beta_j^l(t-1)}{dw_{pq}^{rk}} + \delta_{lk}\delta_{ip}\beta_q^l(t-1) \right) ((\alpha_2^l)'(\eta_i^l(t)))$$

end;
  end;
end;
// Forwardpropagating derivatives wrt coefficients of range extenders by linear prediction:
  For each $p \in E_{LP}$, do
    For $q = -J_p + 1, -J_p + 2, \ldots, 0$, do $$\frac{d\beta_i^l(t)}{ds_{pq}} = \left( \sum_j w_{ij}^l \frac{d\beta_j^{l-1}(t)}{ds_{pq}} + \sum_j w_{ij}^{rl} \frac{d\beta_j^l(t-1)}{ds_{pq}} \right) ((a_i^l)'(\eta_i^l(t)))$$

end;
    For $q = 1, 2, \ldots, J_p$, do $$\frac{d\beta_i^l(t)}{dc_{pq}} = \left( \sum_j w_{ij}^l \frac{d\beta_j^{l-1}(t)}{dc_{pq}} + \sum_j w_{ij}^{rl} \frac{d\beta_j^l(t-1)}{dc_{pq}} \right) ((a_i^l)'(\eta_i^l(t)))$$

end;
  end;
// If scaling is used, replace $a_i^L$ with composition of
// scaling function and $a_i^L$.
  end;
end;

Subroutine RTRL_through_Extender:

// Forwardpropagation to output nodes of EKF:
For each $i \in K$, do
// Forwardpropagating derivatives wrt initialization values of range reducer:
  For each $p \in R_{LP}$, do
    For $q = -J_p + 1, -J_p + 2, \ldots, 0$, do $$\frac{d\hat{\gamma}_i(t)}{du_{pq}} = \sum_{j \in K_{NS}} \frac{\partial \hat{\gamma}_i(t)}{\partial \gamma_j(t-1)} \cdot \frac{d\gamma_j(t-1)}{du_{pq}} + \sum_{j \in K_{EKF}} \frac{\partial \hat{\gamma}_i(t)}{\partial \hat{\gamma}_j(t-1)} \cdot \frac{d\hat{\gamma}_j(t-1)}{du_{pq}} + \sum_{j,k} \frac{\partial \hat{\gamma}_i(t)}{\partial \Pi_{jk}(t-1)} \cdot \frac{d\Pi_{jk}(t-1)}{du_{pq}}$$

end;
  end;
If called by main program RTRL_for_Neural_System_with_MLPWOF then
// Forwardpropagating derivatives wrt initial dynamic state of MLPWOF:
  For each $p \in F$, do $$\frac{d\hat{\gamma}_i(t)}{dv_p^L} = \sum_{j \in K_{NS}} \frac{\partial \hat{\gamma}_i(t)}{\partial \gamma_j(t-1)} \cdot \frac{d\gamma_j(t-1)}{dv_p^L} + \sum_{j \in K_{EKF}} \frac{\partial \hat{\gamma}_i(t)}{\partial \hat{\gamma}_j(t-1)} \cdot \frac{d\hat{\gamma}_j(t-1)}{dv_p^L} + \sum_{j,k} \frac{\partial \hat{\gamma}_i(t)}{\partial \Pi_{jk}(t-1)} \cdot \frac{d\Pi_{jk}(t-1)}{dv_p^L}$$

end;
  For $k = 1, 2, \ldots, L$, do
    For $p = 1, 2, \ldots, n_k$, do
If called by main program RTRL_for_Neural_System_with_MLPWIN then
// Forwardpropagating derivatives wrt initial dynamic state of MLPWIN:

$$\frac{d\hat{\gamma}_i(t)}{dv_p^k} = \sum_{j \in K_{NS}} \frac{\partial \hat{\gamma}_i(t)}{\partial \gamma_j(t-1)} \cdot \frac{d\gamma_j(t-1)}{dv_p^k} + \sum_{j \in K_{EKF}} \frac{\partial \hat{\gamma}_i(t)}{\partial \hat{\gamma}_j(t-1)} \cdot \frac{d\hat{\gamma}_j(t-1)}{dv_p^k} + \sum_{j,m} \frac{\partial \hat{\gamma}_i(t)}{\partial \Pi_{jm}(t-1)} \cdot \frac{d\Pi_{jm}(t-1)}{dv_p^k} \; ;$$

// Forwardpropagating derivatives wrt delayless weights;
    For $q = 0, 1, \ldots, n_{k-1}$, do $$\frac{d\hat{\gamma}_i(t)}{dw_{pq}^k} = \sum_{j \in K_{NS}} \frac{\partial \hat{\gamma}_i(t)}{\partial \gamma_j(t-1)} \cdot \frac{d\gamma_j(t-1)}{dw_{pq}^k} + \sum_{j \in K_{EKF}} \frac{\partial \hat{\gamma}_i(t)}{\partial \hat{\gamma}_j(t-1)} \cdot \frac{d\hat{\gamma}_j(t-1)}{dw_{pq}^k} + \sum_{j,m} \frac{\partial \hat{\gamma}_i(t)}{\partial \Pi_{jm}(t-1)} \cdot \frac{d\Pi_{jm}(t-1)}{dw_{pq}^k}$$

end;
If called by main program RTRL_for_Neural_System_with_MLPWIN then
// Forwardpropagating derivatives wrt delay weights of MLPWIN:
    For $q = 1, 2, \ldots, n_k$, do $$\frac{d\hat{\gamma}_i(t)}{dw_{pq}^{rk}} = \sum_{j \in K_{NS}} \frac{\partial \hat{\gamma}_i(t)}{\partial \gamma_j(t-1)} \cdot \frac{d\gamma_j(t-1)}{dw_{pq}^{rk}} + \sum_{j \in K_{EKF}} \frac{\partial \hat{\gamma}_i(t)}{\partial \hat{\gamma}_j(t-1)} \cdot \frac{d\hat{\gamma}_j(t-1)}{dw_{pq}^{rk}} + \sum_{j,m} \frac{\partial \hat{\gamma}_i(t)}{\partial \Pi_{jm}(t-1)} \cdot \frac{d\Pi_{jm}(t-1)}{dw_{pq}^{rk}}$$

end;
    end;
end;
// Forwardpropagating derivatives wrt coefficients of range extenders by linear prediction:
For each $p \in E_{LP}$, do
    For $q = -J_p + 1, -J_p + 2, \ldots, 0$, do $$\frac{d\hat{\gamma}_i(t)}{ds_{pq}} = \sum_{j \in K_{NS}} \frac{\partial \hat{\gamma}_i(t)}{\partial \gamma_j(t-1)} \cdot \frac{d\gamma_j(t-1)}{ds_{pq}} + \sum_{j \in K_{EKF}} \frac{\partial \hat{\gamma}_i(t)}{\partial \hat{\gamma}_j(t-1)} \cdot \frac{d\hat{\gamma}_j(t-1)}{ds_{pq}} + \sum_{j,m} \frac{\partial \hat{\gamma}_i(t)}{\partial \Pi_{jm}(t-1)} \cdot \frac{d\Pi_{jm}(t-1)}{ds_{pq}}$$

end;
    For $q = 1, 2, \ldots, J_p$, do $$\frac{d\hat{\gamma}_i(t)}{dc_{pq}} = \sum_{j \in K_{NS}} \frac{\partial \hat{\gamma}_i(t)}{\partial \gamma_j(t-1)} \cdot \frac{d\gamma_j(t-1)}{dc_{pq}} + \sum_{j \in K_{EKF}} \frac{\partial \hat{\gamma}_i(t)}{\partial \hat{\gamma}_j(t-1)} \cdot \frac{d\hat{\gamma}_j(t-1)}{dc_{pq}} + \sum_{j,m} \frac{\partial \hat{\gamma}_i(t)}{\partial \Pi_{jm}(t-1)} \cdot \frac{d\Pi_{jm}(t-1)}{dc_{pq}}$$

end;
end;
// Forwardpropagating Derivatives of EKF covariances to outputs of EKF:
For each $j \in K$, do
// Forwardpropagating derivatives wrt initialization values of range reducer:
For each $p \in R_{LP}$, do
    For $q = -J_p + 1, -J_p + 2, \ldots, 0$, do $$\frac{d\Pi_{ij}(t)}{du_{pq}} = \sum_{m \in K_{NS}} \frac{\partial \Pi_{ij}(t)}{\partial \gamma_m(t-1)} \cdot \frac{d\gamma_m(t-1)}{du_{pq}} + \sum_{m \in K_{EKF}} \frac{\partial \Pi_{ij}(t)}{\partial \hat{\gamma}_m(t-1)} \cdot \frac{d\hat{\gamma}_m(t-1)}{du_{pq}} + \sum_{m,n} \frac{\partial \Pi_{ij}(t)}{\partial \Pi_{mn}(t-1)} \cdot \frac{d\Pi_{mn}(t-1)}{du_{pq}}$$

end;
end;
If called by main program RTRL_for_Neural_System_with_MLPWOF then
// Forwardpropagating derivatives wrt initial dynamic state of MLPWOF:
For each $p \in F$, do $$\frac{d\Pi_{ij}(t)}{dv_p^L} = \sum_{m \in K_{NS}} \frac{\partial \Pi_{ij}(t)}{\partial \gamma_m(t-1)} \cdot \frac{d\gamma_m(t-1)}{dv_p^L} + \sum_{m \in K_{EKF}} \frac{\partial \Pi_{ij}(t)}{\partial \hat{\gamma}_m(t-1)} \cdot \frac{d\hat{\gamma}_m(t-1)}{dv_p^L} + \sum_{m,n} \frac{\partial \Pi_{ij}(t)}{\partial \Pi_{mn}(t-1)} \cdot \frac{d\Pi_{mn}(t-1)}{dv_p^L}$$

end;
For $k = 1, 2, \ldots, L$, do
    For $p = 1, 2, \ldots, n_k$, do
        If called by main program RTRL_for_Neural_System_with_MLPWIN then
// Forwardpropagating derivatives wrt initial dynamic state of MLPWIN:

$$\frac{d\Pi_{ij}(t)}{dv_p^k} = \sum_{m \in K_{NS}} \frac{\partial \Pi_{ij}(t)}{\partial \gamma_m(t-1)} \cdot \frac{d\gamma_m(t-1)}{dv_p^k} + \sum_{m \in K_{EKF}} \frac{\partial \Pi_{ij}(t)}{\partial \hat{\gamma}_m(t-1)} \cdot \frac{d\hat{\gamma}_m(t-1)}{dv_p^k} + \sum_{m,n} \frac{\partial \Pi_{ij}(t)}{\partial \Pi_{mn}(t-1)} \cdot \frac{d\Pi_{mn}(t-1)}{dv_p^k} \; ;$$

// Forwardpropagating derivatives wrt delayless weights:
For $q = 0, 1, \ldots, n_{k-1}$, do $$\frac{d\Pi_{ij}(t)}{dw_{pq}^k} = \sum_{m \in K_{NS}} \frac{\partial \Pi_{ij}(t)}{\partial \gamma_m(t-1)} \cdot \frac{d\gamma_m(t-1)}{dw_{pq}^k} + \sum_{m \in K_{EKF}} \frac{\partial \Pi_{ij}(t)}{\partial \hat{\gamma}_m(t-1)} \cdot \frac{d\hat{\gamma}_m(t-1)}{dw_{pq}^k} + \sum_{m,n} \frac{\partial \Pi_{ij}(t)}{\partial \Pi_{mn}(t-1)} \cdot \frac{d\Pi_{mn}(t-1)}{dw_{pq}^k}$$

end;
    If called by main program RTRL_for_Neural_System_with_MLPWIN then
// Forwardpropagating derivatives of delay weights of MLPWIN:
    For $q = 1, 2, \ldots, n_k$, do $$\frac{d\Pi_{ij}(t)}{dw_{pq}^{rk}} = \sum_{m \in K_{NS}} \frac{\partial \Pi_{ij}(t)}{\partial \gamma_m(t-1)} \cdot \frac{d\gamma_m(t-1)}{dw_{pq}^{rk}} + \sum_{m \in K_{EKF}} \frac{\partial \Pi_{ij}(t)}{\partial \hat{\gamma}_m(t-1)} \cdot \frac{d\hat{\gamma}_m(t-1)}{dw_{pq}^{rk}} + \sum_{m,n} \frac{\partial \Pi_{ij}(t)}{\partial \Pi_{mn}(t-1)} \cdot \frac{d\Pi_{mn}(t-1)}{dw_{pq}^{rk}}$$

end;
    end;
end;
// Forwardpropagating derivatives wrt coefficients of range extenders by linear prediction:
For each $p \in E_{LP}$, do
    For $q = -J_p + 1, -J_p + 2, \ldots, 0$, do $$\frac{d\Pi_{ij}(t)}{ds_{pq}} = \sum_{m \in K_{NS}} \frac{\partial \Pi_{ij}(t)}{\partial \gamma_m(t-1)} \cdot \frac{d\gamma_m(t-1)}{ds_{pq}} + \sum_{m \in K_{EKF}} \frac{\partial \Pi_{ij}(t)}{\partial \hat{\gamma}_m(t-1)} \cdot \frac{d\hat{\gamma}_m(t-1)}{ds_{pq}} + \sum_{m,n} \frac{\partial \Pi_{ij}(t)}{\partial \Pi_{mn}(t-1)} \cdot \frac{d\Pi_{mn}(t-1)}{ds_{pq}}$$

end;
    For $q = 1, 2, \ldots, J_p$, do $$\frac{d\Pi_{ij}(t)}{dc_{pq}} = \sum_{m \in K_{NS}} \frac{\partial \Pi_{ij}(t)}{\partial \gamma_m(t-1)} \cdot \frac{d\gamma_m(t-1)}{dc_{pq}} + \sum_{m \in K_{EKF}} \frac{\partial \Pi_{ij}(t)}{\partial \hat{\gamma}_m(t-1)} \cdot \frac{d\hat{\gamma}_m(t-1)}{dc_{pq}} + \sum_{m,n} \frac{\partial \Pi_{ij}(t)}{\partial \Pi_{mn}(t-1)} \cdot \frac{d\Pi_{mn}(t-1)}{dc_{pq}}$$

end;
    end;
  end;
end;
// Forwardpropagation to output terminals of neural system:
For each $i \in O$, do
// Forwardpropagating derivatives wrt initialization values of range reducer:
  For each $p \in R_{LP}$, do
    For $q = -J_p + 1, -J_p + 2, \ldots, 0$, do If $i \in E_{LP}$ then $\dfrac{d\gamma_i(t)}{du_{pq}} = \sum_{j=1}^{J_i} c_{ij} \dfrac{d\gamma_i(t-j)}{du_{pq}} + \dfrac{d\beta_i^L(t)}{du_{pq}}$ , // output $i$ above is extended by range extender by linear prediction else if $i \in E_{EKF}$ then $\dfrac{d\gamma_i(t)}{du_{pq}} = \dfrac{d\hat{\gamma}_i(t)}{du_{pq}} + \dfrac{d\beta_i^L(t)}{du_{pq}}$ , // output $i$ above is extended by range extender by KF else $\dfrac{d\gamma_i(t)}{du_{pq}} = \dfrac{d\beta_i^L(t)}{du_{pq}}$ ;

// output $i$ above is not extended by linear prediction or KF
    end;
  end;
  If called by main program *RTRL_for_Neural_System_with_MLPWOF* then
// Forwardpropagating derivatives wrt initial dynamic state of MLPWOF:
    For each $p \in F$, do If $i \in E_{LP}$ then $\dfrac{d\gamma_i(t)}{dv_p^L} = \sum_{j=1}^{J_i} c_{ij} \dfrac{d\gamma_i(t-j)}{dv_p^L} + \dfrac{d\beta_i^L(t)}{dv_p^L}$ , else if $i \in E_{EKF}$ then $\dfrac{d\gamma_i(t)}{dv_p^L} = \dfrac{d\hat{\gamma}_i(t)}{dv_p^L} + \dfrac{d\beta_i^L(t)}{dv_p^L}$ , else $\dfrac{d\gamma_i(t)}{dv_p^L} = \dfrac{d\beta_i^L(t)}{dv_p^L}$ ;

end;
  For $k = 1, 2, \ldots, L$, do
    For $p = 1, 2 \ldots, n_k$, do

If called by main program *RTRL_for_Neural_System_with_MLPWIN* then
// Forwardpropagating derivatives wrt initial dynamic state of MLPWIN:

If $i \in E_{LP}$ then $\dfrac{d\gamma_i(t)}{dv_p^k} = \sum_{j=1}^{J_i} c_{ij} \dfrac{d\gamma_i(t-j)}{dv_p^k} + \dfrac{d\beta_i^L(t)}{dv_p^k}$ , else if $i \in E_{EKF}$ then $\dfrac{d\gamma_i(t)}{dv_p^k} = \dfrac{d\hat{\gamma}_i(t)}{dv_p^k} + \dfrac{d\beta_i^L(t)}{dv_p^k}$ , else $\dfrac{d\gamma_i(t)}{dv_p^k} = \dfrac{d\beta_i^L(t)}{dv_p^k}$ ;

// Forwardpropagating derivatives wrt delayless weights:
    For $q = 0, 1, \ldots, n_{k-1}$, do If $i \in E_{LP}$ then $\dfrac{d\gamma_i(t)}{dw_{pq}^k} = \sum_{j=1}^{J_i} c_{ij} \dfrac{d\gamma_i(t-1)}{dw_{pq}^k} + \dfrac{d\beta_i^L(t)}{dw_{pq}^k}$ , else if $i \in E_{EKF}$ then $\dfrac{d\gamma_i(t)}{dw_{pq}^k} = \dfrac{d\hat{\gamma}_i(t)}{dw_{pq}^k} + \dfrac{d\beta_i^L(t)}{dw_{pq}^k}$ , else $\dfrac{d\gamma_i(t)}{dw_{pq}^k} = \dfrac{d\beta_i^L(t)}{dw_{pq}^k}$ ;

end;
    If called by main program *RTRL_for_Neural_System_with_MLPWIN* then

-continued

// Forwardpropagating derivatives wrt delay weights of *MLPWIN*:
  For $q = 1, 2, \ldots, n_k$, do $$\text{If } i \in E_{LP} \text{ then } \frac{d\gamma_i(t)}{dw_{pq}^{kr}} = \sum_{j=1}^{J_i} c_{ij} \frac{d\gamma_i(t-j)}{dw_{pq}^{kr}} + \frac{d\beta_i^L(t)}{dw_{pq}^{kr}},$$

$$\text{else if } i \in E_{EKF} \text{ then } \frac{d\gamma_i(t)}{dw_{pq}^{kr}} = \frac{d\hat{\gamma}_i(t)}{dw_{pq}^{kr}} + \frac{d\beta_i^L(t)}{dw_{pq}^{rk}},$$

$$\text{else } \frac{d\gamma_i(t)}{dw_{pq}^{kr}} = \frac{d\beta_i^L(t)}{dw_{pq}^{rk}} ;$$

end;
  end;
  end;
// Forwardpropagating derivatives wrt coefficients of range extenders by linear prediction:
  For each $p \in E_{LP}$, do
    For $q = -J_p + 1, -J_p + 2, \ldots, 0$, do $$\text{If } i \in E_{LP} \text{ then } \frac{d\gamma_i(t)}{ds_{pq}} = \sum_{j=1}^{J_i} c_{ij} \frac{d\gamma_i(t-j)}{ds_{pq}} + \frac{d\beta_i^L(t)}{ds_{pq}} + \delta_{ip} \sum_{j=-J_i+t}^{0} c_i(t-j)\delta_{jp},$$

$$\text{else if } i \in E_{EKF} \text{ then } \frac{d\gamma_i(t)}{ds_{pq}} = \frac{d\hat{\gamma}_i(t)}{ds_{pq}} + \frac{d\beta_i^L(t)}{ds_{pq}},$$

$$\text{else } \frac{d\gamma_i(t)}{ds_{pq}} = \frac{d\beta_i^L(t)}{ds_{pq}} ;$$

end;
    For $q = 1, 2, \ldots, J_p$, do $$\text{If } i \in E_{LP} \text{ then } \frac{d\gamma_i(t)}{dc_{pq}} = \sum_{j=1}^{J_i} c_{ij} \frac{d\gamma_i(t-j)}{dc_{pq}} + \frac{d\beta_i^L(t)}{dc_{pq}} + \delta_{ip}\gamma_i(t-q) + \delta_{ip}\sum_{j=t}^{J_i} \delta_{jq}s_i(t-j),$$

$$\text{else if } i \in E_{EKF} \text{ then } \frac{d\gamma_i(t)}{dc_{pq}} = \frac{d\hat{\gamma}_i(t)}{dc_{pq}} + \frac{d\beta_i^L(t)}{dc_{pq}},$$

$$\text{else } \frac{d\gamma_i(t)}{dc_{pq}} = \frac{d\beta_i^L(t)}{dc_{pq}} ;$$

end;
  end;
end;

Subroutine Differentiating_$Q_\omega$_wrt_Weight_and_Initial_State_for_MLPWIN_by_RTRL:

For $l = 1, 2, \ldots, L$, do
  For $p = 1, 2, \ldots, n_l$, do $$\frac{dQ_w}{dv_p^l} = \sum_t \sum_{i \in O} \frac{\partial Q_\omega}{\partial \gamma_i(t)} \frac{d\gamma_i(t)}{dv_p^l} ;$$

For $q = 0, 1, \ldots, n_{l-1}$, do $$\frac{dQ_\omega}{dw_{pq}^l} = \sum_t \sum_{i \in O} \frac{\partial Q_\omega}{\partial \gamma_i(t)} \frac{d\gamma_i(t)}{dw_{pq}^l}$$

end;
  For $q = 1, 2, \ldots, n_l$, do $$\frac{dQ_\omega}{dw_{pq}^{rl}} = \sum_t \sum_{i \in O} \frac{\partial Q_\omega}{\partial \gamma_i(t)} \frac{d\gamma_i(t)}{dw_{pq}^{rl}}$$

end;
  end;
end;

Subroutine Differentiating_$Q_\omega$_wrt_LP_coefficient_by_RTRL:

For each $p \in R_{LP}$, do
  For $q = -J_p + 1, -J_p + 2, \ldots, 0$, do $$\frac{dQ_\omega}{du_{pq}} = \sum_t \sum_{i \in O} \frac{\partial Q_\omega}{\partial \gamma_i(t)} \frac{d\gamma_i(t)}{du_{pq}}$$

end;
end;
For each $p \in E_{LP}$, do
  For $q = -J_p + 1, -J_p + 2, \ldots, 0$, do $$\frac{dQ_\omega}{ds_{pq}} = \sum_t \sum_{i \in O} \frac{\partial Q_\omega}{\partial \gamma_i(t)} \frac{d\gamma_i(t)}{ds_{pq}}$$

end;
  For $q = 1, 2, \ldots, J_p$, do $$\frac{dQ_\omega}{dc_{pq}} = \sum_t \sum_{i \in O} \frac{\partial Q_\omega}{\partial \gamma_i(t)} \frac{d\gamma_i(t)}{dc_{pq}}$$

end;
end;

Subroutine RTRL_through_MLPWOF:

// Forwardpropagation of delayed outputs of *MLPWOF* to input nodes:
For each $i \in F$, do
// Forwardpropagating derivatives *wrt* initialization values of range reducer:
  For each $p \in R_{LP}$, do
    For $q = -J_p + 1, -J_p + 2, \ldots, 0$, do $$\frac{d\beta_i^0(t)}{du_{pq}} = \frac{\beta_i^L(t-1)}{du_{pq}} \ ((\alpha_i^0)'(\eta_i^0(t)))$$

end;
  end;
// Forwardpropagating derivatives *wrt* initial dynamic state:
  For each $p \in F$, do $$\frac{d\beta_i^0(t)}{dv_p^L} = \left( \frac{d\beta_i^L(t-1)}{dv_p^L} + \delta_{ip}\delta_{t1} \right) ((\alpha_i^0)'(\eta_i^0(t)))$$

end;
  For $k = 1, 2, \ldots, L$, do
    For $p = 1, 2, \ldots, n_k$, do
// Forwardpropagating derivatives *wrt* delayless weights:
      For $q = 0, 1, \ldots, n_{k-1}$, do $$\frac{d\beta_i^0(t)}{dw_{pq}^k} = \frac{d\beta_i^L(t-1)}{dw_{pq}^k} \ ((\alpha_i^0)'(\eta_i^0(t)))$$

end;
    end;
  end;
// Forwardpropagating derivatives *wrt* coefficients of range extenders by linear prediction:
  For each $p \in E_{LP}$, do
    For $q = -J_p + 1, -J_p + 2, \ldots, 0$, do $$\frac{d\beta_i^0(t)}{ds_{pq}} = \frac{d\beta_i^L(t-1)}{ds_{pq}} \ ((\alpha_i^0)'(\eta_i^0(t)))$$

end;
    For $q = 1, 2, \ldots, J_p$, do $$\frac{d\beta_i^0(t)}{dc_{pq}} = \frac{d\beta_i^L(t-1)}{dc_{pq}} \ ((\alpha_i^0)'(\eta_i^0(t)))$$

end;
  end;
end;
// Forwardpropagation through *MLPWOF*:
For $l = 1, 2, \ldots, L$, do
  For $i = 1, 2, \ldots, n_l$, do
// Forwardpropagating derivatives *wrt* initialization values of range reducer:
    For each $p \in R_{LP}$, do
      For $q = -J_p + 1, -J_p + 2, \ldots, 0$, do $$\frac{d\beta_i^l(t)}{du_{pq}} = \sum_j w_{ij}^l \frac{d\beta_j^{l-1}(t)}{du_{pq}} \ ((\alpha_i^l)'(\eta_i^l(t)))$$

end;
    end;
// Forwardpropagating derivatives *wrt* initial dynamic state:
    For each $p \in F$, do $$\frac{d\beta_i^l(t)}{dv_p^L} = \sum_j w_{ij}^l \frac{d\beta_j^{l-1}(t)}{dv_p^L} \ ((\alpha_i^l)'(\eta_i^l(t)))$$

end;
// Forwardpropagating derivatives *wrt* delayless weights:
    For $k = 1, 2, \ldots, L$, do
      For $p = 1, 2, \ldots, n_k$, do
        For $q = 0, 1, \ldots, n_{k-1}$, do $$\frac{d\beta_i^l(t)}{dw_{pq}^k} = \left( \sum_j w_{ij}^l \frac{d\beta_j^{l-1}(t)}{dw_{pq}^k} + \delta_{lk}\delta_{ip}\beta_q^{l-1}(t) \right) ((\alpha_i^l)'(\eta_i^l(t)))$$

end;
      end;
    end;
// Forwardpropagating derivatives *wrt* coefficients of range extenders by linear prediction:
    For each $p \in E_{LP}$, do -continued
For $q = -J_p + 1, -J_p + 2, \ldots, 0$, do $$\frac{d\beta_i^l(t)}{ds_{pq}} = \sum_j w_{ij}^l \frac{d\beta_j^{l-1}(t)}{ds_{pq}} ((\alpha_i^l)'(\eta_i^l(t)))$$

end;
For $q = 1, 2, \ldots, J_p$, do $$\frac{d\beta_i^l(t)}{dc_{pq}} = \sum_j w_{ij}^l \frac{d\beta_j^{l-1}(t)}{dc_{pq}} ((\alpha_i^l)'(\eta_i^l(t)))$$

end;
end;
end;
end;

Subroutine Differentiating_$Q_\omega$_wrt_Weight_and_Initial_State_for_MLPWOF_by_RTRL:

For each $p \in F$, do $$\frac{dQ_\omega}{dv_p^L} = \sum_{t} \sum_{i \in O} \frac{\partial Q_\omega}{\partial \gamma_i(t)} \frac{d\gamma_i(t)}{dv_p^L};$$

end;
For $l = 1, 2 \ldots, L_l$ do
  For $p = 1, 2, \ldots, n_l$, do
    For $q = 0, 1, \ldots, n_{l-l}$, do $$\frac{dQ_\omega}{dw_{pq}^l} = \sum_{t} \sum_{i \in O} \frac{\partial Q_\omega}{\partial \gamma_i(t)} \frac{d\gamma_i(t)}{dw_{pq}^l}$$

end;
end;
end;

The derivatives $dH(w, v)/dw_{ij}^l$, $dH(w, v)/dw_{ij}^{rl}$, $dH(w, v)/dv_i^l$ of the mean Huber's error criterion $$H(w,v) = (1/(T(\#S))) \sum_{\omega \in S} \sum_{t=1}^{T} \sum_{i=1}^{n} E[\rho(x_i(t,\omega) - \hat{x}_i(t,\omega,w,v))]$$

can be computed using the foregoing formulas with $Q_\omega$ replaced by $$H_\omega := (1/(T(\#S))) \sum_{t=1}^{T} \sum_{i=1}^{n} E[\rho(x_i(t,\omega) - \hat{x}_i(t,\omega,w,v))].$$

The derivatives of the mean square error criterion $Q_1(w, v)$ and the mean Huber's error criterion $H_1(w, v)$ for synthesizing training data into an ancillary filter can also be computed using the foregoing formulas with $Q_\omega$ replaced $$Q_{1\omega} := (1/(T(\#S))) \sum_{t=1}^{T} \|V(t,\omega) - \hat{V}(t,\omega,w,v)\|_F^2 \text{ and}$$

$$H_{1\omega} := (1/(T)\#S))) \sum_{t=1}^{T} \sum_{i=1}^{n} \rho(V_i(t,\omega) - \hat{V}_i(t,\omega,w,v)),$$

respectively. In fact, the derivatives of any training criterion $C(w, v)$, that is expressible as $C(w, v) = \Sigma_{\omega \in S} C_\omega$, where $C_\omega$ is a function of the output vectors of the MLPWIN or MLPWOF under training and is differentiable with respect to w and v, can be computed using the foregoing formulas with $Q_\omega$ replaced by $C_\omega$.

If an MLPWIN or an MLPWOF has fixed weights, we may first include these fixed weights in w and use the pseudo computer programs to evaluate all derivatives of $C(w, v)$ with respect to all weights. Those derivatives of $C(w, v)$ with respect to the fixed weights are then discarded. A missing connection is regarded as a connection with a fixed weight equal to zero.

The derivatives $dC(w, v)/dw_{ij}^l$, $dC(w, v)/dw_{ij}^{rl}$ and $dC(w, v)/dv_i^l$ for an MLPWIN (or $dC(w, v)/dw_{ij}^l$ and $dC(w,v)/dv_i^l$ for an MLPWOF) and derivatives of $c(w, v)$ with respect to coefficients and initialization values of range tranformers to be optimized and computed in the foregoing algorithm constitute the gradient of $C(w, v)$ with respect to $(w, v)$ for the neural system with an MLPWIN (or respectively MLPWOF). Given the gradient, to be denoted by $\nabla C(w, v)$, the gradient descent methods, the conjugate gradient methods and the quasi-Newton methods can be applied. There is a large variety of gradient descent methods, but a basic gradient descent method is an iterative method and improves the value of $(w, v)$ in each iteration by $$(w,v)^{new} = (w,v)^{old} - \lambda \nabla C(w,v), \tag{35}$$

where $\lambda$ is a positive constant called the step size. The application of this basic gradient descent method to training RNNs is mentioned on pages 174 and 185 of J. Hertz, A. Krogh and R. G. Palmer, *Introduction to the Theory of Neural Computation*, Addison Wesley (1991). The conjugate gradient methods and the quasi-Newton methods are well-known methods for optimization. A good introduction to them can be found in D. G. Luenberger, *Linear and Nonlinear Programming*, second edition, Addison-Wesley (1973). Some ready to run routines that implement some powerful variants of these methods can be found in W. H. Press, S. A. Teukolsky, W. T. Vetterling and B. P. Flannery, *Numerical Recipes in C*, second edition, Cambridge University Press (1992). In the book, the routine for the conjugate gradient method is called frprmn (p.423) and the routine for the quasi-Newton method is called dfpmin (p.428). A floppy diskett containing the routines is provided in the book.

For evaluating the derivatives of $C(w, v)$, BPTT involves much less computation, but much more memory space than RTRL. For minimizing $C(w, v)$ given its derivatives, quasi-Newton and conjugate gradient methods require about the same amount of computation in each iteration, but the former converges faster than the latter. Quasi-Newton methods also need much more memory space than do conjugate gradient methods. Hence, if plenty of memory space is available in a computer, a combination of BPTT and a quasi-Newton method is preferred on the computer. However, if the memory space is limited in a computer for synthesizing given training data into a filter, a combination of RTRL and a conjugate gradient method is preferred on the computer. Different combinations are possible for different degrees of availability of the memory space in a computer.

Two somewhat different methods of training RNNs use extended Kalman filter (EKF) and are proposed in G. V. Puskorius and L. A. Feldkamp, "Recurrent Network Training with the Decoupled Extended Kalman Filter Algorithm," *Science of Artificial Neural Networks*, edited by D. W. Ruck, *Proceedings SPIE* 1710, pp. 461–473 (1992), and in R. J. Williams, "Training Recurrent Networks Using the Extended Kalman Filter," *Proceedings of the 1992 International Joint Conference on Neural Networks*, Baltimore, Md., pp. IV 241–246 (1992), which are incorporated herein by reference. These EKF methods also require evaluation of the derivatives of C(w, v).

In many applications, real-time training of a neural system is necessary. Real-time training is training while the signal and measurement sequences are being presented (if the true signals become available after some time lag) rather than after they are completely collected. Algorithms for real-time training must be able to train a neural system with signal and measurement sequences of arbitrary length— there are no requirements for memory proportional to the maximum time series length. If the underlying dynamics and/or joint probability distributions of the signal and measurement processes change over time, real-time training enables a filter in operation to adjust its adjustable weights at the same time as it processes the measurement process and produces estimates of a signal process. Such a filter together with means for real-time training is called an adaptive filter.

For real-time training, RTRL is more suitable than BPTT for evaluating derivatives for C(w, v), and the gradient descent and EKF methods are more suitable than conjugate gradient and quasi-Newton methods for minimizing C(w, v) given its derivatives. The combination of RTRL and Puskorius and Feldkamp's EKF method is preferred. The combination works much better than the combination of RTRL and the basic gradient descent method.

Most of the foregoing optimization algorithms are iterative in nature. The adjustable weights of the neural system to be optimized are randomly selected at the beginning of the algorithm. If the initial dynamic state is to be optimized as well, it is either randomly selected or set equal to a canonical initial dynamic state at the beginning of the optimization process. The adjustable weights and initial dynamic state are then adjusted iteratively until the value of the training criterion ceases to improve by more than a preset small number, say $10^{-12}$.

It is known that every one of the training criteria discussed early on contains many undesired local minima, where a local search optimization method can get trapped. Therefore, if a local search method is used, it should be applied a number of times starting at different (randomly or systematically chosen) initial values for the optimization variables (i.e. the adjustable weights and sometimes, initial dynamic state of the neural system). Alternatively, a global search method such as an annealing method, a genetic algorithm or a clustering method can be used for training.

Figure 26:
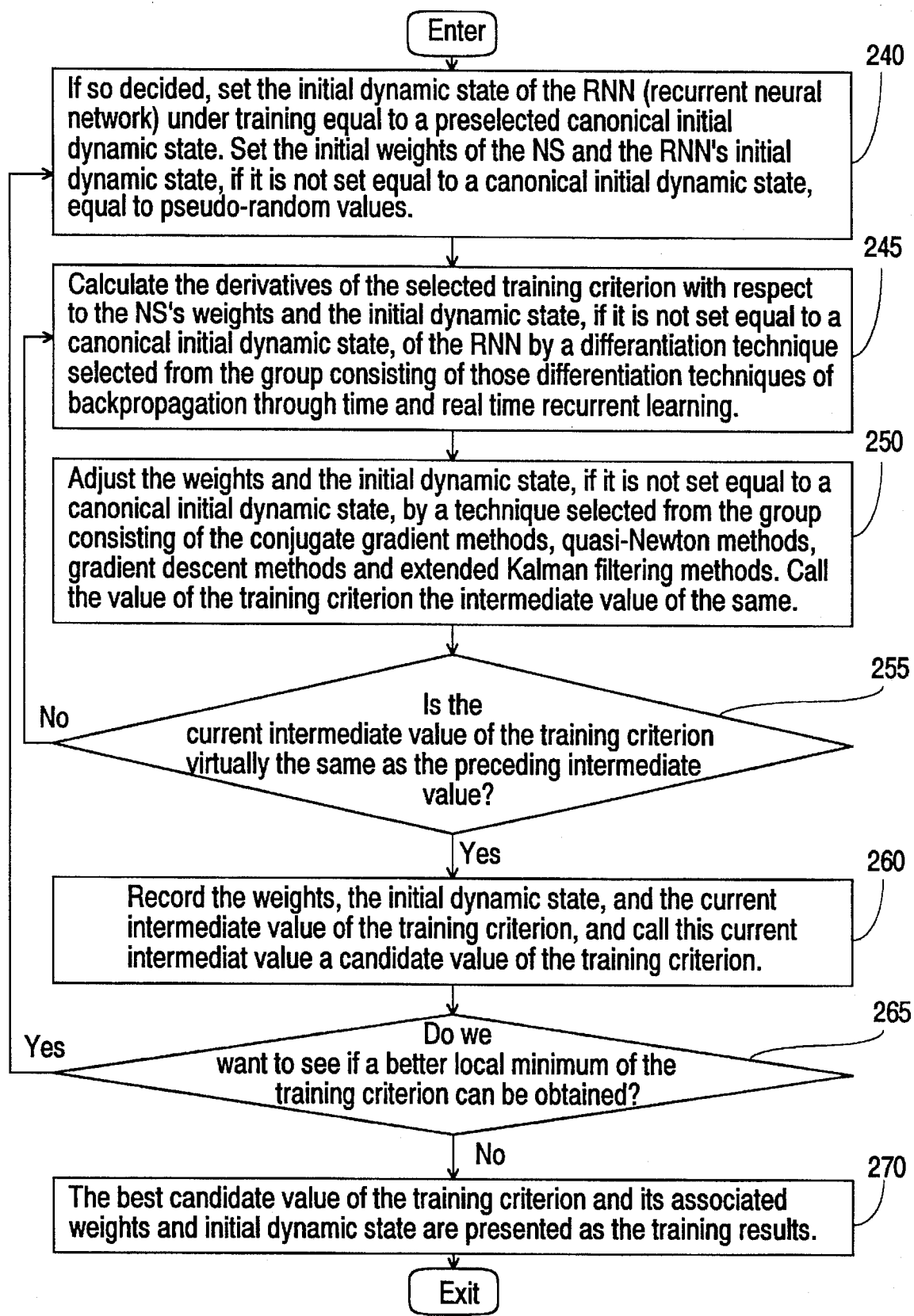
FIG. 26 is a block diagram showing typical iterative procedures taken in training a neural system by a gradient descent, conjugate gradient, quasi-Newton, or extended Kalman filtering method.
Figure 27:
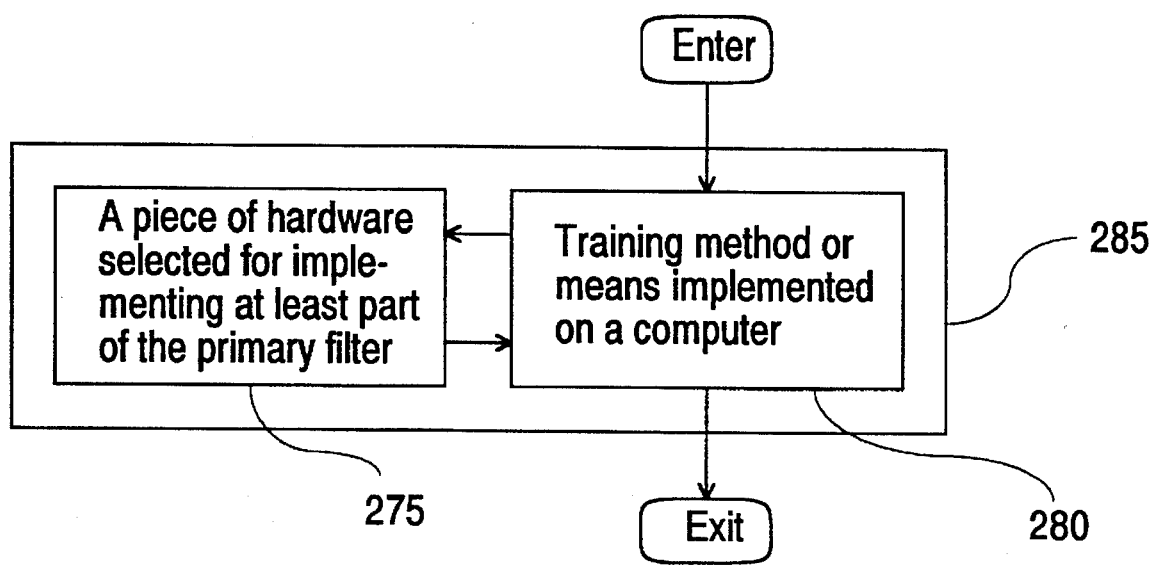
FIG. 27 is a block diagram showing the inclusion of a piece of hardware in the process of training a neural system.

The training methods that have been discussed so far will now be summarized and illustrated by block diagrams in FIG. 26 and FIG. 27. Let us first look at FIG. 26, which is a block diagram showing typical iterative procedures, taken in training a NS (neural system), that uses a differentiation technique and a local search optimization technique. First, we set, in block 240, the initial dynamic state v of the RNN under training equal to a preselected canonical initial dynamic state, if the initial dynamic state v is decided to be so determined. We then in the same block 240 set the NS's initial adjustable weights w and the initial dynamic state v, if v is not set equal to a canonical initial dynamic state, equal to pseudo-random values. We recall that the adjustable weights w exclude those weights that are set equal to some constants. The derivatives $\nabla C(w, v)$ of the selected training criterion C(w, v) with respect to the adjustable weights w and the initial dynamic state v, if v is not set equal to a preselected canonical initial state, are then calculated, in block 245, by a differentiation technique selected from the group consisting of BPTT and RTRL. The adjustable weights w and the initial dynamic state v, if v is not set equal to a canonical initial dynamic state, are then adjusted, in block 250, by a technique selected from the group consisting of the conjugate gradient, quasi-Newton, gradient descent and extended Kalman filtering methods. Call the resulting value of the training criterion the intermediate value of the same. If it is determined in block 255 that the current intermediate value of the training criterion is not virtually the same as the preceding intermediate value, we repeat blocks 245, 250 and 255. Otherwise, we record, in block 260, the adjustable weights, the initial dynamic state, and the current intermediate value of the training criterion, and call this current intermediate value a candidate value of the training criterion. If it is decided in block 265 that we want to see if a better local minimum of the training criterion can be obtained, we go to block 240. Otherwise, we present, in block 270, the best candidate value of the training criterion and its associated initial dynamic state, that have been obtained, as the training results.

If the training data set is not believed to sufficiently represent the joint probability distribution of the signal and measurement processes, the following technique can be used in training a neural system to help ensure its good generalization capability: A second training data set is collected and is called a testing data set. A second training criterion constructed using the testing data set, in the same way the (first) training criterion is constructed using the training data set, is called a testing criterion. A block diagram showing this technique can be obtained by modifying FIG. 26 as follows: In block 250 of FIG. 26, the value of the testing criterion is also computed and called the intermediate value of the testing criterion. In block 255, the question, "Is the current intermediate value of the testing criterion greater than or virtually the same as the preceding intermediate value?" is asked instead of the original question in block 255. In block 260, we record the current intermediate value of the testing criterion as well and call this intermediate value a candidate value of the testing criterion. In block 265, we ask the question, "Do we want to see if a better candidate value of the testing criterion?" instead of the original question in block 265. In block 270, the best candidate value of the testing criterion is also presented as a training result.

Techniques for pruning a recurrent neural network, which are similar to those network-pruning techniques introduced in Simon Haykin, *Neural Networks—A Comprehensive Foundation*, pp. 205–212, Macmillan College Publishing Company, Inc. (1994) can hopefully reduce the number of connections (delayless and delay connections) and to ensure a good generalization capability of a neural system under training.

As indicated previously, a training data set should be sufficiently large to reflect the probability distribution of the signal and measurement processes. As such, the training data set is usually extremely large, making the minimization of the training criterion, which incorporates the training data set, extremely difficult, because the extremely large computer memory and time are required in executing an optimization algorithm on a computer. A training method, which was discovered and has been used successfully by the present inventors, is described under the assumption that both the adjustable weights w and the initial dynamic state v are to be determined by the optimization of C(w, v) as follows: First, the training data set is divided at random into a finite number of subsets, which are usually more or less the same size and are numbered, say i=1, . . . , M. Second, we form the training criterion $C_i$(w, v) for each of these training data subsets as if it were the only training data available. Third, we select an iterative optimization algorithm. Fourth, execute the following algorithm:

(a). Select the initial value $(w^{(O)}, v^{(O)})$ of (w, v) at random, set $\tau$ equal to a selected positive integer, and set i=1;

(b). Execute $\tau$ iterations of the iterative optimization algorithm to minimize $C_{i \bmod M}(w, v)$, where i mod M is defined to be i–kM for such an integer k that $1 \leq i-kM \leq M$, record the resulting value $(w^{(i)}, v^{(i)})$ of (w, v), and set i=i+1;

(c). If the sequence $(w^{(i)}, v^{(i)})$ obtained so far has not converged satisfactorily, then go to (b). Otherwise, stop and report the result $(w, v)=(w^{(i)}, v^{(i)})$.

The sizes (or size) of the training data subsets should be selected such that the memory and speed of the computer used for training are utilized efficiently in applying the optimization algorithm to $C_{i \bmod M}$(w, v). The positive integer $\tau$ should be selected small enough so that executing step (b) above a single time does not "wipe out" too much of the effects on the value of (w, v) by the previous executions of the same step, step (b). The selection of the sizes of the training data subsets and the selection of the positive integer $\tau$ may have to be done by trial-and-error a few times for the particular application and computer involved. Fortunately, this training method is not very sensitive to the selections.

This training method of dividing the training data into subsets and alternately training a neural system on each of these subsets is called the divide-and-conquer training method. It will be appreciated that the divide-and-conquer training method has many possible variants. The essential idea of the method is indicated by the phrase "divide-and-conquer." Namely, if the training data set is or is expected to be too large for the computer to handle efficiently or effectively, subsets of the training data can be alternately handled to achieve the over-all goal of training. A useful variant of the method is the following: We may want to repeat the procedure consisting of collecting a subset of training data and executing a selected number of iterations of the optimization algorithm on the training criterion formed with the subset of training data. The repetitions continue until the convergence of the resulting sequence of values of (w, v) is reached. Notice here that each training data subset is collected (by simulation or experiment), used for training, and discarded. If the number of iterations in applying the optimization algorithm is small enough for each training data subset, the collection of all such training data subsets that will have been used in training up an RNN will usually be very large and reflect the probability distribution of the signal and measurement processes very sufficiently. Nevertheless, the cost of data collection is proportionally high.

As shown in FIG. 24, whatever training method is used, it is used to train many neural systems so that each of them has a filtering performance as close as desired to the optimal performance with respect to the selected estimation error criterion, that is achievable for its given architecture. The last step in synthesizing training data into a primary (or respectively ancillary) filter is to select a trained neural system as the primary (or respectively ancillary) filter in consideration of the RNN size, the computational cost of each range extender and reducer, and the filtering accuracy to optimize the cost-effectiveness.

Training and synthesizing can be performed on a general-purpose digital computer (e.g. IBM personal computers, SUN workstations and Connection Machines), a coprocessor accelerator board (e.g. Balboa 860 of HNC, Inc., 5501 Oberlin Dr., San Diego, Calif. 92121-1718), or a programmable neurocomputer (e.g. CNAPS server of Adaptive Solutions, Inc., 1400 N. W. Compton Drive, Suite 340, Beaverton, Oregon 97006).

Upon the completion of synthesizing training data on one of these computing devices, the resulting neural filter has already been programmed into the device, thereby completing implementation of the neural filter at the same time.

If a neural filter that results from synthesizing training data is to be implemented on a piece of hardware (e.g. a neural network chip, electronic circuit, optical device, or electro-optical apparatus), it is sometimes necessary to include, as shown in FIG. 27, the piece of hardware 275 in the process 285 of training NSs, so as to overcome the anomalies and/or imperfections of the hardware. For example, there is considerable cell-to-cell variation across the analog multiplying synapse array in Intel's 80170NX Electrically Trainable Artificial Neural Network (ETANN) chip. One of the critical elements in the successful deployment of the 80170NX chip has been the development of the proper model and training software to closely couple the non-ideal chip behavior to the training algorithm—a process termed "chip-in-the-loop" optimization (H. A. Castro, S. M. Tam and M. Holier, "Implementation and Performance of an Analog Non-Volatile Neural Network," in 80170*NX Neural Network Technology & Applications*, Publication #241359, Intel Corporation (1992)).

Figure 28:
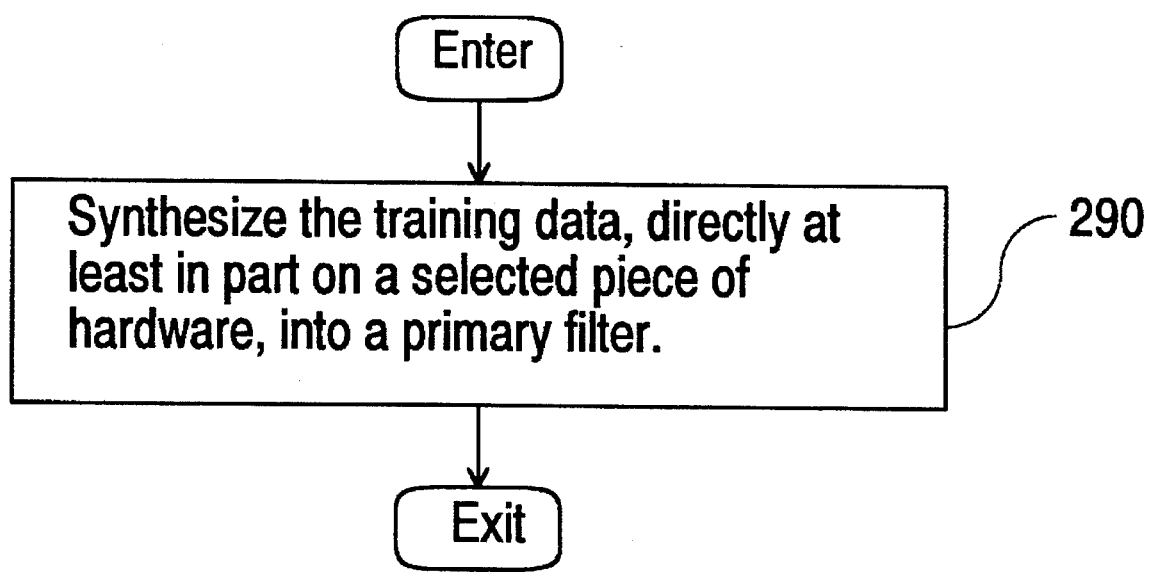
FIG. 28 is a block diagram showing the synthesis of the training data, directly on a selected piece of hardware, into a primary filter.
Figure 30:
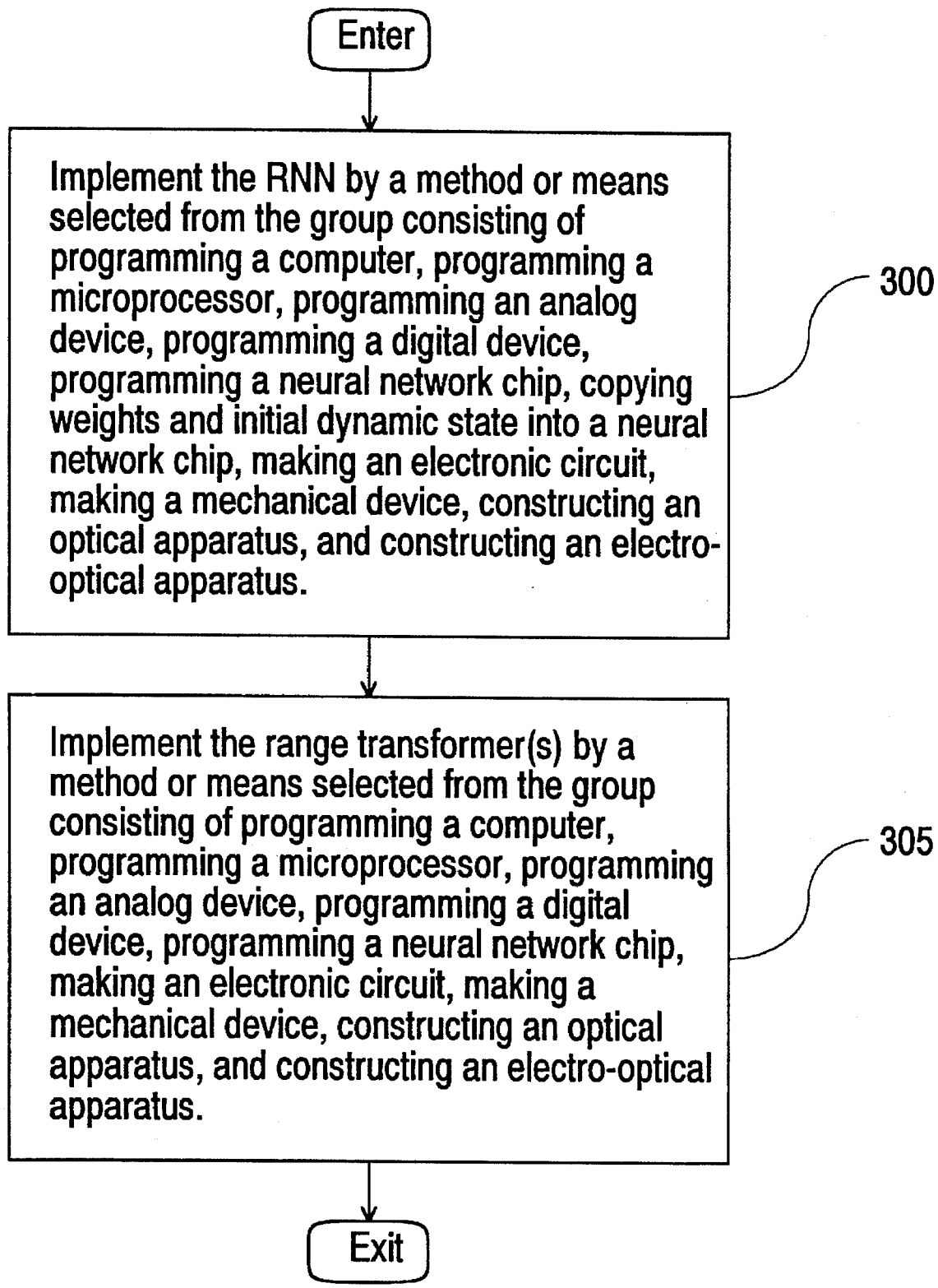
FIG. 30 is a block diagram showing the implementation of a primary filter by implementing its RNN by a method or a procedure selected from the group consisting of programming a computer, programming a microprocessor, programming an analog device, programming a digital device, programming a neural network chip, copying weights and initial dynamic state into a neural network chip, making an electronic circuit, making a mechanical device, constructing an optical device, and constructing an electro-optical apparatus, and by implementing said primary filter's range transformer(s) by a method or procedure selected from programming a computer, programming a microprocessor, programming an analog device, programming a digital device, programming a neural network chip, making an electronic circuit, making a mechanical device, constructing an optical device, and constructing an electro-optical apparatus.

Training and synthesizing can also be performed directly on some general-purpose or special-purpose neural network chips, electronic circuits, optical devices, or electro-optical apparatuses, thereby completing implementation at the same time. This is shown by block 290 in FIG. 28.

Augmenting Inputs to Neural Filters for Treating Time-Variant Processes

A process as defined herein can be classified as a time-variant process or a time-invariant process. A time-invariant process is a process whose behavior or evolution given the same initial value is invariant under a shift of time. For instance, if the functions, f(x, t) and G(x, t), that appear in the model, (1), are functions of their first argument x only and do not depend on their second argument t, and if the covariance $E[\xi(t)\xi^T(t)]$ of the Gaussian noise process $\xi(t)$, in the same model is a constant matrix, then the signal process described by the model is a time-invariant signal process. In addition, if the function, h(x, t), that appears in (2) is also a function of its first argument x only and does not depend on its second argument t, and if the covariance $E[\epsilon(t)\epsilon^T(t)]$ of the Gaussian noise process $\epsilon(t)$ is a constant matrix, then the measurement process described by (2) is a time-invariant measurement process.

If both the signal and measurement processes are time-invariant, they are called time-invariant signal and measurement processes. Otherwise, they are called time-variant signal and measurement processes.

Up to this point, the time-variant signal and measurement processes and the time-invariant signal and measurement processes have been simultaneously treated with no distinction being made between them. All the statements that have been made so far are valid for both the time-variant and time-invariant cases. However, if the signal and measurement processes are time-variant, large numbers of connections an d neurons are usually required of a neural filter for "memorizing" the time-variant property, especially when the length of the time interval, over which filtering is performed, is long. A modified method and apparatus will now be described that greatly reduces the numbers of connections and neurons in a neural filter for time-variant signal and measurement processes.

The idea is to input all or some of the known time-variant property as described by a vector-valued time function to the neural filter. In other words, the input terminals of a neural filter are augmented to receive a vector-valued time function, representing the time-variant property, in addition to the measurement process. Such a neural filter is called a neural filter with augmented input terminals. The following examples are given to illustrate the idea:

EXAMPLE 1

Consider the scalar signal and scalar measurement processes described by the equations, $$x(t+1)=f(t)x(t)+g(t)\xi(t), \quad x(1)=x_1, \tag{36}$$

$$y(t)=h(t)x^3(t)+\epsilon(t), \tag{37}$$

where f(t), g(t) and h(t) are known scalar-valued functions of time; the variances of the zero-mean Gaussian noise processes, $\xi(t)$ and $\epsilon(t)$, are $E[\xi^2(t)]=q(t)$ and $E[\epsilon^2(t)]=r(t)$, which are also known functions of time; $x_1$ is a zero-mean Gaussian random variable with variance 1; and $x_1$, $\xi(t)$ and $\epsilon(t)$ are statistically independent. The functions of time, f(t), g(t), h(t), q(t), and r(t), describe the time-variant property of the time-variant signal and measurement processes. According to the foregoing idea, the primary (neural) filter for processing y(t) to estimate x(t) should have six input terminals to receive the vector (y(t), f(t), g(t), h(t), q(t), r(t)) as its input vector at time t. If an ancillary filter is required, it should also have six input terminals to receive the same vector at time t in addition to possibly one extra input terminal for receiving the output $\hat{x}(t)$ from the primary filter.

EXAMPLE 2

Consider the n-dimensional signal and m-dimensional measurement processes described by the equations, $$x(t+1)=f(x(t),u(t))+G(x(t),u(t))\xi(t), \quad x(1)=z_1 \tag{38}$$

$$y(t)=h(x(t),u(t))+\epsilon(t), \tag{39}$$

where u(t) is a p-dimensional function of time; $x_1$ is a Gaussian random vector with mean zero and covariance $E[x_1 x_1^T]=p_1$; $\xi(t)$ and $\epsilon(t)$ are respectively $n_1$-dimensional and $m_1$-dimensional Gaussian noise processes with zero means and covariance $E[\xi(t)\xi^T(t)]=Q$ and $E[\epsilon(t)\epsilon^T(t)]=R$; $x_1$, $\xi(t)$ and $\epsilon(t)$ are statistically independent; the functions f(x, u), G(x, u), and h(x, u) are known functions with such appropriate dimensions and properties that the above equations describe the signal and measurement processes faithfully. In fact, the above equations describe a rather general control system with x(t), y(t) and u(t) as the state, observation and control respectively. The control function u(t) is assumed to be a known function of time and describes the time-variant property of the above signal and measurement processes. According to the foregoing idea, the primary (neural) filter for processing y(t) to estimate x(t) should have m+p input terminals to receive y(t) and u(t) as their input vector at time t. If an ancillary filter is required, it should also have m+p input terminals to receive the same vector at time t in addition to possibly n extra input terminals for receiving the output $\hat{x}(t)$ from the primary filter.

In a case where no mathematical/statistical model of the signal and measurement processes exists, but some vector-valued function of time describing or affecting the time-variant property of the signal and measurement processes is available, the foregoing idea is still applicable and the primary filter and the ancillary filter (if required) should have extra input terminals for receiving said function of time. Recall that a scalar is herein regarded as a one-dimensional vector. Hence a scalar-valued function of time is a one-dimensional vector-valued function of time.

Figure 18:
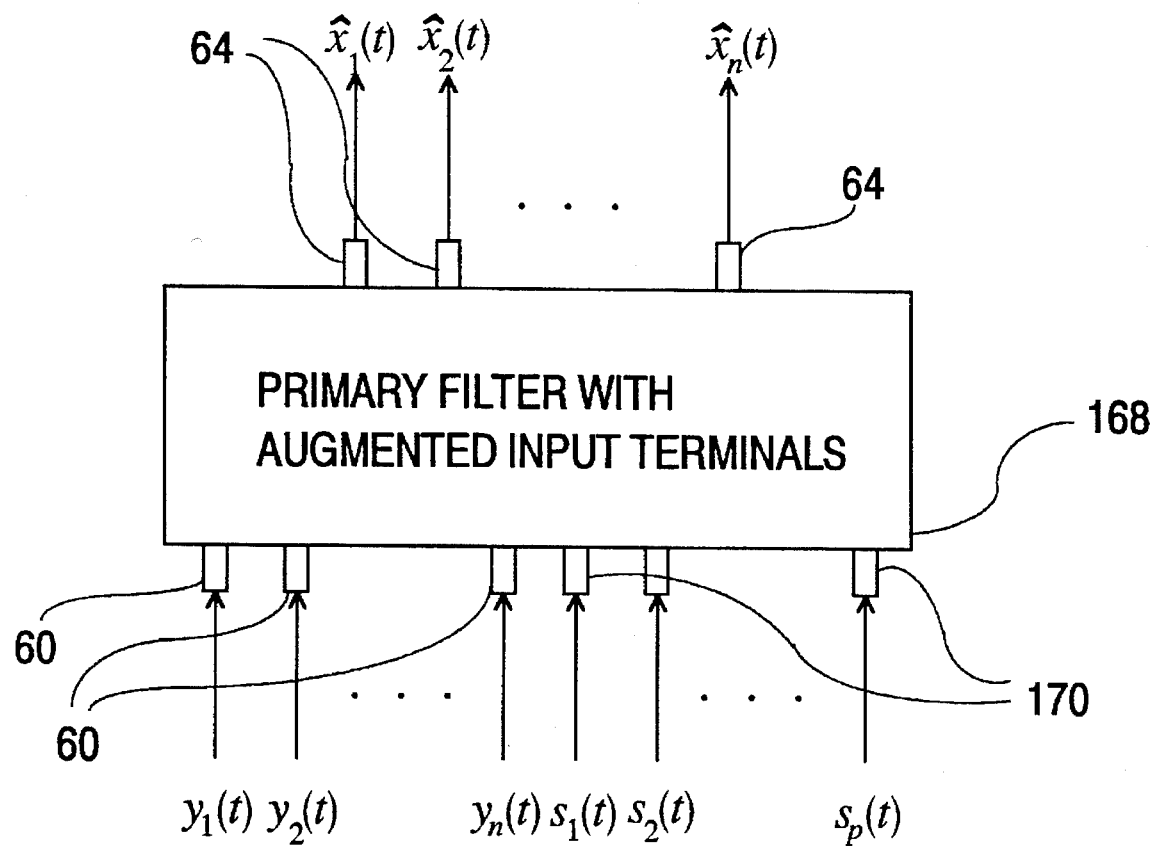
FIG. 18 shows a primary filter whose inputs have been augmented to treat time-variant processes. It receives the measurement vector y(t) and the time function s(t) at the input terminals of the filter and sends out the estimate $\hat{x}(t)$ of the signal vector x(t) at time t.

Whether there is a mathematical/statistical model of the signal and measurement processes, a primary filter 168 after implementation in accordance with the foregoing idea for treating time-variant signal and measurement processes, as depicted in FIG. 18, has m input terminals 60 for receiving the measurement vector $y(t)=(y_1(t), y_2(t), \ldots, y_m(t))$ and $\rho$ input terminals 170 for receiving $\rho$ components of the time function $s(t)=(s_1(t), s_2(t), \ldots, s_p(t))$, that describes partly or fully the time-variant property of the signal and measurement processes. An ancillary filter after implementation in accordance with the foregoing idea for treating time-variant signal and measurement processes has the same number of input terminals as does the primary filter for receiving y(t) and s(t). However, if there is a need for the ancillary filter to receive $\hat{x}(t)$ as inputs, the ancillary filter should have n+m+p input terminals altogether for receiving $\hat{x}(t)$, y(t) and s(t) as its inputs at time t. While the output terminals 64 of the primary filter send out the estimate $\hat{x}(t)$ of the signal x(t), the output terminals of the ancillary filter send out the estimate $\hat{V}(t)$ of the ancillary signal V(t). Such a primary filter and an ancillary filter are called a primary filter with augmented input terminals and an ancillary filter with augmented input terminals respectively.

A training data set for such a primary filter is a group of finite sequences, $((y(t,\omega),s(t)), x(t,\omega))$, $t=1,2,\ldots,T$, $\omega \in S$, where (y(t,$\omega$),s(t)) are used as inputs and x(t,$\omega$) are used as the corresponding target outputs in training RNNs together with selected range extenders and/or reducers into a primary filter. In generating a sequence $w$ in the training data set, x(t,$\omega$) and y(t,$\omega$) are generated for the same corresponding time function s(t), that actually describes the time-variant property at the same time.

Suppose that there are different time functions s(t) describing different time-variant situations of the signal and measurement processes in different filtering environments. All such time functions or a subset thereof that is sufficiently representative of their relative frequency (or probability) distribution should be included in the training data set. Such included time functions are called exemplary time functions. In case there is only one time function included in the training data set, the time function will also be called an exemplary time function. Whether there is one or many exemplary time functions, the totality of all of them will be called the set of exemplary time functions. For each exemplary time function s(t) included, a sufficient number of sequences of x(t,$\omega$) and y(t,$\omega$) should be generated and included jointly as $((y(t,\omega), s(t)), x(t,\omega))$, $t=1, 2, \ldots, T$, $\omega \in S$ in the training data set. It will be much more convenient to write such a training data set as $((y(t,\omega), s(t,\omega)), x(t, \omega))$, $t=1,2,\ldots,T$, $\omega \in S$, where s(t,$\omega$) denotes the function of time describing the time-variant property of the signal and measurement processes at the time the realizations x(t,ω) and y(t,ω) take place and are recorded. Such a training data set is called an augmented training data set.

Treating the process, (y(t), s(t)), t=1,2, ..., T, and its realizations, (y(t, ω), s(t,ω)), t=1, 2, ..., T, and ω∈S as if they were the measurement process and its realizations, an augmented training data set is synthesized into a primary filter with augmented input terminals in exactly the same way as described previously for synthesizing a training data set into a primary filter. Using the notations established for the foregoing pseudo computer programs, the input sequence for synthesizing a primary filter with augmented input terminals is $\zeta(t,\omega)=[y^T(t,\omega),s^T(t,\omega)]^T$, t=1,2,...,T for each ω∈S. Similarly, treating the process, (y(t), s(t)), t=1, 2, ..., T, and its realizations, (y(t,ω), s(t,ω)), t=1, 2, ..., T and ω∈S, as if they were the measurement process and its realizations, an augmented ancillary training data set can be generated and synthesized into an ancillary filter with augmented input terminals in exactly the same way as described previously for generating an ancillary training data set and synthesize it into an ancillary filter. Using the notations established for the foregoing pseudo computer programs, the input sequence for synthesizing an ancillary filter with augmented input terminals is $\zeta(t,\omega)=[y^T(t,\omega), s^T(t,\omega), \hat{x}^T(t,\omega)]^T$ or $\zeta(t, \omega)=[y^T(t,\omega), s^T(t,\omega)]^T$, t=1, 2, ..., T for each ω∈S, depending on whether or not $\hat{x}(t)$ is used. FIG. 29 is a table 295 showing the replacements of terminologies required to convert the block diagram in FIG. 5, FIGS. 10–17, and FIGS. 23–28 into corresponding block diagrams for a primary filter with augmented input terminals or an ancillary filter with augmented input terminals.

Neural Filtering in an Interactive Environment

In many important applications of filtering, a neural filter interacts with its environment, where the signal and measurement processes come from. The filter outputs affect the environment, which in turn shows the effect in the measurement process and thus affects the filter outputs. This interaction between the filter and its environment amounts to feedback loops for the filter and its environment. If one or more neural filters are to be employed for filtering in such an interactive environment, the effects of these feedback loops between the filters and their environment have to be taken into account in determining the adjustable weights (including the coefficients and initialization values of the range transformers) and initial dynamic states of the neural filters in order to obtain neural filters, whose filtering performances are as close as desired to the optimal performances with respect to selected estimation error criteria, that are achievable for the architectures of the neural filters.

Figure 19:
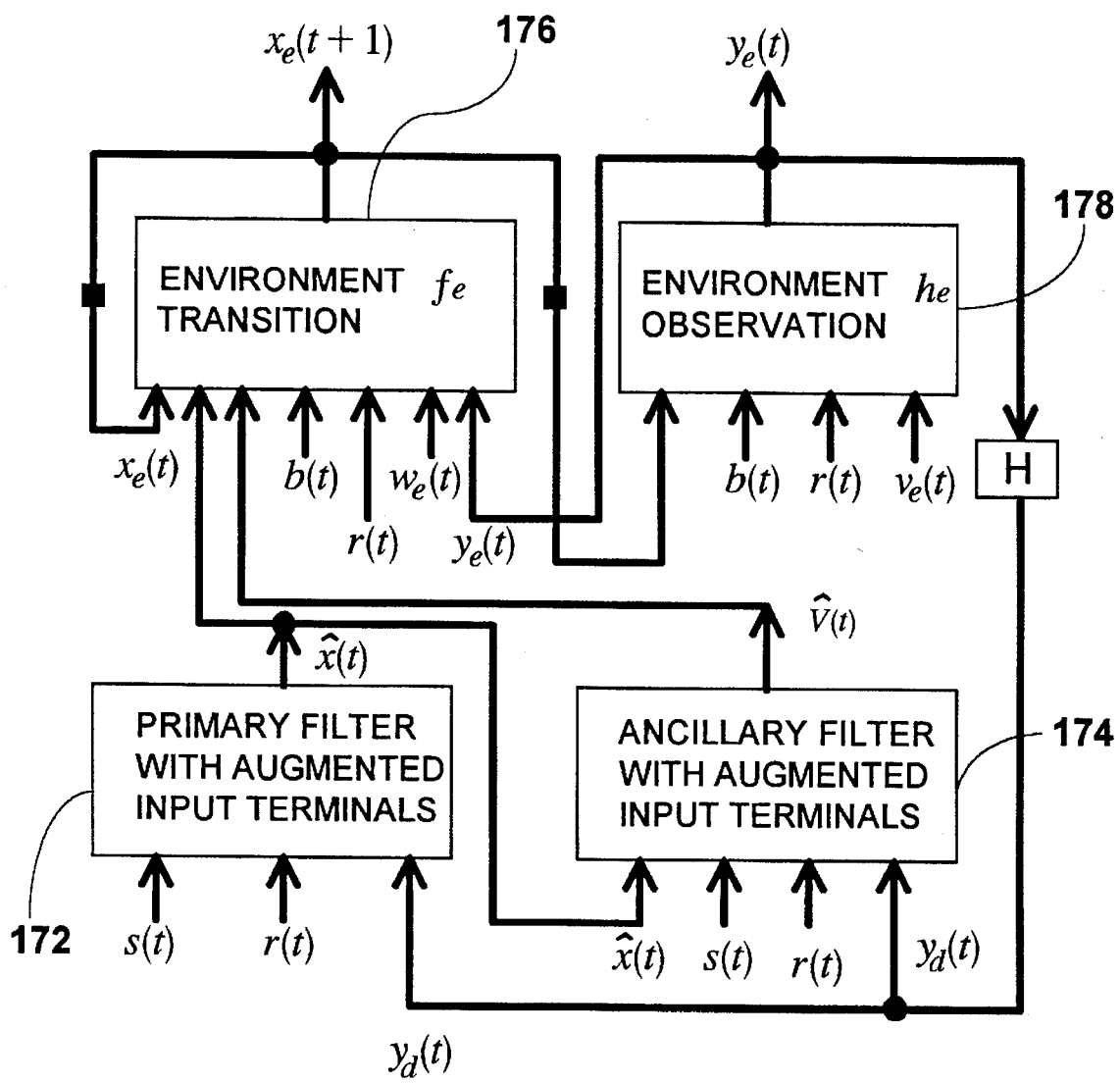
FIG. 19 is a block diagram showing a primary filter and an ancillary filter both with augmented input nodes in an interactive environment, which consists of an environment transition system and an environment observation system.

In FIG. 19 a primary filter with augmented input terminals 172, an ancillary filter with augmented input terminals 174, and their environment, including an environment transition system 176 and an environment observation system 178, are depicted. The thick connection lines indicate multiple channel (or vector-valued) connection. The output vectors $\hat{x}(t)$ and $\hat{V}(t)$ of the neural filters are input into the environment transition system 176 at time t. A process, denoted by b(t), that represents the state of the world outside but relevant to the neural filters and the environment systems 176, 178 and is received through some sensors by the environment systems is called a baseline process. The baseline process is usually closely related to and sometimes the same as the signal process. A process, denoted by r(t), whose value at each time t is known from external sources and carries information about the signal and/or baseline process is called a reference measurement process and is distributed to each of the four blocks, 172, 174, 176, 178. The random driving process $w_c(t)$ and the observational noise $v_c(t)$ have known joint probability distributions and are received respectively by the environment transition system and observation system. The environment transition system is, in general, a dynamic system 176, whose dynamic state, denoted by $x_c(t)$ at time t, is called the environmental state. The environmental state is observed together with b(t) and r(t) in the observational noise $v_c(t)$ by the environment observation system 178. The output process $y_c(t)$ of the environment observation system, and a certain number of its components, which form the vector-valued process $y_d(t)$ called the environment observation process are input to the environment transition system 176 and the neural filters 172, 174 respectively. The processes $y_d(t)$ and $y_c(t)$ are related by $y_d(t)=Hy_c(t)$, where H is a constant matrix that selects components of $y_c(t)$ to form the environment observation process $y_d(t)$. The processes $y_d(t)$ and r(t) constitute the measurement process y(t) for the neural filters 172, 174. A time function s(t), that describes the time-variant property of the signal process x(t), the environment transition and observation systems, the reference measurement process r(t), and the baseline process b(t), is input to the neural filters.

A description of the environment transition system and observation system, that will be used to illustrate our ideas, is the following pair of discrete-time equations:

$$x_e(t+1)=f_e(x_e(t),\hat{x}(t),\hat{V}(t),b(t),r(t),y_c(t),w_e(t),t), \quad x_e(1)=x_{e1} \quad (40)$$

$$y_c(t)=h_e(x_e(t),b(t),r(t),v_e(t),t), \quad (41)$$

where $x_{e1}$ is the initial environment state and $f_e$ and $h_e$ are known functions. We stress that all the processes considered here, namely b(t), r(t), $w_e(t)$, $v_e(t)$, s(t), $x_e(t)$, $y_e(t)$, $\hat{x}(t)$, and $\hat{V}(t)$, are vector-valued. The joint relative frequency (or probability) distributions of b(t), r(t), $w_e(t)$, $v_e(t)$, s(t), and $x_{e1}$ are assumed known.

The filtering environment depicted in FIG. 19 and described by (40) and (41) is rather general. It can be easily reduced to a large variety of special cases. Let us look at some examples. If the time function s(t) is not available or if the signal and measurement processes are time-invariant, the neural filters are reduced to primary and ancillary filters (without augmented input terminals) and the inputs s(t) to these neural filters are removed from FIG. 19. If the reference measurement process r(t) is unavailable, the inputs r(t) to all the four blocks in FIG. 19 are eliminated. If r(t) is available, but it does not enter the environment transition and observation systems, the input r(t) to these systems are removed from FIG. 19. If the ancillary filter is not used for either providing the primary filter's estimation error statistics or influencing the environment transition and observation systems, then the ancillary filter and all the connections of its inputs and outputs are taken out of FIG. 19.

EXAMPLE 3

Another example, which is concerned with the control of a stochastic system, is the following: The state dynamic equation of a stochastic control system is $$x_s(t+1)=f_s(x_s(t), u_c(t), b(t), r(t),\xi_s(t), t), \quad x_s(1)=x_{s1}, \quad (42)$$

where $u_c(t)$ denotes the control function and $x_{s1}$ and $\xi_s(t)$ are, respectively, a vector-valued random variable and stochastic process. The observation process is $$y_s(t)=h_s(x_s(t), b(t), r(t), \epsilon_x(t),t), \quad (43)$$

where the observational noise $\epsilon_x(t)$ is a vector-valued stochastic process. The feedback control is generated by the control dynamic equations, $$x_c(t+1)=f_c(x_c(t),\hat{x}(t+1), \hat{V}(t+1), y_c(t+1),\xi_c(t+1), t), \quad (44)$$

$$u_c(t)=h_c(x_1(t), \hat{x}(t), \hat{V}(t), \epsilon_c(t)), \quad (45)$$

where $y_e(t)$ will be defined later, $\hat{x}(t)$ and $\hat{V}(t)$, as before, denote the estimates of the signal $x(t)$ and some estimation error statistics of $\hat{x}(t)$, which are generated respectively by two neural filters. Here we assume that $x_{s1}$, $\xi_s(t)$, $\epsilon_s(t)$, $\xi_c(t)$ and $\epsilon_c(t)$ are a vector-valued random variable and stochastic processes with known joint probability distributions.

Simple substitution yields $$x_s(t+1)=f_s(x_s(t),h_c(f_c(x_c(t-1),\hat{x}(t),\hat{V}(t),y_c(t), \xi_c(t),t-1),\hat{x}(t),\hat{V}(t),\epsilon_c(t)), b(t),r(t),\xi_s(t),t). \quad (46)$$

Defining $x_e(t):=[x_s^T(t), x_c^T(t-1)]^T$, $w_e(t):=[\xi_s^T(t),\xi_c^T(t),\epsilon_c^T(t)]^T$, and $$f_e(x_e(t),\hat{x}(t),\hat{V}(t),b(t),r(t),y_e(t),w_e(t),t) := \begin{bmatrix} f_s(x_s(t),h_c(f_c(x_c(t-1),\hat{x}(t),\hat{V}(t),y_e(t),\xi_c(t),t-1),\hat{x}(t),\hat{V}(t),E_c(t)),b(t),r(t),\xi_s(t),t) \\ f_c(x_c(t-1),\hat{x}(t),\hat{V}(t),y_e(t),\xi_c(t),t-1) \end{bmatrix}, \quad (47)$$

we obtain the environment transition system, $$x_e(t+1)=f_e(x_e(t),\hat{x}(t),\hat{V}(t),b(t),r(t),y_e(t),w_e(t),t). \quad (48)$$

Defining $v_e(t):=\epsilon_s(t)$, and $h_e(x_e(t), b(t), r(t), v_e(t), t):=h_s(x_s(t), b(t), r(t), \epsilon_s(t), t)$, we obtain the environment observation system, $$y_e(t)=h_e(x_e(t),b(t),r(t),v_e(t),t). \quad (49)$$

Including two neural filters exactly as shown in FIG. 19, we obtain a filtering situation that is a special case of the filtering situation depicted in FIG. 19 and described by (40) and (41).

As indicated early on, the interaction between the neural filters and their environment has to be taken into account in determining the adjustable weights and initial dynamic state of the neural filters. In the following, we will first define a single training criterion for both the neural systems, that incorporates this interaction. We will then disclose the algorithms for differentiating this training criterion with respect to (wrt) each of the adjustable weights and initial dynamic state variables to be determined by minimizing the training criterion. Aided by these algorithms, a conjugate gradient or quasi-Newton method can be used to effectively train the neural systems in an interactive environment.

The training data set here consists of realizations $x(t,\omega)$, $b(t,\omega)$, $r(t,\omega)$, $w_c(t,\omega)$, $v_c(t,\omega)$, $s(t,\omega)$, and $x_{c1}(\omega)$ of $x(t)$, $b(t)$, $r(t)$, $w_c(t)$, $v_c(t)$, $s(t)$, and $x_{c1}$, respectively, for $t=1,2,\ldots,T$ and $\omega \in S$. The realizations ought to sufficiently reflect the joint relative frequency distributions of $b(t)$, $r(t)$, $w_c(t)$, $v_c(t)$, $s(t)$, and $x_{c1}$. If the initial dynamic states of the neural filters are to be optimized jointly with the adjustable weights of the neural filters, the initial values of the initial dynamic states and the adjustable weights are randomly chosen. Then for each $\omega \in S$, the environmental observation system processes $b(1, \omega)$, $r(1, \omega)$, $v_c(1,\omega)$ and $x_{c1}(\omega)$ to yield $y_c(1,\omega)$. After $y_d(1,\omega)$ is selected from $y_c(1,\omega)$ by H, the primary neural system under training processes $s(1,\omega)$, $r(1,\omega)$ and $y_d(1,\omega)$ to yield $\hat{x}(1,\omega)$ and then the ancillary neural system under training processes $\hat{x}(1,\omega)$, $s(1,\omega)$, $r(1,\omega)$, and $y_d(1,\omega)$ to yield $\hat{V}(1,\omega)$. Then the environmental transition system transforms $x_c(\omega)$, $\hat{x}(1,\omega)$, $\hat{V}(1,\omega)$, $b(1,\omega)$, $r(1,\omega)$, $w_c(1,\omega)$, and $y_c(1,\omega)$ into $x_e(2,\omega)$, completing one processing cycle by the neural systems and their environment at time $t=1$. In the same fashion, the processing cycles at $t=2,3,\ldots,T$ can be carried out. Notice that $\hat{x}(t,\omega)$ and $\hat{V}(t,\omega)$ are dependent on all the adjustable weights and the initial dynamic states of both the primary and ancillary neural systems. Denoting all the adjustable weights of both the neural systems by w and all the initial dynamic state variables by v, we will denote $\hat{x}(t,\omega)$ and $\hat{V}(t,\omega)$ by $\hat{x}(t, \omega, w, v)$ and $\hat{V}(t, \omega, w, v)$ to indicate their dependency on w and v.

A training criterion that incorporates the interaction between the neural systems and their environment is $$Q_\omega = (1-\lambda)\sum_{t=1}^{T} \|x(t,\omega) - \hat{x}(t,\omega,w,v)\|^2/[T(\#S)] +$$

-continued $$\lambda \sum_{t=1}^{T} \|V(t,\omega) - \hat{V}(t,\omega,w,v)\|_F^2/[T(\#S)],$$

where $\lambda$ is an arbitrary constant between 0 and 1. The symbols $Q_\omega$, w, and v to be used in the following algorithms are the only ones that do not have the same meanings as the same symbols had previously. Besides these symbols, all the other notations established previously for the pseudo computer programs for training a neural system without an interactive environment are valid here. In addition, some conventions are needed here. The statement, "Identify the neural system referred to in the next 3 statements as the primary (or respective ancillary) neural system under training," means that in the subroutines called in the next 3 statements, the neural system referred to is the neural system being trained to function as the primary filter 172 (or respectively ancillary filter 174) in FIG. 19. For instance, for identification as the primary neural system, the symbols $\alpha(t)$, $\gamma(t)$, and $\zeta(t)$ are identified with $x(t)$, $\hat{x}(t)$, and $[s^T(t), r^T(t), y_d^T(t)]^T$, respectively. For identification as the ancillary neural system, the symbols $\alpha(t)$, $\gamma(t)$, $\zeta(t)$ are identified with $V(t)$, $\hat{V}(t)$, and $[\hat{x}^T(t),s^T(t),r^T(t),y_d^T(t)]^T$, respectively. The symbol, "$(.)_{primary}$" (or respectively "$(.)_{ancinary}$") indicates that the variable in the pair of parentheses is the corresponding variable in the neural system being trained to function as the primary (or respectively ancillary) filter in FIG. 19. The subroutines that are called but not listed hereinbelow are the same as those given previously under the same names.

Because some inputs of the primary filter as well as the ancillary filter are feedbacks through the environment, which interacts with the neural systems, they are not independent of the adjustable weights of the neural systems. As a result, derivatives of these inputs and derivatives with respect to these inputs need to be considered. This renders training of neural systems with range transformers, especially range extenders by feedforward Kalman filtering and by feedforward linear prediction and range reducers by linear prediction, more involved.

To clarify description of subsequent algorithms, we need to define some new notations. We denote the set of the numberings of all the inputs to a neural system that are also input to range extenders by Kalman filtering in the neural system by $I_{EKF}$. We denote the set of the numberings of all the inputs to to a neural system which are also input to range extenders by feedforward linear prediction in the neural system by $I_{FLP}$. We denote the set of the numberings of all the inputs to to a neural system which are components of $y_d(t)$ by $I_d$. We also denote the set of the numberings of all the outputs of a neural system which are extended by range extenders by feedforward linear prediction by $\epsilon_{FLP}$. Note that a range extender by feedforward Kalman filtering is simply equivalent to a range extender by Kalman filtering for which $K_{NS}$ is an empty set.

Main program BPTT_for_NS_with_MLPWIN_in_ Interactive_Environment:

```
begin
1.  For t = T,T - 1, . . . ,1, do
        Call subroutine BPTT_to__Ancillary_Filter;
        Identify the neural system referred to in the next 3 statements as the ancillary neural system
        under training,
            Call subroutine BPTT_through_Extender_and_reducer;
            Call subroutine BPTT_through_MLPWIN;
            Call subroutine BPTT_to_NS_Input;
        Call subroutine BPTT_to_Primary_Filter;
        Identify the neural system referred to in the next 3 statements as the primary neural system
        under training,
            Call subroutine BPTT_through_Extender_and_Reducer;
            Call subroutine BPTT_through_MLPWIN;
            Call subroutine BPTT_to_NS_Input;
        Call subroutine BPTT_to_h_e;
        Call subroutine BPTT_to_f_e;
2.  Identify the neural system referred to in the next 3 statements as the ancillary neural system
    under training,
        Call subroutine Differentiating_Q_co_wrt_Weight_for_MLPWIN_by_BPTT;
        Call subroutine Differentiating_Q_co_wrt_Initial_State_for_MLPWIN_by_BPTT;
        Call subroutine Differentiating_Q_co_wrt_LP_Parameter_by_BPTT_;
3.  Identify the neural system referred to in the next 3 statements as the primary neural system
    under training,
        Call subroutine Differentiating_Q_co_wrt_Weight_for_MLPWIN_by_BPTT;
        Call subroutine Differentiating_Q_co_wrt_Initial_State_for_MLPWIN_by_BPTT;
        Call subroutine Differentiating_Q_co_wrt_LP_Parameter_by_BPTT;
end.
```

Main program BPTT_for_NS_with_MLPWOF_in_in _Interactive_Environment:

```
begin
1.  For t = T,T - 1, . . . ,1, do
        Call subroutine BPTT_to Ancillary_Filter;
        Identify the neural system referred to in the next 3 statements as the ancillary neural system
        under training,
            Call subroutine BPTT_through_Extender_and_Reducer;
            Call subroutine BPTT_through_MLPWOF;
            Call subroutine BPTT_to_NS_InPut;
        Call subroutine BPTT_to_Primary Filter;
        Identify the neural system referred to in the next 3 statements as the primary neural system
        under training.
            Call subroutine BPTT_through_Extender_and_Reducer;
            Call subroutine BPTT_through_MLPWOF;
            Call subroutine BPTT_to_NS_Input;
        Call subroutine BPTT_to_h_e;
        Call subroutine BPTT_to_f_e;
    end;
2.  Identify the neural system referred to in the next 3 statements as the ancillary neural system
    under training,
        Call subroutine Differentiating_Q_co_wrt_Weight_for_MLPWOF_by_BPTT;
        Call subroutine Differentiating_Q_co_wrt_Initial_State_for_MLPWOF_by_BPTT;
        Call subroutine Differentiating_Q_co_wrt_LP_Parameter_by_BPTT;
3.  Identify the neural system referred to in the next 3 statements as the primary neural system
    under training,
        Call subroutine Differentiating_Q_co_wrt_Weight_for_MLPWO.F_by_BPTT;
        Call subroutine Differentiating_Q_co_wrt_Initial_State_for_MLPWOF_by_BPTT;
        Call subroutine Differentiating_Q_co_wrt_LP_Parameter_by_BPTT;
end.
```

Main program RTRL_for_NS_with_MLPWIN_in_ Interactive_Environment:

```
begin
1.  For t = 1,2, . . . ,T, do
        Call subroutine RTRL_through_f_e;
        Call subroutine RTRL_through_h_e;
        Call subroutine RTRL_through_H;
        Identify the neural system referred to in the next 3 statements as the primary neural system under training,
            Call subroutine RTRL_through_Reducer_2;
            Call subroutine RTRL_through_MLPWIN_2;
            Call subroutine RTRL_through_Extender_2;
        Identify the neural system referred to in the next 3 statements as the ancillary neural system under training,
            Call subroutine RTRL_through_Reducer_2;
            Call subroutine RTRL_through_MLPWIN_2;
            Call subroutine RTRL_through_Extender_2;
    end;
2.  Identify the neural system referred to in the next 2 statements as the primary neural system under training,
        Call subroutine Differentiating_Q_ω_wrt_Weight_and_Initial_State_for_MLPWIN_by_RTRL;
        Call subroutine Differentiating_Q_ω_wrt_LP_Parameter_by_RTRL;
3.  Identify the neural system referred to in the next 2 statements as the ancillary neural system under training,
        Call subroutine Differentiating_Q_ω_wrt_Weight_and_Initial_State_for_MLPWIN_by_RTRL;
        Call subroutine Differentiating_Q_ω_wrt_LP_Parameter_by_RTRL;
end.
```

Main program RTRL_for_NS_with_MLPWOF_in_Interactive_Environment:

```
begin
1.  For t = 1,2, . . . ,T, do
        Call subroutine RTRL_through_f_e;
        Call subroutine RTRL_through_h_e;
        Call subroutine RTRL_through_H;
        Identify the neural system referred to in the next 3 statements as the primary neural system under training,
            Call subroutine RTRL_through_Reducer_2;
            Call subroutine RTRL_through_MLPWOF_2;
            Call subroutine RTRL_through_Extender_2;
        Identify the neural system referred to in the next 3 statements as the ancillary neural system under training,
            Call subroutine RTRL_through_Reducer_2;
            Call subroutine RTRL_through_MLPWOF_2;
            Call subroutine RTRL_through_Extender_2;
    end;
2.  Identify the neural system referred to in the next 2 statements as the priniary neural sysstem under training,
        Call subroutine Differentiating_Q_ω_wrt_Weight_and_Initial_State_for_MLPWOF_by_RTRL;
        Call subroutine Differentiating_Q_ω_wrt_LP_Parameter_by_RTRL;
3.  Identify the neural system referred to in the next 2 statements as the ancillary neural system under training,
        Call subroutine Differentiating_Q_ω_wrt_Weight_and_Initial_State_for_MLPWOF_by_RTRL;
        Call subroutine Differentiating_Q_ω_wrt_LP_Parameter_by_RTRL;
end.
```

Subroutine BPTT_to_Ancillary_Filter:

// Backpropagation to output of ancillary filter:

For each component $i$ of $\hat{V}(t)$, do $$\frac{dQ_\omega}{d\hat{V}_i(t)} = \sum_j \frac{dQ_\omega}{dx_{ej}(t+1)} \cdot \frac{\partial x_{ej}(t+1)}{\partial \hat{V}_i(t)} + \frac{\partial Q_\omega}{\partial \hat{V}_i(t)}$$

Subroutine BPTT_to_Primary_Filter:

// Backpropagation to output of primary filter:
For each component $i$ of $\hat{x}(t)$, do $$\frac{dQ_\omega}{d\hat{x}_i(t)} = \sum_j \frac{dQ_\omega}{dx_{ej}(t+1)} \cdot \frac{\partial x_{ej}(t+1)}{\partial \hat{x}_i(t)} + \left(\frac{dQ_\omega}{d\hat{\zeta}_i(t)}\right)_{ancillary} + \frac{\partial Q_\omega}{\partial \hat{x}_i(t)}$$

end;

Subroutine BPTT_to_NS_Input:

// Backpropagation from input nodes of RNN to input of neural system:
For each $i \in I$, do
  If $i \notin I_{EKF}, i \notin I_{FLP}$ and $i \notin R_{LP}$ then $$\frac{dQ_\omega}{d\hat{\zeta}_i(t)} = \frac{dQ_\omega}{d\eta_i^0(t)} \ ;$$

If $i \notin I_{EKF}, i \notin I_{FLP}$ and $i \in R_{LP}$ then

-continued $$\frac{dQ_\omega}{d\zeta_i(t)} = \frac{dQ_\omega}{d\eta_i^0(t)} + \sum_{j=1}^{J_i} c_{ij} \frac{dQ_\omega}{d\eta_i^0(t)} \, ;$$

If $i \notin I_{EKF}, i \in I_{FLP}$ and $i \notin R_{LP}$ then $$\frac{dQ_\omega}{d\zeta_i(t)} = \frac{dQ_\omega}{d\eta_i^0(t)} + \sum_{j \in E_{FLP}} \sum_{k=0}^{J_j-1} \frac{\partial \hat{y}_j(t+k)}{\partial \zeta_i(t)} \cdot \frac{dQ_\omega}{d\hat{y}_j(t+k)} \, ;$$

If $i \notin I_{EKF}, i \in I_{FLP}$ and $i \in R_{LP}$ then $$\frac{dQ_\omega}{d\zeta_i(t)} = \frac{dQ_\omega}{d\eta_i^0(t)} + \sum_{j=1}^{J_i} c_{ij} \frac{dQ_\omega}{d\eta_i^0(t)} + \sum_{j \in E_{FLP}} \sum_{k=0}^{J_j-1} \frac{\partial \hat{y}_j(t+k)}{\partial \zeta_i(t)} \cdot \frac{dQ_\omega}{d\hat{y}_j(t+k)} \, ;$$

If $i \in I_{EKF}, i \notin I_{FLP}$ and $i \notin R_{LP}$ then $$\frac{dQ_\omega}{d\zeta_i(t)} = \frac{dQ_\omega}{d\eta_i^0(t)} + \sum_{j \in E_{EKF}} \frac{\partial \hat{y}_j(t)}{\partial \zeta_i(t)} \cdot \frac{dQ_\omega}{d\hat{y}_j(t)} + \sum_{j \in E_{EKF}} \sum_{k \in E_{EKF}} \frac{\partial \Pi_{jk}(t)}{\partial \zeta_i(t)} \cdot \frac{dQ_\omega}{d\Pi_{jk}(t)} \, ;$$

If $i \in I_{EKF}, i \notin I_{FLP}$ and $i \in R_{LP}$ then $$\frac{dQ_\omega}{d\zeta_i(t)} = \frac{dQ_\omega}{d\eta_i^0(t)} + \sum_{j=1}^{J_i} c_{ij} \frac{dQ_\omega}{d\eta_i^0(t)} + \sum_{j \in E_{EKF}} \frac{\partial \hat{y}_j(t)}{\partial \zeta_i(t)} \cdot \frac{dQ_\omega}{d\hat{y}_j(t)} + \sum_{j \in E_{EKF}} \sum_{k \in E_{EKF}} \frac{\partial \Pi_{jk}(t)}{\partial \zeta_i(t)} \cdot \frac{dQ_\omega}{d\Pi_{jk}(t)} \, ;$$

If $i \in I_{EKF}, i \in I_{FLP}$ and $i \notin R_{LP}$ then $$\frac{dQ_\omega}{d\zeta_i(t)} = \frac{dQ_\omega}{d\eta_i^0(t)} + \sum_{j \in E_{FLP}} \sum_{k=0}^{J_j-1} \frac{\partial \hat{y}_j(t+k)}{\partial \zeta_i(t)} \cdot \frac{dQ_\omega}{d\hat{y}_j(t+k)} + \sum_{j \in E_{EKF}} \frac{\partial \hat{y}_j(t)}{\partial \zeta_i(t)} \cdot \frac{dQ_\omega}{d\hat{y}_j(t)} +$$

$$\sum_{j \in E_{EKF}} \sum_{k \in E_{EKF}} \frac{\partial \Pi_{jk}(t)}{\partial \zeta_i(t)} \cdot \frac{dQ_\omega}{d\Pi_{jk}(t)} \, ;$$

If $i \in I_{EKF}, i \in I_{FLP}$ and $i \in R_{LP}$ then $$\frac{dQ_\omega}{d\zeta_i(t)} = \frac{dQ_\omega}{d\eta_i^0(t)} + \sum_{j=1}^{J_i} c_{ij} \frac{dQ_\omega}{d\eta_i^0(t)} + \sum_{j \in E_{FLP}} \sum_{k=0}^{J_j-1} \frac{\partial \hat{y}_j(t+k)}{\partial \zeta_i(t)} \cdot \frac{dQ_\omega}{d\hat{y}_j(t+k)} + \sum_{j \in E_{EKF}} \frac{\partial \hat{y}_j(t)}{\partial \zeta_i(t)} \cdot \frac{dQ_\omega}{d\hat{y}_j(t)} +$$

$$\sum_{j \in E_{EKF}} \sum_{k \in E_{EKF}} \frac{\partial \Pi_{jk}(t)}{\partial \zeta_i(t)} \cdot \frac{dQ_\omega}{d\Pi_{jk}(t)} \, ;$$

end;

Subroutine BPTT_to_$h_e$:

// Backpropagation to output of environment observation:
For each component $i$ of $y_e(t)$, do $$\frac{dQ_\omega}{dy_{ei}(t)} =$$

$$\sum_{j \in I_d} \left( \left( \frac{dQ_\omega}{d\zeta_j(t)} \right)_{primary} + \left( \frac{dQ_\omega}{d\zeta_j(t)} \right)_{ancillary} \right) \frac{\partial y_{dj}(t)}{\partial y_{ei}(t)} +$$

$$\sum_j \frac{dQ_\omega}{dx_{ej}(t+1)} \cdot \frac{\partial x_{ej}(t+1)}{\partial y_{ei}(t)}$$

end;

Subroutine BPTT_to_$f_e$:

// Backpropagation to output of environment transition:
For each component $i$ of $x_e(t)$, do $$\frac{dQ_\omega}{dx_{ei}(t)} = \sum_j \frac{dQ_\omega}{dx_{ej}(t+1)} \cdot \frac{\partial x_{ej}(t+1)}{\partial x_{ei}(t)} + \sum_j \frac{dQ_\omega}{dy_{ej}(t)} \cdot \frac{\partial y_{ej}(t)}{\partial x_{ei}(t)}$$

end;

Subroutine RTRL_through_$f_e$:

// Forwardpropagation to output of environment transition:
For each weight, parameter or initial dynamic state $\theta$ of primary and ancillary neural systems, do
  For each component $i$ of $x_e(t)$, do $$\frac{dx_{ei}(t)}{d\theta} = \sum_j \frac{\partial x_{ei}(t)}{\partial x_{ej}(t-1)} \cdot \frac{dx_{ej}(t-1)}{d\theta} + \sum_j \frac{\partial x_{ei}(t)}{\partial \hat{x}_j(t-1)} \cdot \frac{d\hat{x}_j(t-1)}{d\theta} + \sum_j \frac{\partial x_{ei}(t)}{\partial \hat{V}_j(t-1)} \cdot \frac{d\hat{V}_j(t-1)}{d\theta} +$$

$$\sum_j \frac{\partial x_{ei}(t)}{\partial y_{ej}(t-1)} \cdot \frac{dy_{ej}(t-1)}{d\theta}$$

end;
end;

Subroutine RTRL_through_$h_e$:

// Forwardpropagation to output of environment observation:
For each weight, parameter or initial dynamic state θ of
primary and ancillary neural systems, do
    For each component $i$ of $y_e(t)$, do $$\frac{dy_{ei}(t)}{d\theta} = \sum_j \frac{\partial y_{ei}(t)}{\partial x_{ej}(t)} \cdot \frac{dx_{ej}(t)}{d\theta}$$

end;
end;

Subroutine RTRL_through_H:

// Forwardpropagation to output of $H$:
For each weight, parameter or initial dynamic state θ of
primary and ancillary neural systems, do
    For each component $i$ of $y_d(t)$, do $$\frac{dy_{di}(t)}{d\theta} = \sum_j \frac{\partial y_{di}(t)}{\partial y_{ej}(t)} \cdot \frac{dy_{ej}(t)}{d\theta}$$

end;
end;

Subroutine RTRL_through_Reducer_2:

// Forwardpropagation to input nodes of $RNN$:
For each $i \in I$, do
    For each weight, parameter or initial dynamic state θ of primary and ancillary neural systems, do If $i \in R_{MAP}$ then $\dfrac{d\beta_i^0(t)}{d\theta} = \sum\limits_{j \in M} \left( \dfrac{d\zeta_i(t)}{d\theta} + \dfrac{d\partial_i(t)}{\partial \gamma_j(t-1)} \cdot \dfrac{d\gamma_j(t-1)}{d\theta} \right) ((\alpha_i^0)'(\eta_i^0(t))),$ else if $i \in R_{LP}$ then If θ is $u_{pq}$ then $\dfrac{d\beta_i^0(t)}{du_{pq}} = \left( \dfrac{d\zeta_i(t)}{du_{pq}} - \sum\limits_{j=1}^{J_i} c_{ij} \dfrac{d\zeta_i(t-j)}{du_{pq}} - \delta_{ip} \sum\limits_{j=-J_p+t}^{0} \delta_{qj} c_{p(t-j)} \right) ((\alpha_i^0)'(\eta_i^0(t))),$ else $\dfrac{d\beta_i^0(t)}{d\theta} = \left( \dfrac{d\zeta_i(t)}{d\theta} - \sum\limits_{j=1}^{J_i} c_{ij} \dfrac{d\zeta_i(t-j)}{d\theta} \right) ((\alpha_i^0)'(\eta_i^0(t)));$ else $\dfrac{d\beta_i^0(t)}{d\theta} = \dfrac{d\zeta_i(t)}{d\theta} \cdot ((\alpha_i^0)'(\eta_i^0(t)));$ // if $\zeta_i(t)$ above, e.g. components of $b(t)$, does not depend on θ, $\dfrac{d\zeta_i(t)}{d\theta} = 0$ end;
end;

Subroutine RTRL_through_MLPWIN_2:

// Forwardpropagation through $MLPWIN$:
For $l = 1, 2, \ldots, L$, do
  For $i = 1, 2, \ldots, n_l$, do
    For each weight, parameter or initial dynamic state θ of primary and ancillary neural systems, do If θ is $v_p^k$ then $\dfrac{d\beta_i^l(t)}{dv_p^k} = \left( \sum\limits_j w_{ij}^l \dfrac{d\beta_j^{l-1}(t)}{dv_p^k} + \sum\limits_j w_{ij}^{rl} \dfrac{d\beta_j^l(t-1)}{dv_p^k} + \delta_{lk}\delta_{r1}w_{ip}^{rk} \right) ((\alpha_i^l)'(\eta_i^l(t))),$ else if θ is $w_{pq}^k$ then $\dfrac{d\beta_i^l(t)}{dw_{pq}^k} = \left( \sum\limits_j w_{ij}^l \dfrac{d\beta_j^{l-1}(t)}{dw_{pq}^k} + \sum\limits_j w_{ij}^{rl} \dfrac{d\beta_j^l(t-1)}{dw_{pq}^k} + \delta_{lk}\delta_{ip}\beta_q^{l-1}(t) \right) ((\alpha_i^l)'(\eta_i^l(t))),$ else if θ is $w_{pq}^{rk}$ then $\dfrac{d\beta_i^l(t)}{dw_{pq}^{rk}} = \left( \sum\limits_j w_{ij}^l \dfrac{d\beta_j^{l-1}(t)}{dw_{pq}^{rk}} + \sum\limits_j w_{ij}^{rl} \dfrac{d\beta_j^l(t-1)}{dw_{pq}^{rk}} + \delta_{lk}\delta_{ip}\beta_q^l(t-1) \right) ((\alpha_i^l)'(\eta_i^l(t))),$ else $\dfrac{d\beta_i^l(t)}{d\theta} = \left( \sum\limits_j w_{ij}^l \dfrac{d\beta_j^{l-1}(t)}{d\theta} + \sum\limits_j w_{ij}^{rl} \dfrac{d\beta_j^l(t-1)}{d\theta} \right) ((\alpha_i^l)'(\eta_i^l(t)))$ end;
// If scaling is used, replace $\alpha_i^L$ with composition of
// scaling function and $\alpha_i^L$.
  end;
end;

Subroutine RTRL_through_Extender_2:

// Forwardpropagation to output nodes of *EKF*:
For each $i \in \kappa$, do
   For each weight, parameter or initial dynamic state $\theta$ of primary and ancillary neural systems, do $$\frac{d\hat{\gamma}_i(t)}{d\theta} = \sum_{j \in \kappa_{NS}} \frac{\partial \hat{\gamma}_i(t)}{\partial \gamma_j(t-1)} \cdot \frac{d\gamma_j(t-1)}{d\theta} + \sum_{j \in \kappa_{EKF}} \frac{\partial \hat{\gamma}_i(t)}{\partial \hat{\gamma}_j(t-1)} \cdot \frac{d\hat{\gamma}_j(t-1)}{d\theta} + \sum_{j,k} \frac{\partial \hat{\gamma}_i(t)}{\partial \Pi_{jk}(t-1)} \cdot$$

$$\frac{d\Pi_{jk}(t-1)}{d\theta} + \sum_{j \in I_{EKF}} \frac{\partial \hat{\gamma}_i(t)}{\partial \zeta_j(t)} \cdot \frac{d\zeta_j(t)}{d\theta}$$

end;
// Forwardpropagating Derivatives of *EKF* covariances to outputs of *EKF*:
   For each $j \in \kappa$, do
     For each weight, parameter or initial dynamic state $\theta$ of primary and ancillary neural systems, do $$\frac{d\Pi_{ij}(t)}{d\theta} = \sum_{m \in \kappa_{NS}} \frac{\partial \Pi_{ij}(t)}{\partial \gamma_m(t-1)} \cdot \frac{d\gamma_m(t-1)}{d\theta} + \sum_{m \in \kappa_{EKF}} \frac{\partial \Pi_{ij}(t)}{\partial \hat{\gamma}_m(t-1)} \cdot \frac{d\hat{\gamma}_m(t-1)}{d\theta} + \sum_{m,n} \frac{\partial \Pi_{ij}(t)}{\partial \Pi_{mn}(t-1)} \cdot$$

$$\frac{d\Pi_{mn}(t-1)}{d\theta} + \sum_{m \in I_{EKF}} \frac{\partial \Pi_{ij}(t)}{\partial \zeta_m(t)} \cdot \frac{d\zeta_m(t)}{d\theta}$$

end;
   end;
end;
// Forwardpropagation to output terminals of neural system:
For each $i \in O$, do
   For each weight, parameter or initial dynamic state $\theta$ of primary and ancillary neural systems, do
     If $i \in E_{LP}$ then If $\theta$ is $s_{pq}$ then $\dfrac{d\gamma_i(t)}{ds_{pq}} = \sum_{j=1}^{J_i} c_{ij} \dfrac{d\gamma_i(t-j)}{ds_{pq}} + \dfrac{d\beta_i^L(t)}{ds_{pq}} + \delta_{ip} \sum_{j=-J_i+t}^{0} c_i(t-j)\delta_{jq}$, else if $\theta$ is $c_{pq}$ then $\dfrac{d\gamma_i(t)}{dc_{pq}} = \sum_{j=1}^{J_i} c_{ij} \dfrac{d\gamma_i(t-j)}{dc_{pq}} + \dfrac{d\beta_i^L(t)}{dc_{pq}} + \delta_{ip}\gamma_i(t-q) + \delta_{ip} \sum_{j=t}^{J_i} \delta_{jq}s_i(t-j)$, else $\dfrac{d\gamma_i(t)}{d\theta} = \sum_{j=1}^{J_i} c_{ij} \dfrac{d\gamma_i(t-j)}{d\theta} + \dfrac{d\beta_i^L(t)}{d\theta}$ ;

// output *i* above is extended by range extender by linear prediction else if $i \in E_{FLP}$ then $\dfrac{d\gamma_i(t)}{d\theta} = \sum_{j \in I_{FLP}} \sum_{k=0}^{J_i-1} \dfrac{\partial \hat{\gamma}_i(t)}{\partial \zeta_j(t-k)} \cdot \dfrac{d\zeta_j(t-k)}{d\theta} + \dfrac{d\beta_i^L(t)}{d\theta}$ , // output *i* above is extended by range extender by feedforward linear prediction else if $i \in E_{EKF}$ then $\dfrac{d\gamma_i(t)}{d\theta} = \dfrac{d\hat{\gamma}_i(t)}{d\theta} + \dfrac{d\beta_i^L(t)}{d\theta}$ , // output *i* above is extended by range extender by *KF* else $\dfrac{d\gamma_i(t)}{d\theta} = \dfrac{d\beta_i^L(t)}{d\theta}$ ;

// output *i* above is not extended by linear prediction or *KF*
   end;
end;

Subroutine RTRL_through_MLPWOF_2:

// Forwardpropagation of delayed outputs of *MLPWOF* to input nodes:
For each $i \in F$, do
   For each weight, parameter or initial dynamic state $\theta$ of primary and ancillary neural systems, do
   // Forwardpropagating derivatives wrt initial dynamic state:

If $\theta$ is $v_p^L$ then $\dfrac{d\beta_i^0(t)}{dv_p^L} = \left( \dfrac{d\beta_i^L(t-1)}{dv_p^L} + \delta_{ip}\delta_{t1} \right) ((\alpha_i^0)'(\eta_i^0(t)))$, else $\dfrac{d\beta_i^0(t)}{d\theta} = \dfrac{d\beta_i^L(t-1)}{d\theta} ((\alpha_i^0)'(\eta_i^0(t)))$;

end;
end;

```
// Forwardpropagation through MLPWOF:
For l = 1,2, . . . ,L, do
    For i = 1,2, . . . ,n_l, do
        For each weight, parameter or initial dynamic state θ of primary and ancillary neural systems, do
// Forwardpropagating derivatives wrt feedforward weights:
``` if θ is $w_{pq}^k$ then $\dfrac{d\beta_i^l(t)}{dw_{pq}^k} = \left( \sum_j w_{ij}^l \dfrac{d\beta_j^{l-1}(t)}{dw_{pq}^k} + \delta_{ik}\delta_{ip}\beta_q^{l-1}(t) \right) ((\alpha_i^l)'(\eta_i^l(t)))$, else $\dfrac{d\beta_i^l(t)}{d\theta} = \sum_j w_{ij}^l \dfrac{d\beta_j^{l-1}(t)}{d\theta} \quad ((\alpha_i^l)'(\eta_i^l(t)));$

```
        end;
    end;
end;
```

Examples for Neural Filters with Range Extenders and/or Reducers

Two numerical examples are given in the following to illustrate the effectiveness of the neural filters with range extenders and/or reducers.

EXAMPLE 4

The performances of two neural filters, one with a range scaling function and the other with a range extender by accumulation, are compared in this example. The signal and measurement processes are described by the following model:

$$x(t+1)=x(t)+1.2 \sin x(t)+1.21+0.2\xi(t), \quad (50)$$

$$y(t)=\sin x(t)+0.1\epsilon(t), \quad (51)$$

where ξ(t) and ε(t) are independent standard white Gaussian sequences, and x(0)=0. Note that the measurement process y(t) is confined essentially in a compact domain.

Figure 20:
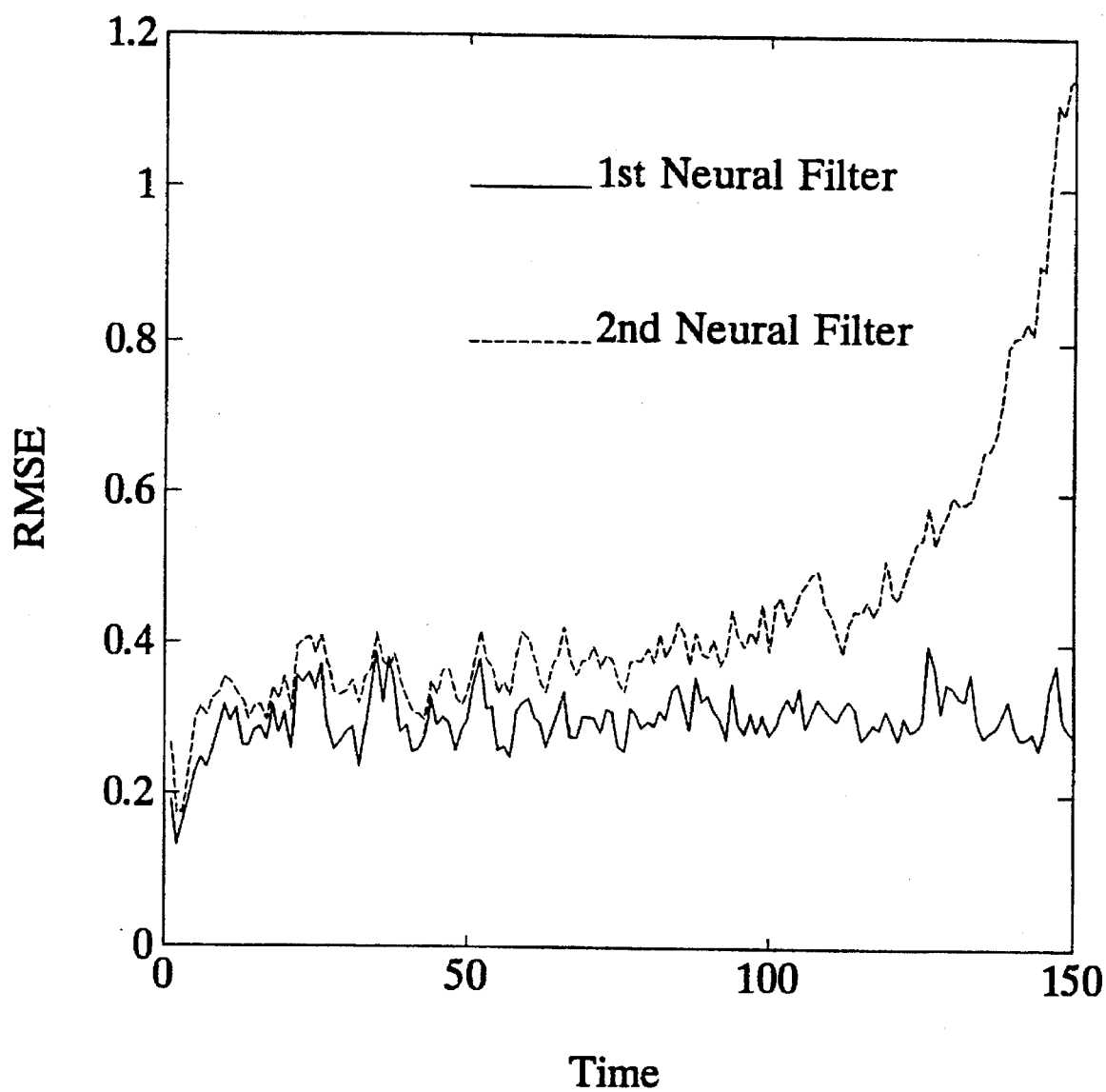
FIG. 20 shows the root mean square error versus time for a primary filter with an MLPWIN and a range extender by accumulation, and that for a primary filter with an MLPWIN whose output range is extended by scaling in the first numerical example, Example 4.

The first neural filter consists of an MLPWIN and an accumulator concatenated at the output node of the MLPWIN as a range extender. The MLPWIN has a fully-connected hidden layer consists of 9 neurons. The training data set, generated using (50) and (51), consists of 100 realizations each over 100 time points. The training is accomplished by using the aforestated BPTT algorithms for a neural system, with an MLPWIN and a range extender by accumulation, in conjunction with the aforementioned BFGS optimization algorithm. After training of the neural filter, a testing data set consisting of 500 realizations each over 150 time points is generated for testing the performance of the neural filter. The root mean square errors (RMSEs) of the filter outputs, which are obtained by averaging the square errors over the 500 realizations at each of the 150 time points, are plotted versus time in FIG. 20 (—).

The second neural filter consists of an MLPWIN and an output scaling function. More specifically, the output of MLPWIN is multiplied by 40. The MLPWIN has a fully-connected hidden layer consists of 9 neurons. The training data set and testing data set are the same as those for the training and testing of the above first neural filter. The training is accomplished by using aforementioned BPTT algorithms for a neural system with an MLPWIN and an output scaling function in conjunction with the aforementioned BFGS optimization algorithm. The RMSEs of the second neural filter outputs, which are obtained by averaging the squared error over the 500 realizations at each of the 150 time points, is also plotted versus time in FIG. 20 (—).

The first neural filter has a better performance than the second neural filter, before 100 time points. After 100 time points, the latter deteriotes rapidly while the former remains good. Since the MLPWINs in both neural filters are of the same architecture, the range extender by accumulation is apparently more effective than extending the output range by scaling in this example.

The same testing set was also used to test the performance of the extended Kalman filter and the iterated extended Kalman filter. Both failed to track the signal and the results are not plotted.

EXAMPLE 5

The signal and measurement processes are described by the model:

$$x(t+1)=x(t)+1.2 \sin x(t)+1.21+0.2\xi(t), \quad (52)$$

$$y(t)=x(t)+\epsilon(t), \quad (53)$$

where ξ(t) and ε(t) are independent standard white Gaussian sequences, and x(0)=0. Note that extended Kalman filter should be a good estimator for this problem because the signal x(t) enters the measurement y(t) in a linear fashion.

Figure 21:
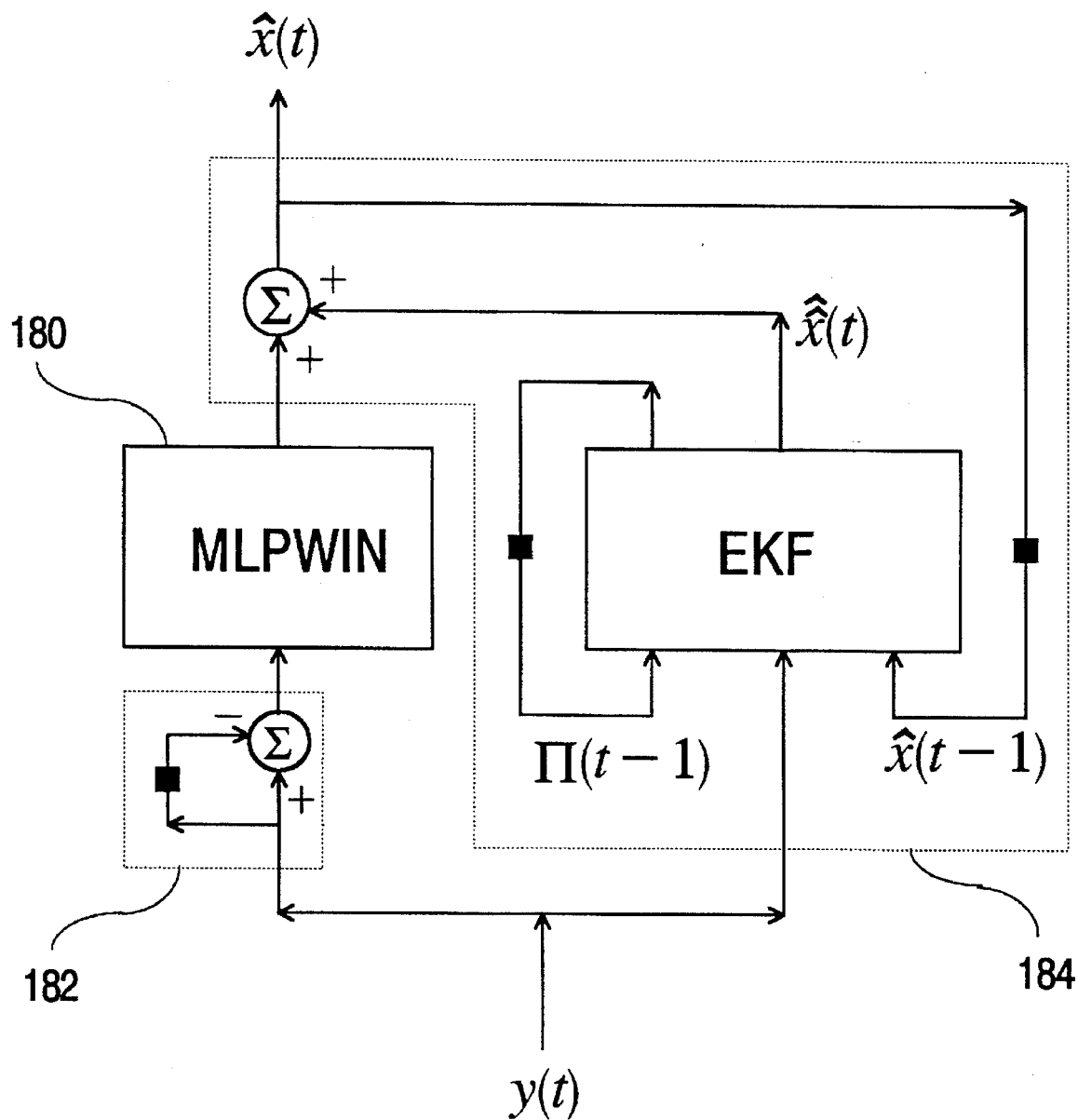
FIG. 21 shows a primary filter consisting of an RNN, a range extender by Kalman filtering, and a range reducer by differencing. The primary filter is used in the second numerical example, Example 5.
Figure 22:
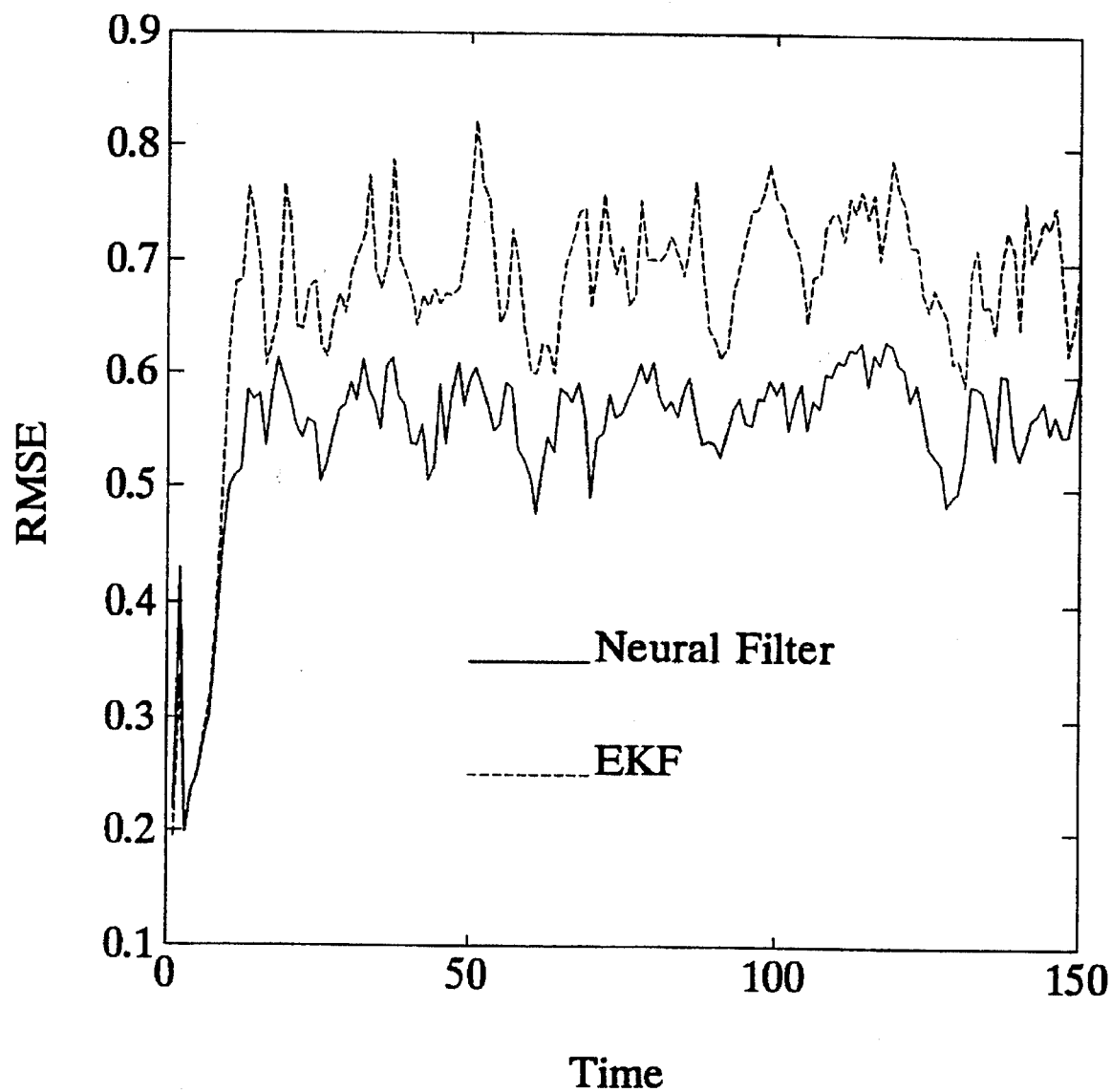
FIG. 22 shows the root mean square error versus time for a primary filter with an MLPWIN, a range reducer by differencing and a range extender by Kalman filtering, and that for an extended Kalman filter in the second numerical example, Example 5.

The neural filter in this example consists of an MLPWIN, a range extender by Kalman filtering and a range reducer by differencing. The MLPWIN has a fully-connected hidden layer consists of 9 neurons. The training data set, generated using (52) and (53), consists of 100 realizations each over 100 time points. The training is accomplished by using the aforestated BPTT algorithms for a neural system with an MLPWIN and a range extender by Kalman filtering in conjunction with the aforementioned BFGS optimization algorithm. After training of the neural filter, a testing data set consisting of 500 realizations each over 150 time points is generated for testing the performance of the neural filter. The RMSEs of the neural filter outputs, which are obtained by averaging the squared errors over the 500 realizations at each of the 150 time points, are plotted versus time in FIG. 21 (—).

For comparison, the same testing set is also used to test the performance of the extended Kalman filter. The RMSEs of the extented Kalman filter outputs, which are obtained by averaging the squared error over the 500 realizations at each of the 150 time points, is also plotted versus time in FIG. 21 (—).

The performance of the neural filter is significantly better than that of the extended Kalman filter.

THE BEST MODE OF CARRYING OUT THE INVENTION

Recall that a primary filter and an ancillary filter are each referred to as a neural filter. Correspondingly, a signal process x(t) and an ancillary signal process V(t) are each referred to as a target (or desired) output process of a neural filter. Also correspondingly, a measurement process y(t) and a process of the (measurement, signal estimate) pair (y(t), x̂(t)) are each referred to as an input process to a neural filter.

We define a signal and a measurement process and generate training data using the methods described earlier on in the sections with the corresponding titles. If the signal and measurement processes are time-variant, some vector-valued time function s(t) that represents the time-variance property of the same is included as part of the input vector to the neural filter. In this case, we still use the symbol y(t) to represent the input vector consisting of the measurement process y(t) and this time function s(t) at time t to simplify our discussion here.

The RNN (recurrent neural network) paradigm that the inventors prefer is the MLPWINs (multilayer perceptrons with interconnected neurons), whose activation functions in the hidden neurons are the hyperbolic tangent function tanh x. MLPWINs with range transformers, that are properly synthesized in accordance with the teachings of this invention, approximate optimal filters to arbitrary accuracy. As opposed to the MLPWOFs, the MLPWINs do not have free-feedback-sending nodes and thus we do not need to determine the number of these nodes in synthesizing a neural filter made out of an MLPWIN.

Recall that the conditional expectation $E[x(t)|y(1), \ldots, y(t)]$ of the signal x(t) given the measurements $y(1), \ldots, y(t)$ minimizes the mean square error of an estimate x̂(t), i.e., $$E[x(t)|y(1), \ldots, y(t)] = \arg\min_{\hat{x}(t)} E[\|x(t) - \hat{x}(t)\|],$$

where x̂(t) denotes a functional of $y(1), \ldots, y(t)$. This fact makes this mean square error and its associated mean square error criterion Q(w,v) for the RNN training the most preferable estimation error criterion and RNN training criterion respectively, unless there is a special requirement such as robustness in the application.

Corresponding to the mean square error criterion for the RNN training, the preferred ancillary estimation criterion and ancillary training criterion are the conditional error covariance and its associated training criterion $Q_1(w, v)$, if estimation error statistics are required. In most applications, only the diagonal entries of $Q_1(w, v)$ are needed. The ancillary signal process for $Q_1(w, v)$ is described in the section entitled "Selecting an estimation error criterion, an ancillary signal processes, etc." The corresponding ancillary RNN paradigm preferred is also the MLPWINs, whose activation functions in the hidden neurons are the hyperbolic tangent function tanh x.

Three ways to examine the possible range of a component of an input or target output process of a neural filter are described in the section entitled "Selecting Range Extenders and/or Reducers." This component is referred to as a component process. First, we consider the physical meaning of the component process. Second, we analyze the dynamic equation (if it exists) that governs the evolution of the component process. Third, we examine the realizations of the component process in the training data set. Usually, we can decide whether a range transformer is necessary for the component process by one of these three ways. However, if there is still some doubt as to whether the range of the component process should be regarded as large, we simply regard the component as needing a range transformer.

If it is decided that one or more range transformers are needed for certain component processes, a type of range transformer is selected for each of these component processes. Among the disclosed types, the present inventors prefer to use the range extenders by linear prediction and the range reducers by linear prediction, which are disclosed and described in detail in the section entitled "Range Extenders Used to Construct Neural Filters" and the section entitled "Range Reducers Used to Construct Neural Filters," respectively. The range extenders by linear prediction and the range reducers by linear prediction are simple, effective and easy to implement.

Methods of evaluating the performances of range extenders and range reducers without first training the neural system that includes these range extenders and range reducers are provided in the section entitled "Selecting Range Extenders and/or Reducers." These methods can be used to get very good estimates of the orders of linear prediction for the required range extenders and range reducers by linear prediction. If the best such orders of linear prediction are required in an application, they are determined by training neural systems with range extenders and reducers by linear prediction of various orders and selecting the neural system with the best filtering performance. To minimize computation involved in training, a method of coordinating the range transformer evaluation and selection with the neural system training is given in the section entitled "Selecting Range Extenders and/or Reducers." The method can be used here in determining the best orders of linear prediction for the required range extenders and range reducers by linear prediction.

The algorithm for training a neural system that the present inventors favor is the backpropagation through time followed by a quasi-Newton method, which are described in other parts of the specification. The implementation of the synthesized neural filter that the present inventors favor is a programmed digital device.

Implementation of Neural Filters

A primary filter, an ancillary filter, a primary filter with augmented input terminals, an ancillary filter with augmented input terminals, a primary filter in interactive environment, or an ancillary filter in interactive environment, that results from synthesizing a neural system comprising a recurrent neural network and at least one range transformer, is called a neural filter. The recurrent neural network (RNN) is specified by its architecture, weights, and initial dynamic state. A range transformer is specified by such coefficients as the orders, coefficients and initialization values of linear predictors and estimators and the parameters in Kalman or extended Kalman filters.

The RNN and at least one range transformer in a neural filter can be jointly or separately implemented by programming at least one general-purpose or special-purpose digital, analog, and/or optical/electro-optical, serial or parallel, computer, processor or device. They can also be jointly or separately implemented into at least one general-purpose or special-purpose electronic/electric circuit and/or optical/electro-optical device. FIG. 19 is a block diagram showing the implementation of a primary filter by a method or a procedure selected from the group consisting of programming a computer, programming a microprocessor, programming an analog device, programming a digital device, copying weights and initial dynamic state into a neural network chip, making an electronic circuit, making a mechanical device, constructing an optical device, and constructing an electro-optical apparatus.

A very large number of articles have been published on hardware implementation of neural networks in recent years.

A collection of some important ones is included in E. Sanchez-Sinencio and C. Lau, editors, *Artificial Neural Networks*, IEEE Press (1992). A good brief introduction can be found in J. M. Zurada, *Introduction to Artificial Neural Networks*, West Publishing Company (1992) and R. Hecht-Nielsen, *Neurocomputing*, Addison-Wesley (1990). General-purpose and special-purpose hardware designed for recurrent neural network implementation has recently become available. It builds on the parallelism within RNNs to provide a very high-speed processing. In the following, we will briefly describe, as an example, a commercially available neural network chip, which can be used to implement a neural filter. It will be appreciated that other neural network chips can be used as well, as long as they support implementation of a recurrent neural network.

The 80170NX Electrically Trainable Analog Neural Network (ETANN) chip is one of the first successfully deployed artificial neural network implementations, employing analog non-volatile floating gate technology. The use of floating gates allows a very compact synapse design and permits integration of chips into a neural network of sufficiently large size for a large variety of real-world applications. Being a completely analog and parallel design, the 80170NX ETANN chip is a very fast, non-volatile and high density neural network processor, capable of achieving in excess of 1.3 billion connections (or multiply-accumulate operations) per second. By interconnecting eight chips, the integration can achieve more than 10.4 billion connections per second.

The core of the 80170NX ETANN chip is a four quadrant, non-volatile, analog multiplying synapse array. It employs a modified Gilbert multiplier cell and operates over a very large dynamic range. The hardware imperfections can be overcome by a process termed "chip-in-the-loop" optimization. The chip is fabricated with CHMOS III EEPROM technology, which supports non-volatile weight storage and electrical reprogrammability.

The 80170NX ETANN chip has 64 neurons (or processing elements), which independently compute inner products (or weighted sums) of an input vector and weight vectors stored in one or both of two 64×54 weight matrices. The computation takes 3 microseconds per layer, generating scalars which are passed through sigmoid activation functions.

Third-party simulation software is available for simulating the performance of entire 80170NX applications using PC/AT equipment. Simulation software can be used not only to verify that an application will run successfully but also to generate training files. The Intel Neural Network Training System (iNNTS), provided by Intel, Inc., uses these training files to download synaptic weights to the 80170NX chip. Furthermore, the iNNTS comes with a complete set of system software modules that can be used to control all aspects of the 80170NX, to perform chip-in-the-loop optimization, and to interface other software. For multi-chip application, Intel offers the ETANN multi-chip board (EMB) that interfaces with iNNTS.

Detailed information about the 80170NX ETANN chip can be obtained from its manufacturer, Intel Corporation, 2250 Mission College Boulevard, Mail Stop SC9-40, Santa Clara, Calif. 95052-8125.

CONCLUSION, RAMIFICATION, AND SCOPE OF INVENTION

If some or all components of the signal and measurement processes have large and/or expanding ranges, a neural filter, that is called a primary filter and comprises a recurrent neural network and at least one range extender or reducer, is provided, in accordance with the teachings of the present invention. The primary filter herein provided approximates the optimal filter in performance with respect to a selected estimation error criterion to any desired degree of accuracy. If some estimation error statistics is required, another neural filter, that is called an ancillary filter and comprises a recurrent neural network and at least one range extender or reducer, is provided as well, in accordance with the teachings of the present invention. The ancillary filter herein provided yields approximates of the estimation error statistics also to any desired degree of accuracy. If the signal and measurement processes are time-variant and a vector-valued function of time, that describes the time-variant property, is available, the function of time can be included as part of an augmented measurement process and the input terminals of a neural filter can be augmented to receive the augmented measurement process so as to reduce the size of the neural filter to achieve the same degree of approximation accuracy and to greatly enhance the generalization capability of the neural filter. If a neural filter interacts with its environment, training for such a neural filter must take this interaction into account.

In addition to the embodiments described hereinabove, those skilled in the art will recognize that other embodiments are possible within the teachings of the present invention. Accordingly, the scope of the present invention should be limited only by the appended claims and their appropriately construed legal equivalents, rather than by the examples given.

What is claimed is:

1. A method for processing an m-dimensional vector-valued measurement process to estimate an n-dimensional vector-valued signal process, said method comprising the steps of:

(1) selecting a recurrent neural network paradigm;
    (2) selecting an estimation error criterion;
    (3) generating training data comprising realizations of said signal process and corresponding realizations of said measurement process;
    (4) constructing a training criterion;
    (5) selecting at least one range transformer;
    (6) synthesizing said training data into a primary filter, which comprises a recurrent neural network of said recurrent neural network paradigm and said at least one range transformer;
    (7) implementing said primary filter; and
    (8) receiving one measurement vector of said measurement process at a time at at least one input terminal of the implementation of said primary filter and producing an estimate of one signal vector of said signal process at a time at at least one output terminal of the implementation of said primary filter.

2. The method of claim 1 wherein said steps of selecting a recurrent neural network paradigm, selecting an estimation error criterion, and selecting at least one range transformer are accomplished such that a candidate primary filter with said at least one range transformer, whose recurrent neural network is of said recurrent neural network paradigm, exists that approximates an optimal filter in performance with respect to said estimation error criterion to any predetermined level of accuracy.

3. The method of claim 2 wherein said step of selecting at least one range transformer is accomplished by selecting at least one range transformer from the group consisting of range extenders by Kalman filtering, range extenders by accumulation, and range reducers by differencing.

4. The method of claim 3 wherein said step of implementing said primary filter is accomplished by implementing said recurrent neural network by a method selected from the group consisting of programming a computer, programming a microprocessor, programming an analog device, programming a digital device, programming a neural network chip, copying the weights and initial dynamic state into a neural network chip, making an electronic circuit, making a mechanical device, constructing an optical apparatus, and constructing an electro-optical apparatus, and by implementing said at least one range transformer by a method selected from the group consisting of programming a computer, programming a microprocessor, programming an analog device, programming a digital device, programming a neural network chip, making an electronic circuit, making a mechanical device, constructing an optical apparatus, and constructing an electro-optical apparatus.

5. The method of claim 3 wherein said step of synthesizing said training data into a primary filter is performed, at least in part, directly on a piece of hardware used to implement at least part of said primary filter, thereby completing said step of implementing said primary filter at the same time.

6. The method of claim 3 wherein said step of implementing said primary filter includes implementing at least part of said primary filter on a piece of hardware, and wherein said step of synthesizing said training data into a primary filter is accomplished through including said piece of hardware in the synthesizing process so as to overcome the anomalies and imperfections of said piece of hardware.

7. The method of claim 1 wherein said step of selecting at least one range transformer is accomplished by selecting at least one range transformer from the group consisting of range extenders by estimate addition and range reducers by estimate subtraction.

8. The method of claim 1 wherein said step of implementing said primary filter is accomplished by implementing said recurrent neural network by a method selected from the group consisting of programming a computer, programming a microprocessor, programming an analog device, programming a digital device, programming a neural network chip, copying the weights and initial dynamic state into a neural network chip, making an electronic circuit, making a mechanical device, constructing an optical apparatus, and constructing an electro-optical apparatus, and by implementing said at least one range transformer by a method selected from the group consisting of programming a computer, programming a microprocessor, programming an analog device, programming a digital device, programming a neural networkchip, making an electronic circuit, making a mechanical device, constructing an optical apparatus, and constructing an electro-optical apparatus.

9. The method of claim 1 wherein said step of synthesizing said training data is, at least in part, performed directly on a piece of hardware used to implement at least part of said primary filter, thereby completing said step of implementing said primary filter at the same time.

10. The method of claim 1 wherein said step of implementing said primary filter includes implementing at least part of said primary filter on a piece of hardware, and wherein said step of synthesizing said training data into a primary filter is accomplished through including said piece of hardware in the synthesizing process so as to overcome the anomalies and imperfections of said piece of hardware.

11. A method for evaluating a q-dimensional vector-valued estimation error statistic process, that is required for a primary filter for processing an m-dimensional vector-valued measurement process to estimate an n-dimensional vector-valued signal process, said method comprising the steps of:

(1) selecting an ancillary signal process on the basis of said estimation error statistic process;

(2) selecting an ancillary estimation error criterion on the basis of said estimation error statistic process;

(3) selecting an ancillary recurrent neural network paradigm;

(4) generating ancillary training data comprising realizations of said measurement process and corresponding realizations of said ancillary signal process;

(5) constructing an ancillary training criterion;

(6) selecting at least one ancillary range transformer;

(7) synthesizing said ancillary training data into an ancillary filter, which comprises an ancillary recurrent neural network of said ancillary recurrent neural network paradigm and said at least one ancillary range transformer;

(8) implementing said ancillary filter; and (9) receiving one measurement vector of said measurement process at a time at at least one input terminal of the implementation of said ancillary filter, and producing an estimate of one ancillary signal vector of said ancillary signal process at a time at at least one output terminal of said implementation of said ancillary filter.

12. A method for evaluating a q-dimensional vector-valued estimation error statistic process, that is required for a primary filter for processing an m-dimensional vector-valued measurement process to estimate an n-dimensional vector-valued signal process, said method comprising the steps of:

(1) selecting an ancillary signal process on the basis of said estimation error statistic process;

(2) selecting an ancillary estimation error criterion on the basis of said estimation error statistic process;

(3) selecting an ancillary recurrent neural network paradigm;

(4) generating ancillary training data comprising realizations of said measurement process, corresponding realizations of said primary filter's output process and corresponding realizations of said ancillary signal process;

(5) constructing an ancillary training criterion;

(6) selecting at least one ancillary range transformer;

(7) synthesizing said ancillary training data into an ancillary filter, which comprises an ancillary recurrent neural network of said ancillary recurrent neural network paradigm and said at least one ancillary range transformer;

(8) implementing said ancillary filter; and (9) receiving one measurement vector of said measurement process and one output vector of said primary filter at a time at at least one input terminal of the implementation of said ancillary filter, and producing an estimate of one ancillary signal vector of said ancillary signal process at a time at at least one output terminal of said implementation of said ancillary filter.

13. A primary filter for processing an m-dimensional vector-valued measurement process to estimate an n-dimensional vector-valued signal process with respect to a selected estimation error criterion, said primary filter being an implementation of a neural system comprising a recurrent neural network, of a selected recurrent neural network paradigm, and at least one range transformer.

14. The primary filter of claim 13 wherein said neural system has at least one adjustable weight that is determined by synthesizing, with respect to a training criterion constructed on the basis of said estimation error criterion, training data, comprising realizations of said signal process and corresponding realizations of said measurement process, into said neural system.

15. The primary filter of claim 14 wherein said recurrent neural network comprises (1) a plurality of neurons, each neuron being means for receiving said neuron's input values, processing said input values and producing an output value, that is called the activation level of said neuron; and (2) a plurality of delay connections, each delay connection being means for multiplying a first neuron's activation level by said delay connection's weight, holding the resulting product for at least one unit of time, and then sending said product to a second neuron as one of said second neuron's input values;

and wherein said at least one range transformer is at least one range extender transforming outputs from at least one output node of said recurrent neural network, which output node is included in said plurality of neurons.

16. The primary filter of claim 14 wherein said recurrent neural network comprises (1) a plurality of neurons, each neuron being means for receiving said neuron's input values, processing said input values and producing an output value, that is called the activation level of said neuron; and (2) a plurality of delay connections, each delay connection being means for multiplying a first neuron's activation level by said delay connection's weight, holding the resulting product for at least one unit of time, and then sending said product to a second neuron as one of said second neuron's input values;

and wherein said at least one range transformer is at least one range reducer transforming at least one component of said primary filter's input vector at a time and having the resultant sent to at least one input node of said recurrent neural network, said input node being included in said plurality of neurons.

17. The primary filter of claim 14 wherein said recurrent neural network paradigm includes such a candidate recurrent neural network that a candidate neural system employing said candidate recurrent neural network exists that approximates an optimal filter in performance with respect to said estimation error criterion to any predetermined level of accuracy.

18. The primary filter of claim 14 wherein said one range transformer is of such a type that a candidate neural system employing at least one candidate range transformer of said type exists that approximates an optimal filter in performance with respect to said estimation error criterion to any predetermined level of accuracy.

19. The primary filter of claim 18 wherein said one range transformer is selected from the group consisting of range extenders by estimate addition and range reducers by estimate subtraction.

20. The primary filter of claim 19 wherein said one range transformer is selected from the group consisting of range extenders by Kalman filtering, range extenders by accumulation, range extenders by linear prediction, range extenders by feedforward linear estimation, range reducers by model-aided prediction, range reducers by differencing and range reducers by linear prediction.

21. The primary filter of claim 20 wherein the said one range transformer is selected from the group consisting of range extenders by Kalman filtering, range extenders by accumulation, and range reducers by differencing.

22. The primary filter of claim 21 wherein the implementation of said recurrent neural network is selected from the group consisting of a programmed computer, a programmed microprocessor, a programmed analog device, a programmed digital device, a specially designed electronic circuit, a programmed neural network chip, a neural network chip into which the weights and initial dynamic state have been copied after completion of said synthesis, a specially made mechanical device, a specially constructed optical apparatus, and a specially constructed electro-optical apparatus, and wherein the implementation of said at least one range transformer is selected from the group consisting of a programmed computer, a programmed microprocessor, a programmed analog device, a programmed digital device, a programmed neural network chip, a specially designed electronic circuit, a specially made mechanical device, a specially constructed optical apparatus, and a specially constructed electro-optical apparatus.

23. The primary filter of claim 14 wherein the implementation of said recurrent neural network is selected from the group consisting of a programmed computer, a programmed microprocessor, a programmed analog device, a programmed digital device, a specially designed electronic circuit, a programmed neural network chip, a neural network chip into which the weights and initial dynamic state have been copied after completion of said synthesis, a specially made mechanical device, a specially constructed optical apparatus, and a specially constructed electro-optical apparatus, and wherein the implementation of said at least one range transformer is selected from the group consisting of a programmed computer, a programmed microprocessor, a programmed analog device, a programmed digital device, a programmed neural network chip, a specially designed electronic circuit, a specially made mechanical device, a specially constructed optical apparatus, and a specially constructed electro-optical apparatus.

24. An ancillary filter for evaluating, with respect to an ancillary estimation error criterion, a q-dimensional vector-valued estimation error statistic process, that is required for a primary filter for processing an m-dimensional vector-valued measurement process to estimate an n-dimensional vector-valued signal process, said ancillary filter being an implementation of an ancillary neural system comprising an ancillary recurrent neural network, of a selected ancillary recurrent neural network paradigm, and at least one ancillary range transformer.

25. The ancillary filter of claim 24 wherein said ancillary neural system has at least one adjustable weight that is determined by synthesizing ancillary training data, comprising realizations of an ancillary signal process, selected on the basis of said estimation error statistic process, and corresponding realizations of said measurement process, into said ancillary neural system.

26. The ancillary filter of claim 25 wherein said ancillary recurrent neural network paradigm includes such a candidate ancillary recurrent neural network that a candidate ancillary neural system employing said candidate ancillary recurrent neural network exists that approximates an optimal filter in performance with respect to said ancillary estimation error criterion to any predetermined level of accuracy.

27. The ancillary filter of claim 25 wherein said one ancillary range transformer is of such a type that a candidate ancillary neural system employing at least one candidate range ancillary transformer of said type exists that approximates an optimal filter in performance with respect to said ancillary estimation error criterion to any predetermined level of accuracy.

28. The ancillary filter of claim 27 wherein said one ancillary range transformer is selected from the group consisting of range extenders by estimate addition and range reducers by estimate subtraction.

29. A method for processing an m-dimensional vector-valued measurement process to estimate an n-dimensional vector-valued signal process, said signal and measurement processes being time-variant with said signal and measurement processes' time-variant property described by a p-dimensional vector-valued time function, said method comprising the steps of:

(1) selecting a recurrent neural network paradigm;
(2) selecting an estimation error criterion;
(3) generating augmented training data comprising a set of exemplary time functions and realizations of said signal and measurement processes that correspond to each said exemplary time function;
(4) constructing a training criterion;
(5) selecting at least one range transformer;
(6) synthesizing said augmented training data into a primary filter with augmented input terminals, which comprises a recurrent neural network of said recurrent neural network paradigm and said at least one range transformer;
(7) implementing said primary filter with augmented input terminals; and
(8) receiving one measurement vector of said measurement process and one vector of said p-dimensional vector-valued time function at a time at at least one input terminal of the implementation of said primary filter with augmented input terminals, and producing an estimate of one signal vector of said signal process at a time at at least one output terminal of the implementation of said primary filter with augmented input terminals.

30. The method of claim 29 wherein said steps of selecting a recurrent neural network paradigm, selecting an estimation error criterion, and selecting at least one range transformer are accomplished such that a candidate primary filter with augmented input terminals, that contains said at least one range transformer and whose recurrent neural network is of said recurrent neural network paradigm, exists that approximates an optimal filter in performance with respect to said estimation error criterion to any predetermined level of accuracy.

31. The method of claim 29 wherein said step of selecting at least one range transformer is accomplished by selecting at least one range transformer from the group consisting of range extenders by estimate addition and range reducers by estimate subtraction.

32. The method of claim 27 wherein said step of implementing said primary filter with augmented input terminals is accomplished by implementing said recurrent neural network by a method selected from the group consisting of programming a computer, programming a microprocessor, programming an analog device, programming a digital device, programming a neural network chip, copying the weights and initial dynamic state into a neural network chip, making an electronic circuit, making a mechanical device, constructing an optical apparatus, and constructing an electro-optical apparatus, and implementing said at least one range transformer by a method selected from the group consisting of programming a computer, programming a microprocessor, programming an analog device, programming a digital device, programming a neural network chip, making a mechanical device, constructing an optical apparatus, and constructing an electro-optical apparatus.

33. The method of claim 29 wherein said step of synthesizing said augmented training data is, at least in part, performed directly on a piece of hardware used to implement at least part of said primary filter, thereby completing said step of implementing said primary filter with augmented input terminals at the same time.

34. The method of claim 29 wherein said step of implementing said primary filter with augmented input terminals includes implementing at least part of said primary filter with augmented input terminals on a piece of hardware, and wherein said step of synthesizing said augmented training data into a primary filter with augmented input terminals is accomplished through including said piece of hardware in the synthesizing process so as to overcome the anomalies and imperfections of said piece of hardware.

35. A method for evaluating a q-dimensional vector-valued estimation error statistic process, that is required for a primary filter with augmented input terminals for processing an m-dimensional vector-valued measurement process to estimate an n-dimensional vector-valued signal process, said signal and measurement processes being time-variant with said signal and measurement processes' time-variant property described by a p-dimensional vector-valued time function, said method comprising the steps of:

(1) selecting an ancillary signal process on the basis of said estimation error statistic process;
(2) selecting an ancillary estimation error criterion on the basis of said estimation error statistic process;
(3) selecting an ancillary recurrent neural network paradigm;
(4) generating augmented ancillary training data comprising a set of exemplary time functions, corresponding realizations of said measurement process and corresponding realizations of said ancillary signal process;
(5) constructing an ancillary training criterion;
(6) selecting at least one ancillary range transformer;
(7) synthesizing said augmented ancillary training data into an ancillary filter with augmented input terminals, which comprises an ancillary recurrent neural network of said ancillary recurrent neural network paradigm and said at least one ancillary range transformer;
(8) implementing said ancillary filter with augmented input terminals; and
(9) receiving one measurement vector of said measurement process and one vector of said p-dimensional vector-valued time function at a time at at least one input terminal of the implementation of said ancillary filter with augmented input terminals and producing an estimate of one signal vector of said ancillary signal process at a time at at least one output terminal of said implementation of said ancillary filter with augmented input terminals.

36. A method for evaluating a q-dimensional vector-valued estimation error statistic process, that is required for a primary filter with augmented input terminals for processing an m-dimensional vector-valued measurement process to estimate an n-dimensional vector-valued signal process, said signal and measurement processes being time-variant with said signal and measurement processes' time-variant property described by a p-dimensional vector-valued time function, said method comprising the steps of:

(1) selecting an ancillary signal process on the basis of said estimation error statistic process;

(2) selecting an ancillary estimation error criterion on the basis of said estimation error statistic process;

(3) selecting an ancillary recurrent neural network paradigm;

(4) generating augmented ancillary training data comprising a set of exemplary time functions, corresponding realizations of said measurement process, corresponding realizations of the output process of said primary filter with augmented input terminals, and corresponding realizations of said ancillary signal process;

(5) constructing an ancillary training criterion;

(6) selecting at least one ancillary range transformer;

(7) synthesizing said augmented ancillary training data into an ancillary filter with augmented input terminals, which comprises an ancillary recurrent neural network of said ancillary recurrent neural network paradigm and said at least one ancillary range transformer;

(8) implementing said ancillary filter with augmented input terminals; and (9) receiving one vector of said p-dimensional vector-valued time function, one measurement vector of said measurement process and one output vector of said primary filter at a time at at least one input terminal of the implementation of said ancillary filter with augmented input terminals and producing an estimate of one signal vector of said ancillary signal process at a time at at least one output terminal of said implementation of said ancillary filter with augmented input terminals.

37. A primary filter with augmented input terminals for processing an m-dimensional vector-valued measurement process to estimate an n-dimensional vector-valued signal process with respect to a selected estimation error criterion, which signal and measurement processes are time-variant with said signal and measurement processes' time-variant property described by a p-dimensional vector-valued time function, said primary filter with augmented input terminals being an implementation of a neural system comprising a recurrent neural network, of a selected neural network paradigm, and at least one range transformer.

38. The primary filter with augmented input terminals of claim 37 wherein said neural system has at least one adjustable weight that is determined by synthesizing, with respect to a training criterion constructed on the basis of said estimation error criterion, augmented training data, comprising a set of exemplary time functions, and realizations of said signal process and realizations of said measurement process, that correspond to each said exemplary time function, into said neural system.

39. The primary filter with augmented input terminals of claim 38 wherein said recurrent neural network comprises (1) a plurality of neurons, each neuron being means for receiving said neuron's input values, processing said input values and producing an output value, that is called the activation level of said neuron; and (2) a plurality of delay connections, each delay connection being means for multiplying a first neuron's activation level by said delay connection's weight, holding the resulting product for at least one unit of time, and then sending said product to a second neuron as one of said second neuron's input values;

and wherein said at least one range transformer is at least one range extender transforming outputs from at least one output node of said recurrent neural network, said output node being included in said plurality of neurons.

40. The primary filter with augmented input terminals of claim 38 wherein said recurrent neural network comprises (1) a plurality of neurons, each neuron being means for receiving said neuron's input values, processing said input values and producing an output value, that is called the activation level of said neuron; and (2) a plurality of delay connections, each delay connection being means for multiplying a first neuron's activation level by said delay connection's weight, holding the resulting product for at least one unit of time, and then sending said product to a second neuron as one of said second neuron's input values;

and wherein said at least one range transformer is at least one range reducer transforming at least one component of the input vector of said primary filter with augmented input terminals at a time and having the resultant sent to at least one input node of said recurrent neural network, said input node being included in said plurality of neurons.

41. The primary filter with augmented input terminals of claim 38 wherein said recurrent neural network paradigm includes such a candidate recurrent neural network that a candidate neural system employing said candidate recurrent neural network exists that approximates an optimal filter in performance with respect to said estimation error criterion to any predetermined level of accuracy.

42. The primary filter with augmented input terminals of claim 38 wherein said one range transformer is of such a type that a candidate neural system employing at least one candidate range transformer of said type exists that approximates an optimal filter in performance with respect to said estimation error criterion to any predetermined level of accuracy.

43. The primary filter with augmented input terminals of claim 42 wherein said one range transformer is selected from the group consisting of range extenders by estimate addition and range reducers by estimate subtraction.

44. The primary filter with augmented input terminals of claim 43 wherein said one range transformer is selected from the group consisting of range extenders by Kalman filtering, range extenders by accumulation, range extenders by linear prediction, range extenders by feedforward linear estimation, range reducers by model-aided prediction, range reducers by differencing and range reducers by linear prediction.

45. The primary filter with augmented input terminals of claim 38 wherein the implementation of said recurrent neural network is selected from the group consisting of a programmed computer, a programmed microprocessor, a programmed analog device, a programmed digital device, a specially designed electronic circuit, a programmed neural network chip, a neural network chip into which the weights and initial dynamic state have been copied after completion of said synthesis, a specially made mechanical device, a specially constructed optical apparatus, and a specially constructed electro-optical apparatus, and wherein the implementation of said at least one range transformer is selected from the group consisting of a programmed computer, a programmed microprocessor, a programmed analog device, a programmed digital device, a programmed neural network chip, a specially designed electronic circuit, a specially made mechanical device, a specially constructed optical apparatus, and a specially constructed electro-optical apparatus.

46. An ancillary filter with augmented input terminals for evaluating, with respect to an ancillary estimation error criterion, a q-dimensional vector-valued estimation error statistic process, that is required for a primary filter with augmented input terminals for processing an m-dimensional vector-valued measurement process to estimate an n-dimensional vector-valued signal process, said signal and measurement processes being time-variant with said signal and measurement processes' time-variant property described by a p-dimensional vector-valued time function, said ancillary filter with augmented input terminals being an implementation of an ancillary neural system comprising an ancillary recurrent neural network, of a selected ancillary recurrent neural network paradigm, and at least one ancillary range transformer.

47. The ancillary filter with augmented input terminals of claim 46 wherein said ancillary neural system has at least one adjustable weight that is determined by synthesizing ancillary training data, comprising a set of exemplary time functions, corresponding realizations of au ancillary signal process, selected on the basis of said estimation error statistic process, and corresponding realizations of said measurement process, into said ancillary neural system.

48. The ancillary filter with augmented input terminals of claim 47 wherein said ancillary recurrent neural network paradigm includes such a candidate ancillary recurrent neural network that a candidate ancillary neural system employing said candidate ancillary recurrent neural network exists that approximates an optimal filter in performance with respect to said ancillary estimation error criterion to any predetermined level of accuracy.

49. The ancillary filter with augmented input terminals of claim 47 wherein said one ancillary range transformer is of such a type that a candidate ancillary neural system employing at least one candidate ancillary range transformer of said type exists that approximates an optimal filter in performance with respect to said ancillary estimation error criterion to any predetermined level of accuracy.

50. The ancillary filter with augmented input terminals of claim 49 wherein said one ancillary range transformer is selected from the group consisting of range extenders by estimate addition and range reducers by estimate subtraction.

51. A method for processing a vector-valued measurement process to estimate a vector-valued signal process in an interactive environment composed of an environment transition system and an environment observation system, said method comprising the steps of:

(1) selecting a recurrent neural network paradigm;

(2) selecting an estimation error criterion;

(3) generating training data comprising realizations of said signal process and said measurement process;

(4) constructing a training criterion;

(5) selecting at least one range transformer;

(6) synthesizing said training data, while taking into account said interactive environment, into a primary filter, which comprises a recurrent neural network of said recurrent neural network paradigm and said at least one range transformer;

(7) implementing said primary filter; and (8) receiving one measurement vector of said measurement process and at a time at at least one input terminal of the implementation of said primary filter and producing an estimate of one signal vector of said signal process at a time at at least one output terminal of the implementation of said primary filter.

52. The method of claim 51 wherein said steps of selecting a recurrent neural network paradigm, selecting an estimation error criterion, and selecting at least one range transformer are accomplished such that a candidate primary filter with said at least one range transformer, whose recurrent neural network is of said recurrent neural network paradigm, exists that approximates an optimal filter in performance with respect to said estimation error criterion to any predetermined level of accuracy.

53. The method of claim 51 wherein said step of selecting at least one range transformer is accomplished by selecting at least one range transformer from the group consisting of range extenders by estimate addition and range reducers by estimate subtraction.

54. The method of claim 51 wherein said step of implementing said primary filter is accomplished by implementing said recurrent neural network by a method selected from the group consisting of programming a computer, programming a microprocessor, programming an analog device, programming a digital device, programming a neural network chip, copying the weights and initial dynamic state into a neural network chip, making an electronic circuit, making a mechanical device, constructing an optical apparatus, and constructing an electro-optical apparatus, and by implementing said at least one range transformer by a method selected from the group consisting of programming a computer, programming a microprocessor, programming an analog device, programming a digital device, programming a neural network chip, making an electronic circuit, making a mechanical device, constructing an optical apparatus, and constructing an electro-optical apparatus.

55. The method of claim 51 wherein said step of synthesizing said training data into a primary filter is, at least in part, performed directly on a piece of hardware used to implement at least part of said primary filter, thereby completing said step of implementing said primary filter at the same time.

56. The method of claim 51 wherein said step of implementing said primary filter includes implementing at least part of said primary filter on a piece of hardware, and wherein said step of synthesizing said training data into a primary filter is accomplished through including said piece of hardware in the synthesizing process so as to overcome the anomalies and imperfections of said piece of hardware.

57. A method for evaluating a vector-valued estimation error statistic process, that is required for a primary filter for processing a vector-valued measurement process to estimate a vector-valued signal process in an interactive environment composed of an environment transition system and an environment observation system, said method comprising the steps of:

(1) selecting an ancillary signal process on the basis of said estimation error statistic process;

(2) selecting an ancillary estimation error criterion on the basis of said estimation error statistic process;

(3) selecting an ancillary recurrent neural network paradigm;

(4) generating training data comprising realizations of said measurement process and said ancillary signal process;

(5) constructing an ancillary training criterion;

(6) selecting at least one ancillary range transformer;

(7) synthesizing said training data, while taking into account said interactive environment, into an ancillary filter, which comprises an ancillary recurrent neural network of said ancillary recurrent neural network paradigm and said at least one ancillary range transformer;

(8) implementing said ancillary filter; and (9) receiving one measurement vector of said measurement process at a time at at least one input terminal of the implementation of said ancillary filter, and producing an estimate of one ancillary signal vector of said ancillary signal process at a time at at least one output terminal of said implementation of said ancillary filter.

58. A method for evaluating a vector-valued estimation error statistic process, that is required for a primary filter for processing a vector-valued measurement process to estimate a vector-valued signal process in an interactive environment composed of an environment transition system and an environment observation system, said method comprising the steps of:

(1) selecting an ancillary signal process on the basis of said estimation error statistic process;

(2) selecting an ancillary estimation error criterion on the basis of said estimation error statistic process;

(3) selecting an ancillary recurrent neural network paradigm;

(4) generating training data comprising realizations of said measurement process, said primary filter's output process, and said ancillary signal process;

(5) constructing an ancillary training criterion;

(6) selecting at least one ancillary range transformer;

(7) synthesizing said training data, while taking into account said interactive environment, into an ancillary filter, which comprises an ancillary recurrent neural network of said ancillary recurrent neural network paradigm and said at least one ancillary range transformer;

(8) implementing said ancillary filter; and (9) receiving one measurement vector of said measurement process and one output vector of said primary filter at a time at at least one input terminal of the implementation of said ancillary filter, and producing an estimate of one ancillary signal vector of said ancillary signal process at a time at at least one output terminal of said implementation of said ancillary filter.

59. A primary filter for processing a vector-valued measurement process to estimate a vector-valued signal process with respect to a selected estimation error criterion in an interactive environment composed of an environment transition system and an environment observation system, said primary filter being an implementation of a neural system comprising a recurrent neural network, of a selected recurrent neural network paradigm, and at least one range transformer.

60. The primary filter of claim 59 wherein said neural system has at least one adjustable weight that is determined by synthesizing, with respect to a training criterion constructed on the basis of said estimation error criterion, training data, comprising realizations of said signal process and corresponding realizations of said measurement process, into said recurrent neural system, while taking into account said interactive environment.

61. The primary filter of claim 60 wherein said recurrent neural network comprises (1) a plurality of neurons, each neuron being means for receiving said neuron's input values, processing said input values and producing an output value, that is called the activation level of said neuron; and (2) a plurality of delay connections, each delay connection being means for multiplying a first neuron's activation level by said delay connection's weight, holding the resulting product for at least one unit of time, and then sending said product to a second neuron as one of said second neuron's input values;

and wherein said at least one range transformer is at least one range extender transforming outputs from at least one output node of said recurrent neural network, said output node being included in said plurality of neurons.

62. The primary filter of claim 60 wherein said recurrent neural network comprises (1) a plurality of neurons, each neuron being means for receiving said neuron's input values, processing said input values and producing an output value, that is called the activation level of said neuron; and (2) a plurality of delay connections, each delay connection being means for multiplying a first neuron's activation level by said delay connection's weight, holding the resulting product for at least one unit of time, and then sending said product to a second neuron as one of said second neuron's input values;

and wherein said at least one range transformer is at least one range reducer transforming at least one component of said primary filter's input vector at a time and having the resultant sent to at least one input node of said recurrent neural network, said input node being included in said plurality of neurons.

63. The primary filter of claim 60 wherein said recurrent neural network paradigm includes such a candidate recurrent neural network that a candidate neural system employing said candidate recurrent neural network exists that approximates an optimal filter in performance with respect to said estimation error criterion to any predetermined level of accuracy.

64. The primary filter of claim 60 wherein said one range transformer is of such a type that a candidate neural system employing at least one candidate range transformer of said type exists that approximates an optimal filter in performance with respect to said estimation error criterion to any predetermined level of accuracy.

65. The primary filter of claim 64 wherein said one range transformer is selected from the group consisting of range extenders by estimate addition and range reducers by estimate subtraction.

66. The primary filter of claim 65 wherein said one range transformer is selected from the group consisting of range extenders by Kalman filtering, range extenders by accumulation, range extenders by linear prediction, range extenders by feedforward linear estimation, range reducers by model-aided prediction, range reducers by differencing and range reducers by linear prediction.

67. The primary filter of claim 60 wherein the implementation of said recurrent neural network is selected from the group consisting of a programmed computer, a programmed microprocessor, a programmed analog device, a programmed digital device, a specially designed electronic circuit, a programmed neural network chip, a neural network chip into which the weights and initial dynamic state have been copied after completion of said synthesis, a specially made mechanical device, a specially constructed optical apparatus, and a specially constructed electro-optical apparatus, and wherein the implementation of said at least one range transformer is selected from the group consisting of a programmed computer, a programmed microprocessor, a programmed analog device, a programmed digital device, a programmed neural network chip, a specially designed electronic circuit, a specially made mechanical device, a specially constructed optical apparatus, and a specially constructed electro-optical apparatus.

68. An ancillary filter for evaluating, with respect to an ancillary estimation error criterion, a vector-valued estimation error statistic process, that is required for a primary filter for processing a vector-valued measurement process to estimate a vector-valued signal process in an interactive environment composed of an environment transition system and an environment observation system, said ancillary filter being an implementation of an ancillary neural system comprising an ancillary recurrent neural network, of a selected ancillary recurrent neural network paradigm, and at least one ancillary range transformer.

69. The ancillary filter of claim 68 wherein said ancillary neural system has at least one adjustable weight that is determined by synthesizing ancillary training data, comprising realizations of an ancillary signal process, selected on the basis of said estimation error statistic process, and corresponding realizations of said measurement process, into said ancillary neural system, while taking into account said interactive environment.

70. The ancillary filter of claim 69 wherein said ancillary recurrent neural network paradigm includes such a candidate ancillary recurrent neural network that a candidate ancillary neural system employing said candidate ancillary recurrent neural network exists that approximates an optimal filter in performance with respect to said ancillary estimation error criterion to any predetermined level of accuracy.

71. The ancillary filter of claim 69 wherein said one ancillary range transformer is of such a type that a candidate ancillary neural system employing at least one candidate ancillary range transformer of said type exists that approximates an optimal filter in performance with respect to said ancillary estimation error criterion to any predetermined level of accuracy.

72. The ancillary filter of claim 71 wherein said one ancillary range transformer is selected from the group consisting of range extenders by estimate addition and range reducers by estimate subtraction.

73. A method for processing a vector-valued measurement process to estimate a vector-valued signal process, which signal and measurement processes are time-variant with said signal and measurement processes' time-variant property described by a vector-valued time function, in an interactive environment composed of an environment transition system and an environment observation system, said method comprising the steps of:

(1) selecting a recurrent neural network paradigm;

(2) selecting an estimation error criterion;

(3) generating augmented training data comprising a set of exemplary time functions and realizations of said signal and measurement processes that correspond to each said exemplary time function;

(4) constructing a training criterion;

(5) selecting at least one range transformer;

(6) synthesizing said augmented training data, while taking into account said interactive environment, into a primary filter with augmented input terminals, which comprises a recurrent neural network of said recurrent neural network paradigm and said at least one range transformer;

(7) implementing said primary filter with augmented input terminals; and (8) receiving one measurement vector of said measurement process and one vector of said vector-valued time function at a time at at least one input terminal of the implementation of said primary filter with augmented input terminals, and producing an estimate of one signal vector of said signal process at a time at at least one output terminal of the implementation of said primary filter with augmented input terminals.

74. The method of claim 73 wherein said steps of selecting a recurrent neural network paradigm, selecting an estimation error criterion, and selecting at least one range transformer are accomplished such that a candidate primary filter with augmented input terminals, that contains said at least one range transformer and whose recurrent neural network is of said recurrent neural network paradigm, exists that approximates an optimal filter in performance with respect to said estimation error criterion to any predetermined level of accuracy.

75. The method of claim 74 wherein said step of implementing said primary filter with augmented input terminals includes implementing at least part of said primary filter with augmented input terminals on a piece of hardware, and wherein said step of synthesizing said augmented training data into a primary filter with augmented input terminals is accomplished through including said piece of hardware in the synthesizing process so as to overcome the anomalies and imperfections of said piece of hardware.

76. The method of claim 73 wherein said step of selecting at least one range transformer is accomplished by selecting at least one range transformer from the group consisting of range extenders by estimate addition and range reducers by estimate subtraction.

77. The method of claim 73 wherein said step of implementing said primary filter with augmented input terminals is accomplished by implementing said recurrent neural network by a method selected from the group consisting of programming a computer, programming a microprocessor, programming an analog device, programming a digital device, programming a neural network chip, copying the weights and initial dynamic state into a neural network chip, making an electronic circuit, making a mechanical device, constructing an optical apparatus, and constructing an electro-optical apparatus, and implementing said at least one range transformer by a method selected from the group consisting of programming a computer, programming a microprocessor, programming an analog device, programming a digital device, programming a neural network chip, making a mechanical device, constructing an optical apparatus, and constructing an electro-optical apparatus.

78. The method of claim 73 wherein said step of synthesizing said augmented training data is, at least in part, performed directly on a piece of hardware used to implement at least part of said primary filter, thereby completing said step of implementing said primary filter with augmented input terminals at the same time.

79. A method for evaluating a vector-valued estimation error statistic process, that is required for a primary filter with augmented input terminals for processing a vector-valued measurement process to estimate a vector-valued signal process, said signal and measurement processes being time-variant with said signal and measurement processes' time-variant property described by a vector-valued time function, in an interactive environment composed of an environment transition system and an environment observation system, said method comprising the steps of:

(1) selecting an ancillary signal process on the basis of said estimation error statistic process;

(2) selecting an ancillary estimation error criterion on the basis of said estimation error statistic process;

(3) selecting an ancillary recurrent neural network paradigm;

(4) generating augmented ancillary training data comprising a set of exemplary time functions, corresponding realizations of said measurement process and corresponding realizations of said ancillary signal process;

(5) constructing an ancillary training criterion;

(6) selecting at least one ancillary range transformer;

(7) synthesizing said augmented ancillary training data, while taking into account said interactive environment, into an ancillary filter with augmented input terminals, which comprises an ancillary recurrent neural network of said ancillary recurrent neural network paradigm and said at least one ancillary range transformer;

(8) implementing said ancillary filter with augmented input terminals; and (9) receiving one measurement vector of said measurement process and one vector of said vector-valued time function at a time at at least one input terminal of the implementation of said ancillary filter with augmented input terminals and producing an estimate of one signal vector of said ancillary signal process at a time at at least one output terminal of said implementation of said ancillary filter with augmented input terminals.

80. A method for evaluating a vector-valued estimation error statistic process, that is required for a primary filter with augmented input terminals for processing a vector-valued measurement process to estimate a vector-valued signal process, said signal and measurement processes being time-variant with said signal and measurement processes' time-variant property described by a vector-valued time function, in an interactive environment composed of an environment transition system and an environment observation system, said method comprising the steps of:

(1) selecting an ancillary signal process on the basis of said estimation error statistic process;

(2) selecting an ancillary estimation error criterion on the basis of said estimation error statistic process;

(3) selecting an ancillary recurrent neural network paradigm;

(4) generating augmented ancillary training data comprising a set of exemplary time functions, corresponding realizations of said measurement process, corresponding realizations of the output process of said primary filter with augmented input terminals, and corresponding realizations of said ancillary signal process;

(5) constructing an ancillary training criterion;

(6) selecting at least one ancillary range transformer;

(7) synthesizing said augmented ancillary training data, while taking into account said interactive environment, into an ancillary filter with augmented input terminals, which comprises an ancillary recurrent neural network of said ancillary recurrent neural network paradigm and said at least one ancillary range transformer;

(8) implementing said ancillary filter with augmented input terminals; and (9) receiving one vector of said vector-valued time function, one measurement vector of said measurement process and one output vector of said primary filter at a time at at least one input terminal of the implementation of said ancillary filter with augmented input terminals and producing an estimate of one signal vector of said ancillary signal process at a time at at least one output terminal of said implementation of said ancillary filter with augmented input terminals.

81. A primary filter with augmented input terminals for processing an m-dimensional vector-valued measurement process to estimate an n-dimensional vector-valued signal process with respect to a selected estimation error criterion, which signal and measurement processes are time-variant with said signal and measurement processes' time-variant property described by a p-dimensional vector-valued time function, said primary filter with augmented input terminals being an implementation of a neural system comprising a recurrent neural network, of a selected neural network paradigm, and at least one range transformer.

82. The primary filter with augmented input terminals of claim 81 wherein said neural system has at least one adjustable weight that is determined by synthesizing, with respect to a training criterion constructed on the basis of said estimation error criterion, augmented training data, comprising a set of exemplary time functions, and realizations of said signal process and realizations of said measurement process, that correspond to each said exemplary time function, into said neural system, while taking into account said interactive environment.

83. The primary filter with augmented input terminals of claim 82 wherein said recurrent neural network comprises (1) a plurality of neurons, each neuron being means for receiving said neuron's input values, processing said input values and producing an output value, that is called the activation level of said neuron; and (2) a plurality of delay connections, each delay connection being means for multiplying a first neuron's activation level by said delay connection's weight, holding the resulting product for at least one unit of time, and then sending said product to a second neuron as one of said second neuron's input values;

and wherein said at least one range transformer is at least one range extender transforming outputs from at least one output node of said recurrent neural network, said output node being included in said plurality of neurons.

84. The primary filter with augmented input terminals of claim 82 wherein said recurrent neural network comprises (1) a plurality of neurons, each neuron being means for receiving said neuron's input values, processing said input values and producing an output value, that is called the activation level of said neuron; and (2) a plurality of delay connections, each delay connection being means for multiplying a first neuron's activation level by said delay connection's weight, holding the resulting product for at least one unit of time, and then sending said product to a second neuron as one of said second neuron's input values;

and wherein said at least one range transformer is at least one range reducer transforming at least one component of the input vector of said primary filter with augmented input terminals at a time and having the resultant sent to at least one input node of said recurrent neural network, said input node being included in said plurality of neurons.

85. The primary filter with augmented input terminals of claim 82 wherein said recurrent neural network paradigm includes such a candidate recurrent neural network that a candidate neural system employing said candidate recurrent neural network exists that approximates an optimal filter in performance with respect to said estimation error criterion to any predetermined level of accuracy.

86. The primary filter with augmented input terminals of claim 82 wherein said one range transformer is of such a type that a candidate neural system employing at least one candidate range transformer of said type exists that approximates an optimal filter in performance with respect to said estimation error criterion to any predetermined level of accuracy.

87. The primary filter with augmented input terminals of claim 86 wherein said one range transformer is selected from the group consisting of range extenders by estimate addition and range reducers by estimate subtraction.

88. The primary filter with augmented input terminals of claim 87 wherein said one range transformer is selected from the group consisting of range extenders by Kalman filtering, range extenders by accumulation, range extenders by linear prediction, range extenders by feedforward linear estimation, range reducers by model-aided prediction, range reducers by differencing and range reducers by linear prediction.

89. The primary filter with augmented input terminals of claim 82 wherein the implementation of said recurrent neural network is selected from the group consisting of a programmed computer, a programmed microprocessor, a programmed analog device, a programmed digital device, a specially designed electronic circuit, a programmed neural network chip, a neural network chip into which the weights and initial dynamic state have been copied after completion of said synthesis, a specially made mechanical device, a specially constructed optical apparatus, and a specially constructed electro-optical apparatus, and wherein the implementation of said at least one range transformer is selected from the group consisting of a programmed computer, a programmed microprocessor, a programmed analog device, a programmed digital device, a programmed neural network chip, a specially designed electronic circuit, a specially made mechanical device, a specially constructed optical apparatus, and a specially constructed electro-optical apparatus.

90. An ancillary filter with augmented input terminals for evaluating, with respect to an ancillary estimation error criterion, a vector-valued estimation error statistic process, that is required for a primary filter with augmented input terminals for processing a vector-valued measurement process to estimate a vector-valued signal process, said signal and measurement processes being time-variant with said signal and measurement processes' time-variant property described by a vector-valued time function, in an interactive environment composed of an environment transition system and an environment observation system, said ancillary filter with augmented input terminals being an implementation of an ancillary neural system comprising an ancillary recurrent neural network, of a selected ancillary recurrent neural network paradigm, and at least one ancillary range transformer.

91. The ancillary filter with augmented input terminals of claim 90 wherein said ancillary neural system has at least one adjusahle weight that is determined by synthesizing ancillary training data, comprising a set of exemplary time functions, corresponding realizations of an ancillary signal process, selected on the basis of said estimation error statistic process, and corresponding realizations of said measurement process, into said ancillary neural system, while taking into account said interactive environment.

92. The ancillary filter with augmented input terminals of claim 91 wherein said ancillary recurrent neural network paradigm includes such a candidate ancillary recurrent neural network that a candidate ancillary neural system employing said candidate ancillary recurrent neural network exists that approximates an optimal filter in performance with respect to said ancillary estimation error criterion to any predetermined level of accuracy.

93. The ancillary filter with augmented input terminals of claim 91 wherein said one ancillary range transformer is of such a type that a candidate ancillary neural system employing at least one candidate ancillary range transformer of said type exists that approximates an optimal filter in performance with respect to said ancillary estimation error criterion to any predetermined level of accuracy.

94. The ancillary filter with augmented input terminals of claim 93 wherein said one ancillary range transformer is selected from the group consisting of range extenders by estimate addition and range reducers by estimate subtraction.

* * * * *